United States Patent
Kikushima et al.

(10) Patent No.: US 7,075,157 B2
(45) Date of Patent: Jul. 11, 2006

(54) METHOD OF MANUFACTURING A SEMICONDUCTOR INTEGRATED CIRCUIT DEVICE

(75) Inventors: Kenichi Kikushima, Ome (JP); Fumio Ootsuka, Tokorozawa (JP); Kazushige Sato, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/834,020

(22) Filed: Apr. 29, 2004

(65) Prior Publication Data

US 2004/0203199 A1   Oct. 14, 2004

Related U.S. Application Data

(60) Continuation of application No. 10/461,504, filed on Jun. 16, 2003, now Pat. No. 6,747,324, which is a division of application No. 09/753,515, filed on Jan. 4, 2001, now Pat. No. 6,603,178, which is a division of application No. 09/025,731, filed on Feb. 18, 1998, now Pat. No. 6,171,892, which is a division of application No. 08/784,998, filed on Jan. 17, 1997, now Pat. No. 5,798,551.

(30) Foreign Application Priority Data

Jan. 17, 1996  (JP) .................................. 8-5487
Feb. 23, 1996  (JP) .................................. 8-35872

(51) Int. Cl.
*H01L 29/76* (2006.01)
(52) U.S. Cl. ....................... 257/377; 257/369
(58) Field of Classification Search .............. 257/369, 257/377

See application file for complete search history.

(56) References Cited

U.S. PATENT DOCUMENTS 4,549,340 A   10/1985 Nagasawa et al.

(Continued)

FOREIGN PATENT DOCUMENTS

JP   61-66296   4/1986

(Continued)

OTHER PUBLICATIONS

Balasubramanian, et al., "Monolithic Storage Cell Having Inherent Latent Image Memory Operation", IBM Technical Disclosure Bulletin, vol. 17, No. 12, May 1975, pp. 3634-3635.

(Continued)

*Primary Examiner*—Thomas L. Dickey
(74) *Attorney, Agent, or Firm*—Antonelli, Terry, Stout and Kraus, LLP.

(57) ABSTRACT

Disclosed is a semiconductor integrated circuit device (e.g., an SRAM) having memory cells each of a flip-flop circuit constituted by and a pair of load MISFETs, the MISFETs being cross-connected by a pair of local wiring lines, and having transfer MISFETs, wherein gate electrodes of all of the MISFETs are provided in a first level conductive layer, and the pair of local wiring lines are provided respectively in second and third level conductive layers. The local wiring lines can overlap and have a dielectric therebetween so as to form a capacitance element, to increase alpha particle soft error resistance. Moreover, by providing the pair of local wiring lines respectively in different levels, integration of the device can be increased. Side wall spacers can be provided on the sides of the gate electrodes of the MISFETs and on the sides of the local wiring lines, and connection holes to semiconductor regions of these MISFETs are self-aligned to both the gate electrodes and the local wiring lines, whereby capacitor area can be increased and integration of the device can also be increased.

3 Claims, 109 Drawing Sheets

U.S. PATENT DOCUMENTS

| | | | |
|---|---|---|---|
| 4,554,729 A | 11/1985 | Tanimura et al. |
| 4,882,289 A | 11/1989 | Moriuchi |
| 5,079,611 A | 1/1992 | Ikeda et al. |
| 5,114,879 A | 5/1992 | Madan |
| 5,135,882 A | 8/1992 | Karniewicz |
| 5,145,799 A | 9/1992 | Rodder |
| 5,239,196 A | 8/1993 | Ikeda et al. |
| 5,296,729 A | 3/1994 | Yamanaka et al. |
| 5,298,782 A | 3/1994 | Sundaresan |
| 5,523,598 A * | 6/1996 | Watanabe et al. | 257/301 |
| 5,554,554 A | 9/1996 | Bastani et al. |
| 5,610,856 A | 3/1997 | Yoshizumi et al. |
| 5,661,325 A | 8/1997 | Hayashi et al. |
| 5,700,704 A | 12/1997 | Ikeda et al. |
| 5,700,705 A | 12/1997 | Meguro et al. |
| 5,731,219 A | 3/1998 | Ikeda et al. |
| 5,754,467 A | 5/1998 | Ikeda et al. |
| 5,780,910 A * | 7/1998 | Hashimoto et al. | 257/393 |
| 5,834,851 A | 11/1998 | Ikeda et al. |
| 5,986,309 A | 11/1999 | Fujimoto et al. |

FOREIGN PATENT DOCUMENTS

| | | |
|---|---|---|
| JP | 4-279056 | 10/1992 |
| JP | 04279056 | 10/1992 |

OTHER PUBLICATIONS

Japanese Office Action (Notification of Reason for Refusal), for Application No. JP- Hei 8(1996)-035872, dated Aug. 9, 2005.

* cited by examiner

FIG. 57

METHOD OF MANUFACTURING A SEMICONDUCTOR INTEGRATED CIRCUIT DEVICE

CROSS-REFERENCE TO RELATED APPLICATION

The present application is a Continuation application of application Ser. No. 10/461,504, filed Jun. 16, 2003, now U.S. Pat. No. 6,747,324, which is a Divisional application of application Ser. No. 09/753,515, filed on Jan. 4, 2001, now U.S. Pat. No. 6,603,178, which is a Divisional application of application Ser. No. 09/025,731, filed on Feb. 18, 1998, now U.S. Pat. No. 6,171,892, which is a Divisional application of application Ser. No. 08/784,998, filed Jan. 17, 1997, the contents of which are incorporated by reference herein in their entirety. Application Ser. No. 08/784,998 has issued as U.S. Pat. No. 5,798,551.

BACKGROUND OF THE INVENTION

The present invention relates to a semiconductor integrated circuit device and a method for manufacturing the same and, more particularly, to a technique which is particularly effective when applied to a semiconductor integrated circuit device having an SRAM (Static Random Access Memory).

A memory cell of an SRAM or a semiconductor memory device is composed of: a flip-flop circuit acting as an information storage unit for storing information of 1 bit; and a pair of transfer MISFETs (Metal Insulator Semiconductor Field Effect Transistors) for controlling the electrical connection between writing/reading data lines and the flip-flop circuit.

The flip-flop circuit of the memory cell is composed of a pair of CMOS (Complementary Metal Oxide Semiconductor) inverters, for example. Each of these CMOS inverters is composed of one drive MISFET and one load MISFET. In this case, the memory cell is of a complete CMOS type of a combination of two drive MISFETs, two load MISFETs and two transfer MISFETs. Of these MISFETs, the transfer MISFETs and the drive MISFETs are of n-channel type whereas the load MISFETs are of p-channel type.

A pair of input/output terminals of the flip-flop circuit (the CMOS inverter) are cross-connected through a pair of wiring lines called "local wiring lines", for example. Moreover, one of these input/output terminals is supplied with a power supply voltage (e.g., 3 V) of a circuit through a power supply voltage line whereas the other is supplied with a reference voltage (e.g., 0 V) of the circuit through a reference voltage line.

In U.S. Pat. No. 5,523,598, issued Jun. 4, 1996, there is disclosed an SRAM of the complete CMOS type, which is equipped with a pair of aforementioned local wiring lines. In this SRAM, the gate electrodes of the six MISFETs constituting the memory cells, the power supply voltage line connected with one input/output terminal of the flip-flop circuit, the reference voltage line connected with the other input/output terminal, the pair of local wiring lines, and the data lines connected with the drain regions of the transfer MISFETs are individually provided in different conductive layers. In this SRAM, moreover, the local wiring lines and other conductive layers (e.g., the reference voltage line) are arranged to intersect each other so that the reduction in the alpha particle soft error resistance, which might occur upon the miniaturization of the memory cell size and the lowering of the operating power supply voltage, is prevented by forming a capacitor element in the intersection region to increase the storage node capacitance of the memory cells.

SUMMARY OF THE INVENTION

Various problems arise in connection with the SRAM disclosed in U.S. Pat. No. 5,523,598. In the SRAM disclosed the reference voltage line), and the data lines are formed in different conductive layers. As a result, the mask registration allowance when forming the connection holes in the interlayer insulating film by using a photoresist as the mask is increased, resulting in increase of the memory cell size. When the gate electrodes are formed of a conductive film of a first layer, the local wiring lines are formed of a conductive film of a second layer, and the power supply lines are formed of a conductive film of a third layer, for example, it is necessary to ensure the registration allowance for both the gate electrodes and the local wiring lines.

In the SRAM disclosed in the aforementioned U.S. Pat. No. 5,523,598, the paired local wiring lines are formed of the same conductive film. This makes it necessary to arrange the two local wiring lines transversely in the memory cell, so that the memory cell size is increased.

An object of the present invention is to provide a semiconductor integrated circuit device (for example, a semiconductor memory such as a complete CMOS SRAM) having a reduced memory cell size, and a method of fabricating such semiconductor device.

Another object of the present invention is to provide a semiconductor integrated circuit device (e.g., semiconductor memory such as a complete CMOS SRAM) having improved alpha particle soft error resistance, and a method of fabricating such semiconductor device.

The aforementioned and other objects and novel features of the present invention will become apparent from the following description to be made with reference to the accompanying drawings.

Illustrations of the invention to be disclosed herein will be briefly described in the following. These illustrations are representative of the present invention and do not define the scope thereof, the scope being defined by the appended claims.

According to the present invention, there is provided a semiconductor integrated circuit device comprising an SRAM including memory cells having a flip-flop circuit composed of a pair of drive MISFETs and a pair of load MISFETs, and having a pair of transfer MISFETs, which device-is constructed such that the individual gate electrodes of the drive MISFETs, the load MISFETs and the transfer MISFETs are composed of a first conductive film formed over a major face of a semiconductor substrate; one of the local wiring lines cross-connecting a pair of input/output terminals of the flip-flop circuit, is composed of a second conductive film formed over that first conductive film; and the other of the local wiring lines is composed of a third conductive film formed over the second conductive film, and a method of fabricating the device.

The semiconductor integrated circuit device of the present invention is constructed such that the one and the other of the local wiring lines are so arranged as to have at least partially and vertically overlapping portions, and the one and the other of the local wiring lines and an insulating film interposed therebetween constitute a capacitor element.

In regard to a method for manufacturing a semiconductor integrated circuit device, there is provided a method for manufacturing a semiconductor integrated circuit device (e.g., an SRAM) containing memory cells each having a flip-flop circuit including a pair of drive MISFETs and a pair of load MISFETs, and a pair of transfer MISFETs, comprising the steps of:

(a) preparing (e.g., providing) a semiconductor substrate having a major face, over which the individual gate electrodes of the drive MISFETs, the load MISFETs and the transfer MISFETs are formed;

(b) forming a pair of local wiring lines cross-connecting a pair of input/output terminals of the flip-flop circuit, over the gate electrodes;

(c) forming side wall spacers on the individual side walls of the gate electrodes and the local wiring lines; and (d) forming connection holes reaching the source regions of the drive MISFETs or the load MISFETs by depositing a second insulating film of an etching rate different from (e.g., greater than) that of the first insulating film over the local wiring lines, on which the side wall spacers are formed, and by etching the second insulating film. Also provided is the device fabricated by this method.

In regard to a method for manufacturing a semiconductor integrated circuit device, there is also provided a method for manufacturing a semiconductor integrated circuit device (e.g., an SRAM) containing memory cells each having a flip-flop circuit composed of a pair of drive MISFETs and a pair of load MISFETs, and a pair of transfer MISFETs, comprising the steps of:

(a) preparing (e.g., providing) a semiconductor substrate having a major face, over which the individual gate electrodes of the drive MISFETs, the load MISFETs and the transfer MISFETs are formed;

(b) forming one of a pair of local wiring lines cross-connecting a pair of input/output terminals of the flip-flop circuit, over the gate electrodes;

(c) forming the other of the paired local wiring lines over the local wiring line formed in step (d);

(d) forming side wall spacers on the individual side walls of the gate electrodes and the one and the other of the local wiring lines, by etching a first insulating film which is deposited over the other of the local wiring lines; and (e) forming connection holes reaching the source regions of the drive MISFETs or the load MISFETs by depositing a second insulating film of an etching rate different from that of the first insulating film over the other of the local wiring lines, on which the side wall spacers are formed, and by etching the second insulating film. Also provided is the device fabricating by this method.

According to the means thus far described, the paired local wiring lines cross-connecting the input/output terminals of the flip-flop circuit of the memory cell are formed in different conductive layers vertically with respect to the substrate. Therefore the space, required when the paired local wiring lines are composed of the same conductive film, for arranging the two local wiring lines transversely, can be eliminated, and the local wiring lines can be arranged partially in an overlapping manner, thereby reducing the area occupied by the memory cell.

According to the means thus far described, the one and the other of the local wiring lines are so arranged as to overlap vertically, and a capacitor element is formed of the one and the other of the local wiring lines and an insulating film interposed therebetween, so that the storage node capacitance of the memory cell can be increased, preventing the lowering of alpha particle soft error resistance entailed by the miniaturization of the memory cell size and the lowering of the operation power supply voltage. For example, the capacitor area can be about half the area of the memory cell, which realizes a thick capacitor dielectric. Soft error immunity can be achieved even at a 1.8 V supply voltage.

According to the means thus far described, the mask registration allowance when the connection holes are formed in the interlayer insulating film by using a photoresist as the mask can be eliminated, reducing the area occupied by the memory cells. The connection holes can be formed by a self-alignment technique (self-aligned to both the gates and the local wiring lines).

BRIEF DESCRIPTION OF THE DRAWINGS

FIG. 57 is a section showing the method for manufacturing the memory cell of the SRAM of this third embodiment according to the present invention.

DETAILED DESCRIPTION OF THE INVENTION

Figure 1:
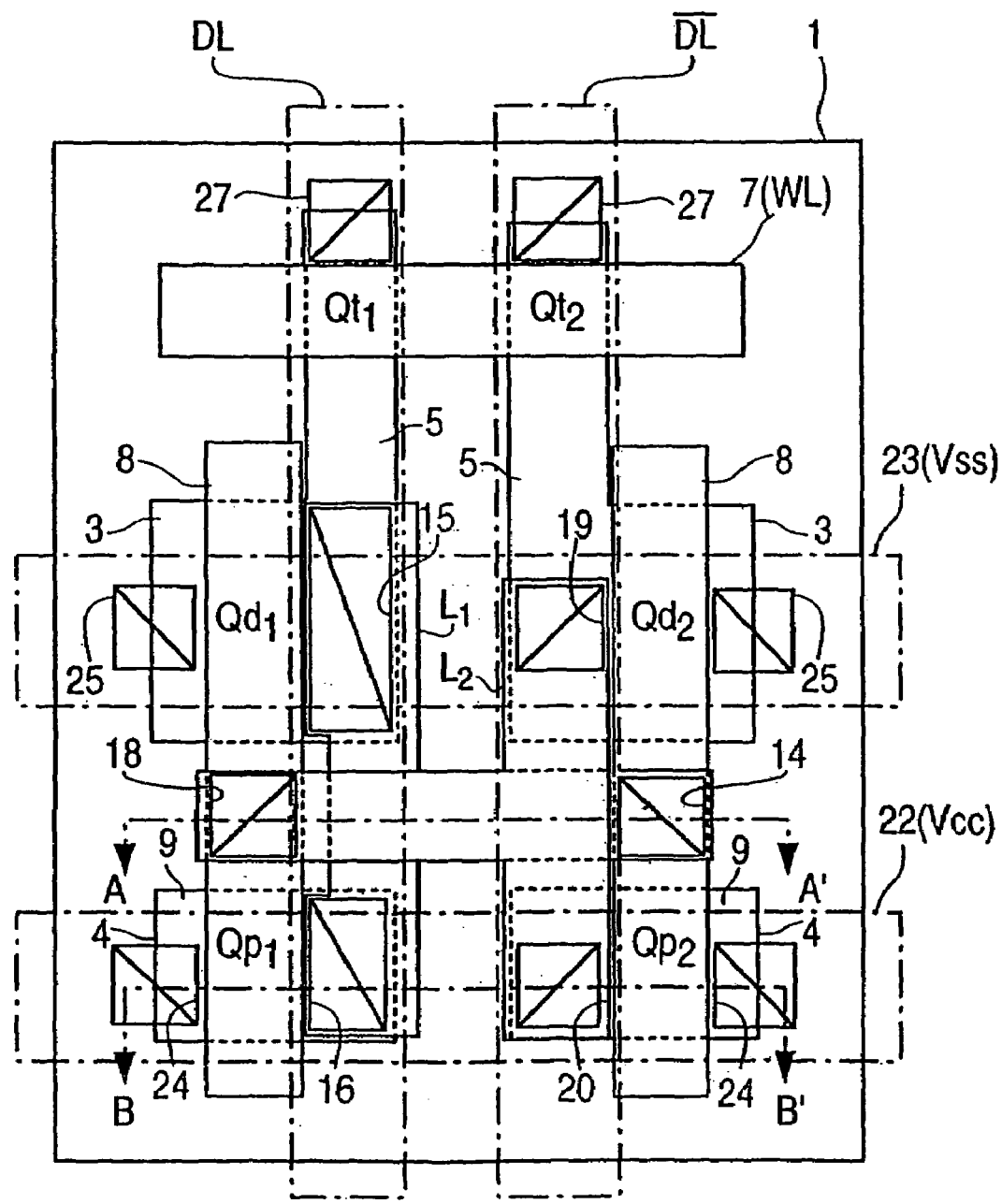
FIG. 1 is a top plan view showing a memory cell of an SRAM of a first embodiment according to the present invention.

While the present invention will be described in connection with specific and preferred embodiments, it will be understood that it is not intended to limit the invention to those embodiments. To the contrary, it is intended to cover all alterations, modifications and equivalents as may be included within the spirit and scope of the invention as defined by the appended claims.

Throughout the present disclosure, where devices are described as including or comprising specific components, and methods are described as comprising or including specific steps, it is contemplated that devices of the present invention also consist essentially of, or consist of, the recited components, and methods of the present invention also consist essentially of, or consist of, the recited steps. Accordingly, throughout the present disclosure any described device or process can consist essentially of, or consist of, the recited components or steps.

The present invention will be described in detail in connection with its embodiments with reference to the accompanying drawings. Throughout all the drawings for explaining the embodiments, the portions having the same functions are designated by the same reference numerals, and their repeated description will be omitted.

EMBODIMENT 1

Figure 5:
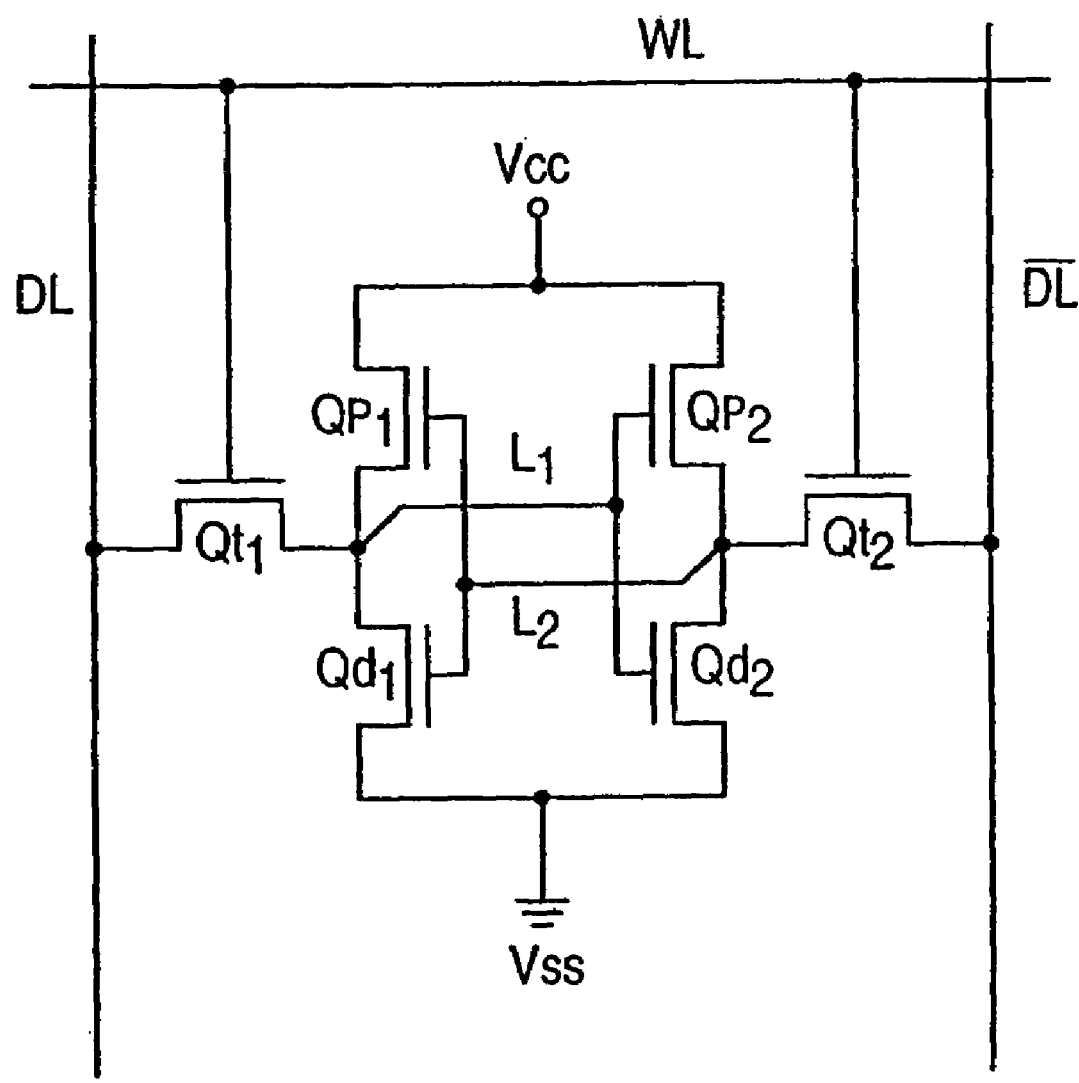
FIG. 5 is an equivalent circuit diagram of the memory cell of the SRAM of the first embodiment according to the present invention.

FIG. 5 is an equivalent circuit diagram of a memory cell of an SRAM of a first embodiment of the present invention. This memory cell is arranged at the intersection between a pair of complementary data lines (a data line DL and a data line DL) and a word line WL and is composed of a pair of drive MISFETs $Qd_1$ and $Qd_2$, a pair of load MISFETs $Qp_1$ and $Qp_2$ and a pair of transfer MISFETs $Qt_1$ and $Qt_2$. Of these MISFETs, the drive MISFETs $Qd_1$ and $Qd_2$ and the transfer MISFETs $Qt_1$ and $Qt_2$ are of p-channel type, and the load MISFETs $Qp_1$ and $Qp_2$ are of p-channel type. In short, this memory cell is constructed of a complete CMOS type using four n-channel MISFETs and two p-channel MISFETs.

Of the six MISFETs constituting the aforementioned memory cell, the paired drive MISFETs $Qd_1$ and $Qd_2$ and the paired load MISFETs $Qp_1$ and $Qp_2$ constitute a flip-flop circuit acting as an information storing unit for storing information of 1 bit. One input/output terminal (a storage node) of this flip-flop circuit is electrically connected with one of the source and drain regions of the transfer MISFET $Qt_1$, and the other input/output (i.e., a storage node) is electrically connected with one of the source and drain regions of the transfer MISFET $Qt_2$.

The data line DL is electrically connected with the other of the source and drain regions of the transfer MISFET $Qt_1$, and the data line DL is electrically connected with the other of the source and drain regions of the transfer MISFET $Qt_2$. Moreover, one end (each source region of the load MISFETs $Qp_1$ and $Qp_2$) of the flip-flop circuit is connected with the power supply voltage (Vcc), and the other (each source region of the drive MISFETs $Qd_1$ and $Qd_2$) is connected with a reference voltage Vss. The power supply voltage (Vcc) is, e.g., 3 V whereas the reference voltage (Vss) is, e.g., 0 V (GND).

The input/output terminals of the flip-flop circuit are cross-connected through a pair of local wiring lines $L_1$ and $L_2$. In the present embodiment, these paired local wiring lines $L_1$ and $L_2$ are arranged in different conductive layers, as will be described hereinafter.

Figure 2:
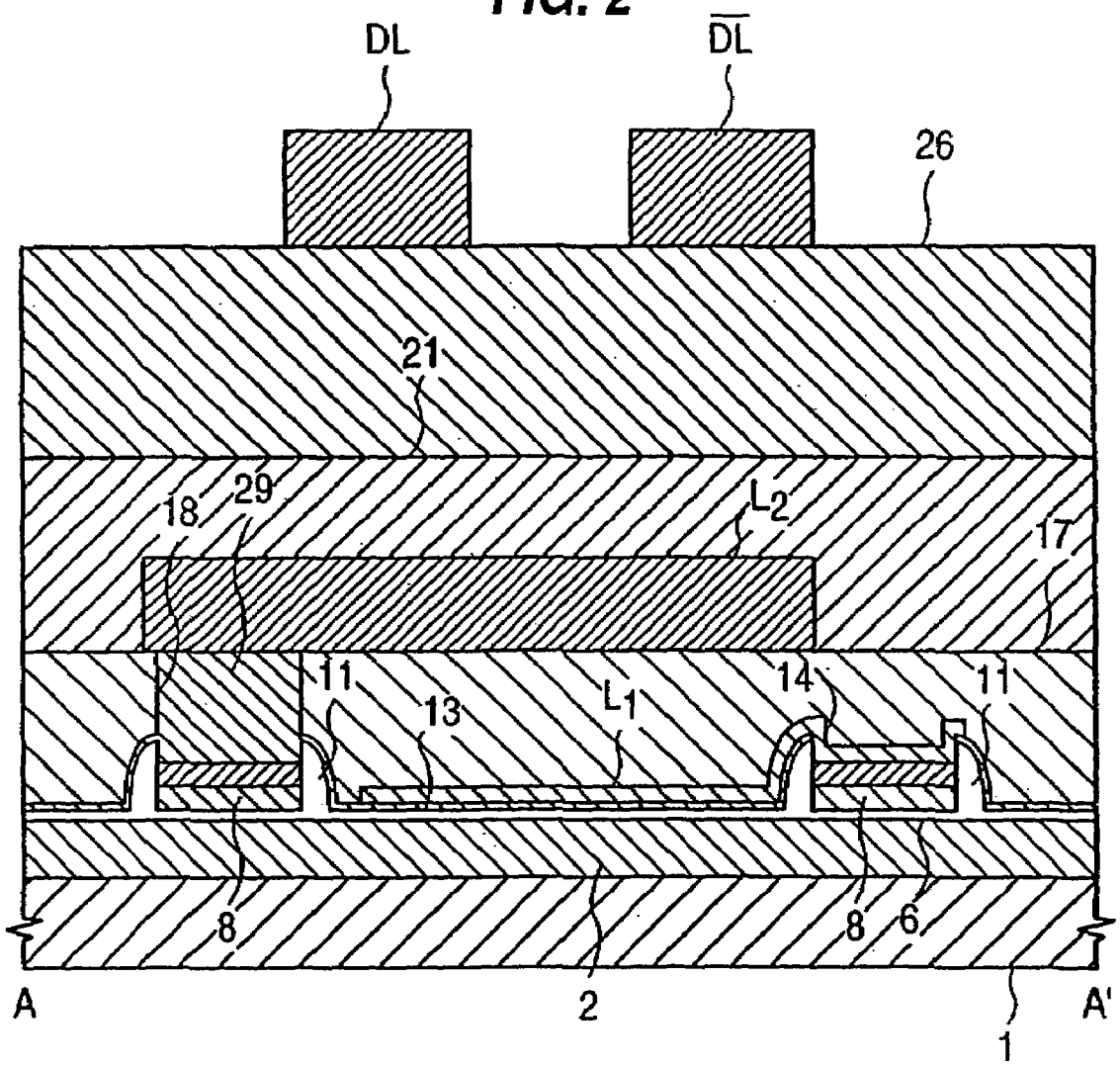
FIG. 2 is a section of the memory cell taken along line A–A' of FIG. 1.
Figure 3:
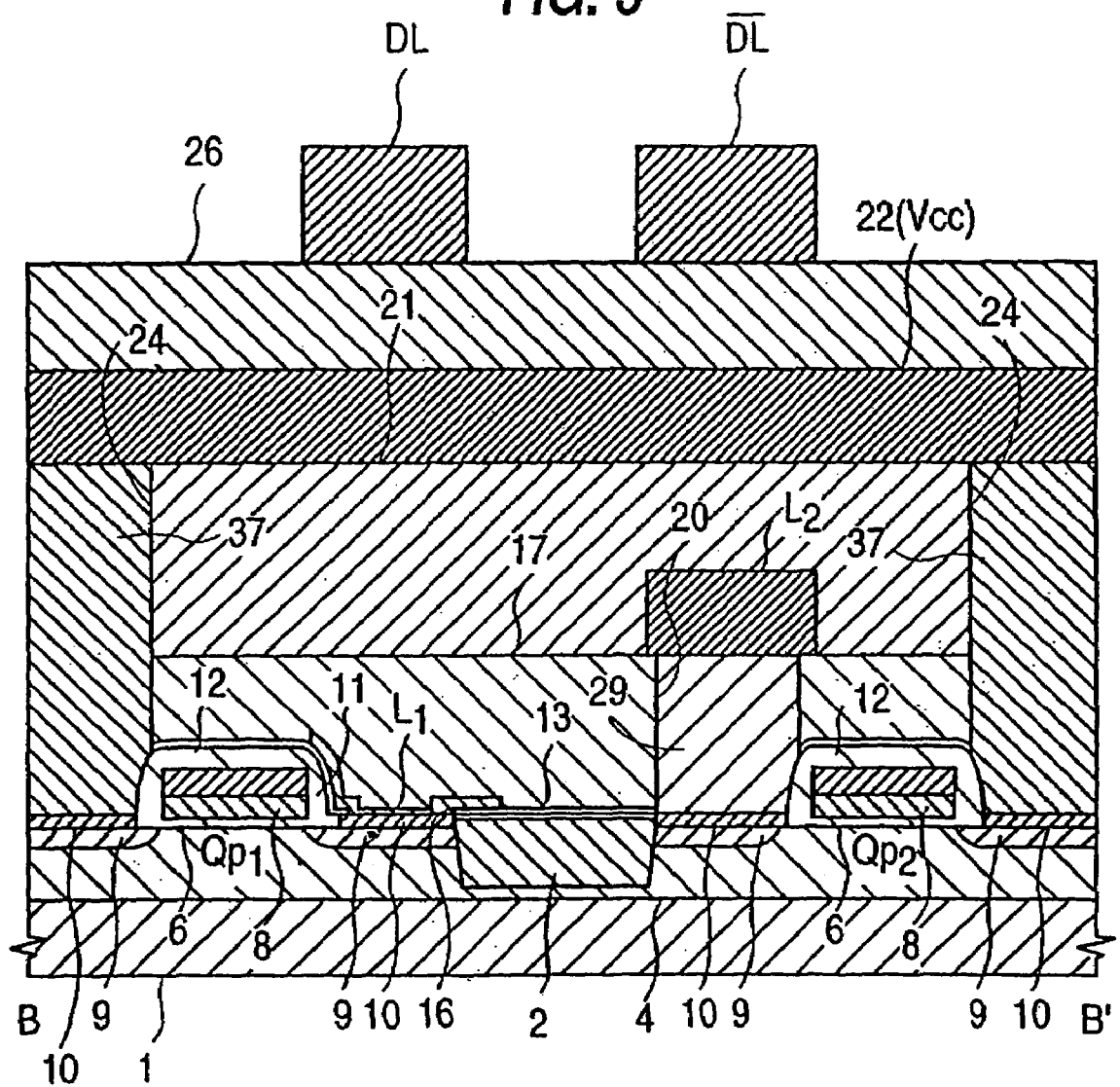
FIG. 3 is a section of the memory cell taken along line B–B' of FIG. 1.
Figure 4:
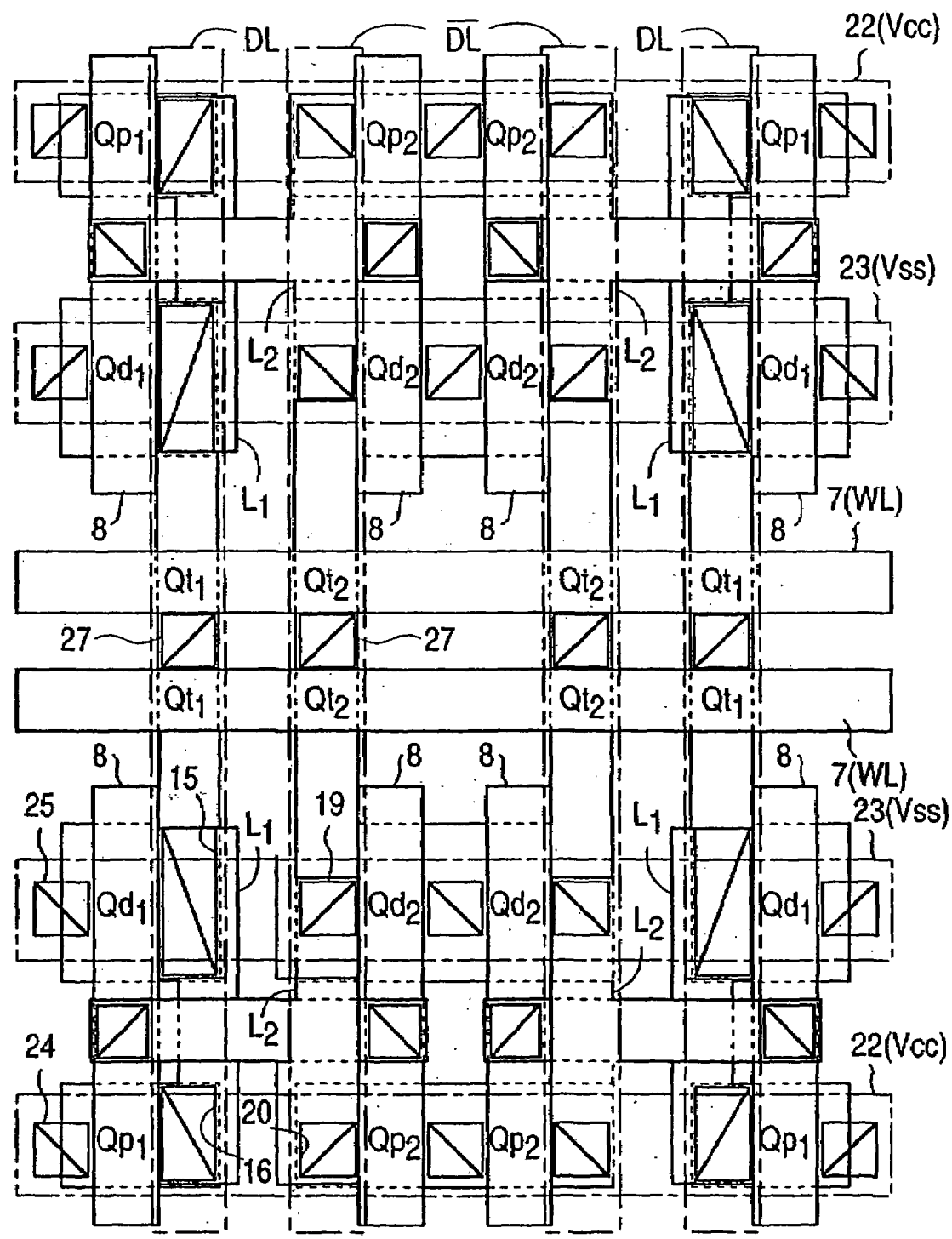
FIG. 4 is a top plan view showing the memory cell (for about four) of the SRAM of this first embodiment according to the present invention.

A specific construction of the memory cell will be described with reference to FIG. 1 (a top plan view of about one memory cell), FIG. 2 (a section taken along line A–A' of FIG. 1), FIG. 3 (a section taken along line B–B' of FIG. 1) and FIG. 4 (a top plan view of about four memory cells). Incidentally, FIGS. 1 and 4 show only connection holes for connecting the conductive layer constituting the memory cell and upper and lower conductive layers but omit the insulating films isolating the individual conductive layers.

The six MISFETs constituting the memory cell are formed in the active region which is surrounded by an element isolating groove 2 of a semiconductor substrate 1 made of single crystalline silicon. The drive MISFETs $Qd_1$ and $Qd_2$ and the transfer MISFETs $Qt_1$ and $Qt_2$ of n-channel type are formed in the active region of a p-type well 3, and the load MISFETs $Qp_1$ and $Qp_2$ of p-channel type are formed in the active region of an n-type well 4.

Each of the paired transfer MISFETs $Qt_1$ and $Qt_2$ include n-type semiconductor regions 5 and 5 (the source region and the drain region) formed in the active region of the p-type well 3, a gate oxide film 6 formed on the surface of the active region, and a gate electrode 7 formed over the gate oxide film 6. The individual gate electrodes 7 of the transfer MISFETs $Qt_1$ and $Qt_2$ are constructed so as to have a polycide structure, in which an n-type polycrystalline silicon film and a W (tungsten) silicide ($WSi_2$) film are stacked, for example, and are integrated with the word line WL. This word line WL is extended in a first direction (in the lateral. direction of FIGS. 1 and 4), and the paired transfer MISFETs $Qt_1$ and $Qt_2$ are arranged adjacent to each other in the first direction. The paired transfer MISFETs $Qt_1$ and $Qt_2$ are so arranged that their gate length direction is a second direction (the vertical direction of FIGS. 1 and 4) perpendicular to the first direction.

Channel forming regions of the transfer MISFETs $Qt_1$ and $Qt_2$ are formed, in the active region of the p-type well 3, under the gate electrodes 7 thereof and between n-type semiconductor regions 5 and 5.

Each of the paired drive MISFETs $Qd_1$ and $Qd_2$ is composed of the n-type semiconductor regions 5 and 5 (the source region and the drain region) formed in the active region of the p-type well 3, the gate oxide film 6 formed on the surface of the active region, and a gate electrode 8 formed over the gate oxide film 6. The n-type semiconductor region 5 (the drain region) of the drive MISFET $Qd_1$ is formed in the active region shared with the n-type semiconductor region (one of the source region and the drain region) of the transfer MISFET $Qd_1$, and the n-type semiconductor region 5 (the drain region) of the n-type semiconductor region 5 of the drive MISFET $Qd_2$ is formed in the active region shared with the n-type semiconductor region 5 (one of the source region and the drain region) of the transfer MISFET $Qt_2$. The individual gate electrodes 8 of the drive MISFETs $Qd_1$ and $Qd_2$ are, illustratively, made to have a polycide structure in which an n-type polycrystalline silicon film and a silicide film are stacked, for example.

Channel forming regions of the driver MISFETs $Qd_1$ and $Qd_2$ are formed, in the active region of the p-type well 3, under the gate electrodes 8 thereof and between the source region and the drain region thereof.

Each of the paired load MISFETs $Qp_1$ and $Qp_2$ is composed of p-type semiconductor regions 9 and 9 (the source region and the drain region) formed in the active region of the n-type well region 4, the gate oxide film 6 formed on the surface of the active region, and the gate electrode 8 formed over the gate oxide film 6. The gate electrode 8 of the load MISFET $Qp_1$ is integrated with the gate electrode 8 of the drive MISFET $Qd_1$, and the gate electrode 8 of the load MISFET $Qp_2$ is integrated with the gate electrode 8 of the drive MISFET $Qd_2$.

Channel forming regions of the load MISFETs $Qp_1$ and $Qp_2$ are formed, in the active region of the n-type well 4, under the gate electrodes 8 thereof and between the source region and the drain region thereof.

The drive MISFET $Qd_1$ is arranged in the second direction between the load MISFET $Qp_1$ and the transfer MISFET $Qt_1$, and the drive MISFET $Qd_2$ is arranged in the second direction between the load MISFET $Qp_1$ and the transfer MISFET $Qt_2$. The paired drive MISFETs $Qd_1$ and $Qd_2$ and the paired load MISFETs $Qp_1$ and $Qp_2$ are so individually arranged that their gate length direction is the first direction.

On the surfaces of the individual n-type semiconductor regions 5 and 5 (the source regions and the drain regions) of the drive MISFETs $Qd_1$ and $Qd_2$ and the transfer MISFETs $Qd_1$ and $Qt_2$, there are formed Ti (titanium) silicide ($TiSi_2$) layers for reducing the sheet resistances of the n-type semiconductor regions 5 and 5. Likewise, on the surfaces of the individual p-type semiconductor regions 9 and 9 (the source regions and the drain regions) of the load MISFETs $Qp_1$ and $Qp_2$, there are formed the Ti-silicide layers for reducing the sheet resistances of the p-type semiconductor regions 9 and 9.

Side wall spacers 11 of a silicon oxide film are formed on the individual side walls of the gate electrode 7 (the word line WL) of the transfer MISFETs $Qd_1$ and $Qt_2$ and the gate electrodes 8 of the drive MISFETs $Qd_1$ and $Qd_2$ (the load MISFETs $Qp_1$ and $Qp_2$). A silicon oxide film (a cap insulating film) 12 is formed over the gate electrode 7 (the word line WL) and the gate electrode 8.

Over the aforementioned six MISFETs, there is formed a silicon nitride film 13, over which is formed one (i.e., the local wiring line $L_1$) of the paired local wiring lines $L_1$ and $L_2$. One end portion of this local wiring line $L_1$ is electrically connected through a connection hole 14, which is opened in the silicon nitride film 13 and the silicon oxide film 12, with the gate electrode 8 which is shared by the load MISFET $Qp_2$ and the drive MISFET $Qd_2$. Another end portion of the local wiring line $L_1$ is electrically connected through a connection hole 15, which is opened in the silicon nitride film 13, with the n-type semiconductor region 5 (the drain region) of the drive MISFET $Qd_1$. Still another end portion of the local wiring line $L_1$ is electrically connected through a connection hole 16, which is opened in the silicon nitride film 13, with the p-type semiconductor region 9 (the drain region) of the load MISFET $Qp_1$. In short, the local wiring line $L_1$ connects the gate electrode 8 of the drive MISFET $Qd_2$ (the load MISFET $Qp_2$), the n-type semiconductor region 5 (the drain region) of the drive MISFET $Qd_1$ and the p-type semiconductor region 9 (the drain region) of the load MISFET $Qp_1$ with one another. The local wiring line $L_1$ is formed of a TiN (titanium nitride) film, for example. The local wiring line $L_1$ can be made of materials other than TiN, a refractory metal such as W or a refractory metal silicide such as a W-silicide.

The local wiring line $L_1$ is formed over the channel forming regions of the driver MISFETs $Qd_1$ and $Qd_2$, of the load MISFETs $Qp_1$ and $Qp_2$, and of the transfer MISFETs $Qt_1$ and $Qt_2$.

Over the local wiring line $L_1$, there is formed the other (the local wiring line $L_2$) of the paired local wiring lines $L_1$ and $L_2$ through an interlayer insulating film 17 of a first layer which is formed of a silicon oxide insulating film of PSG (Phospho Silicate Glass). One end portion of the local wiring line $L_2$ is electrically connected through a connection hole 18, which is opened in the silicon nitride film 13 and the silicon oxide film 12, with the gate electrode 8 which is shared by the load MISFET $Qp_1$ and the drive MISFET $Qd_1$. Another end portion of the local wiring line $L_2$ is electrically connected through a connection hole 19, which is opened in the interlayer insulating film 17 and the silicon nitride film 13, with the n-type semiconductor region 5 (the drain region) of the drive MISFET $Qd_2$. Still another end portion of the local wiring line $L_2$ is electrically connected through a connection hole 20, which is opened in the interlayer insulating film 17 and the silicon nitride film 13, with the p-type semiconductor region 9 (the drain region) of the load MISFET $Qp_2$. In short, the local wiring line $L_2$ connects the gate electrode 8 of the drive MISFET $Qd_1$ (the load MISFET $Qp_1$), the n-type semiconductor region 5 (the drain region) of the drive MISFET $Qd_2$ and the p-type semiconductor region 9 (the drain region) of the load MISFET $Qp_2$ electrically with one another. The local wiring line $L_2$ is composed of an Al (aluminum) film which is overlaid and underlaid with barrier metal layers of TiN, for example. In the connection holes 18, 19 and 20 thus far described, moreover, there is buried plugs 29 which are composed of a W-film for ensuring the reliability of electrical connection between the local wiring line $L_2$ and the gate electrode 8, and electrical connection between the n-type semiconductor region and the p-type semiconductor region 9.

The local wiring line $L_2$ is formed over the channel forming regions of the driver MISFETs $Qd_1$ and $Qd_2$, of the local MISFETs $Qp_1$ and $Qp_2$, and of the transfer MISFETs $Qt_1$ and $Qt_2$.

Over the local wiring line $L_2$, there are formed, through an interlayer insulating film 21 of a second layer made of silicon oxide, a power supply voltage line 22 and a reference voltage line 23. The power supply voltage line 22 is electrically connected through a connection hole 24, which is opened in the interlayer insulating films 21 and 17 and the silicon nitride film 13, with the individual p-type semiconductor regions 9 (the source-regions) of the load MISFETs $Qp_1$ and $Qp_2$ to supply these p-type semiconductor regions 9 with the power supply voltage (Vcc). The reference voltage line 23 is electrically connected through a connections hole 25, which is opened in the interlayer insulating films 21 and 17 and the silicon nitride film 13, with the individual n-type semiconductor regions (the source regions) of the drive MISFETs $Qd_1$ and $Qd_2$ to supply the n-type semiconductor regions with the reference voltage (Vss). The power supply voltage line 22 and the reference voltage line 23 are composed of an Al film which is overlaid and underlaid with barrier metal layers, for example. In the connection holes 24 and 25, there are buried plugs 37 which are composed of a W-film, for example, for ensuring the reliability of electrical connection between the power supply voltage line 22 and the p-type semiconductor region 9, and electrical connection between the reference voltage line 23 and the n-type semiconductor region 5.

Over the power supply voltage line 22 and the reference voltage line 23, there are formed, through an interlayer insulating film 26 of a third layer made of silicon oxide, the paired complementary data lines (the data line DL and the data line DL). One (the data line DL) of these complementary data lines is electrically connected through a connection hole 27, which is opened in the interlayer insulating films 26, 21 and 17 and the silicon nitride film 13, with the n-type semiconductor region 5 (the other of the source region and the drain region) of the transfer MISFET $Qt_1$. The other (the data line DL) of the complementary data lines is electrically connected through the connection hole 27, which is opened in the interlayer insulating films 26, 21 and 17 and the silicon nitride film 13, with the n-type semiconductor region 5 (the other of the source region and the drain region) of the transfer MISFET $Qt_2$. The data line DL and the data line DL are composed of Al films which are overlaid and underlaid with barrier metal layers of TiN. In the connection holes 27 and 27, although not shown, there are buried plugs which are composed of W-films for ensuring the reliability of electrical connection between the data lines (DL and DL) and the n-type semiconductor region 5.

Thus, in the SRAM of the present embodiment, the paired local wiring lines $L_1$ and $L_2$ cross-connecting the input/output terminals of the flip-flop circuit of the memory cell are formed in the different conductive layers. Thanks to this construction, the space, which is required for arranging the two local wiring lines transversely when the paired local wiring lines are formed in the same conductive layer, is not required, so that the local wiring lines $L_1$ and $L_2$ can be arranged partially in an overlapping manner, thereby reducing the area occupied by the memory cell.

A method for manufacturing the memory cell of the SRAM of the present embodiment will be described with reference to FIGS. 6 to 32. Of these showing the memory cell manufacturing method, sections (a) are taken along line A–A' of the top plan views, and sections (b) are taken along line B–B' of the top plan views. These individual top plan views show only the conductive layers and the connection holes but do not show the insulating films.

Figure 6:
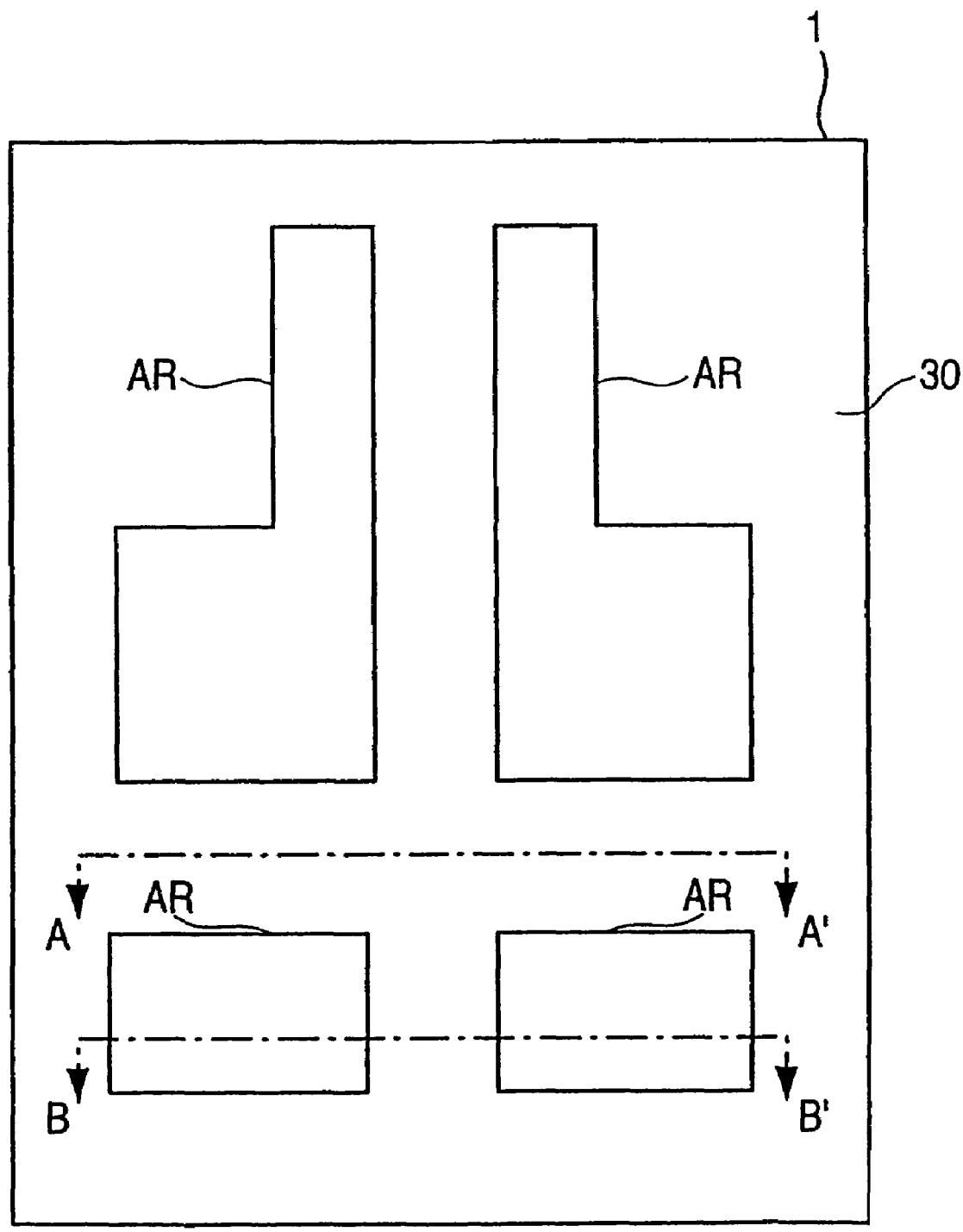
FIG. 6 is a top plan view showing a method for manufacturing the memory cell of the SRAM of the first embodiment according to the present invention.
Figure 7A:
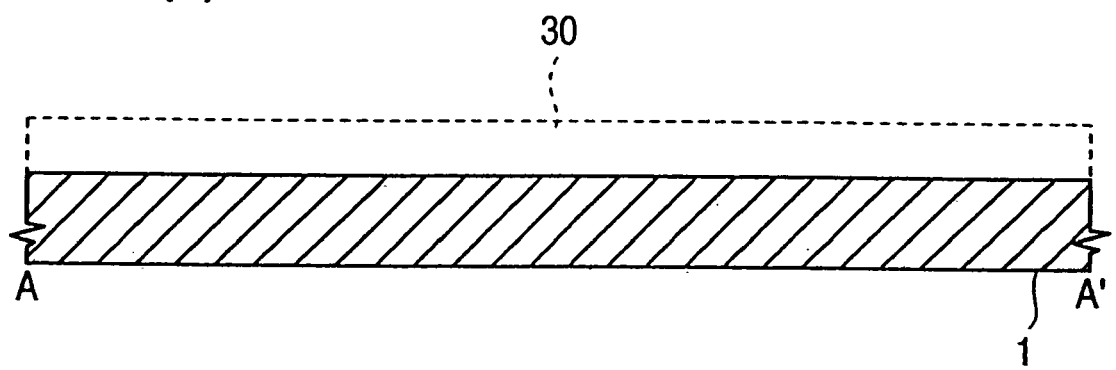
FIGS. 7(a) and 7(b) are sections showing the method for manufacturing the memory cell of the SRAM of this first embodiment according to the present invention.
Figure 7B:
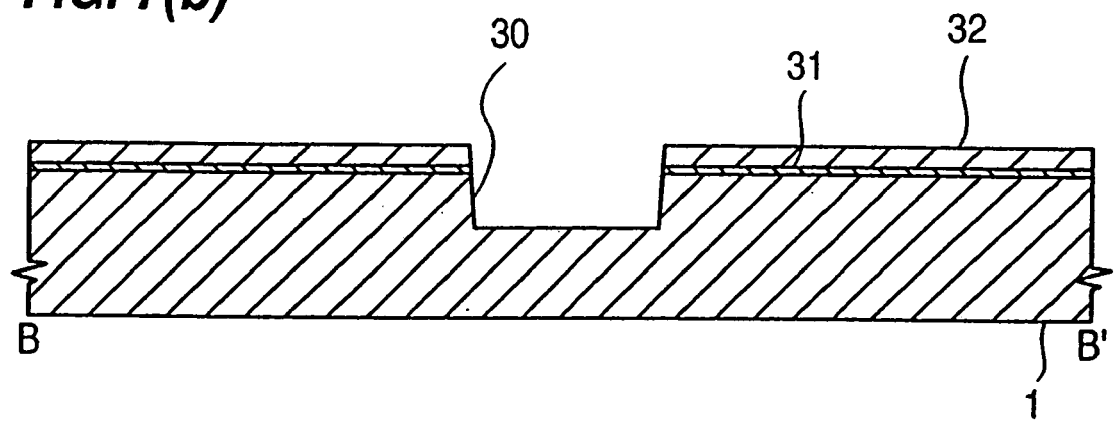

First of all, a groove 30 is formed in the periphery (element isolating region) of an active region AR of the major face of the semiconductor substrate 1 made of p-type single crystal silicon, as shown in FIGS. 6 and 7(a) and (b). This groove 30 is formed by depositing a silicon oxide film 31 and a silicon nitride film 32 consecutively over the semiconductor substrate 1 and then by dry-etching the silicon nitride 32, the silicon oxide film 31 and the semiconductor substrate 1 consecutively by using a photoresist as the mask.

Figure 8A:
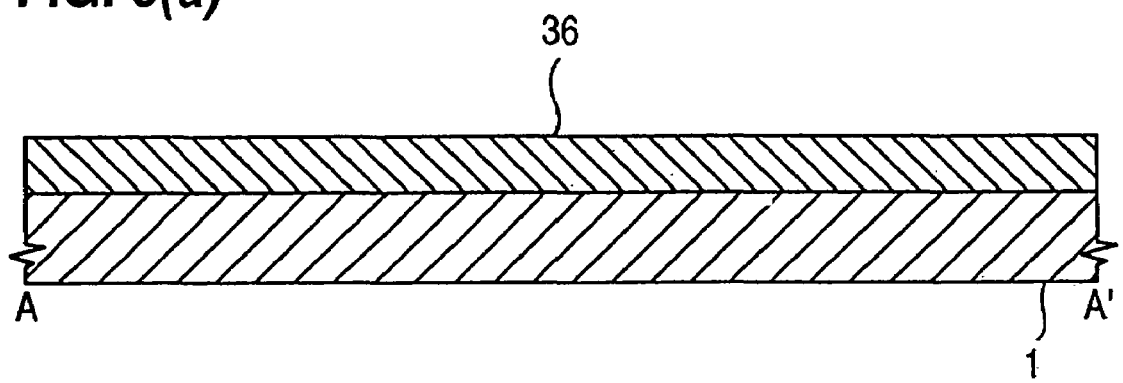
FIGS. 8(a) and 8(b) are sections showing the method for manufacturing the memory cell of the SRAM of this first embodiment according to the present invention.
Figure 8B:
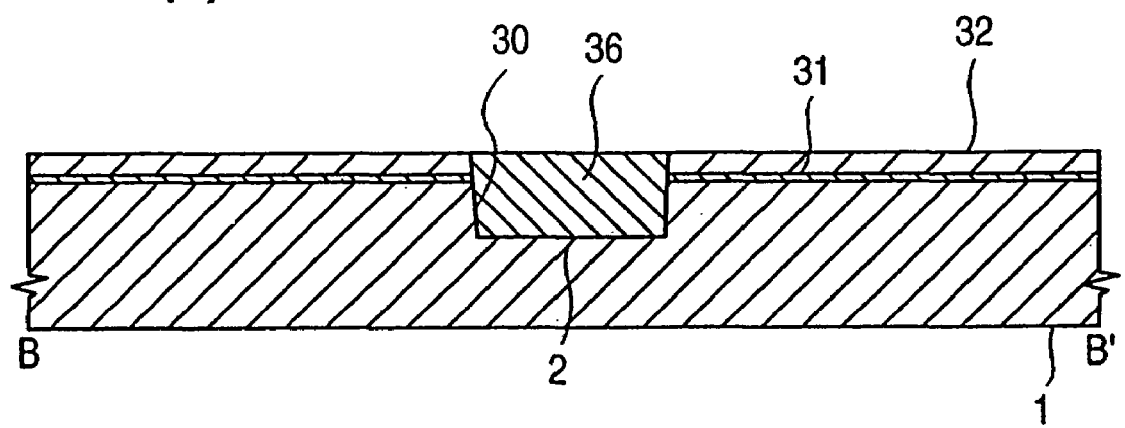

Next, a silicon oxide film 36 is buried in the groove 30 to form the element isolating groove 2, as shown in FIGS. 8(a) and 8(b). The element isolating groove 2 is formed by depositing the silicon oxide film 36 thickly over the semiconductor substrate 1, including the inside of the groove 30, by a CVD (Chemical Vapor Deposition) method and then by etching back (chemico-mechanical polishing (CMP)) the silicon oxide film 36 by using the silicon nitride film 32 as an etching stopper.

Figure 9:
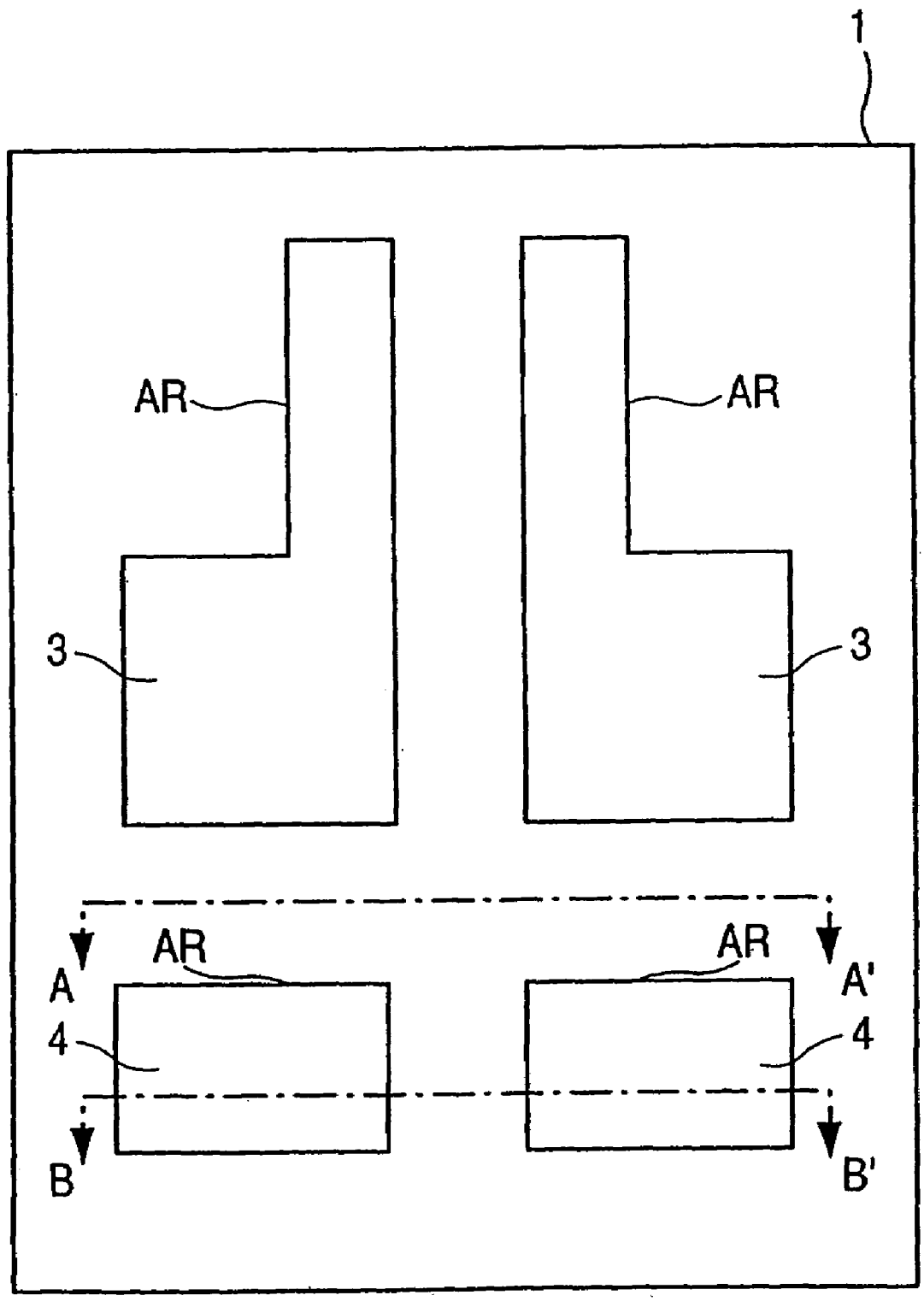
FIG. 9 is a top plan view showing the method for manufacturing the memory cell of the SRAM of this first embodiment according to the present invention.
Figure 10A:
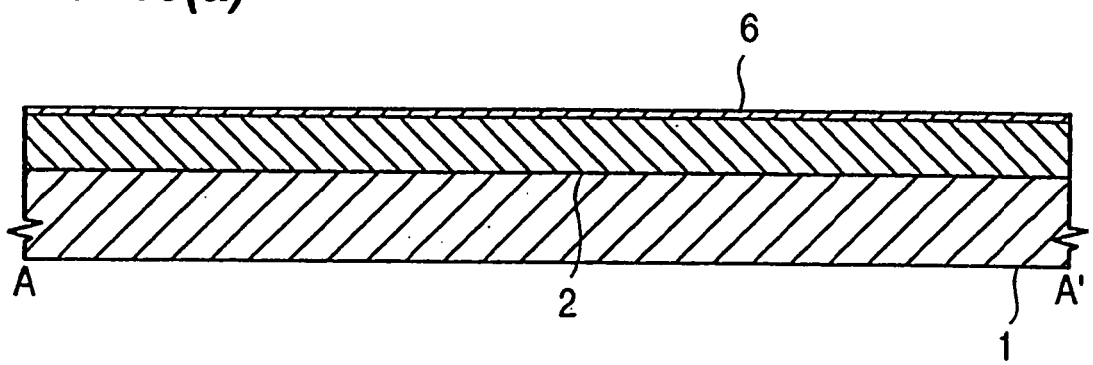
FIGS. 10(a) and 10(b) are sections showing the method for manufacturing the memory cell of the SRAM of this first embodiment according to the present invention.
Figure 10B:
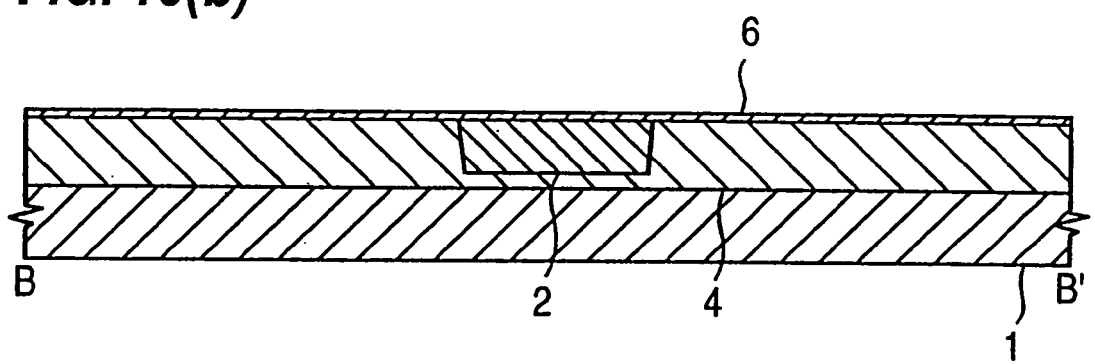

Next, the silicon nitride film 32 and the silicon oxide film 31, left on the surface of the active region AR, are etched away. After this, as shown in FIGS. 9 and 10(a) and 10(b), the semiconductor substrate 1 of the active region AR where the drive MISFETs $Qd_1$ and $Qd_2$ and the transfer MISFETs $Qt_1$ and $Qt_2$ are formed is doped with ions of p-type impurity (boron) to form the p-type well 3, and the semiconductor substrate 1 of the active region AR where the load MISFETs $Qp_1$ and $Qp_2$ are formed is doped with ions of an n-type impurity (phosphorous or arsenic) to form the n-type well 4. After this, the individual surfaces of the p-type well 3 and the n-type well 4 are thermally oxidized to form the gate oxide film 6.

Figure 11A:
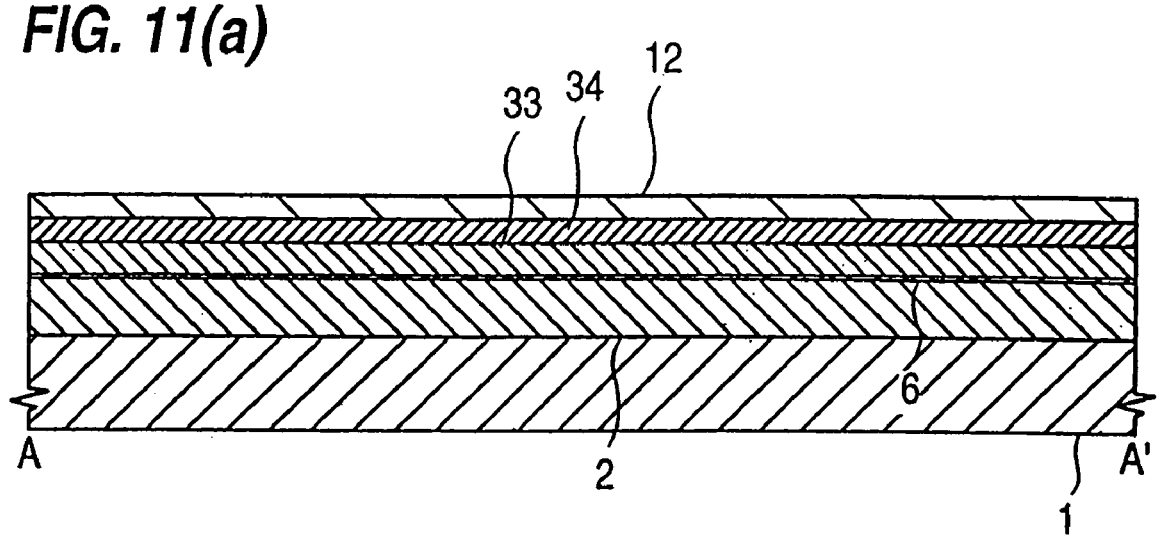
FIGS. 11(a) and (b) are sections showing the method for manufacturing the memory cell of the SRAM of this first embodiment according to the present invention.
Figure 11B:
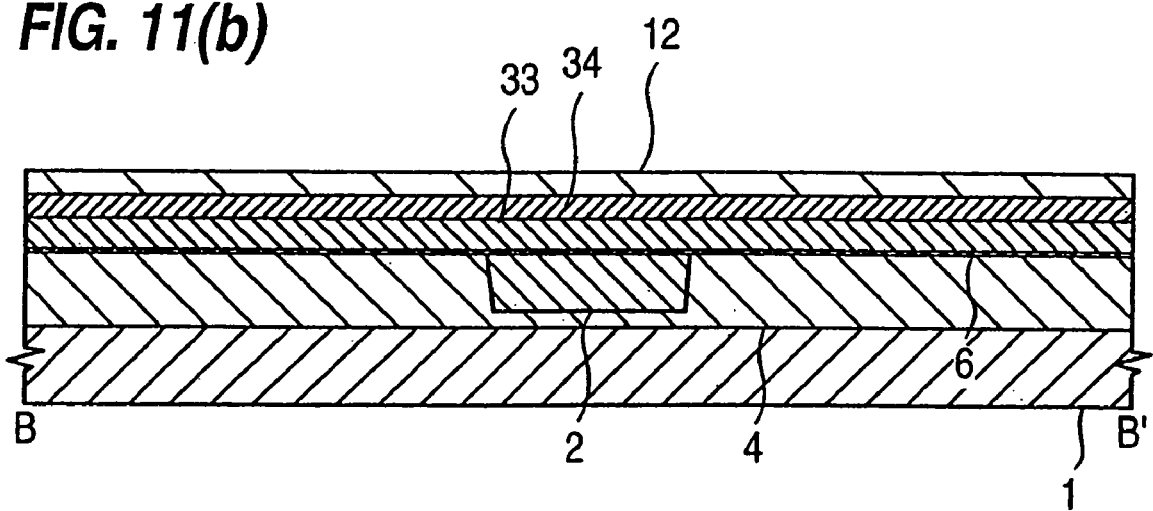
Figure 12:
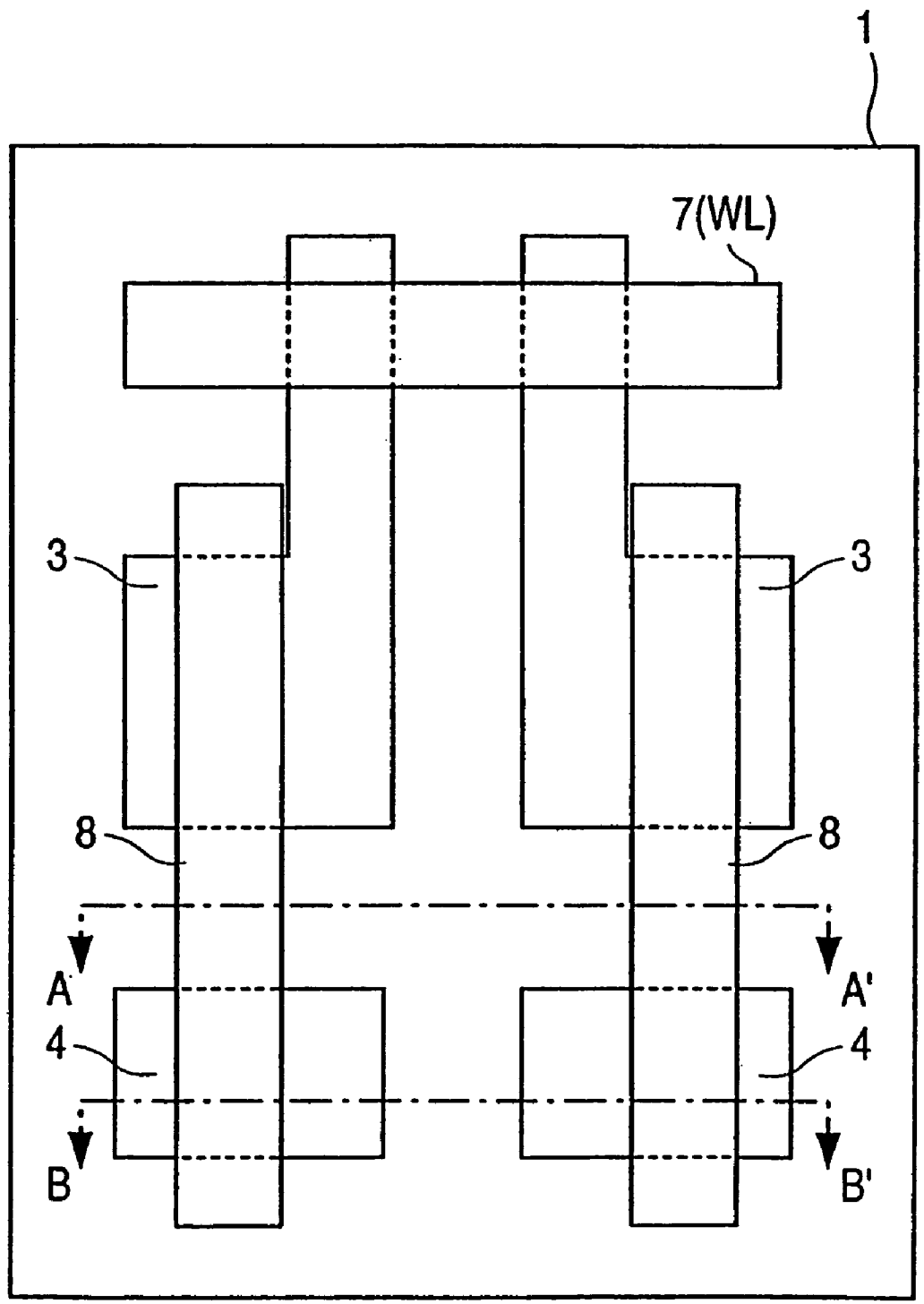
FIG. 12 is a top plan view showing the method for manufacturing the memory cell of the SRAM of this first embodiment according to the present invention.
Figure 13A:
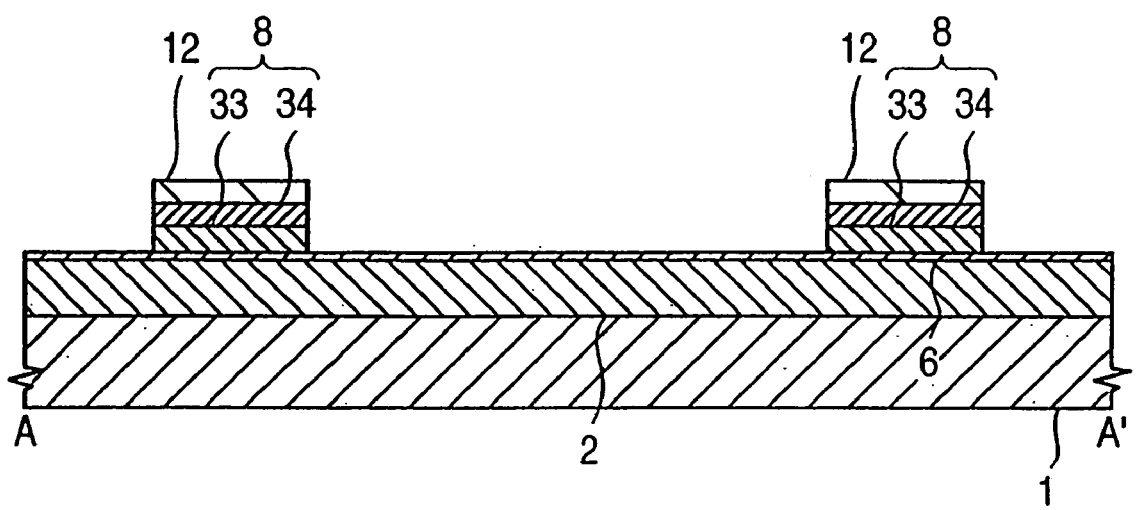
FIGS. 13(a) and (b) are sections showing the method for manufacturing the memory cell of the SRAM of this first embodiment according to the present invention.
Figure 13B:
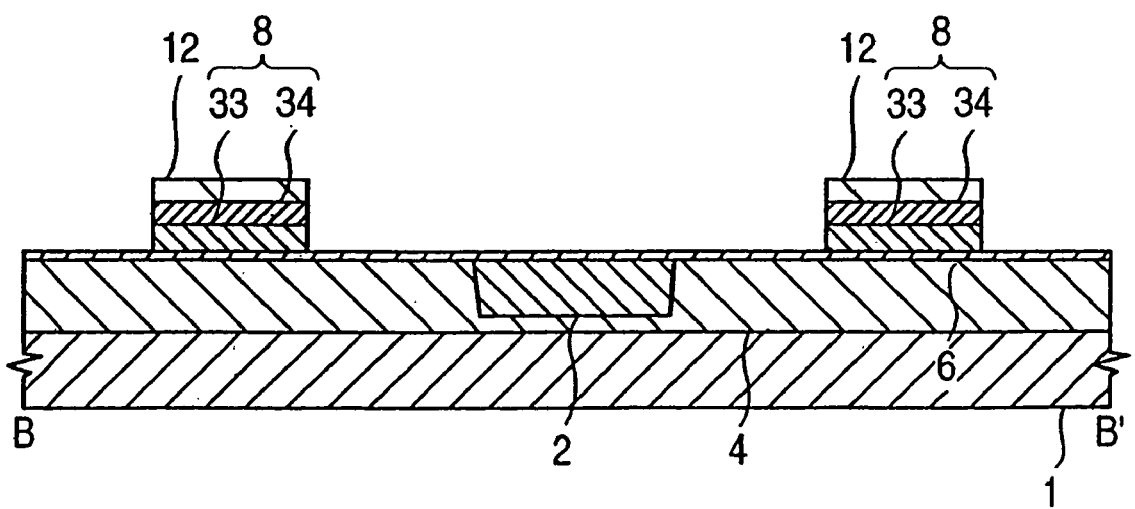

Next, an n-type polycrystalline silicon film 33, a W-silicide film 34 and the silicon oxide film 12 are consecutively deposited over the semiconductor substrate 1 by a CVD method, as shown in FIG. 11(a) and (b). After this, the silicon oxide film 12, the W-silicide film 34 and the n-type polycrystalline silicon film 33 are patterned by using a photoresist as the mask, as shown in FIGS. 12 and 13(a) and 13(b), to form the gate electrode 7 (the word line WL) of the transfer MISFETs $Qt_1$ and $Qt_2$ and the gate electrodes 8 and 8 of the drive MISFETs $Qd_1$ and $Qd_2$ (the load-MISFITs $Qp_1$ and $Qp_2$).

Figure 14:
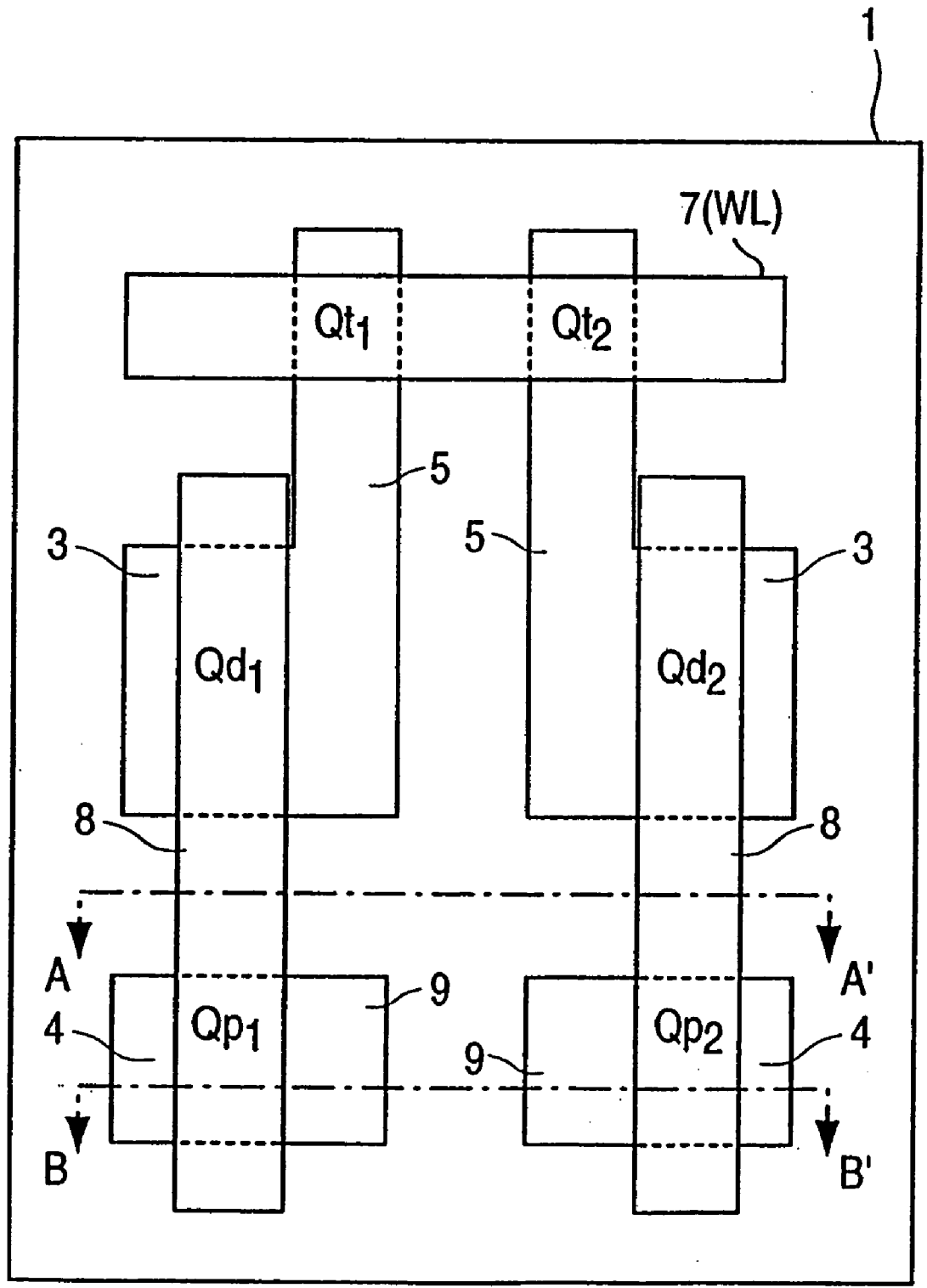
FIG. 14 is a top plan view showing the method for manufacturing the memory cell of the SRAM of this first embodiment according to the present invention.
Figure 15A:
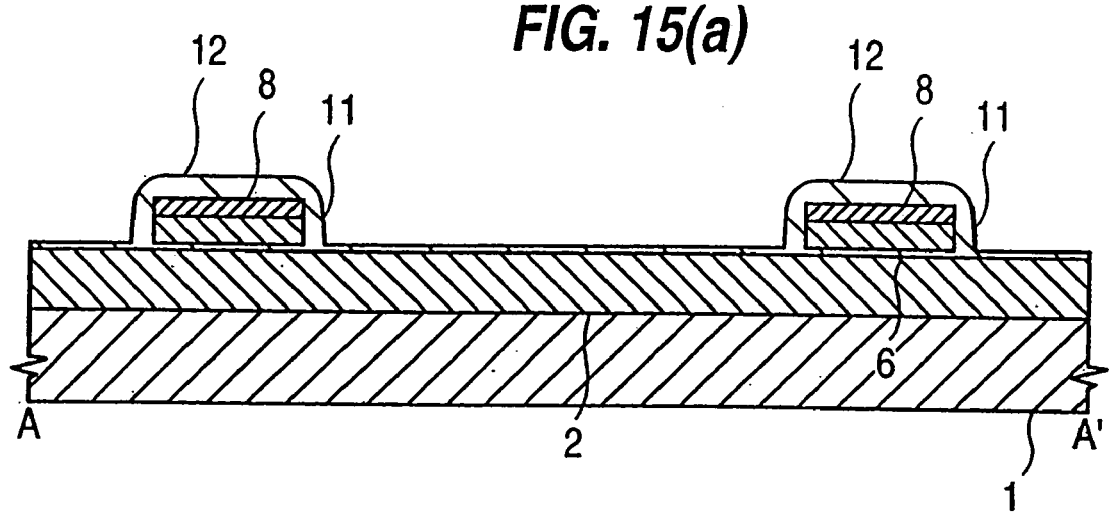
FIGS. 15(a) and 15(b) are sections showing the method for manufacturing the memory cell of the SRAM of this first embodiment according to the present invention.
Figure 15B:
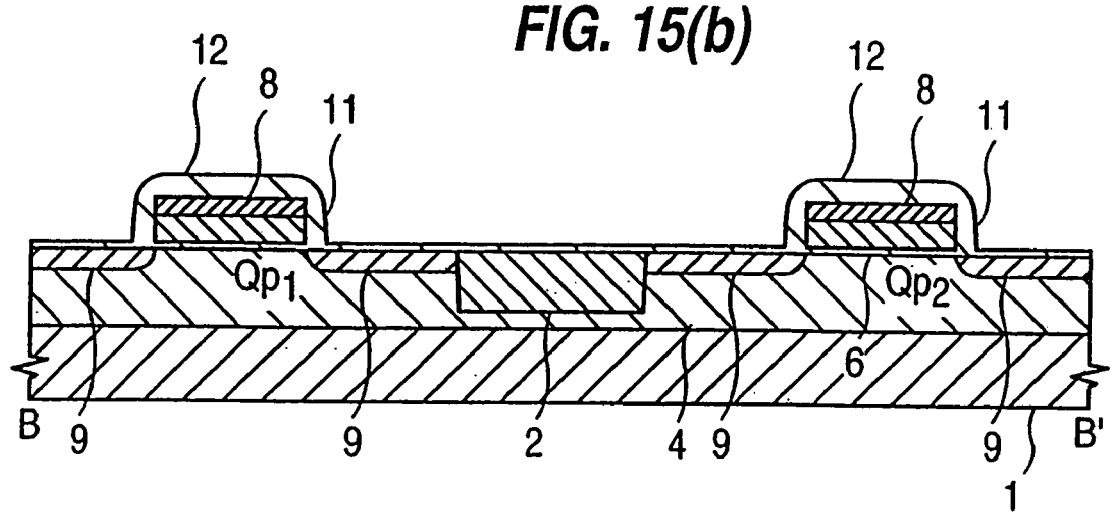

Next, as shown in FIGS. 14 and 15(a) and 15(b), the p-type well 3 is doped with ions of n-type impurity (phosphorous or arsenic) to form the n-type semiconductor regions 5 and 5 (the source region and the drain region) of the transfer MISFETs $Qt_1$ and $Qt_2$, and the drive MISFETs $Qd_1$ and $Qd_2$, and the n-type well 4 is doped with the ions of p-type impurity (boron) to form the p-type semiconductor regions 9 and 9 (the source region and the drain region) of the load MISFETs $Qp_1$ and $Qp_2$. After this, the silicon oxide film, deposited over the semiconductor substrate 1 by a CVD method, is anisotropically etched to form the side wall spacers 11 on the individual side walls of the gate electrode 7 (the word line WL) of the transfer MISFETs $Qt_1$ and $Qt_2$ and the gate electrodes 8 and 8 of the drive MISFETs $Qd_1$ and $Qd_2$.

Figure 16A:
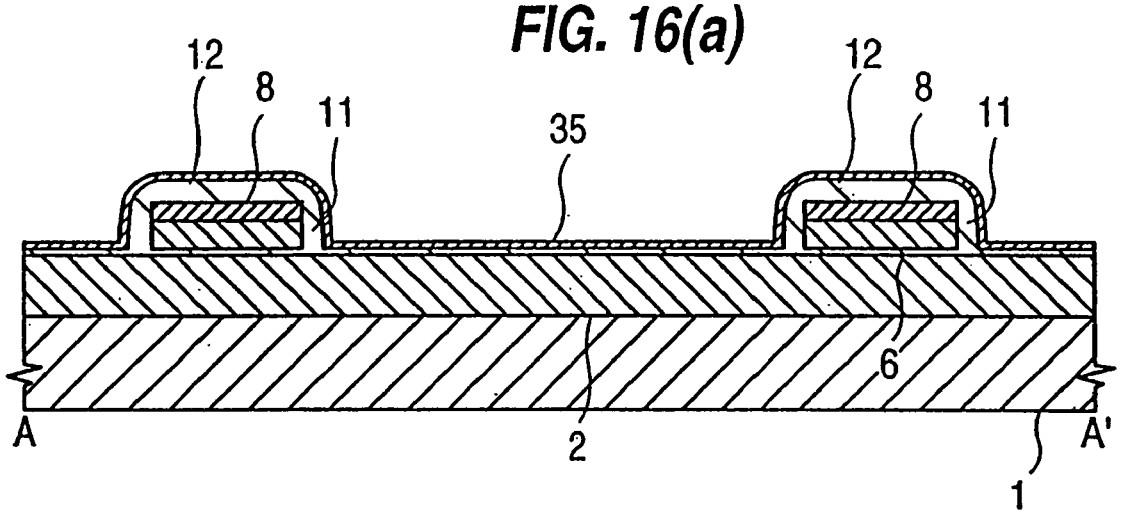
FIGS. 16(a) and 16(b) are sections showing the method for manufacturing the memory cell of the SRAM of the first embodiment according to the present invention.
Figure 16B:
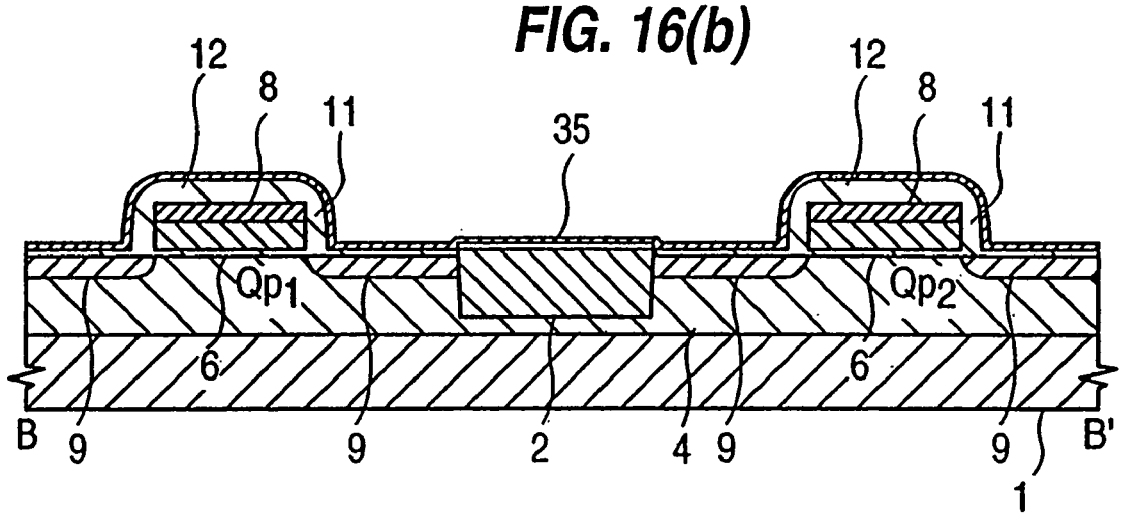

Next, there are etched the gate oxide film covering the surfaces of the individual n-type semiconductor regions 5 and 5 (the source region and the drain region) of the drive MISFETs $Qd_1$ and $Qd_2$ and the transfer MISFETs $Qt_1$ and $Qt_2$, and the gate oxide film 6 covering the surfaces of the p-type semiconductor regions 9 and 9 (the source region and the drain region) of the load MISFETs $Qp_1$ and $Qp_2$. After this, as shown in FIG. 16, a Ti-film 35 is deposited over the semiconductor substrate 1 by sputtering.

Figure 17:
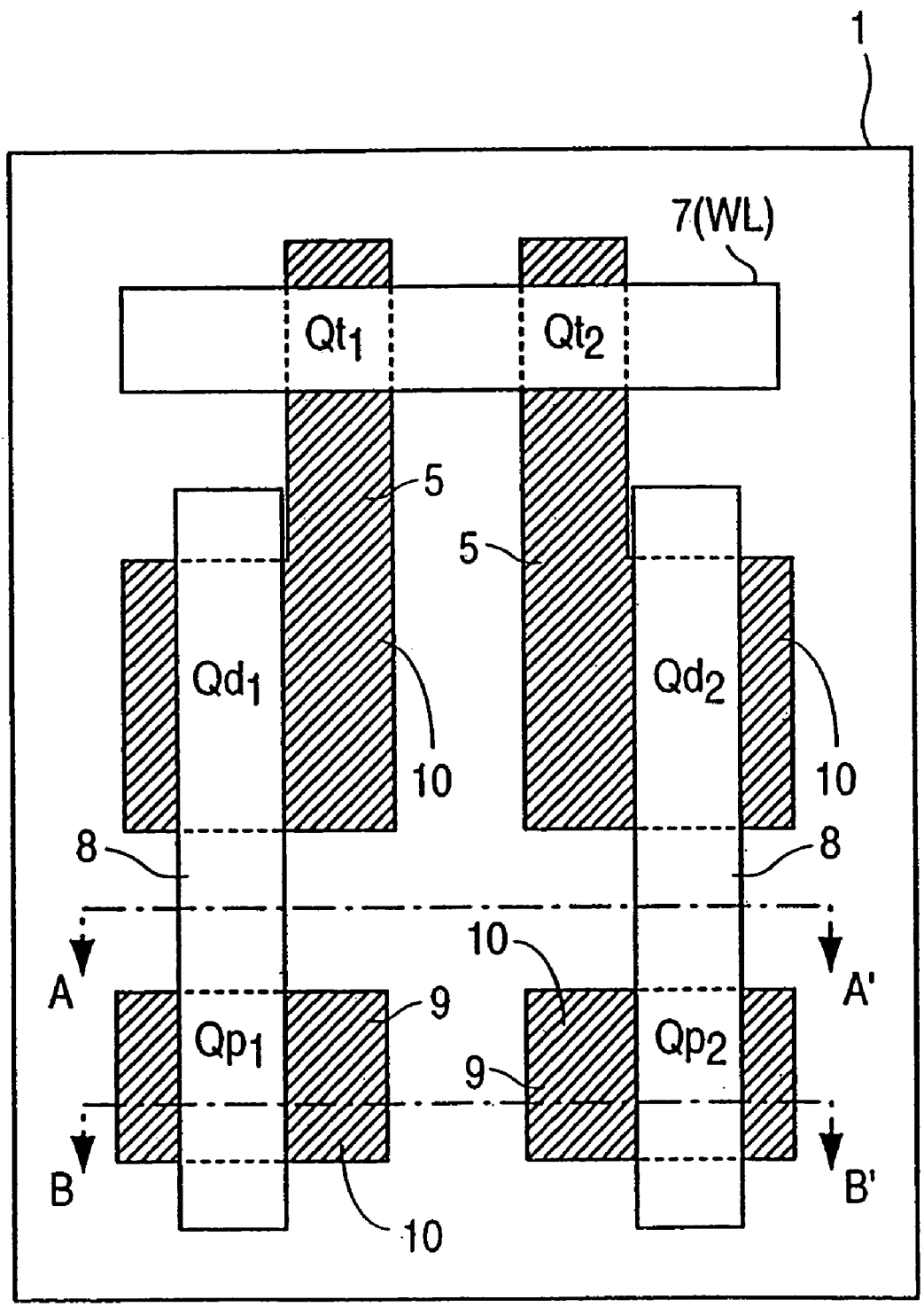
FIG. 17 is a top plan view showing the method for manufacturing the memory cell of the SRAM of this first embodiment according to the present invention.
Figure 18A:
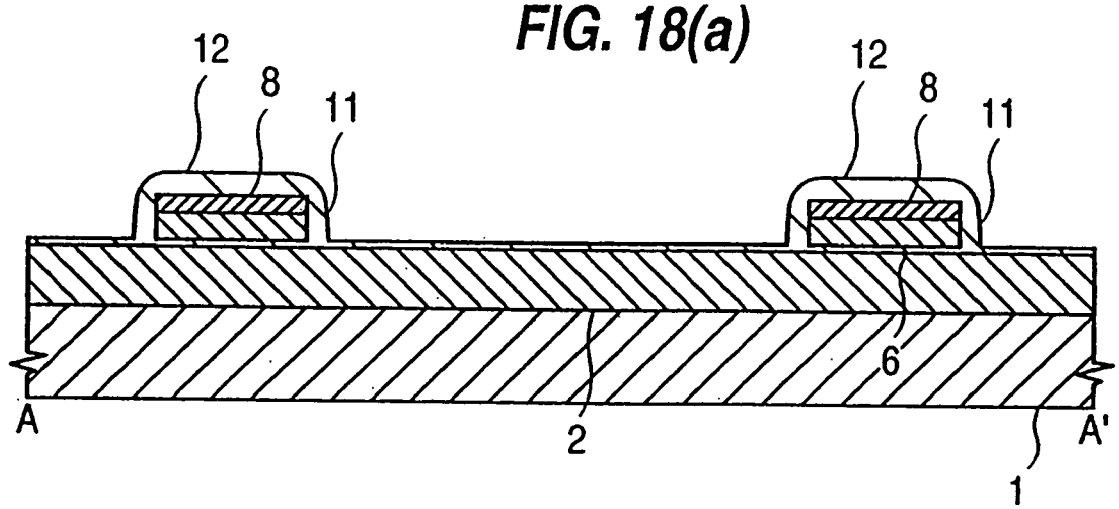
FIGS. 18(a) and 18(b) are sections showing the method for manufacturing the memory cell of the SRAM of this first embodiment according to the present invention.
Figure 18B:
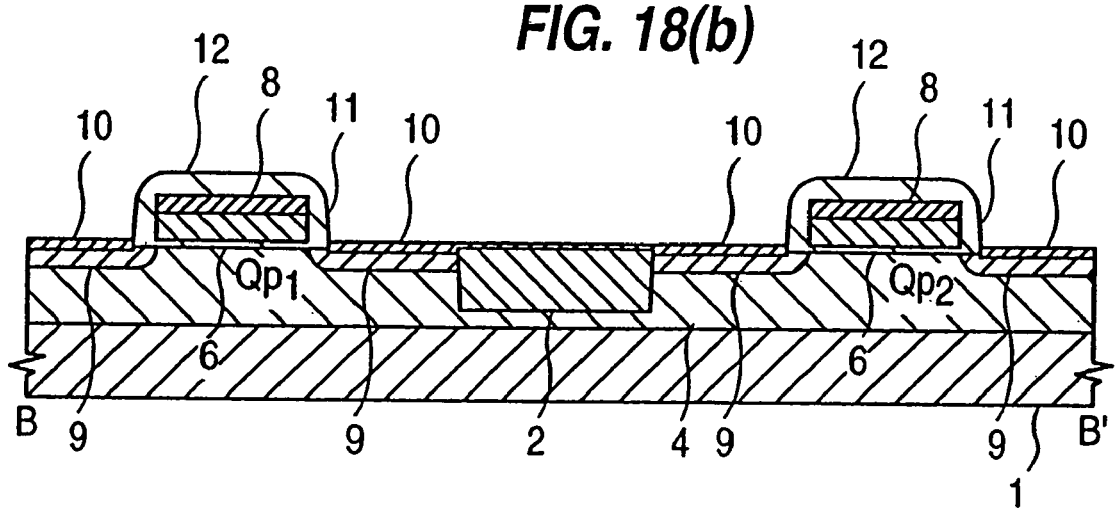

Next the semiconductor substrate 1 is annealed (thermally treated) to cause a reaction between the Ti-film 35 and the semiconductor substrate 1 (the n-type semiconductor region 5 and the p-type semiconductor region 9). After this, the unreacted Ti-film 35 is etched to form the Ti-silicide layer 10 on the surfaces of the p-type semiconductor region 5 and the p-type semiconductor region 9, as shown in FIGS. 17 and 18(a) and 18(b). After this, the semiconductor substrate 1 is annealed, if necessary, to reduce the resistance of the Ti-silicide layer 10. Instead of forming the Ti-silicide layer 10, a Co (cobalt) film may be formed over the semiconductor substrate 1 by sputtering to cause a reaction between the semiconductor substrate 1 (the n-type semiconductor region 5 and the p-type semiconductor region 9) and the Co film, thereby to form a Co-silicide layer.

Figure 19:
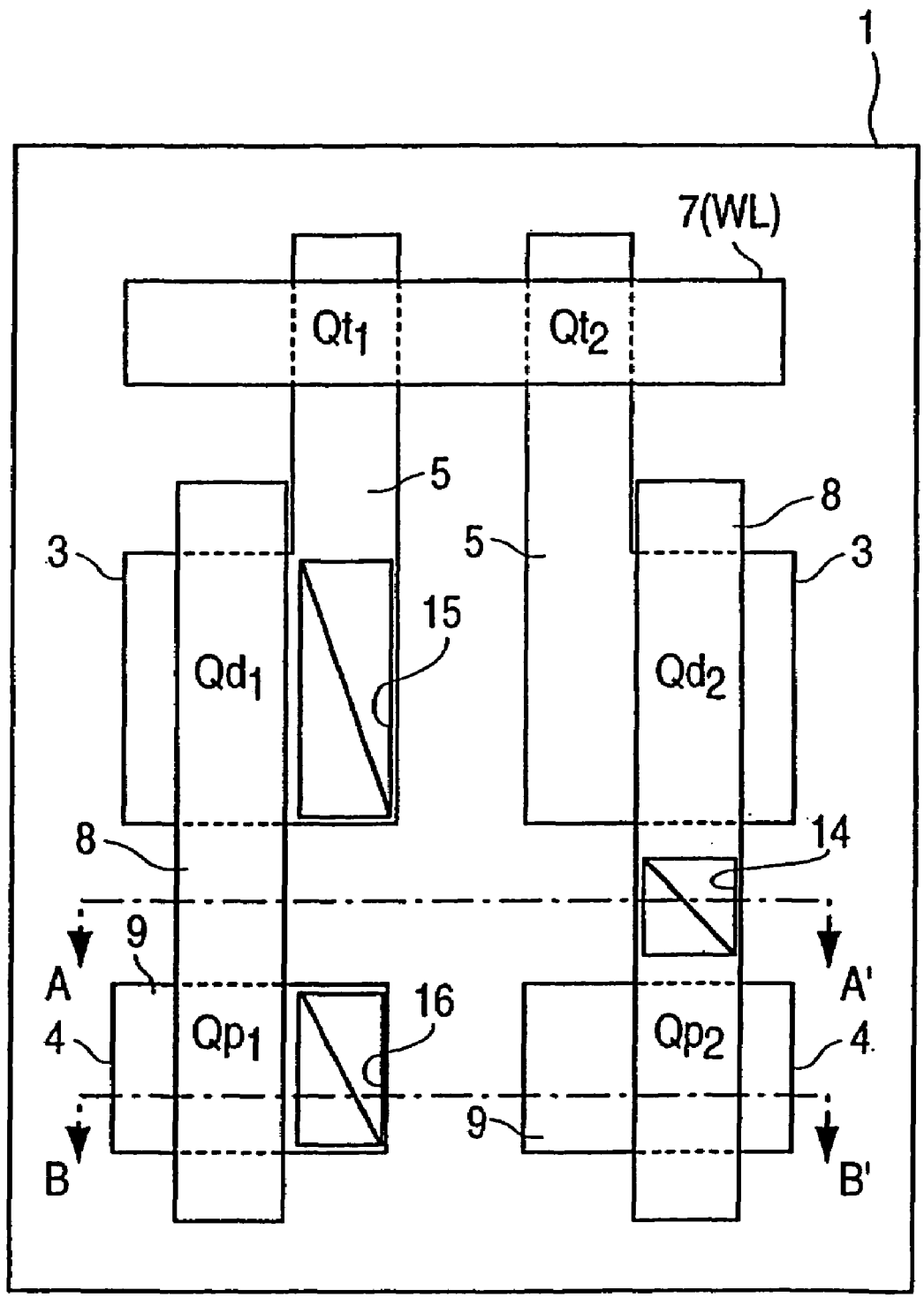
FIG. 19 is a top plan view showing the method for manufacturing the memory cell of the SRAM of this first embodiment according to the present invention.
Figure 20A:
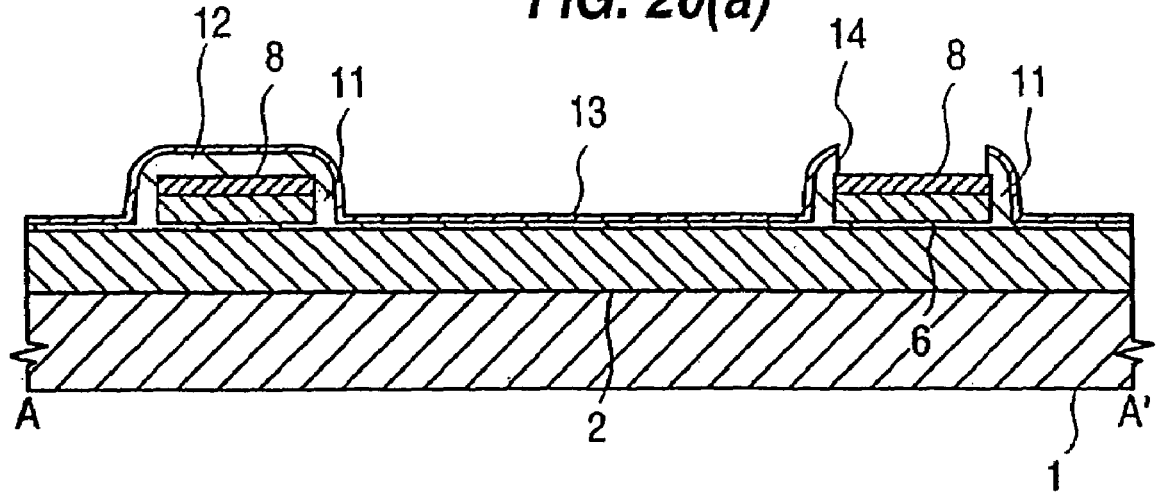
FIGS. 20(a) and 20(b) are sections showing the method for manufacturing the memory cell of the SRAM of this first embodiment according to the present invention.
Figure 20B:
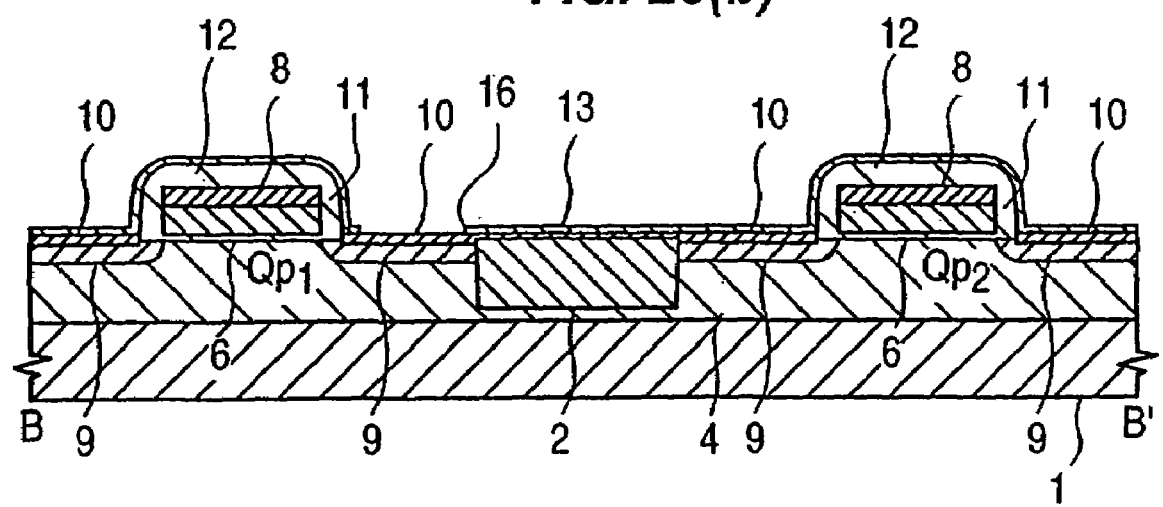
Figure 21:
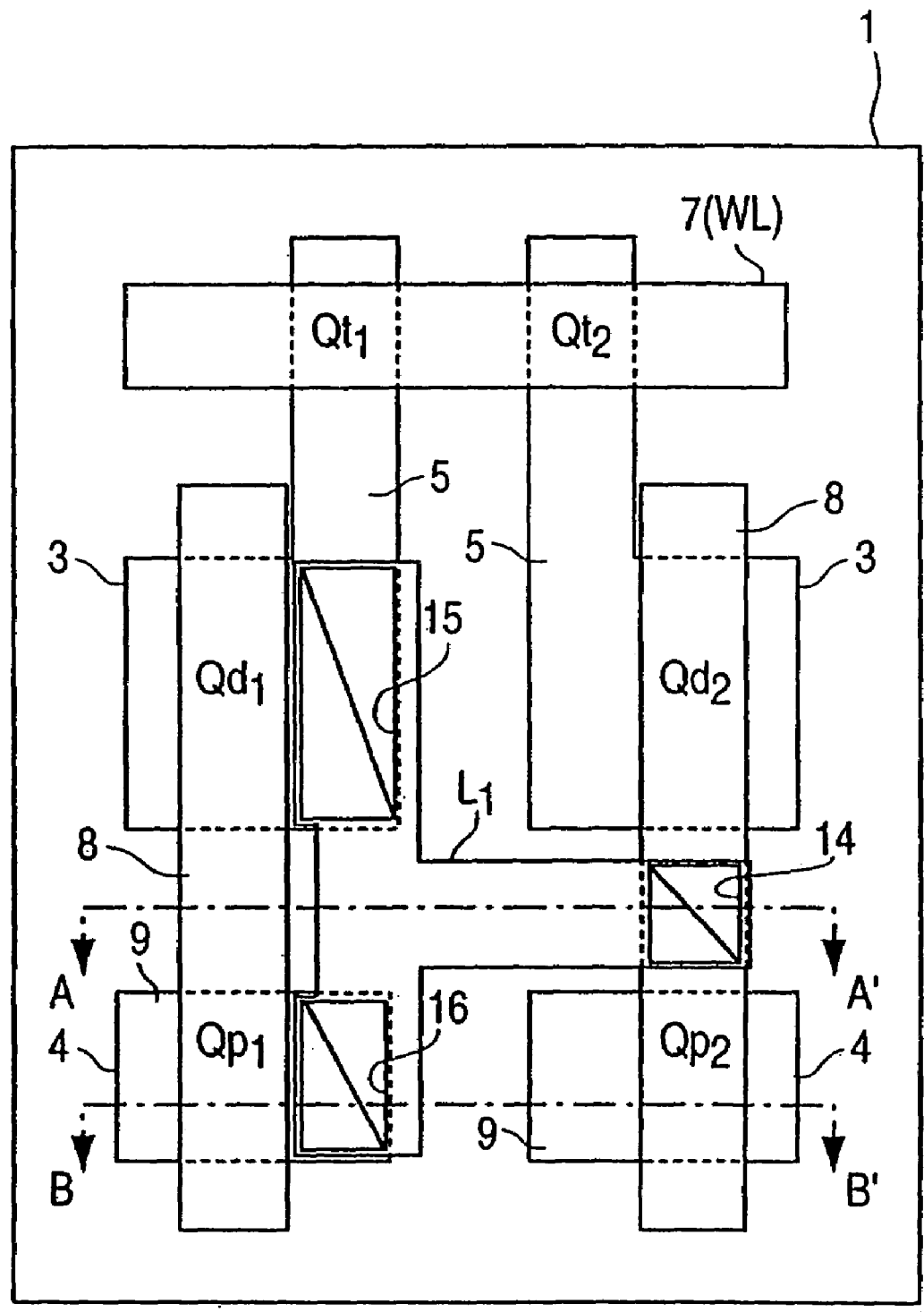
FIG. 21 is a top plan view showing the method for manufacturing the memory cell of the SRAM of this first embodiment according to the present invention.
Figure 22A:
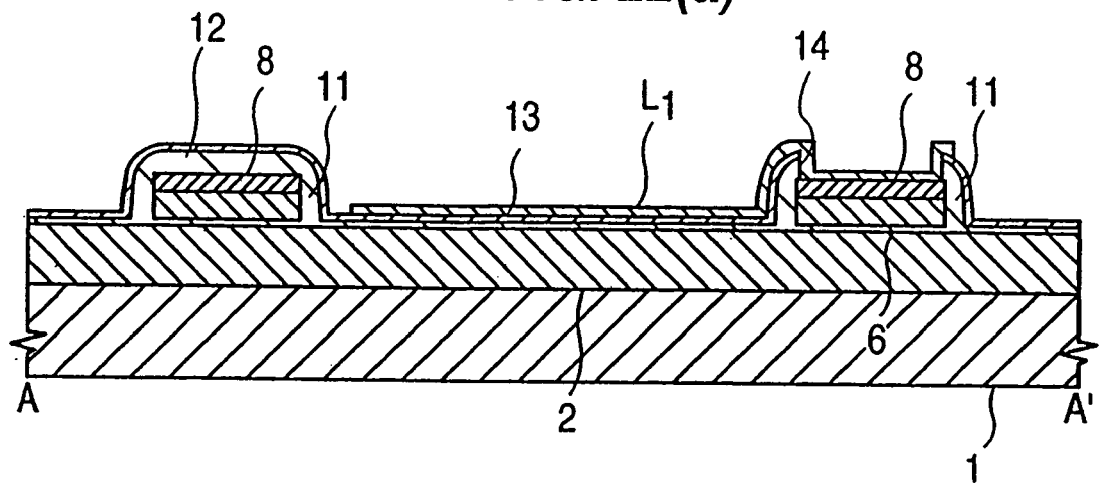
FIGS. 22(a) and 22(b) are sections showing the method for manufacturing the memory cell of the SRAM of this first embodiment according to the present invention.
Figure 22B:
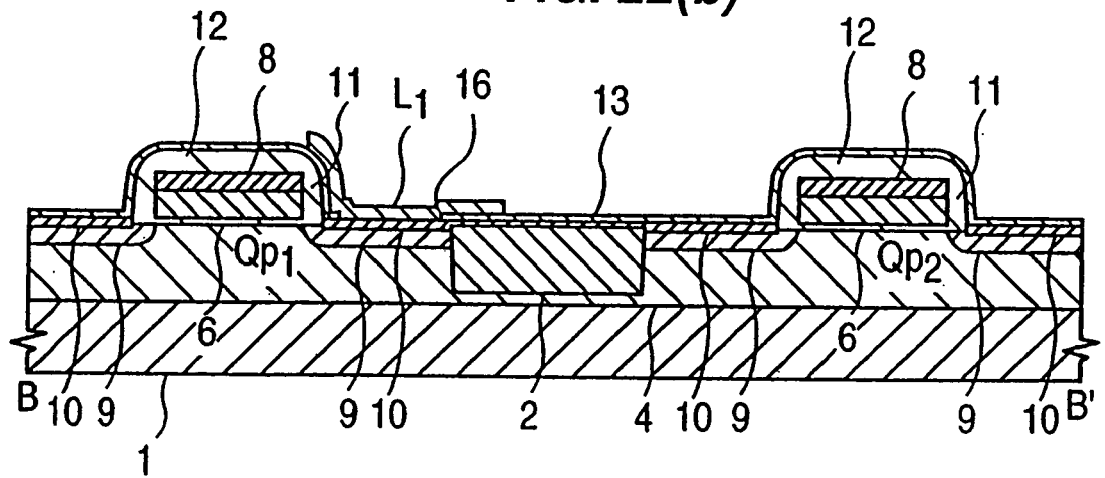

Next, the silicon nitride film 13, as thin as about 30 nm, is deposited over the semiconductor substrate 1, as shown in FIGS. 19 and 20(a) and (b). After this, the connection hole 14 is opened in the silicon nitride film 13 and the silicon oxide film 12 over the gate electrodes 8 of the drive MISFET $Qd_2$ (or the load MISFET $Qp_2$) by a dry-etching method using a photoresist as the mask. Simultaneously with this, the silicon nitride film 13 over the n-type semiconductor region 5 (the drain region) of the drive MISFET $Qd_1$ is etched off to form the connection hole 15, and the silicon nitride film 13 over the p-type semiconductor region 9 (the drain region) of the load MISFET $Qp_1$ is etched to form the connection hole 16. Next, the local wiring line $L_1$ is formed over the silicon nitride film 13, as shown in FIGS. 21 and 22(a) and (b). The local wiring line $L_1$ is formed by patterning the TiN film, having a thickness of about 100 nm and deposited over the semiconductor substrate 1 by a sputtering method or a CVD method, by a dry-etching method using a photoresist as the mask. This local wiring line $L_1$ is connected through the connection hole 14 with the common gate electrode 8 of the load MISFET $Qp_2$ and the drive MISFET $Qd_2$, through the connection hole 15 with the n-type semiconductor region 5 (the drain region) of the drive MISFET $Qd_1$, and through the connection hole 16 with the p-type semiconductor region 9 (the drain region) of the load MISFET $Qp_1$.

Figure 23:
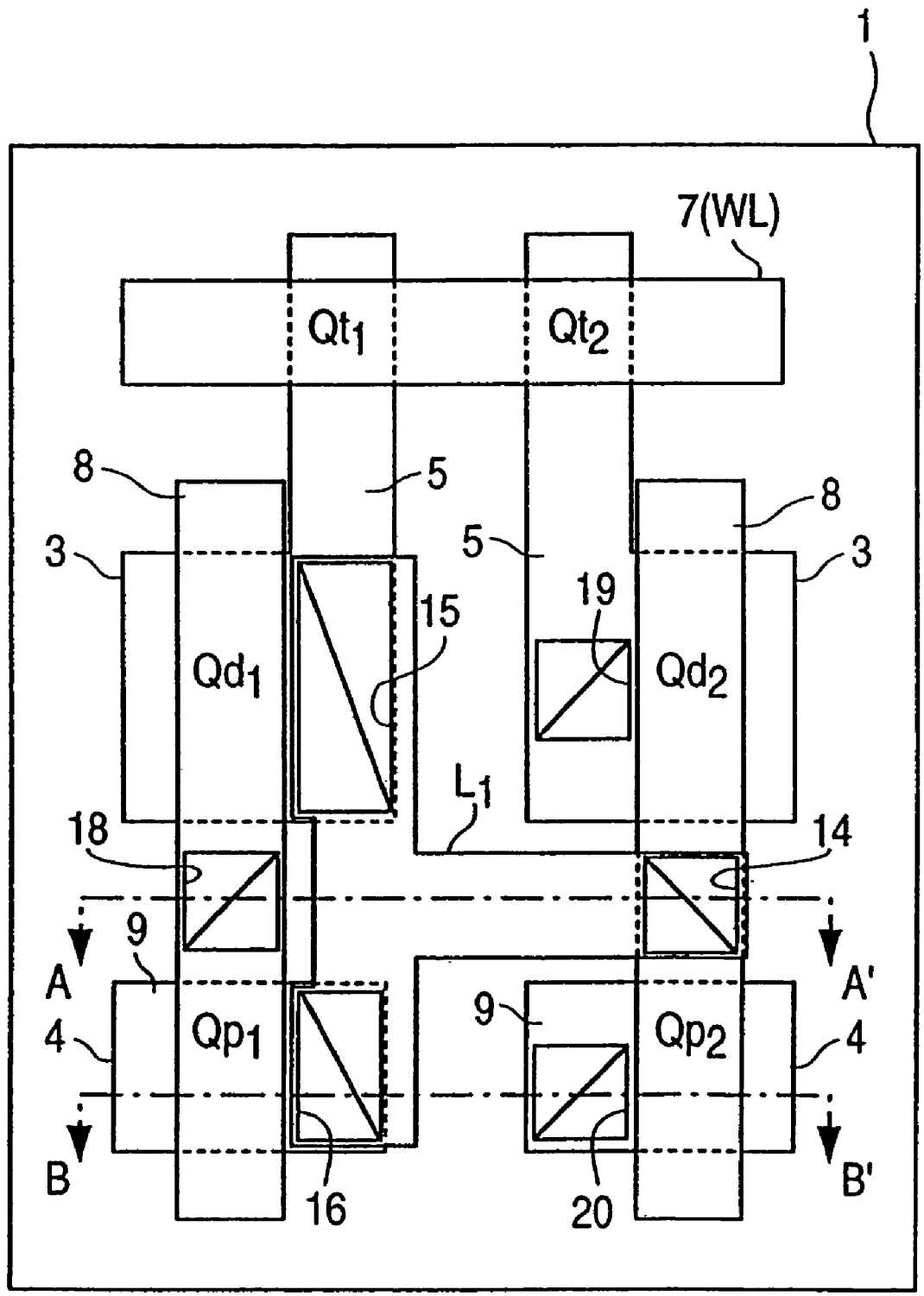
FIG. 23 is a top plan view showing the method for manufacturing the memory cell of the SRAM of this first embodiment according to the present invention.
Figure 24A:
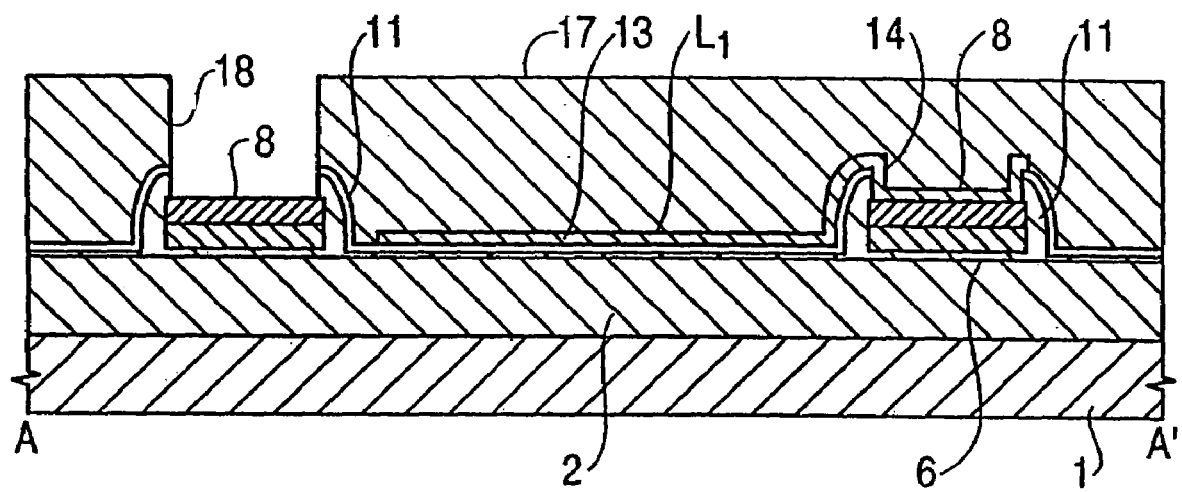
FIGS. 24(a) and 24(b) are sections showing the method for manufacturing the memory cell of the SRAM of this first embodiment according to the present invention.
Figure 24B:
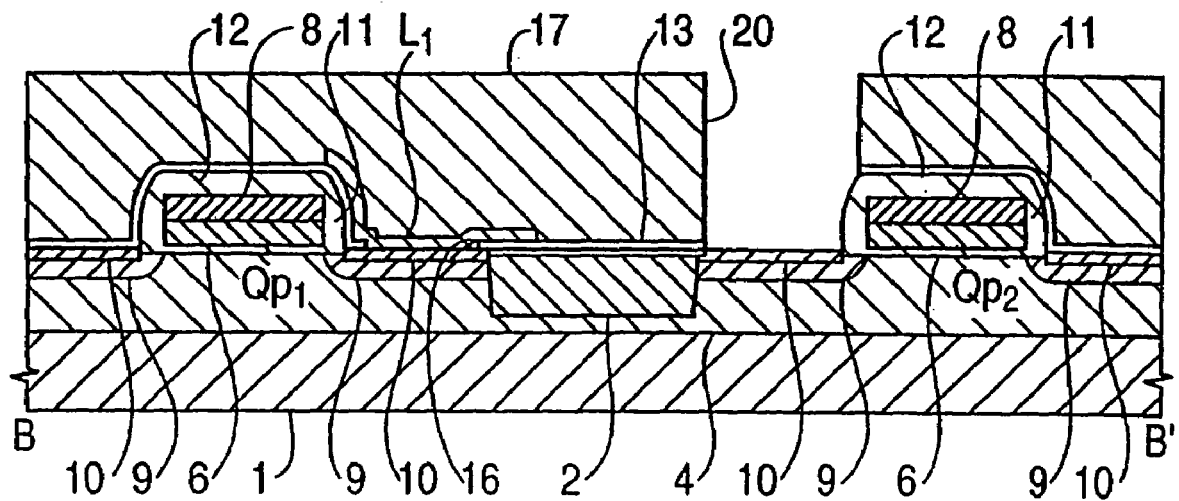

Next, the interlayer insulating film 17 of PSG is deposited over the local wiring line $L_1$ by the CVD method, as shown in FIGS. 23 and 24(a) and (b). After this, the interlayer insulating film 17, the silicon nitride film 13 and the silicon oxide film 12 lying over the gate electrode 8 of the drive MISFET $Qd_1$ (the load MISFET $Qp_1$) are opened to form the connection hole 18 by a dry-etching technique using a photoresist as the mask. Simultaneously with this, the interlayer insulating film 17 and the silicon nitride film 13 over the n-type semiconductor region 5 (the drain region) of the drive MISFET $Qd_2$ are etched to form the connection hole 19, and the interlayer insulating film 17 and the silicon nitride film 13 over the p-type semiconductor region 9 (the drain region) of the load MISFET $Qp_2$ are etched to form the connection hole 20.

Figure 25:
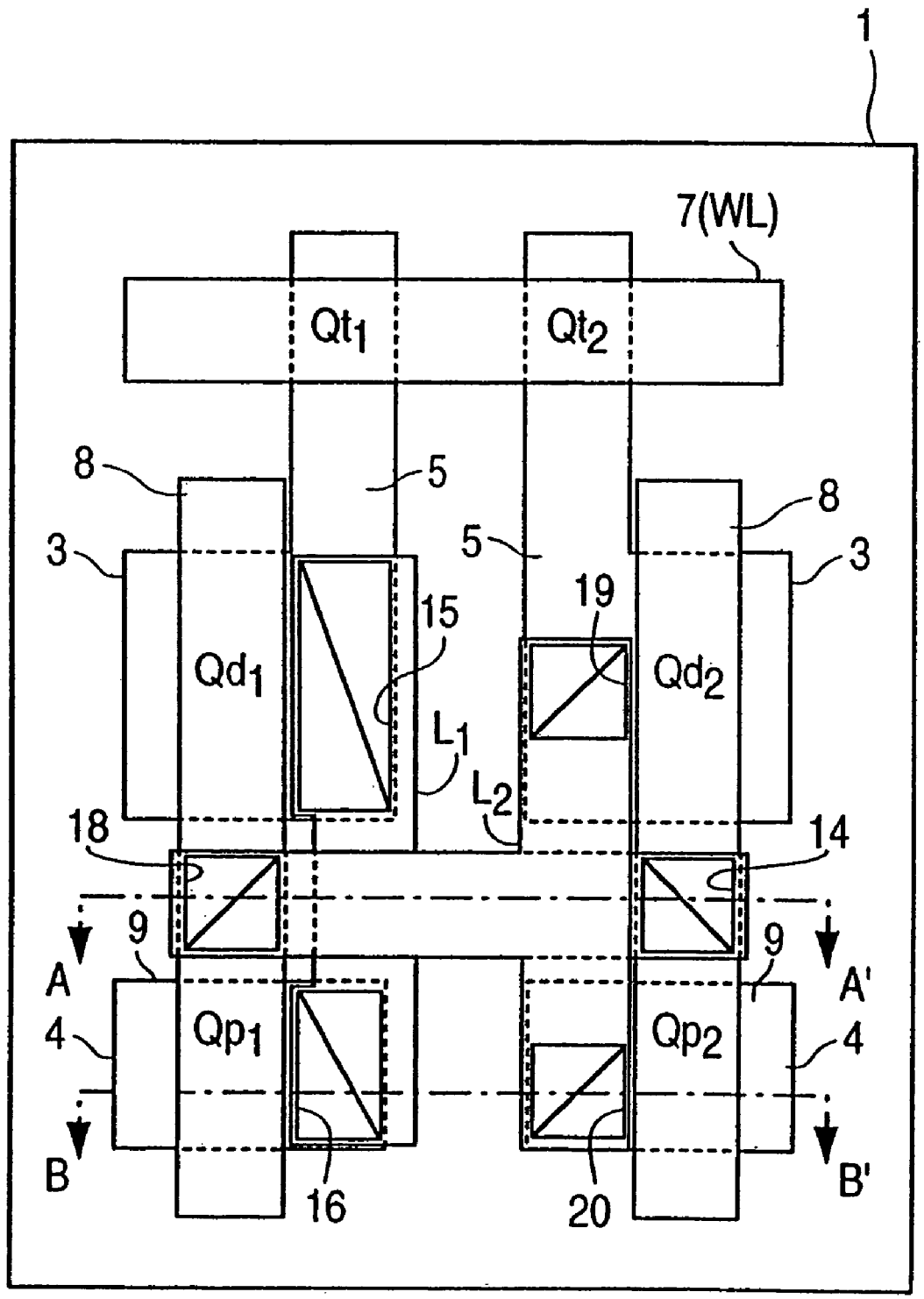
FIG. 25 is a top plan view showing the method for manufacturing the memory cell of the SRAM of this first embodiment according to the present invention.
Figure 26A:
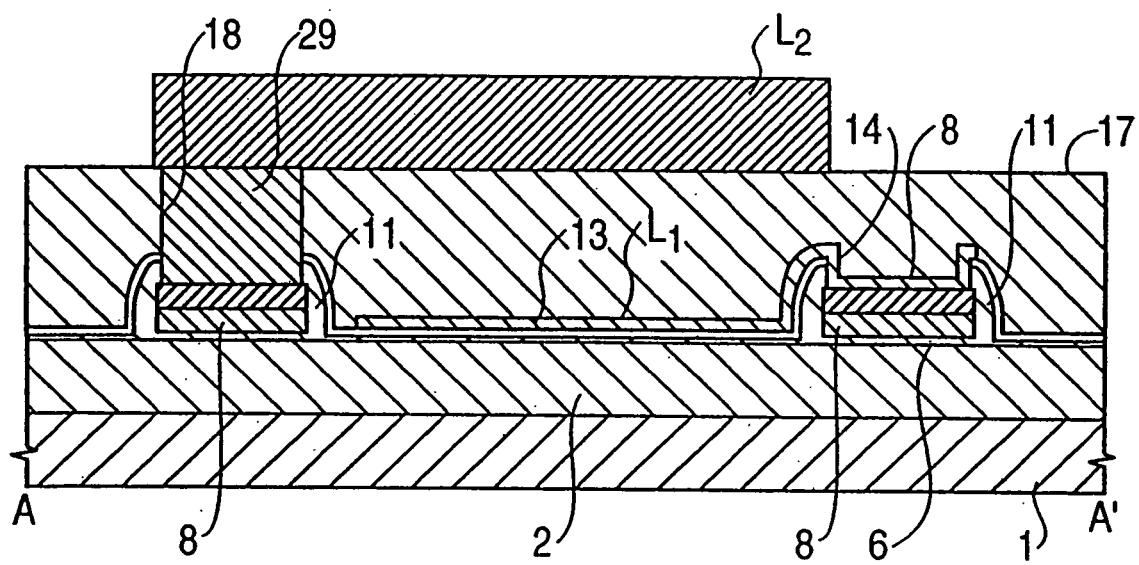
FIGS. 26(a) and 26(b) are sections showing the method for manufacturing the memory cell of the SRAM of this first embodiment according to the present invention.
Figure 26B:
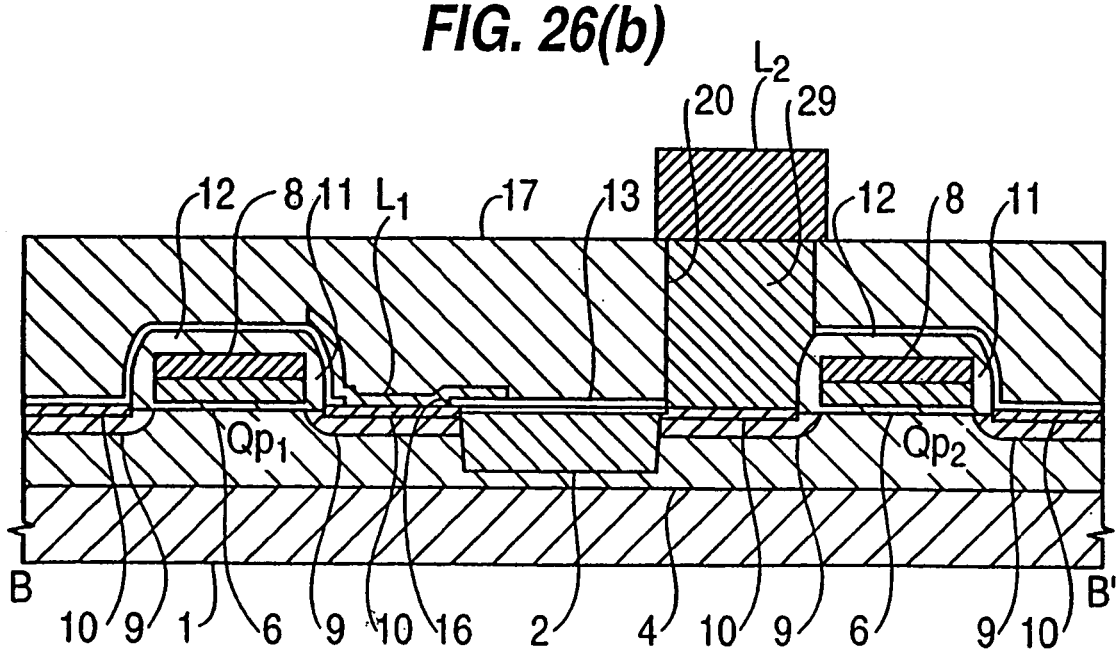

Next, W-films are buried in the connection holes 18, 19 and 20 to form the plugs 29, as shown in FIGS. 25 and 26(a) and (b). After this, the local wiring line $L_2$ is formed over the interlayer insulating film 17. The burying operation of the W-film is carried out by etching back the W-film which is deposited over the interlayer insulating film 17 by a sputtering method. The local wiring line $L_2$ is formed by depositing the TiN film, the Al film and the TiN film consecutively over the interlayer insulating film 17 by a sputtering method and then by patterning those films by a dry-etching method using a photoresist as the mask. The local wiring line $L_2$ is connected through the connection hole 18 with the common gate 8 of the load MISFET $Qp_1$ and the drive MISFET $Qd_1$, through the connection hole 19 with the n-type semiconductor region 5 (the drain region) of the drive MISFET $Qd_2$, and through the connection hole 20 with the p-type semiconductor region 9 (the drain region) of the load MISFET $Qp_2$.

Figure 27:
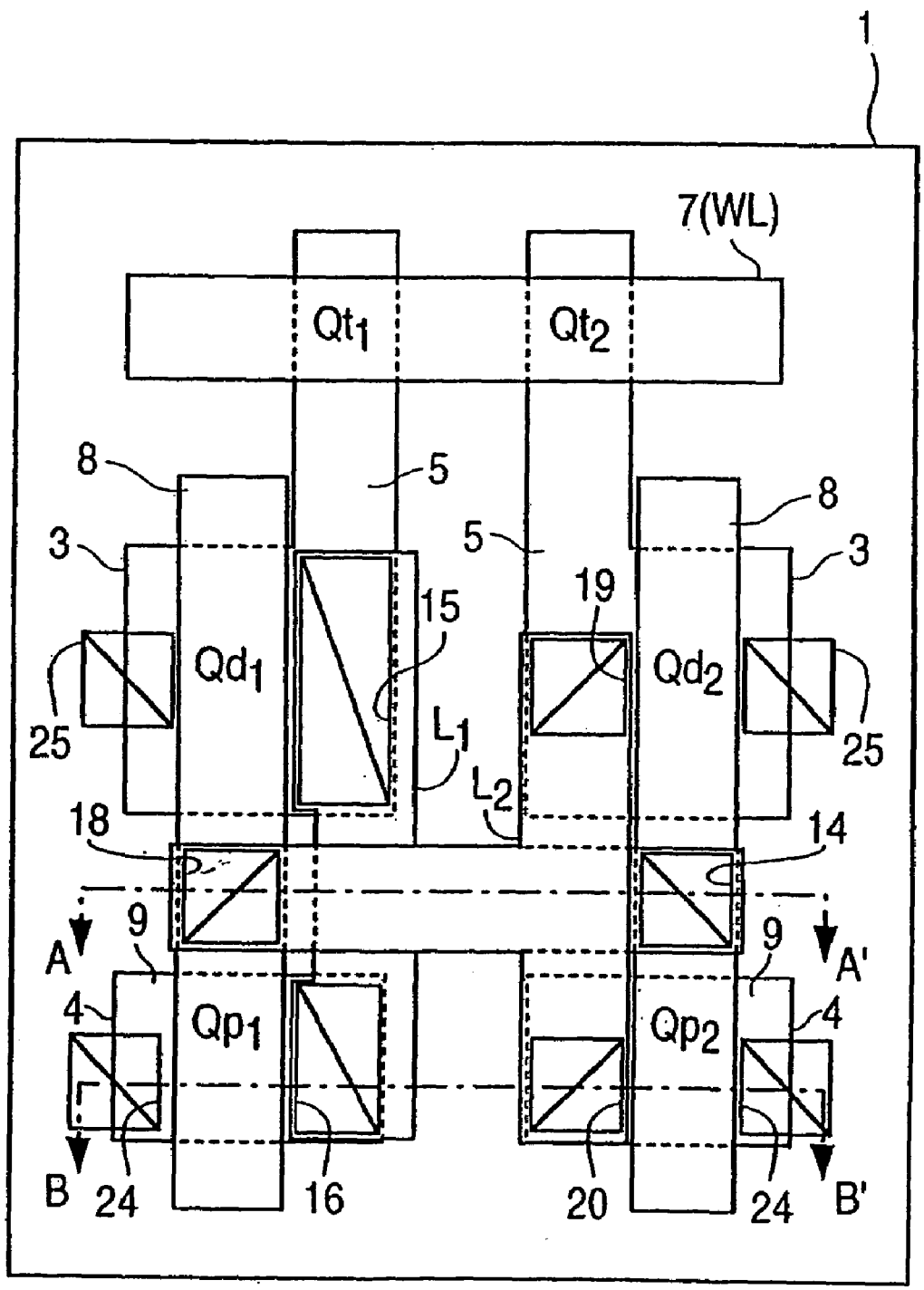
FIG. 27 is a top plan view showing the method for manufacturing the memory cell of the SRAM of this first embodiment according to the present invention.
Figure 28:
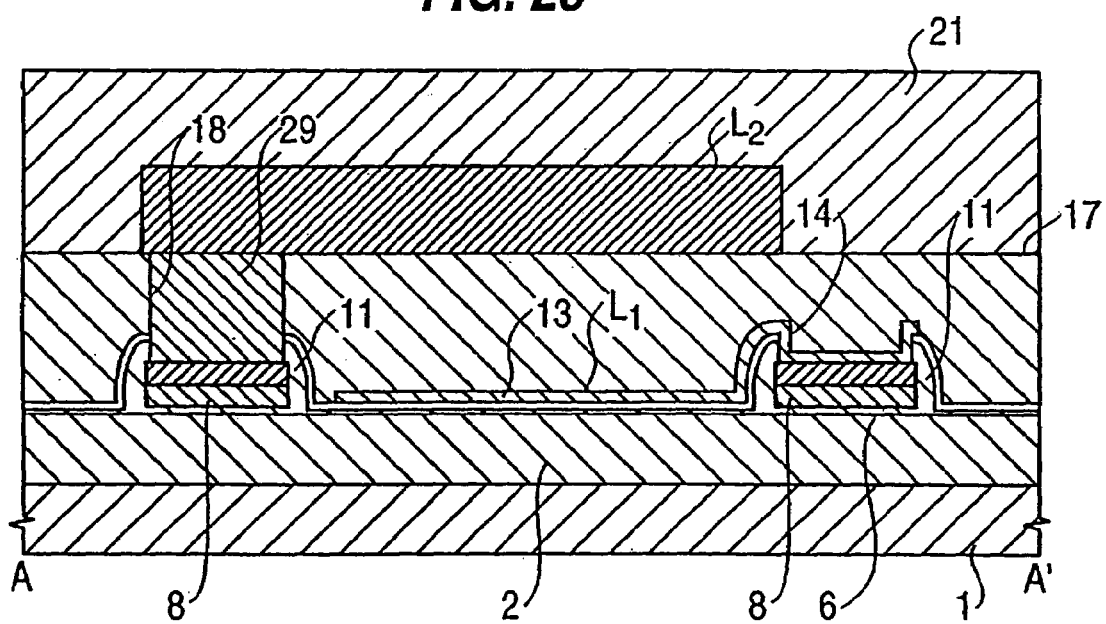
FIG. 28 is a section showing the method for manufacturing the memory cell of the SRAM of this first embodiment according to the present invention.
Figure 29:
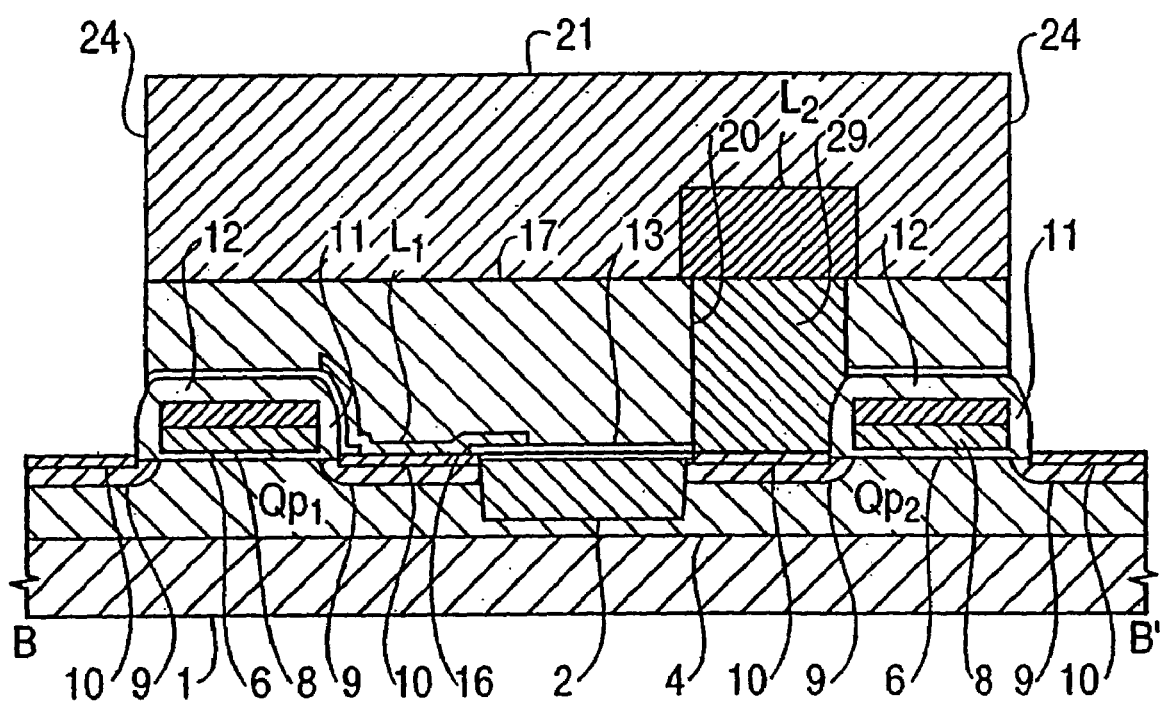
FIG. 29 is a section showing the method for manufacturing the memory cell of the SRAM of this first embodiment according to the present invention.

Next, the interlayer insulating film 21 of silicon oxide is deposited over the local wiring line $L_1$ by a CVD method, as shown in FIGS. 27, 28 and 29. After this, the interlayer insulating films 21 and 17 and the silicon nitride film 13 over the individual p-type semiconductor regions 9 and 9 (the source regions) of the load MISFETs $Qp_1$ and $Qp_2$ are opened to form the connection holes 24 and 24 by the dry-etching method, using a photoresist as the mask. Simultaneously with this, the interlayer insulating films 21 and 17 and the silicon nitride film 13 over the individual n-type semiconductor regions 5 and 5 (the source regions) of the drive MISFETs $Qd_1$ and $Qd_2$ are opened to form the connection holes 25 and 25.

Figure 30:
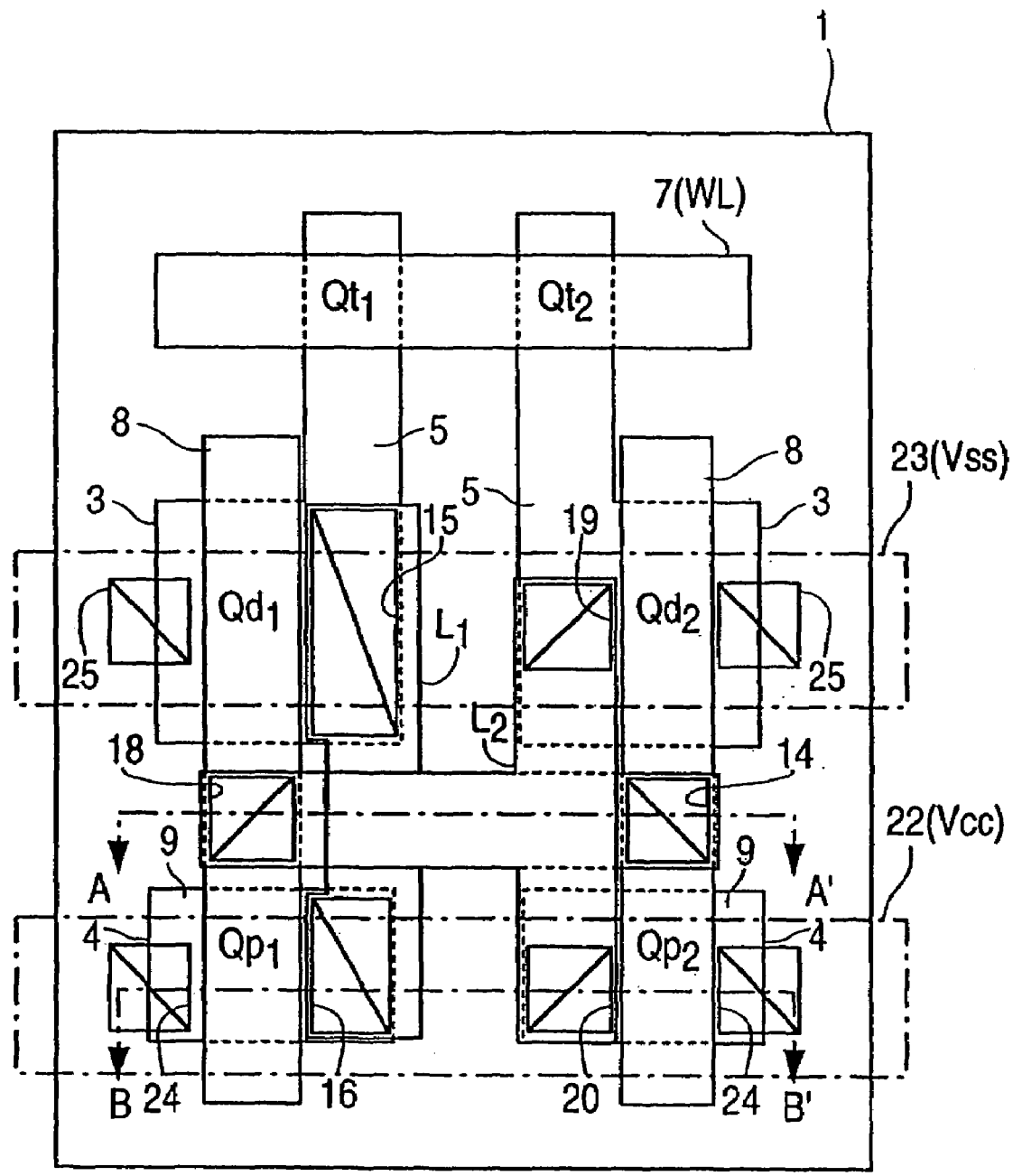
FIG. 30 is a top plan view showing the method for manufacturing the memory cell of the SRAM of this first embodiment according to the present invention.
Figure 31:
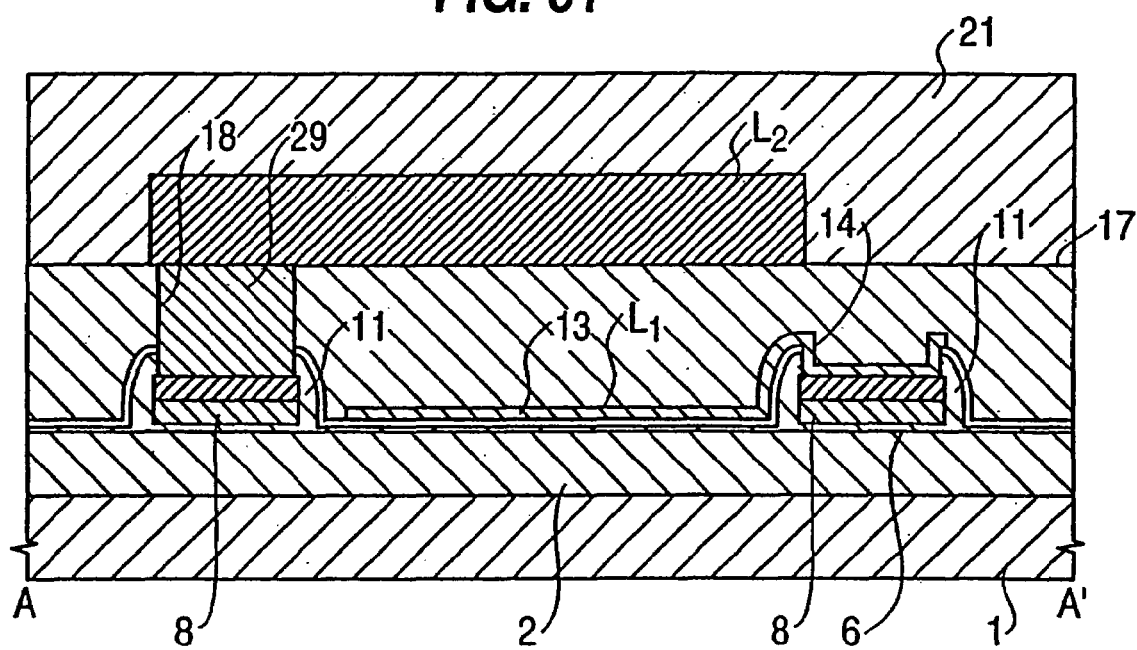
FIG. 31 is a section showing the method for manufacturing the memory cell of the SRAM of this first embodiment according to the present invention.
Figure 32:
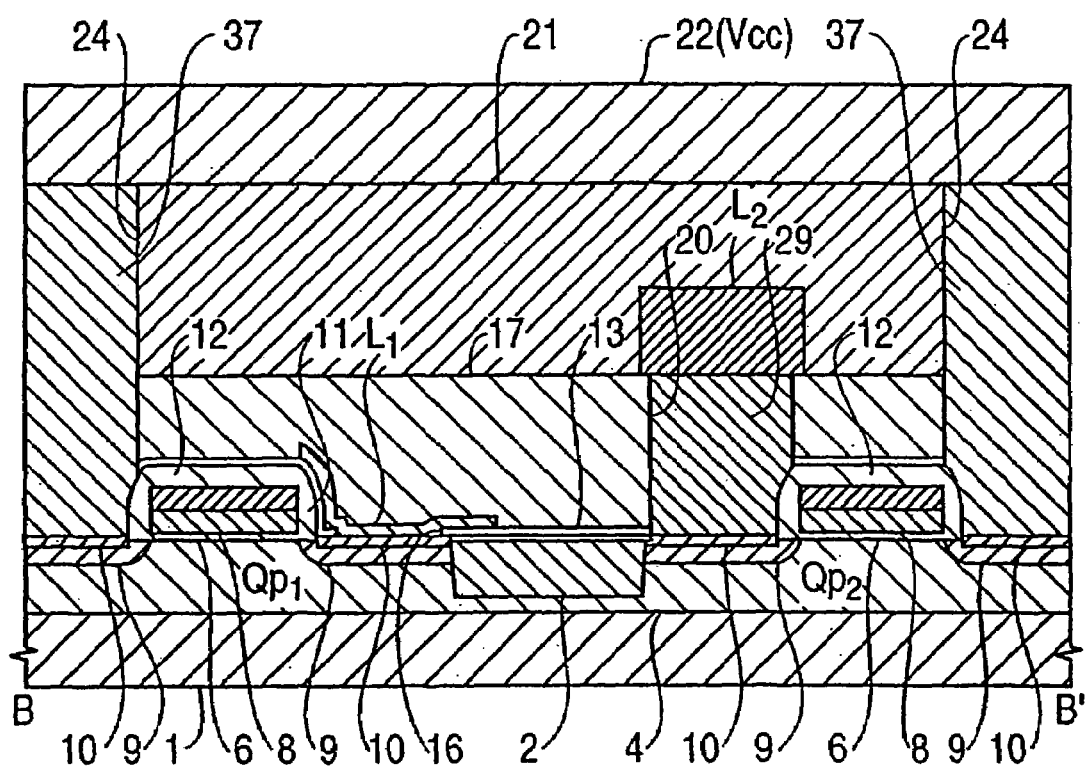
FIG. 32 is a section showing the method for manufacturing the memory cell of the SRAM of this first embodiment according to the present invention.

Next, W-films are buried in the connection holes 24 and 25 to form the plug 37. After this, as shown in FIGS. 30, 31 and 32, the power supply voltage line 22 and the reference voltage line 23 are formed over the interlayer insulating film 21. These power supply and reference voltage lines 22 and 23 are formed by depositing a TiN film, an Al film and a TiN film consecutively over the interlayer insulating film 21 by a sputtering method, and then by patterning those films by a dry-etching method using a photoresist as the mask. The power supply voltage line 22 is connected through the connection holes 24 and 24 with the individual p-type semiconductor regions 9 and 9 (the source regions) of the load MISFETS $Qp_1$ and $Qp_2$, and the reference voltage line 23 is connected through the connection holes 25 and 25 with the individual n-type semiconductor regions 5 and 5 (the source regions) of the drive MISFETS $Qd_1$ and $Qd_2$.

After this, the interlayer insulating film 26 of silicon oxide is deposited over the power supply voltage line 22 and the reference voltage line 23 by a CVD method. After this, the interlayer insulating films 26, 21 and 17 and the silicon nitride film 13 over the individual n-type semiconductor regions 5 and 5 (the drain regions) of the transfer MISFETs $Qt_1$ and $Qt_2$ are opened to form the connection holes 27 and 27 by a dry-etching method using a photoresist as the mask. Subsequently, W-films are buried in the connection holes 27 and 27 to form plugs, and the data lines DL and DL are then formed over the interlayer insulating film 26. These data lines DL and DL are formed by depositing a TiN film, an Al film and a TiN film consecutively over the interlayer insulating film 26 by a sputtering method, and then by patterning those films by a dry-etching method using a photoresist as the mask. The data line DL is connected through one of the connection holes 27 and 27 with the n-type semiconductor region 5 (the drain region) of the transfer MISFET $Qt_1$, and the data line DL is connected through the other of the connection holes 27 and 27 with the n-type semiconductor region 5 (the drain region) of the transfer MISFET $Qt_2$. The memory cell, as shown in FIGS. 1 to 4, is thus completed by the steps described.

EMBODIMENT 2

Figure 33:
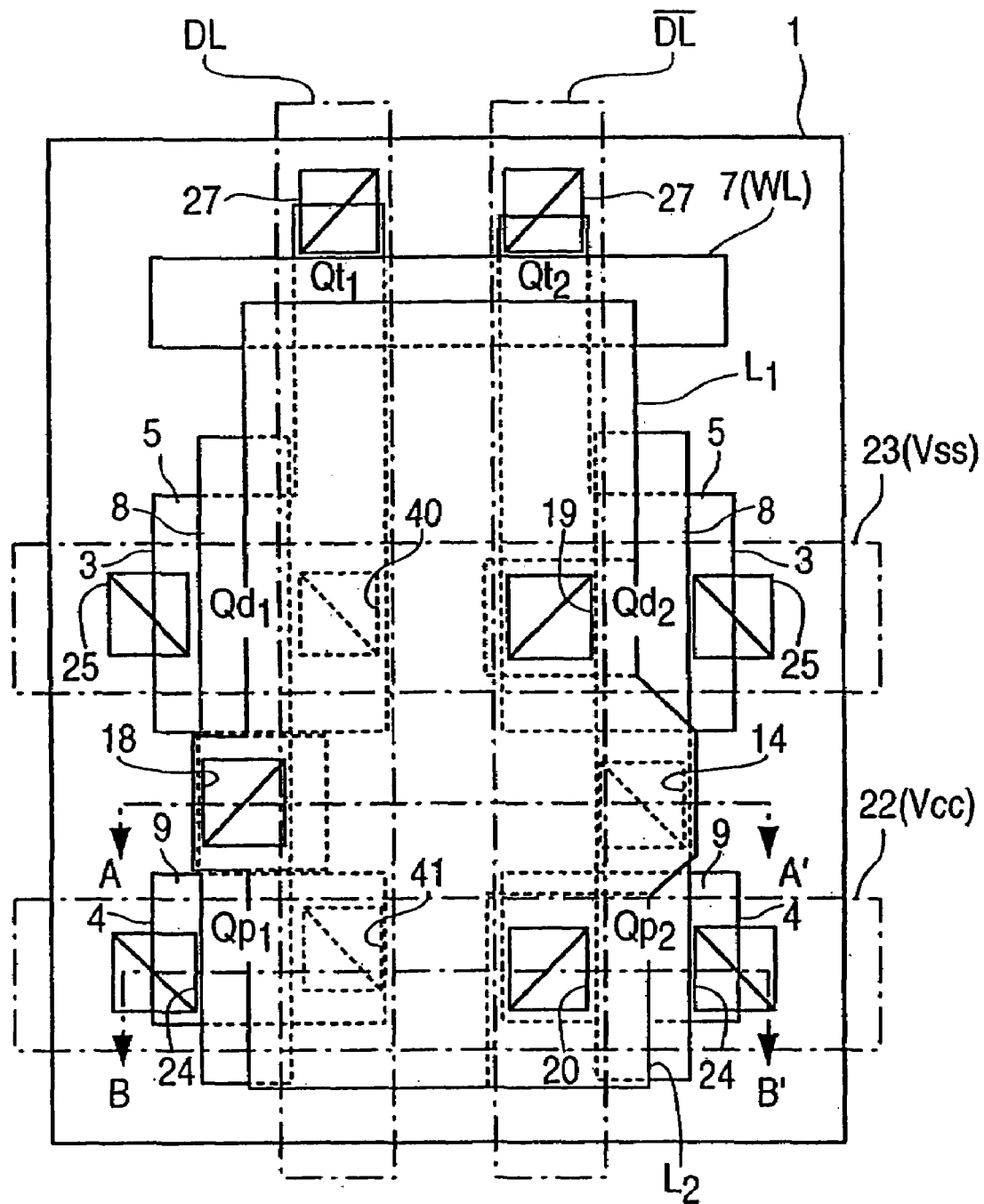
FIG. 33 is a top plan view showing a memory cell of an SRAM of a second embodiment according to the present invention.
Figure 34:
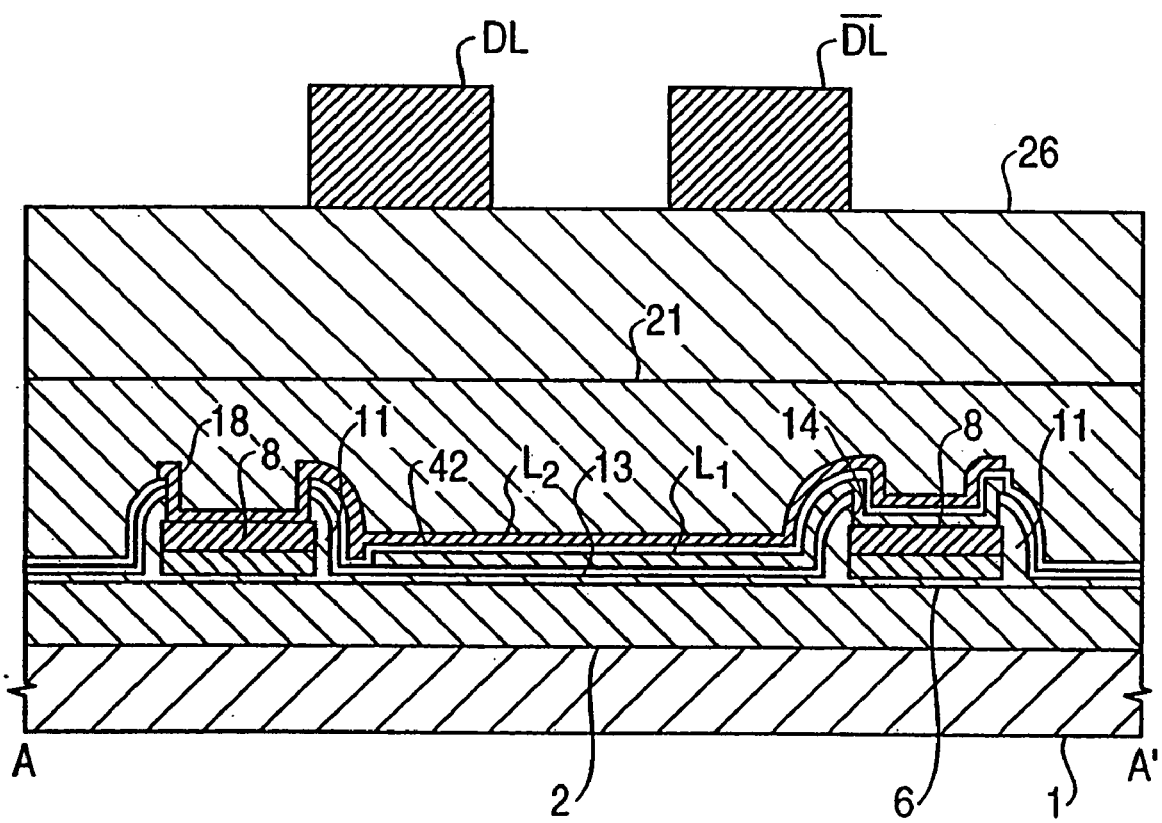
FIG. 34 is a section of the memory cell taken along line A–A' of FIG. 33.
Figure 35:
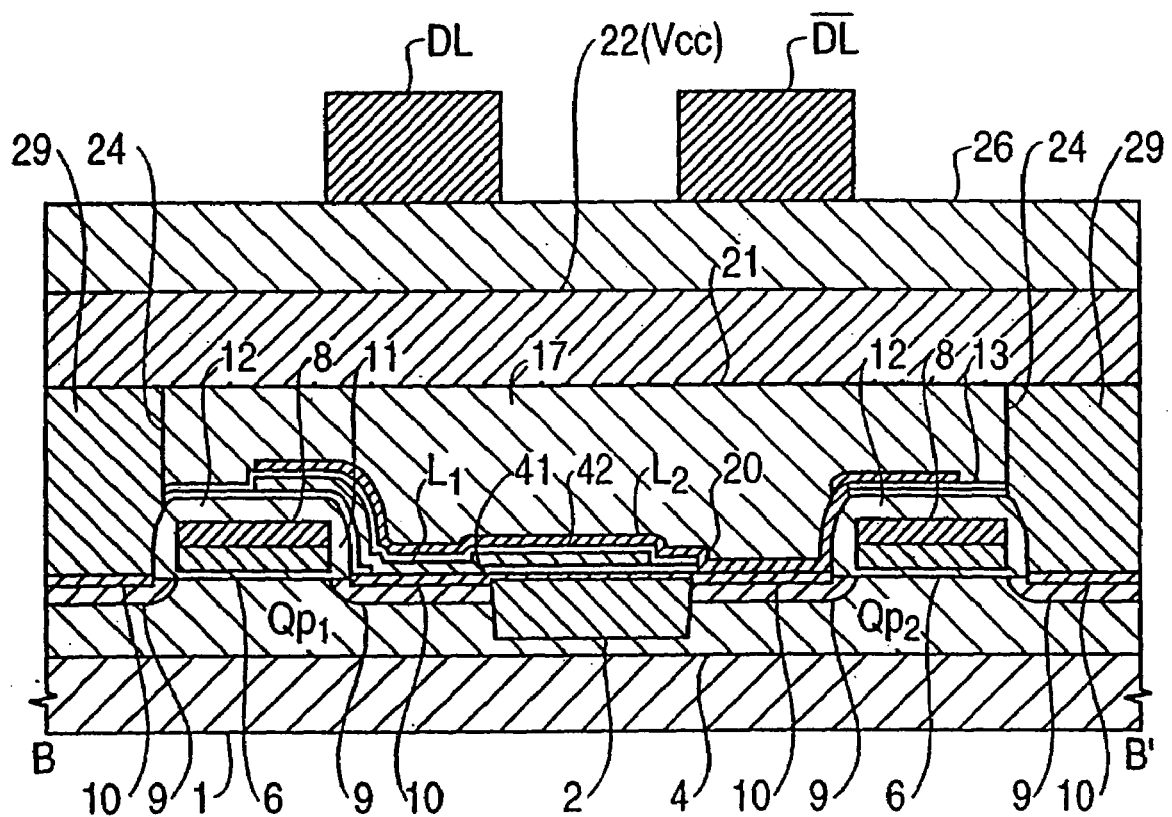
FIG. 35 is a section of the memory cell taken along line B–B' of FIG. 33.
Figure 36:
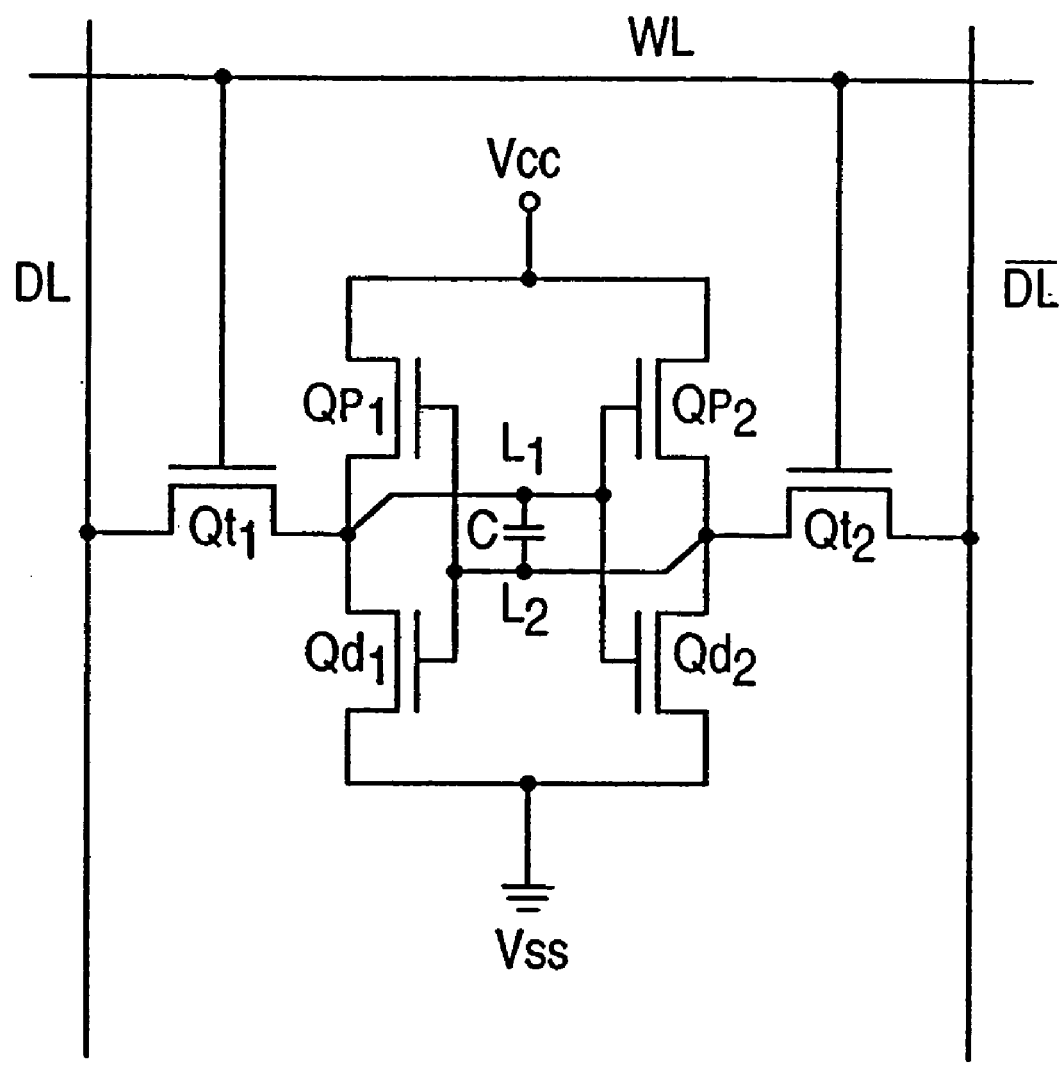
FIG. 36 is an equivalent circuit diagram showing the memory cell of the SRAM of this second embodiment according to the present invention.

FIG. 33 is a top plan view showing a memory cell of an SRAM of the present embodiment; FIG. 34 is a section taken along line A–A' of FIG. 33; FIG. 35 is a section taken along line B–B' of FIG. 33; and FIG. 36 is an equivalent circuit diagram showing the memory cell of the SRAM of the present embodiment.

In the SRAM of the present embodiment, as shown, the paired local wiring lines $L_1$ and $L_2$ cross-connecting the input/output terminals of the flip-flop circuit of the memory cell are formed in different conductive layers, as in the SRAM of the foregoing embodiment 1. In the SRAM of the present embodiment, moreover, the upper local wiring line $L_2$ overlaps with the lower local wiring line $L_1$ over a wide area, and a capacitor element C is composed of the local wiring lines $L_1$ and $L_2$ and a thin insulating film (a silicon nitride film 42) interposed between the wiring lines. Specifically, the upper local wiring line $L_2$ is one electrode of the capacitor element C, the lower local wiring line $L_1$ is the other electrode, and the insulating film (the silicon nitride film 42) is its dielectric film.

A method for manufacturing the memory cell of the SRAM of the present embodiment will be described with reference to FIGS. 37, 38(a) and (b), 39, 40(a) and (b), 41, 42(a) and (b), 43, 44(a) and (b) 45, 46(a) and (b), 47 and 48(a) and (b). Of the individual Figures showing the memory cell manufacturing method, sections (a) are taken along line A–A' of the top plan views, and sections (b) are taken along line B–B' of the top plan views. Moreover, the individual top plan views show only the conductive layers and the connection holes but do not show the insulating films.

First of all, in accordance with the manufacturing method of the foregoing embodiment 1, as shown in FIGS. 6 et seq., up to and including FIGS. 18(a) and (b), an element isolating groove 2, a p-type well 3, an n-type well 4 and a gate oxide film 6 are formed over a major face of the semiconductor substrate 1. After this, drive MISFETs $Qd_1$ and $Qd_2$ and transfer MISFETs $Qt_1$ and $Qt_2$ are formed in a p-type well 3, and load MISFETs $Qp_1$ and $Qp_2$ are formed in an n-type well 4. Moreover, a Ti-silicide layer 10 is formed so as to reduce the sheet resistance over the surfaces of n-type semiconductor regions 5 and 5 (the source region and the drain region) of the transfer MISFETs $Qd_1$ and $Qt_2$ and the drive MISFETs $Qd_1$ and $Qd_2$ and over the surfaces of p-type semiconductor regions 9 and 9 (the source region and the drain region) of the load MISFETs $Qp_1$ and $Qp_2$.

Figure 37:
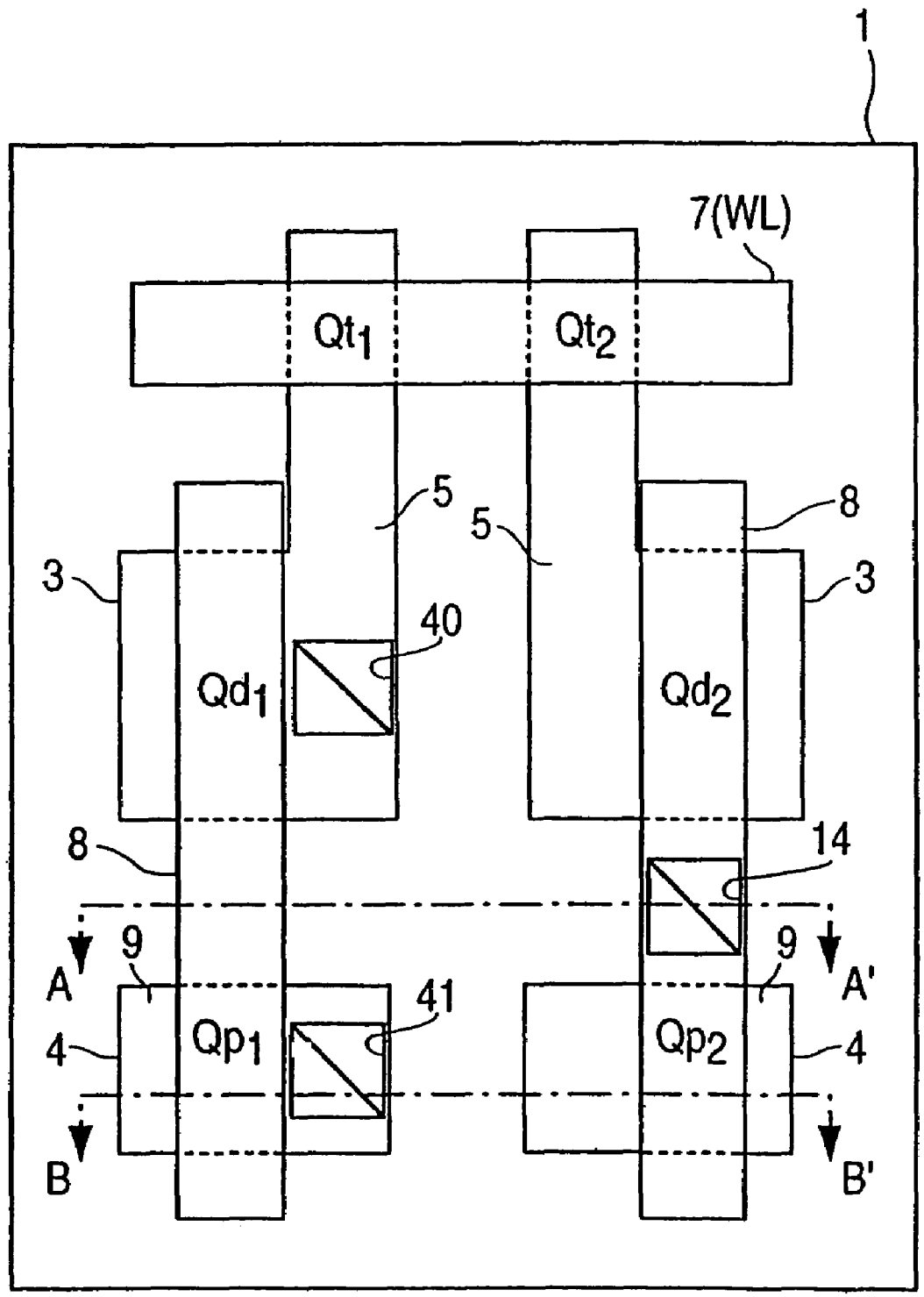
FIG. 37 is a top plan view showing a method for manufacturing the memory cell of the SRAM of this second embodiment according to the present invention.
Figure 38A:
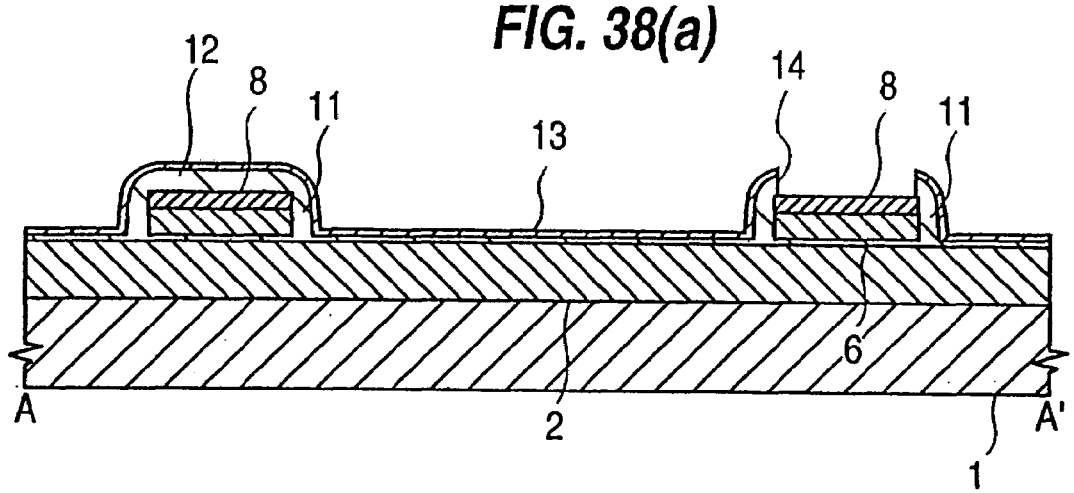
FIGS. 38(a) and 38(b) are sections showing the method for manufacturing the memory cell of the SRAM of this second embodiment according to the present invention.
Figure 38B:
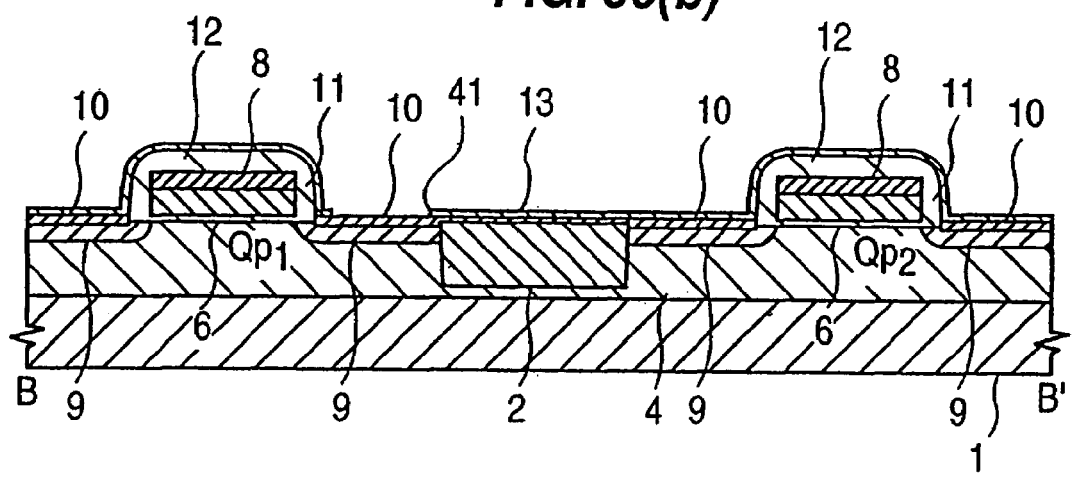

Next, as shown in FIGS. 37 and 38(a) and (b), a silicon nitride film 13, as thick as about 50 nm, is deposited over the semiconductor substrate 1. After this, the silicon nitride film 13 and a silicon oxide film 12 over a gate electrode 8 of the drive MISFET $Qd_2$ (or the load MISFET $Qp_2$) are opened to form a connection hole 14 by a dry-etching method using a photoresist as the mask. Simultaneously with this, the silicon nitride film 13 over the n-type semiconductor region 5 (the drain region) of the drive MISFET $Qd_1$ is etched to form a connection hole 40, and the silicon nitride film 13 over the p-type semiconductor region 9 (the drain region) of the load MISFET $Qp_1$ is etched to form a connection hole 41.

Figure 39:
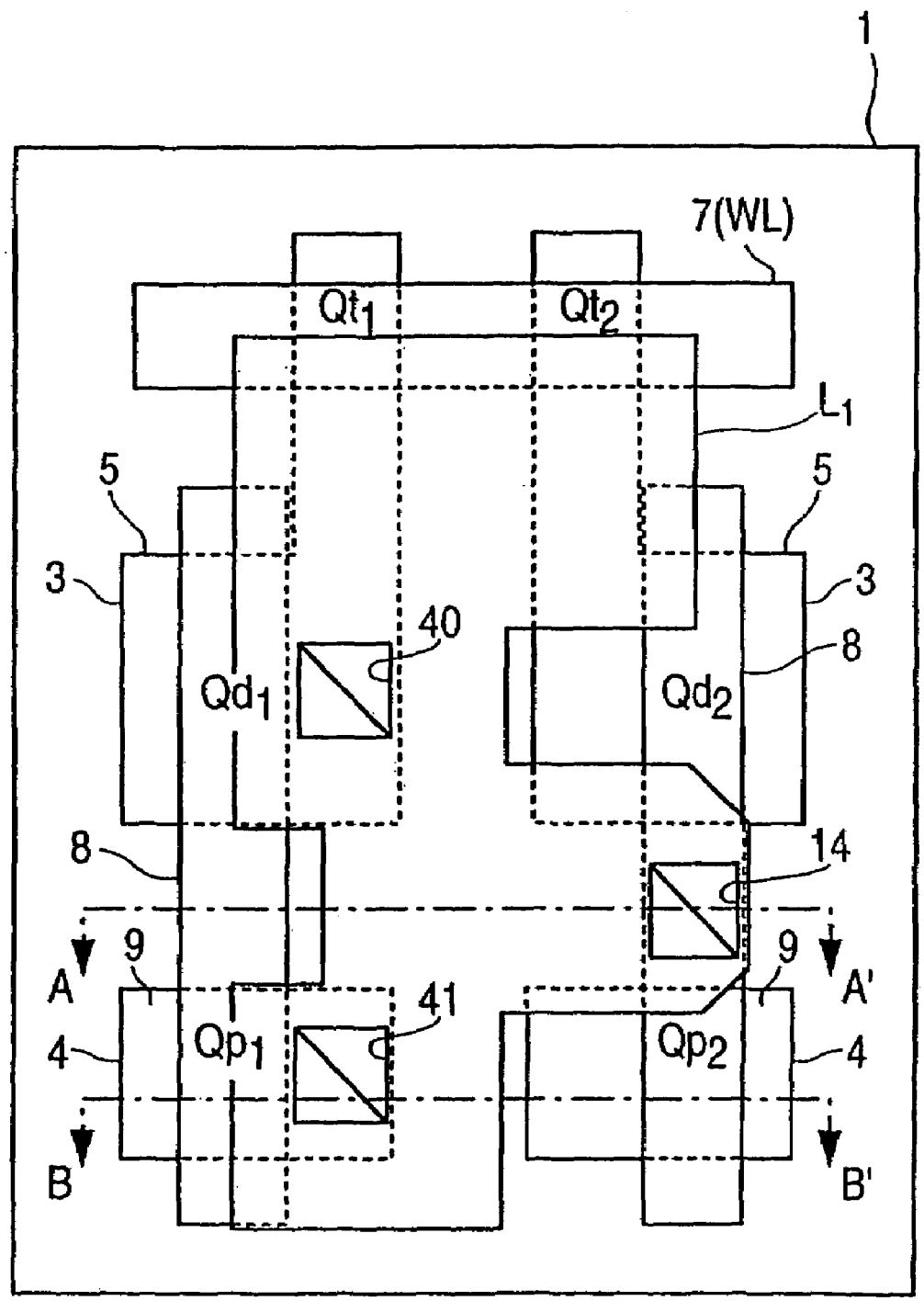
FIG. 39 is a top plan view showing the method for manufacturing the memory cell of the SRAM of this second embodiment according to the present invention.
Figure 40A:
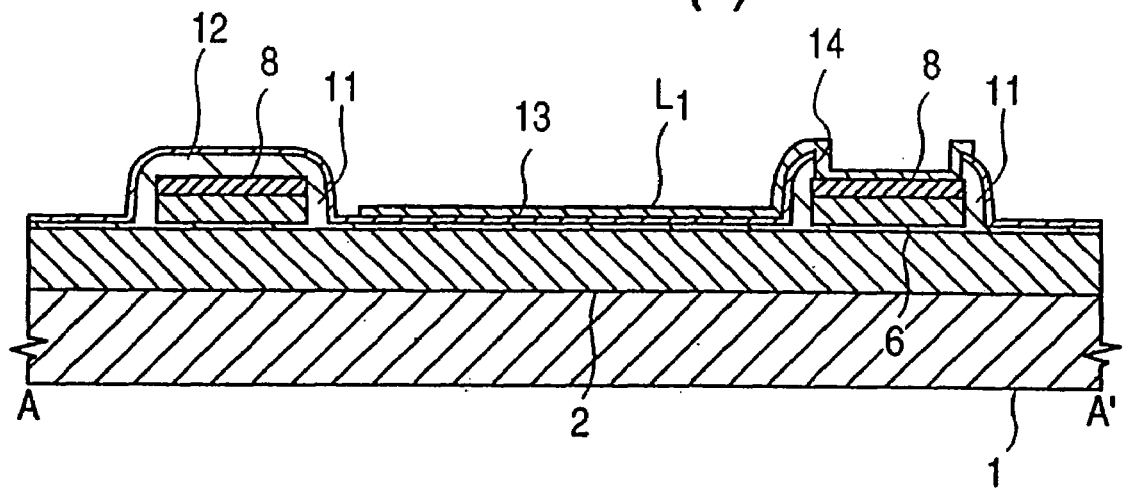
FIGS. 40(a) and 40(b) are sections showing the method for manufacturing the memory cell of the SRAM of this second embodiment according to the present invention.
Figure 40B:
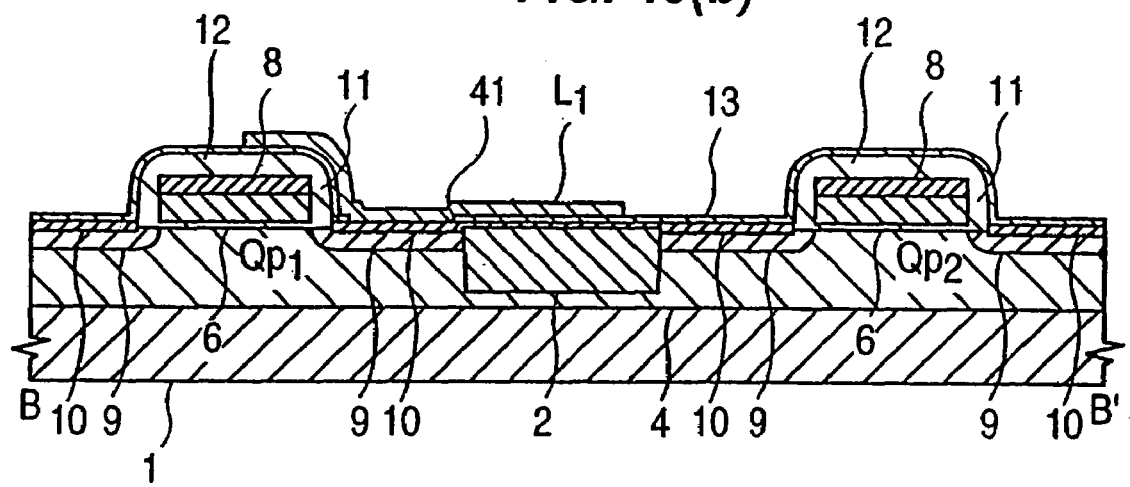

Next, as shown in FIGS. 39 and 40(a) and (b), a local wiring line $L_1$ is formed over the silicon nitride film 13. This local wiring line $L_1$ is formed by patterning a TiN film, having a thickness of about 100 nm and deposited over the silicon nitride film 13 by a sputtering method or a CVD method, by a dry-etching method using a photoresist as the mask. The local wiring line $L_1$ is given an area wide enough to cover the six MISFETs constituting the memory cell. Specifically, the local wiring line $L_1$ is so arranged as to cover the gate electrode 8 of the drive MISFET $Qd_1$ (the load MISFET $Qp_1$), the gate electrode 8 of the drive MISFET $Qd_2$ (the load MISFET $Qp_2$), the gate electrode 7 (the word line W1) of the transfer MISFETs $Qt_1$ and $Qt_2$, the common n-type semiconductor region (one of the source region and the drain region) of the transfer MISFETs $Qt_1$ and $Qt_2$ and the drive MISFETs $Qd_1$ and $Qd_2$, and the p-type semiconductor region 9 (the drain region) of the load MISFETs $Qp_1$ and $Qp_2$.

The local wiring line $L_1$ is connected through the connection hole 14 with the gate electrode 8 of the drive MISFET $Qd_2$ (the load MISFET $Qp_2$), through the connection hole 40 with the n-type semiconductor region 5 (the drain region) of the drive MISFET $Qd_1$, and through the connection hole 41 with the p-type semiconductor region 9 (the drain region) of the load MISFET $Qp_1$.

Figure 41:
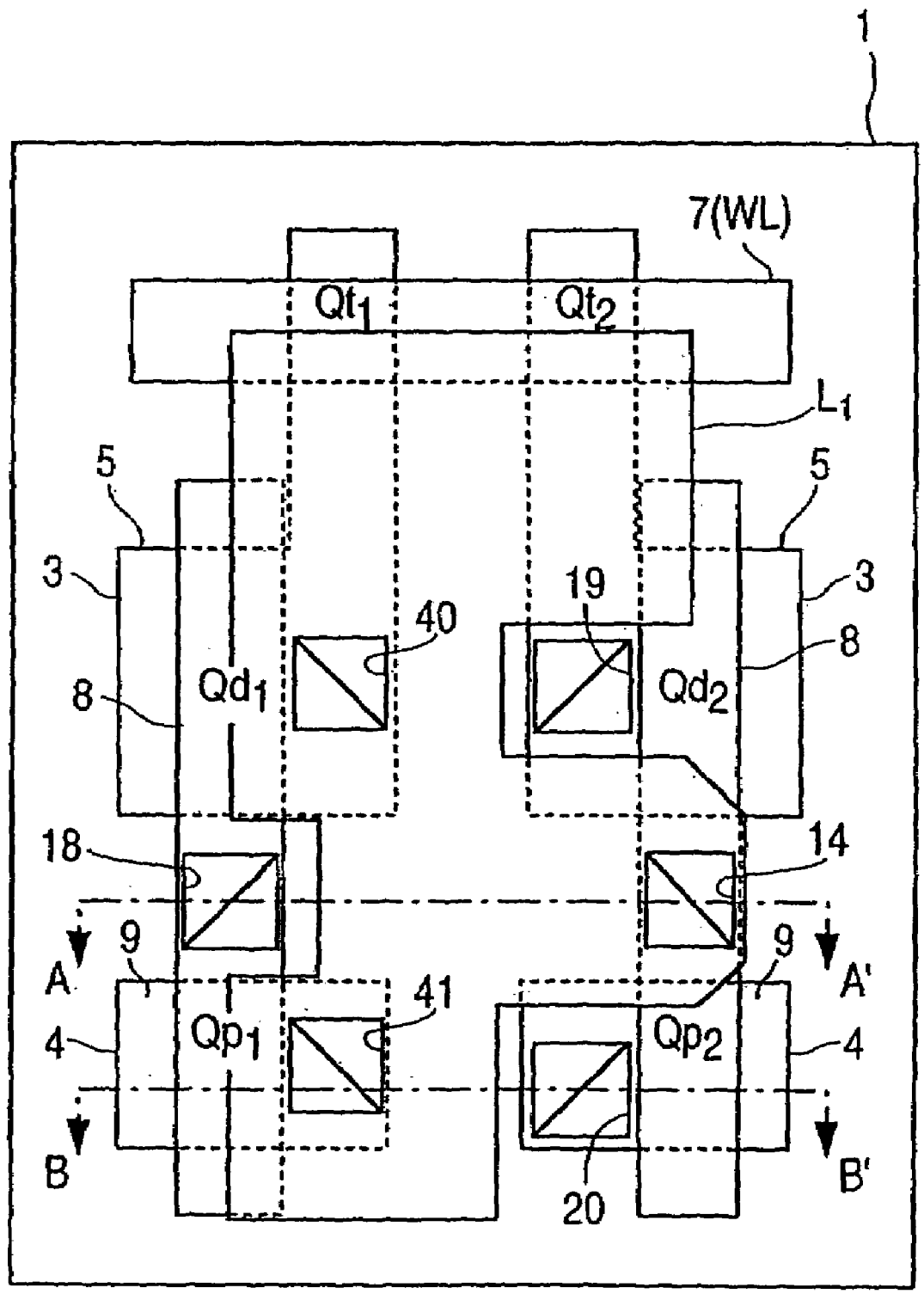
FIG. 41 is a top plan view showing the method for manufacturing the memory cell of the SRAM of this second embodiment according to the present invention.
Figure 42A:
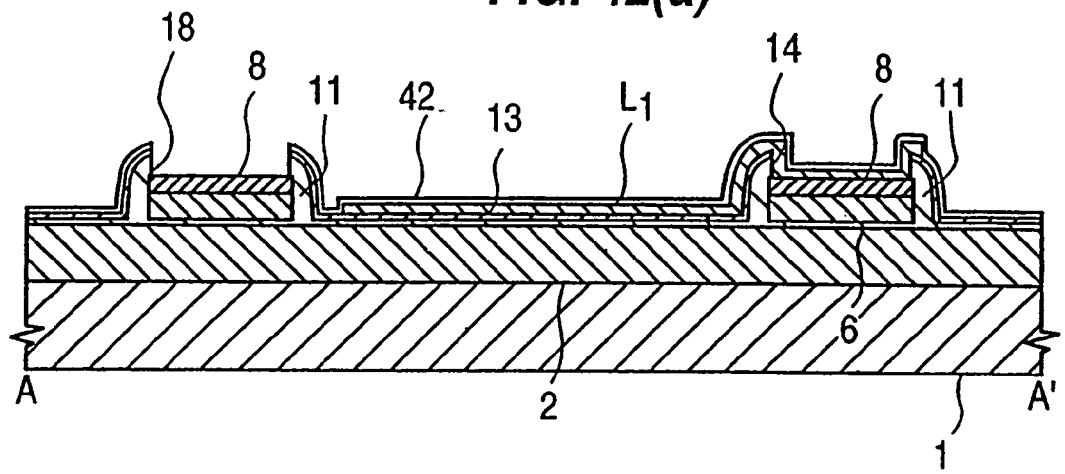
FIGS. 42(a) and 42(b) are sections showing the method for manufacturing the memory cell of the SRAM of this second embodiment according to the present invention.
Figure 42B:
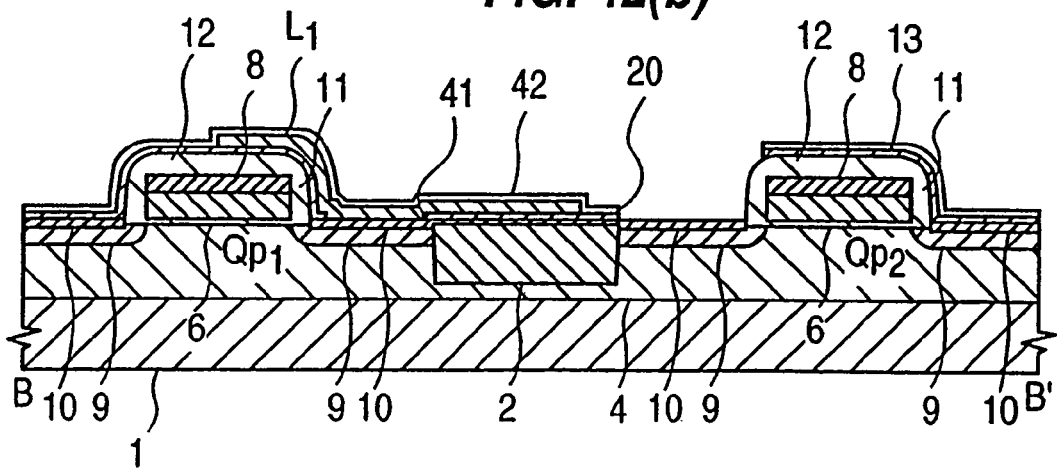

Next, as shown in FIGS. 41 and 42(a) and (b), a silicon nitride film 42 having a thickness of about 30 nm is deposited over the local wiring line $L_1$. After this, the silicon nitride films 17 and 13 and the silicon oxide film 12 over the gate electrode 8 of the drive MISFET $Qd_1$ (the load MISFET $Qp_1$) are opened to form a connection hole 18 by a dry-etching method using a photoresist as the mask. Simultaneously with this, the silicon nitride films 17 and 13 over the n-type semiconductor region 5 (the drain region) of the drive MISFET $Qd_2$ are etched to form the connection hole 19, and the silicon nitride films 17 and 13 over the p-type semiconductor region 9 (the drain region) of the load MISFET $Qp_2$ are etched to form a connection hole 20.

Figure 43:
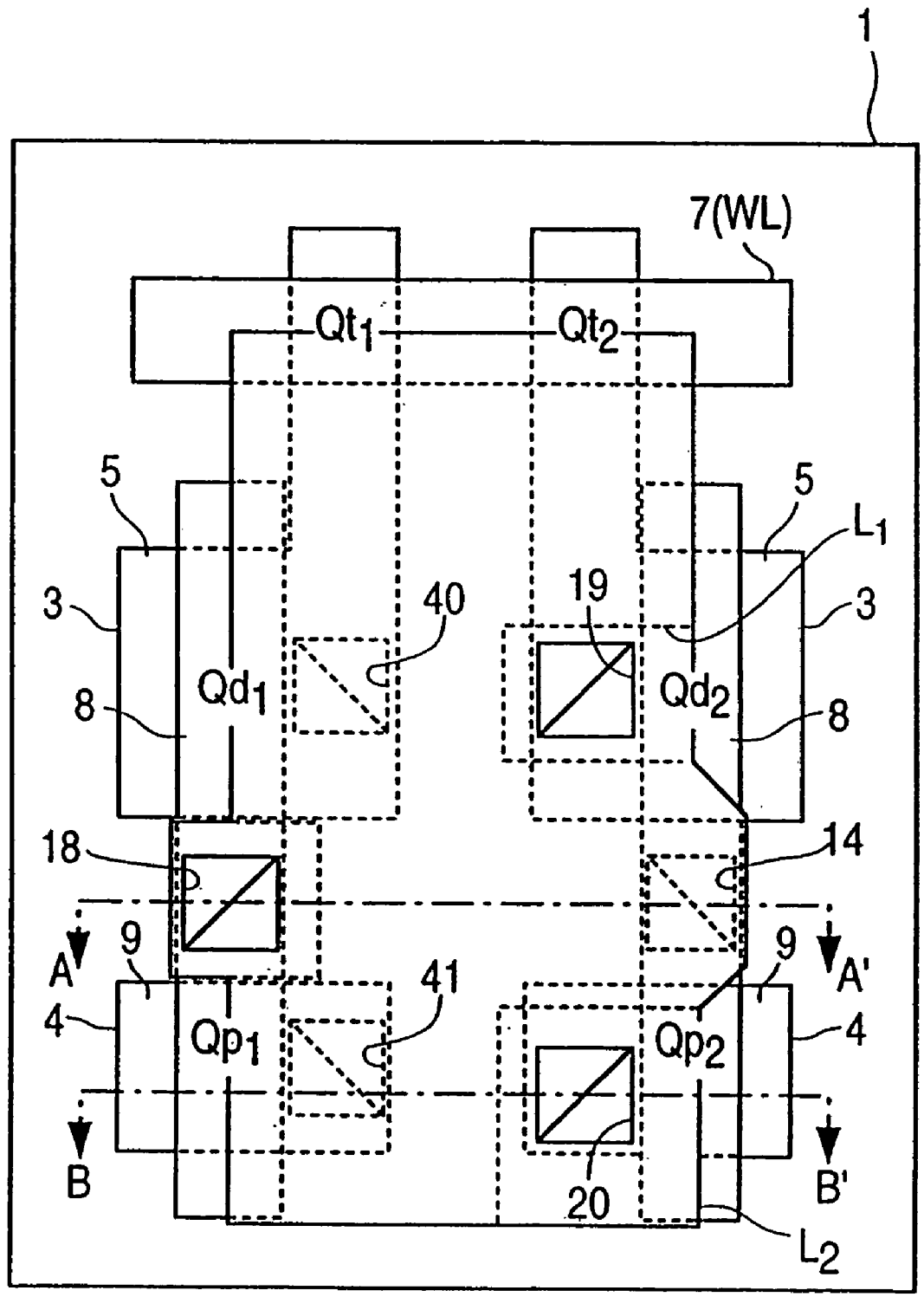
FIG. 43 is a top plan view showing the method for manufacturing the memory cell of the SRAM of this second embodiment according to the present invention.
Figure 44A:
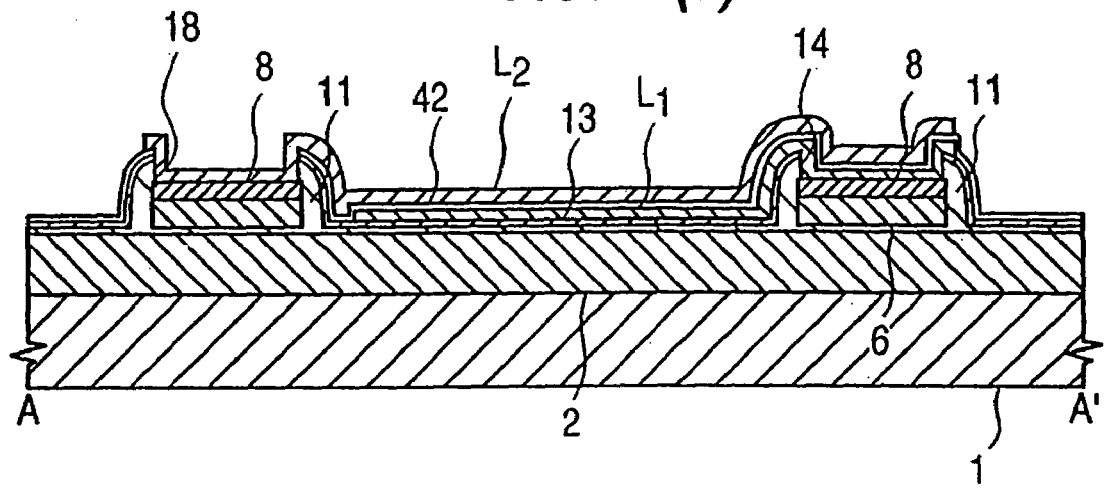
FIGS. 44(a) and 44(b) are sections showing the method for manufacturing the memory cell of the SRAM of this second embodiment according to the present invention.
Figure 44B:
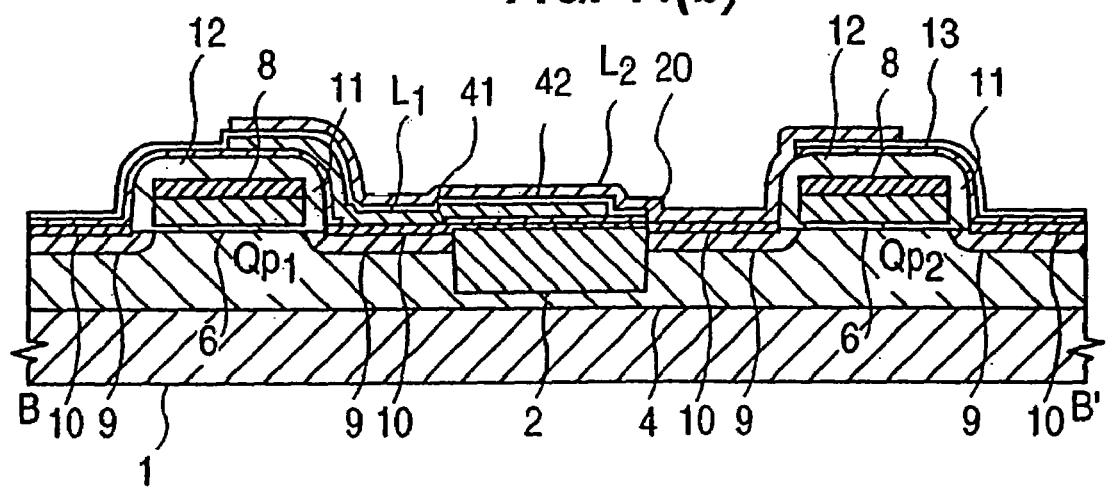

Next, as shown in FIGS. 43 and 44(a) and (b), a local wiring line $L_2$ is formed over the silicon nitride film 42. This local wiring line $L_2$ is formed by patterning the TiN film, which is so deposited as to have a thickness of about 100 nm by a sputtering method or a CVD method, by a dry-etching method using a photoresist as the mask. The local wiring line $L_2$ can be made of not only TiN but also a refractory metal such as W or a refractory metal silicide such as W-silicide.

The local wiring line $L_2$ is connected through the connection hole 18 with the gate electrode 8 of the drive MISFET $Qd_1$ (the load MISFET $Qp_1$), through the connection hole 19 with the n-type semiconductor region 5 (the drain region) of the drive MISFET $Qd_2$, and through the connection hole 20 with the p-type semiconductor region 9 (the drain region) of the load MISFET $Qp_1$.

The local wiring line $L_2$ is so formed over the lower local wiring line $L_1$ as to have an area wide enough to cover the six MISFETs constituting the memory cell and is substantially completely superposed on the local wiring line $L_1$ in the region excepting the open regions of the connection holes 18, 19 and 20 and their registration allowance region. As a result, the capacitor element C can be composed of both the local wiring lines $L_1$ and $L_2$ and the silicon nitride film 42 (the dielectric film) interposed therebetween and made thinner than the local wiring lines $L_1$ and $L_2$, and can be given a large capacitance, so that the amount of stored charge of the storage node can be increased to improve the alpha particle soft error resistance of the memory cell. If, moreover, the thin insulating film, interposed between the local wiring lines $L_1$ and $L_2$, is made of a highly dielectric material such as tantalum pentoxide ($Ta_2O_5$), the amount of stored charge of the storage node can be further increased.

Figure 45:
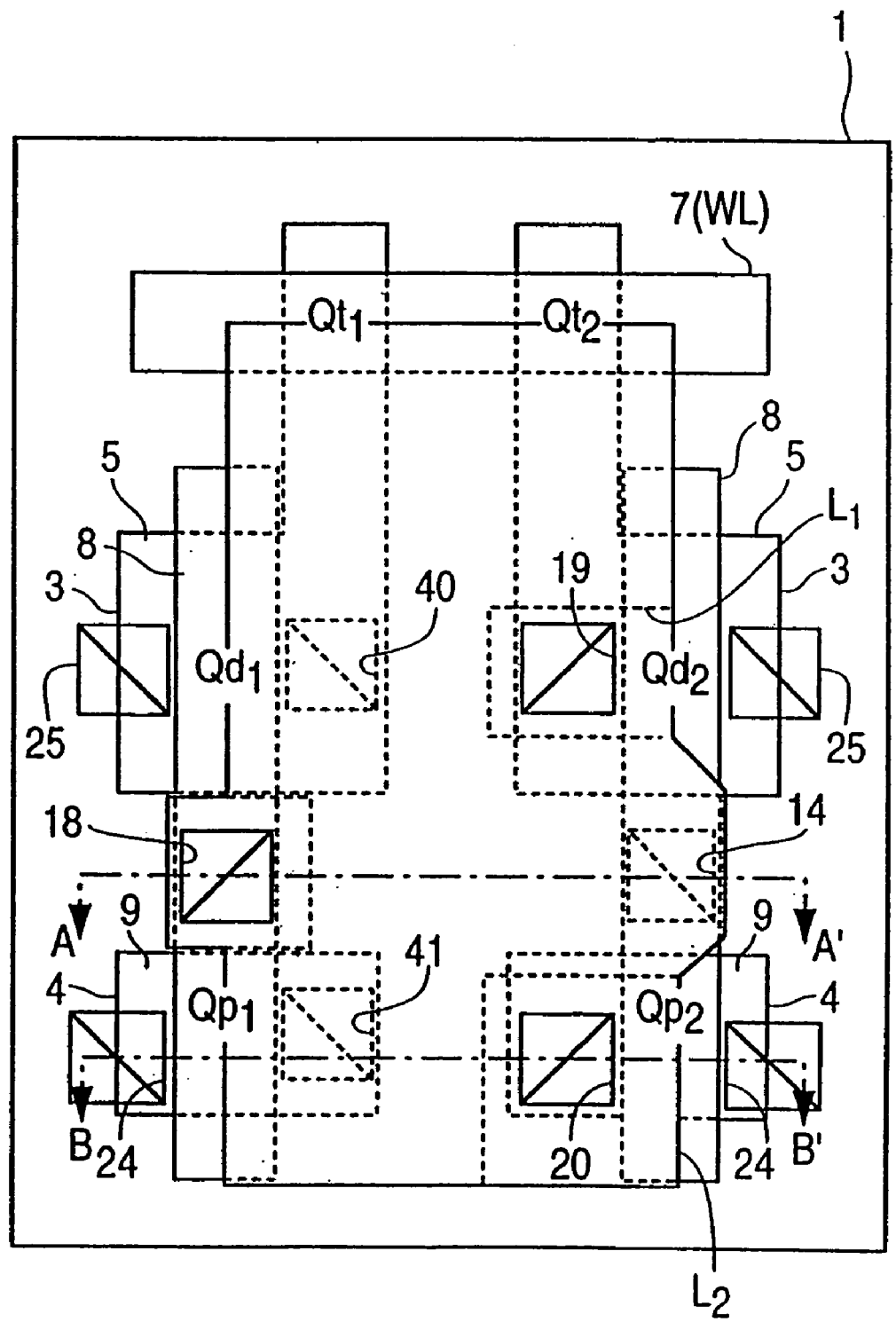
FIG. 45 is a top plan view showing the method for manufacturing the memory cell of the SRAM of this second embodiment according to the present invention.
Figure 46A:
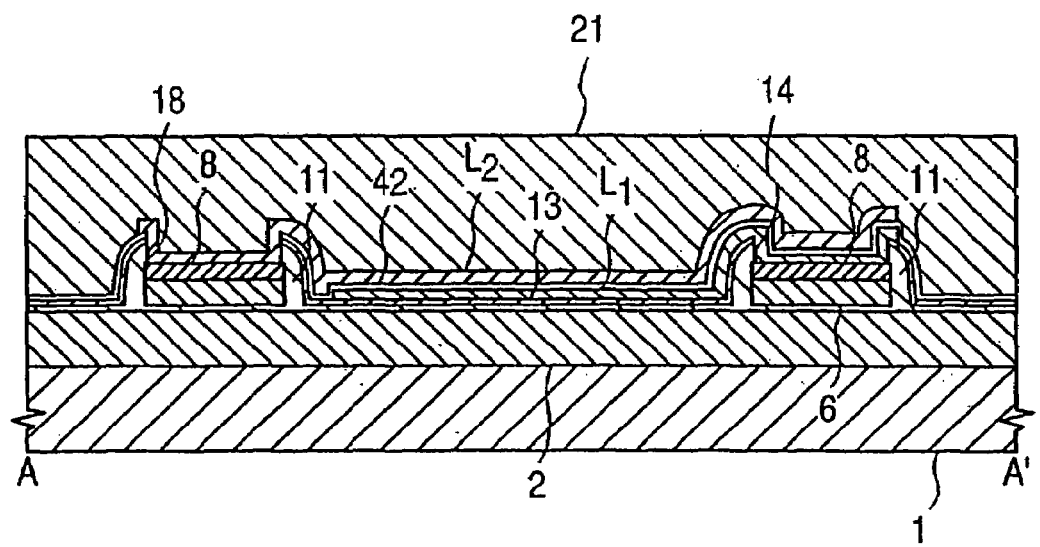
FIGS. 46(a) and 46(b) are sections showing the method for manufacturing the memory cell of the SRAM of this second embodiment according to the present invention.
Figure 46B:
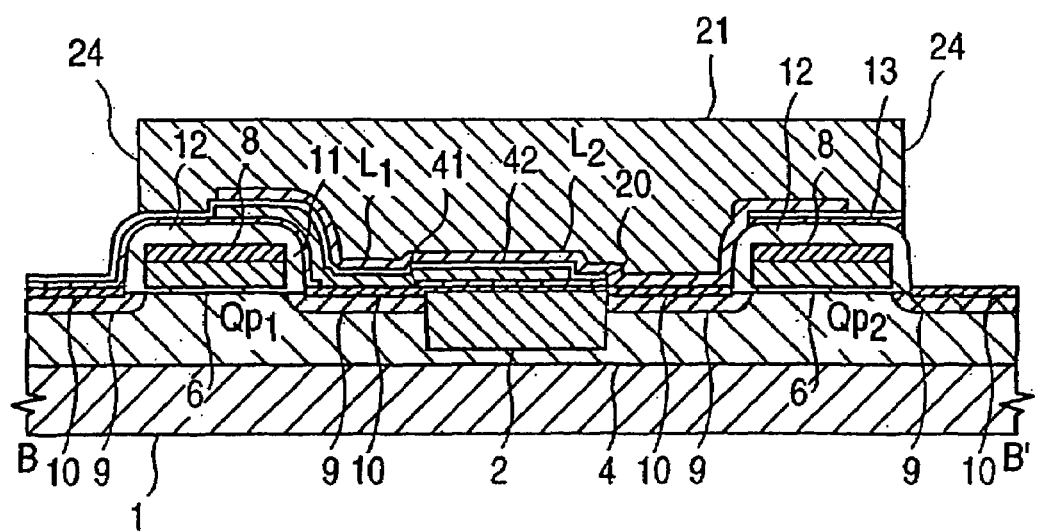

Next, as shown in FIGS. 45 and 46(a) and (b), an interlayer insulating film 21 made of silicon oxide is deposited over the local wiring line $L_2$ by a CVD method. After this, the interlayer insulating film 21 and the silicon nitride films 17 and 13 over the individual p-type semiconductor regions 9 and 9 (the source regions) of the load MISFETs $Qp_1$ and $Qp_2$ are opened to form connection holes 24 and 24 by a dry-etching method using a photoresist as the mask. Simultaneously with this, the interlayer insulating film 21 and the silicon nitride films 17 and 13 over the individual n-type semiconductor regions 5 and 5 (the source regions) of the drive MISFETs $Qd_1$ and $Qd_2$ are opened to form connection holes 25 and 25.

Figure 47:
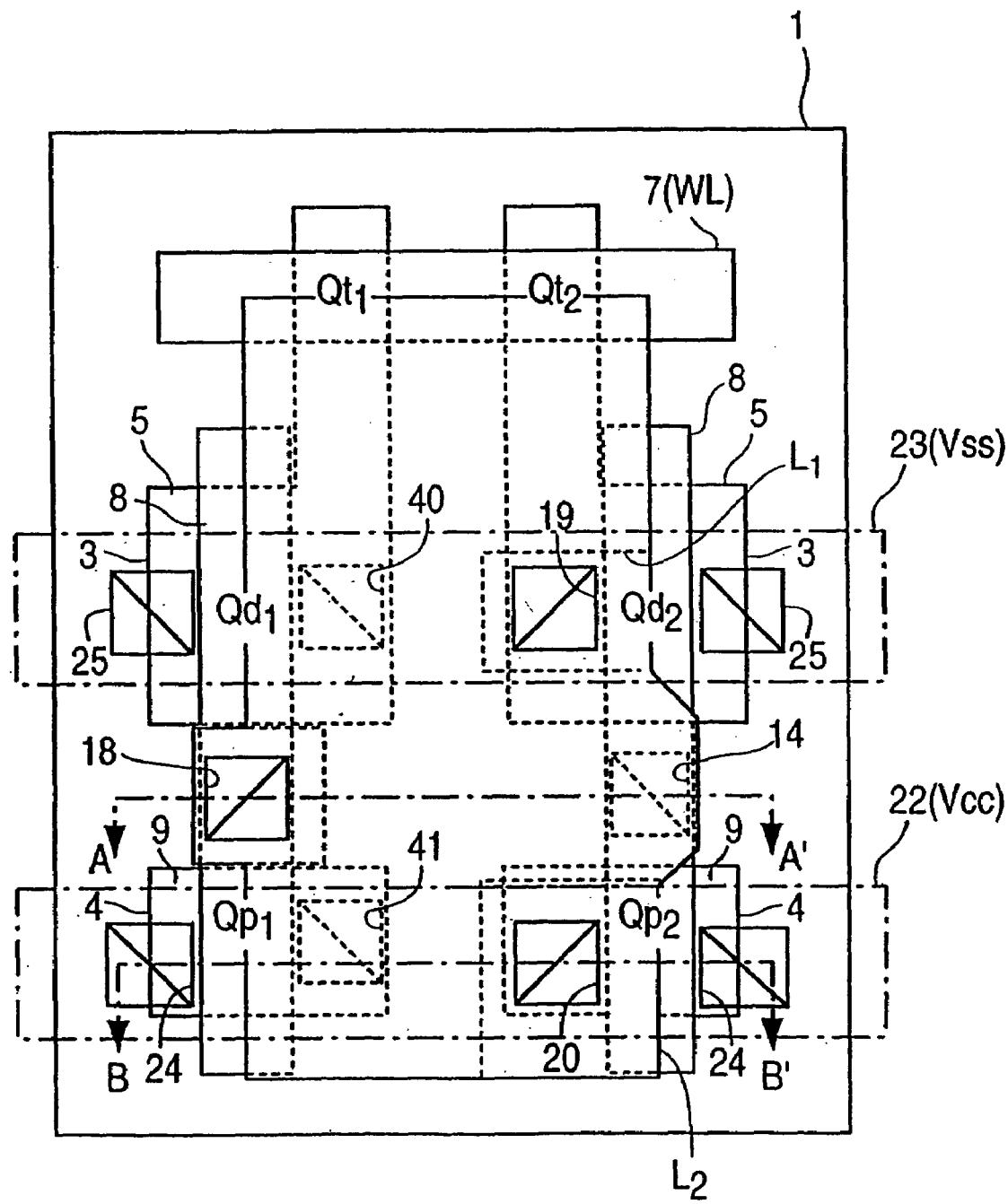
FIG. 47 is a top plan view showing the method for manufacturing the memory cell of the SRAM of this second embodiment according to the present invention.
Figure 48A:
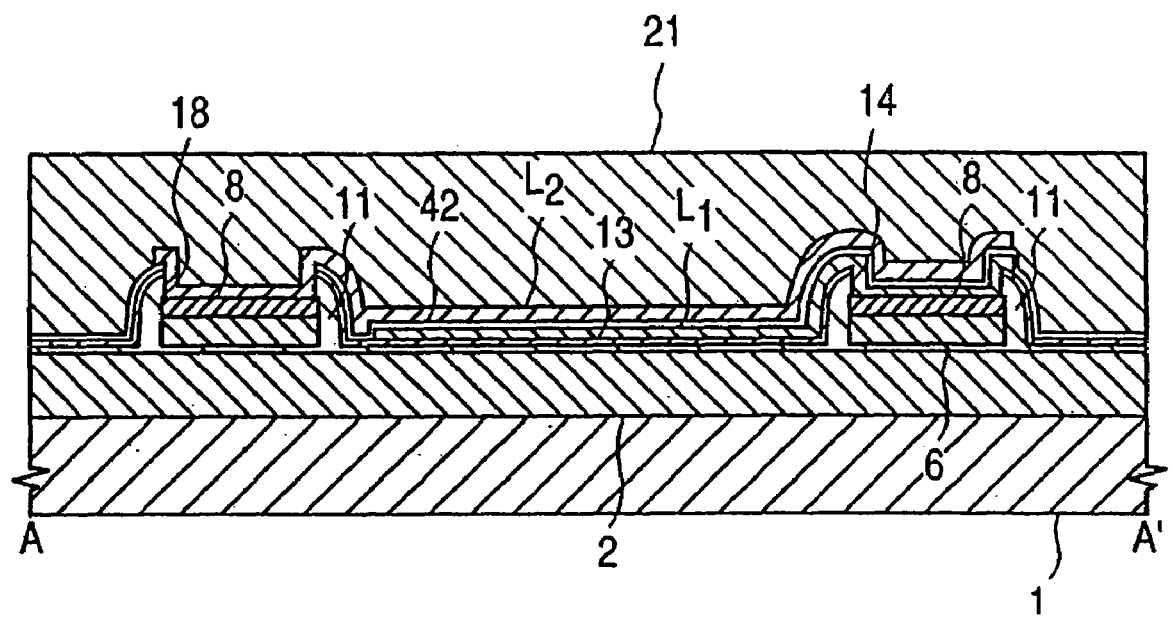
FIGS. 48(a) and 48(b) are sections showing the method for manufacturing the memory cell of the SRAM of this second embodiment according to the present invention.
Figure 48B:
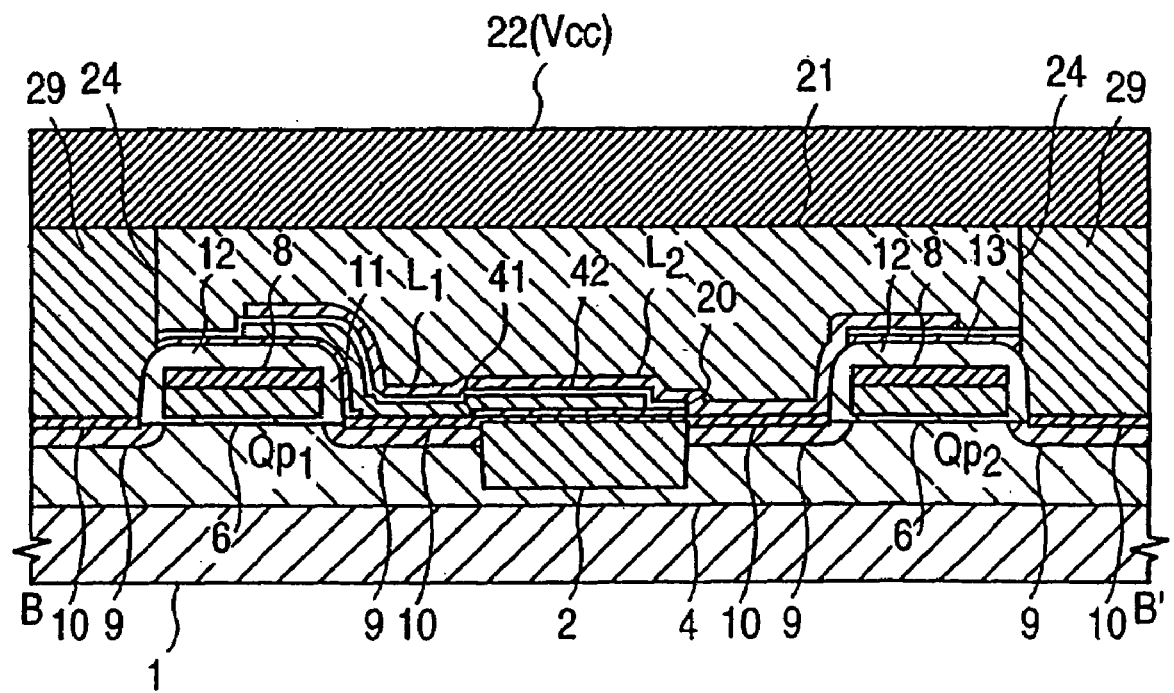

Next, as shown in FIGS. 47 and 48(a) and (b), W-films are buried in the connection holes 24 and 25 to form plugs 29, and power supply voltage line 22 and reference voltage line 23 are then formed over the interlayer insulating film 21. These power supply and reference voltage lines 22 and 23 are formed by depositing a TiN film, an Al film and a TiN film consecutively over the interlayer insulating film 21 by a sputtering method, and then by patterning those films.

After this, an interlayer insulating film 26 of silicon oxide is deposited over the power supply voltage line 22 and the reference voltage line 23 by a CVD method. After this, the interlayer insulating films 26 and 21 and the silicon nitride films 17 and 13 over the individual n-type semiconductor regions 5 and 5 (the drain regions) of the transfer MISFETs $Qt_2$ and $Qt_2$ are opened to form connection holes 27 and 27 by a dry-etching method using a photoresist as the mask. Subsequently, W-films are buried in the connection holes 27 and 27 to form plugs, and the data lines DL and DL are then formed over the interlayer insulating film 26. These data lines DL and DL are formed by depositing a TiN film, an Al film and a TiN film consecutively over the interlayer insulating film 26 by a sputtering method and then by patterning those films. The memory cell, as shown in FIGS. 33 to 35, is thus completed by the steps described.

EMBODIMENT 3

In the SRAM of the present embodiment, the paired local wiring lines $L_1$ and $L_2$ cross-connecting the input/output terminals of the flip-flop circuit of the memory cell are formed in the same conductive layer. The method for manufacturing the memory cell of this SRAM will be described with reference to FIGS. 49 to 64. Of the individual Figures showing the memory cell manufacturing method, sections are taken along line C–C' of the top plan views. Moreover, the individual top plan views show only the conductive layers and the connection holes but do not show the insulating films.

Figure 49:
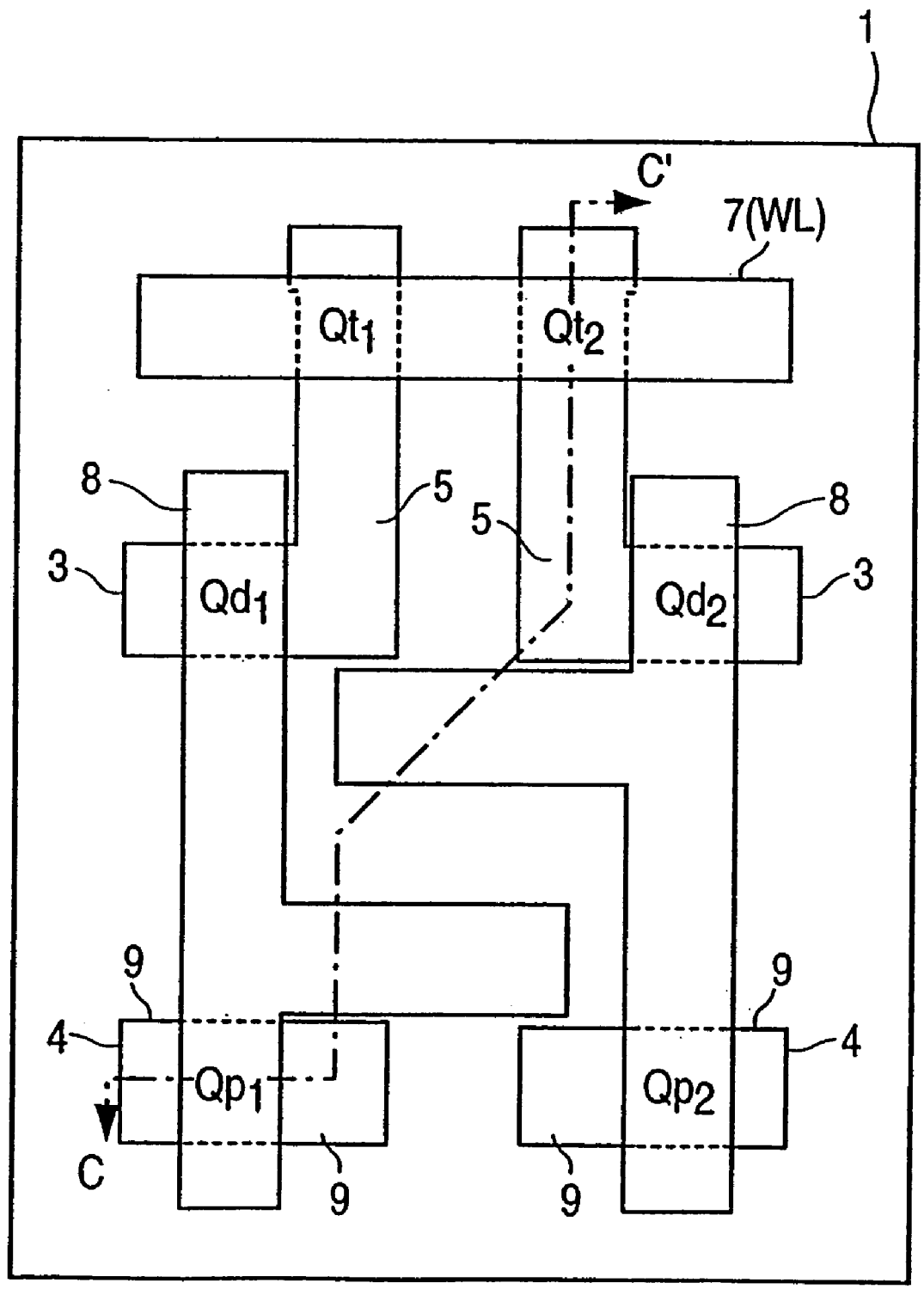
FIG. 49 is a top plan view showing a method for manufacturing a memory cell of an SRAM of a third embodiment according to the present invention.
Figure 50:
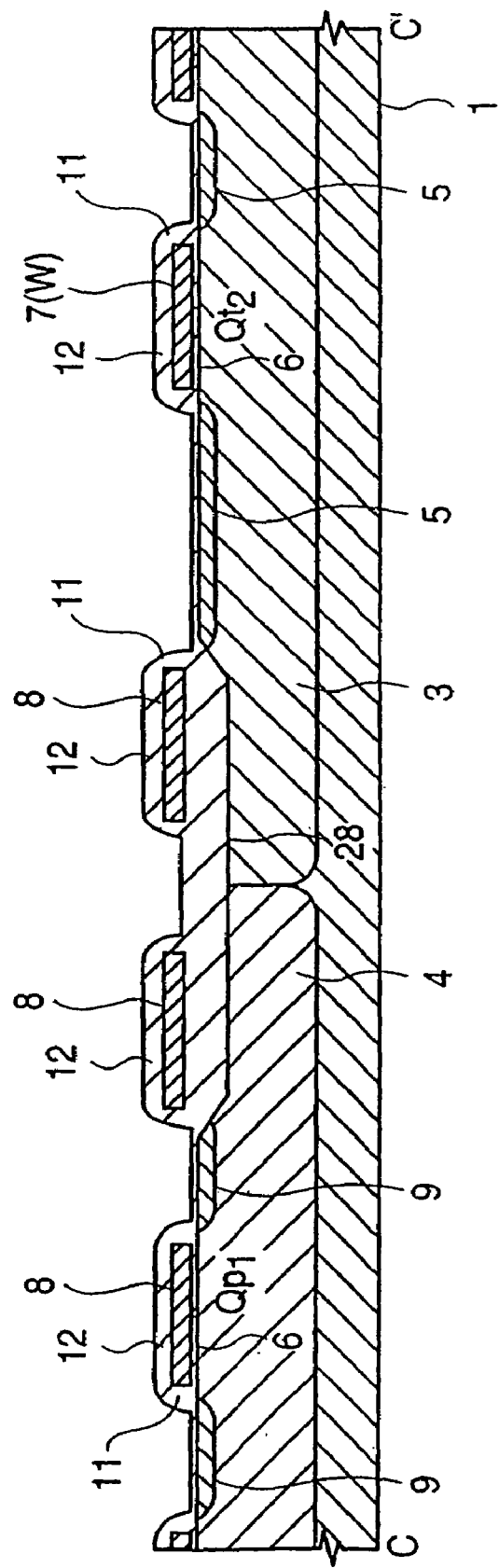
FIG. 50 is a section showing the method for manufacturing the memory cell of the SRAM of this third embodiment according to the present invention.

First of all, as shown in FIGS. 49 and 50, a p-type well 3 and a n-type well 4 are formed over the principal face of a semiconductor substrate 1, and an element isolating field oxide film 28 and a gate oxide film 6 of a MISFET are then formed over those surfaces. After this, drive MISFETs $Qd_1$ and $Qd_2$ and transfer MISFETs $Qt_1$ and $Qt_2$ are formed in the p-type well 3, and load MISFETs $Qp_1$ and $Qp_2$ are formed in the n-type well 4. A gate electrode 7 (the word line WL) of the transfer MISFETs $Qt_1$ and $Qt_2$ and gate electrodes 8 and 8 of the drive MISFETs $Qd_1$ and $Qd_2$ (the load MISFETs $Qp_1$ and $Qp_2$) are formed of a polycrystalline silicon film having a thickness of about 300 nm. Side wall spacers on the individual side walls of the gate electrode 7 (the word line WL) and the gate electrode 8 are formed by etching a silicon oxide film.

Figure 51:
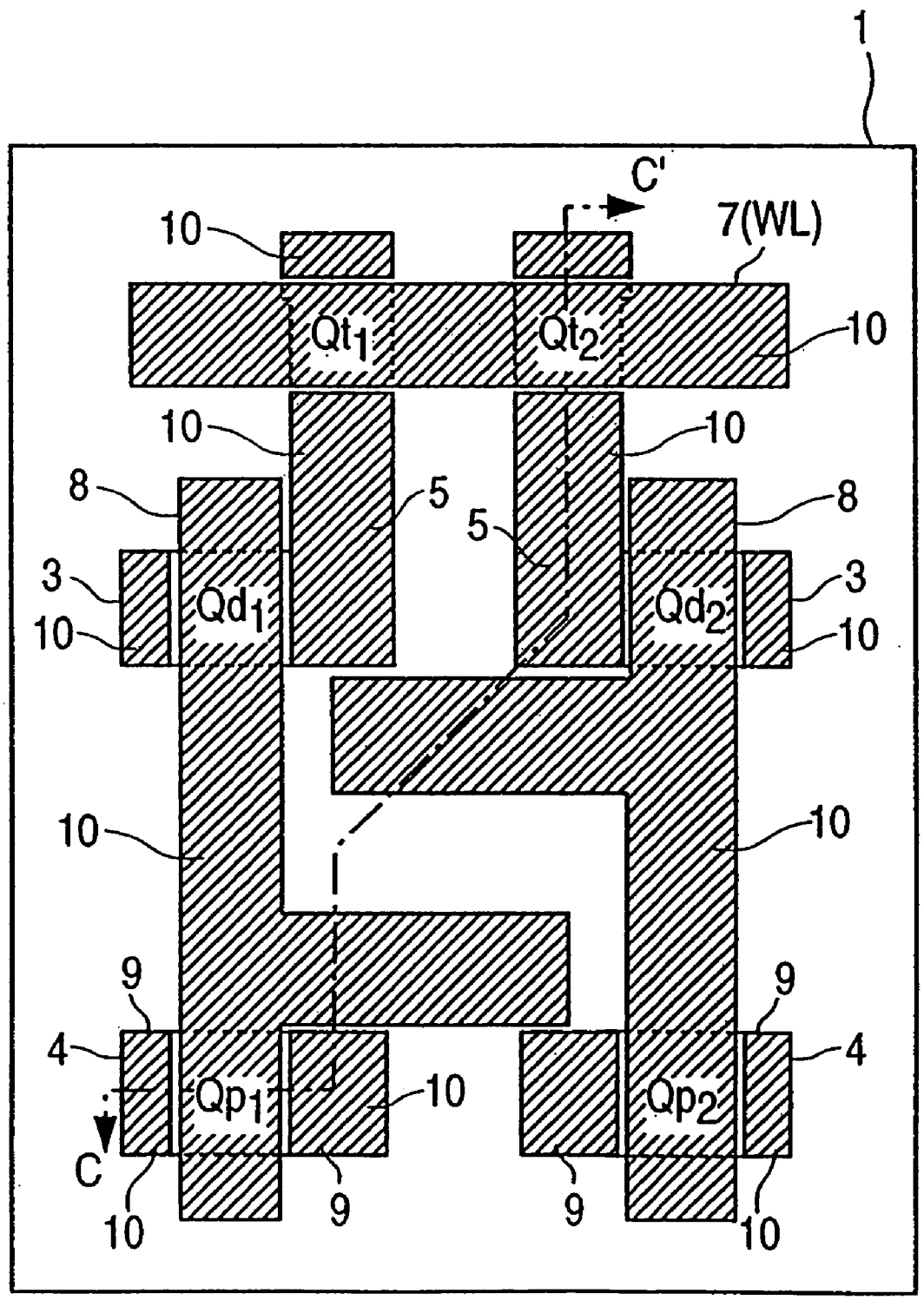
FIG. 51 is a top plan view showing the method for manufacturing the memory cell of the SRAM of this third embodiment according to the present invention.
Figure 52:
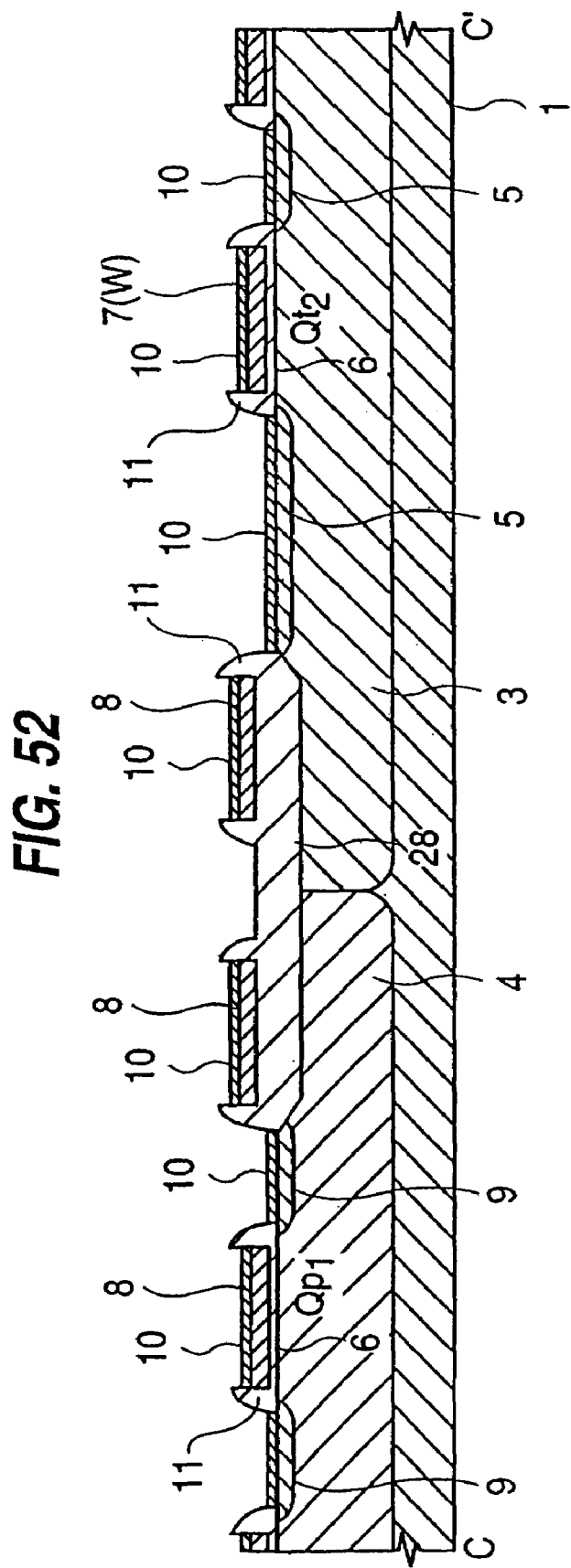
FIG. 52 is a section showing the method for manufacturing the memory cell of the SRAM of this third embodiment according to the present invention.

Next, as shown in FIGS. 51 and 52, in order to reduce the sheet resistance, a Ti-silicide layer 10 is formed on the individual surfaces of the gate electrode 7 (the word line WL) of the transfer MISFETs $Qt_1$ and $Qt_2$, the gate electrodes 8 and 8 of the drive MISFETs $Qd_1$ and $Qd_2$ (the load MISFETs $Qp_1$ and $Qp_2$), individual n-type semiconductor regions 5 and 5 (the source region and the drain region) of the transfer MISFETs $Qt_1$ and $Qt_2$ and the drive MISFETs $Qd_1$ and $Qt_2$, and individual p-type semiconductor regions 9 and 9 of the load MISFETS $Qp_1$ and $Qp_2$.

In order to form the Ti-silicide layer 10, a silicon oxide film 12 covering the individual surfaces of the gate electrode 7 (the word line WL) and the gate electrode 8, a gate oxide film 6 covering the surfaces of the individual n-type semiconductor regions 5 and 5 (the source region and the drain region) of the drive MISFETs $Qd_1$ and $Qd_2$ and the transfer MISFETs $Qt_1$ and $Qt_2$, and a gate oxide film 6 covering the surfaces of the individual p-type semiconductor regions 9 and 9 (the source region and the drain region) of the load MISFETs $Qp_1$ and $Qp_2$ are etched. After this, a Ti-film is deposited over the semiconductor substrate 1 by sputtering. Next, the semiconductor substrate 1 is annealed to cause reactions individually between the Ti-film and the semiconductor substrate 1 (the n-type semiconductor region 5 and the p-type semiconductor region 9) and between the Ti-film and the polycrystalline silicon film (the gate electrodes 7 and 8), and the unreacted Ti-film is then etched away.

Figure 53:
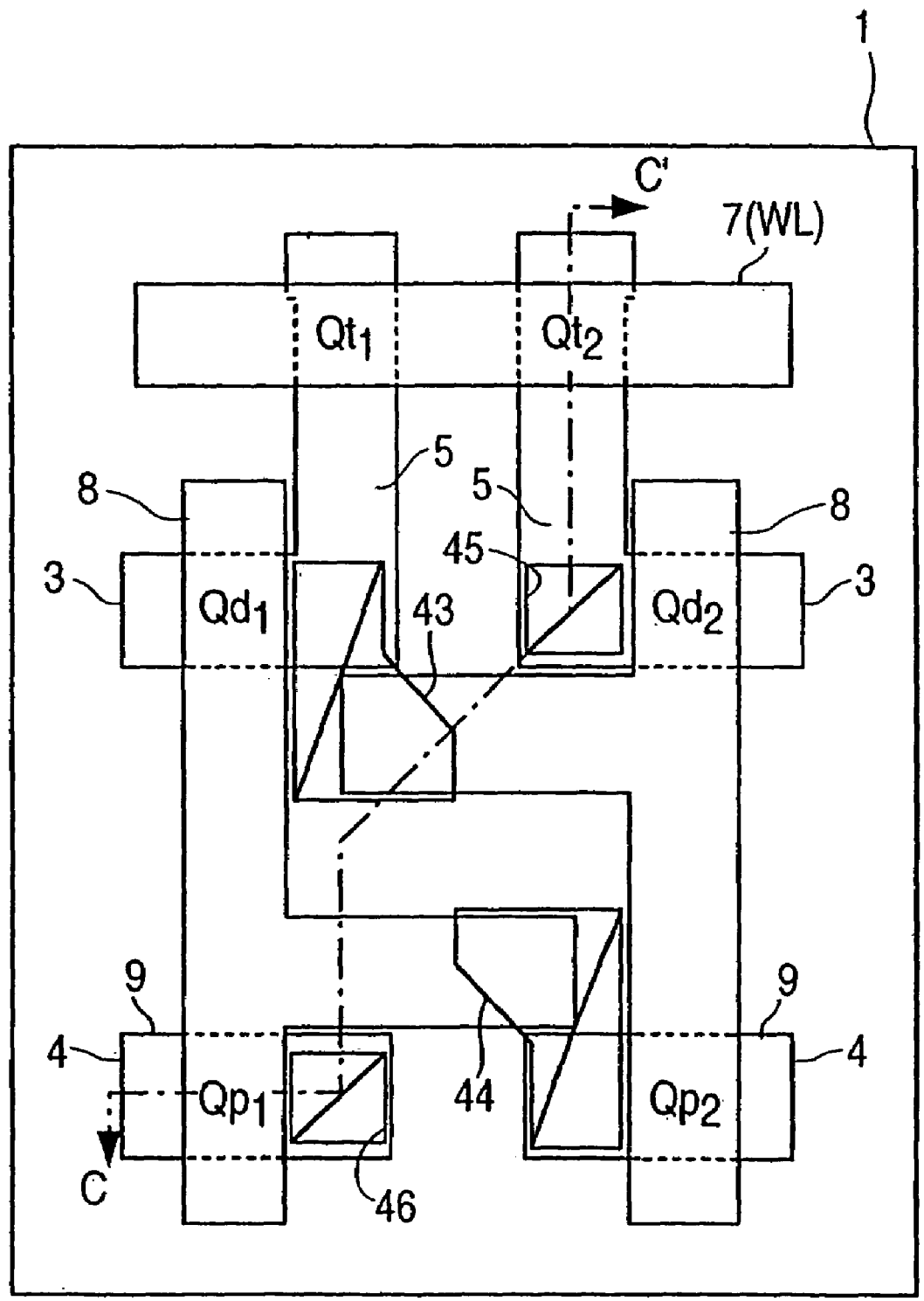
FIG. 53 is a top plan view showing the method for manufacturing the memory cell of the SRAM of this third embodiment according to the present invention.
Figure 54:
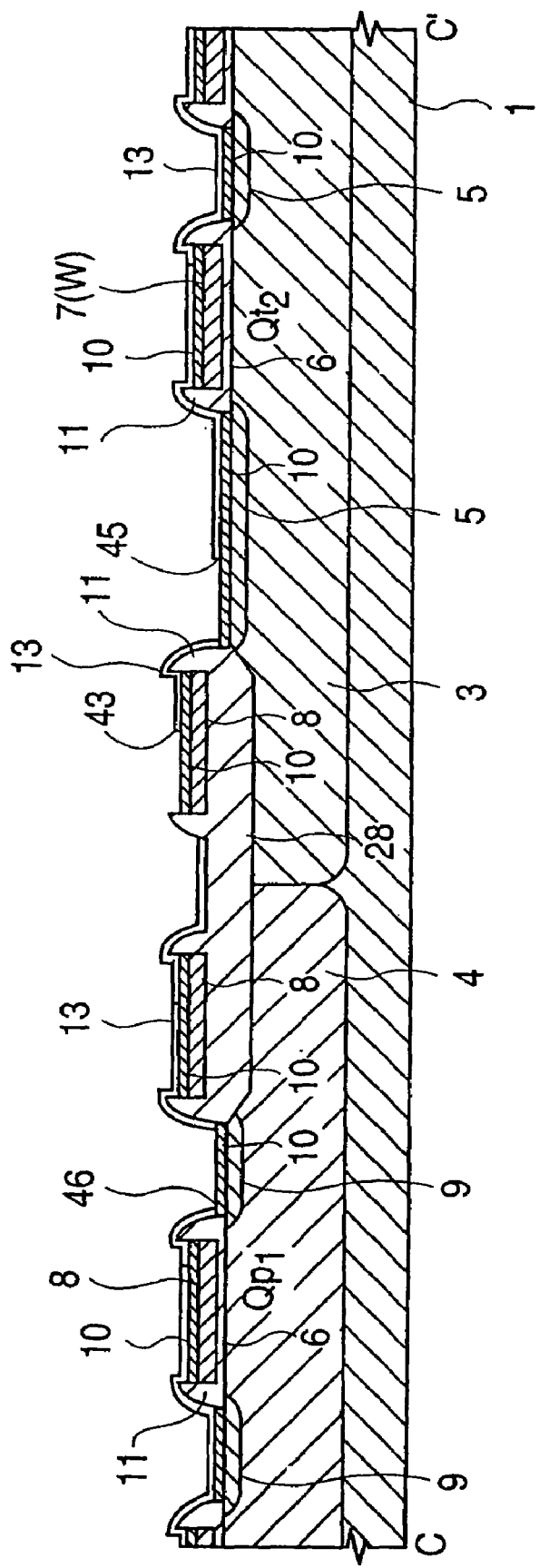
FIG. 54 is a section showing the method for manufacturing the memory cell of the SRAM of this third embodiment according to the present invention.

Next, as shown in FIGS. 53 and 54, a silicon nitride film 13, as thin as about 30 nm, is deposited over the semiconductor substrate 1 by a CVD method. After this, the silicon nitride film 13 is dry-etched by using a photoresist as the mask to form a connection hole 43, which reaches the n-type semiconductor region 5 (the drain region) of the drive MISFET $Qd_1$ and the gate electrode 8 of the drive MISFET $Qd_2$ (the load MISFET $Qp_2$), and a connection hole 44 which reaches the p-type semiconductor region 9 (the drain region) of the load MISFET $Q_2$ and the gate electrode 8 of the drive MISFET $Qd_1$ (the load MISFET $Qp_1$). Simultaneously with this, a connection hole 45 is formed over the n-type semiconductor region 5 (the drain region) of the drive MISFET $Qd_2$, and a connection hole 46 is formed over the p-type semiconductor region 9 (the drain region) of the load MISFET $Qp_1$. At this time, the surface of a field oxide film 28 is covered with the silicon nitride film 13, so that it is not removed by the dry-etching treatment.

Figure 55:
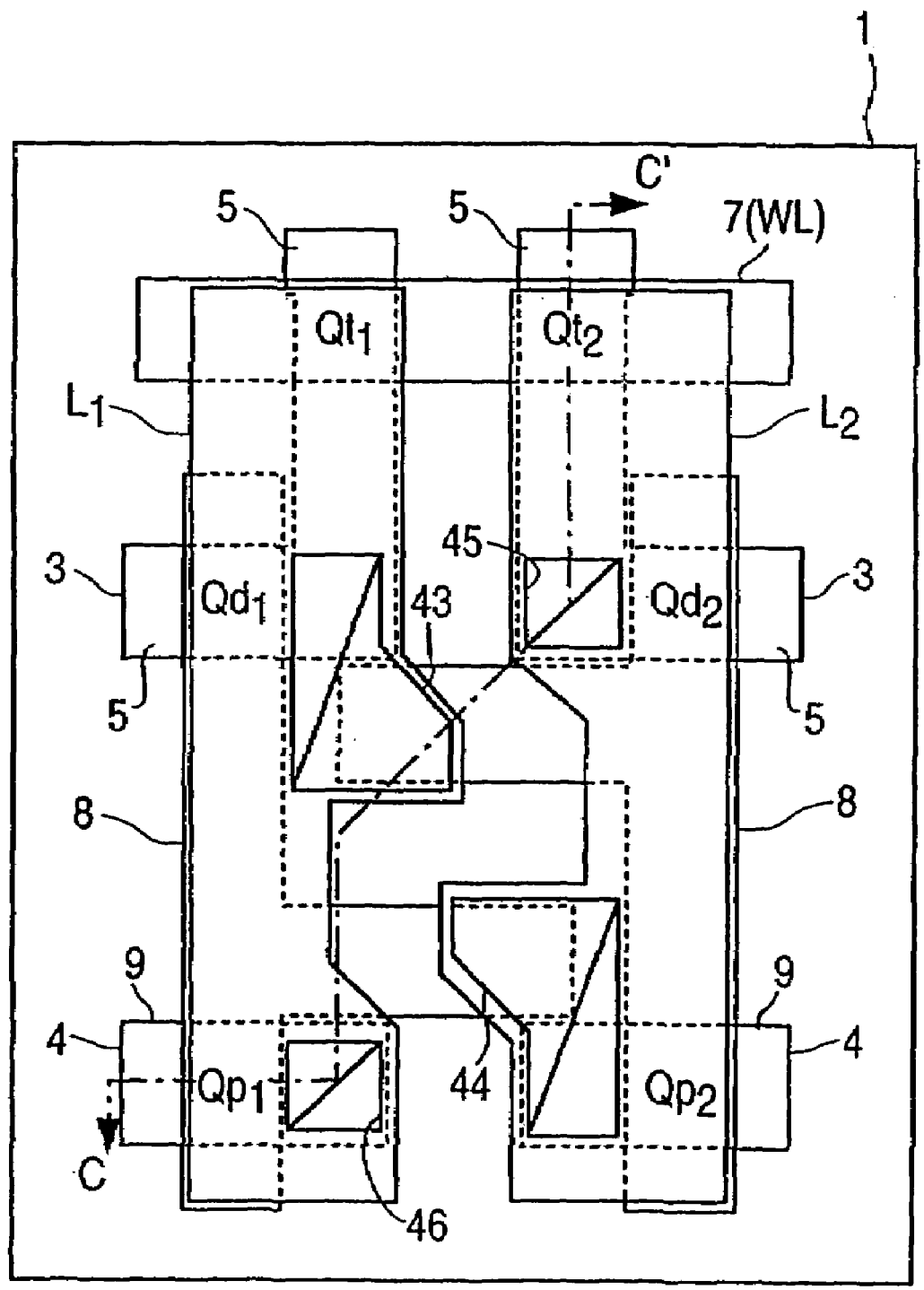
FIG. 55 is a top plan view showing the method for manufacturing the memory cell of the SRAM of this third embodiment according to the present invention.
Figure 56:
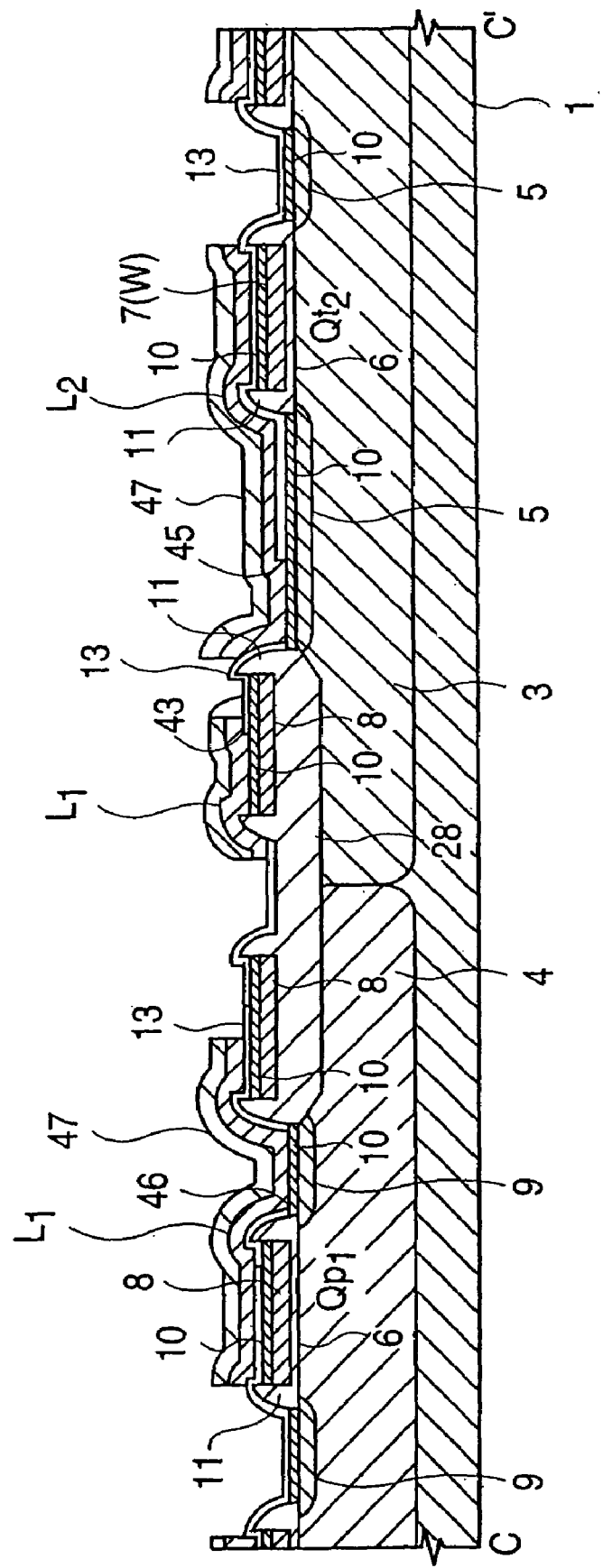
FIG. 56 is a section showing the method for manufacturing the memory cell of the SRAM of this third embodiment according to the present invention.

Next, as shown in FIGS. 55 and 56, the paired local wiring lines $L_1$ and $L_2$, composed of a TiN film, are formed over the silicon nitride film 13. For forming these local wiring lines $L_1$ and $L_2$, a TiN film having a thickness of about 50 to 100 nm is deposited over the silicon nitride film 13 by a sputtering method or a CVD method. Next, a silicon nitride film 47 having a thickness of about 100 nm is deposited over the TiN film by a CVD method. After this, the silicon nitride film 47 and the TiN film are patterned by a dry-etching method using a photoresist as the mask. The local wiring lines $L_1$ and $L_2$ can be made of not only TiN but also a refractory metal such as W or a refractory metal silicide such as a W-silicide.

The local wiring line $L_1$ is so arranged as to overlap with the gate electrode 8 of the drive MISFET $Qd_1$ (the load MISFET $Qp_1$) and the gate electrode 7 (the word line WL) of the transfer MISFETs $Qt_1$ and $Qt_2$, and the local wiring line $L_2$ is so arranged as to overlap with the gate electrode 8 of the drive MISFIT $Qd_2$ (the load MISFET $Qp_2$) and the gate electrode 7 (the word line WL) of the transfer MISFETs $Qt_1$ and $Qt_2$. Thanks to this construction, a capacitor element C' is composed of the local wiring line $L_1$, the gate electrode 8 and the thin silicon nitride film 13 interposed therebetween, and a capacitor element C' is formed of the local wiring line $L_2$, the gate electrode 8 and the silicon nitride film 13 interposed therebetween, so that the charge storage capacity of the storage node can be increased to improve the alpha particle soft error resistance of the memory cell. These capacitor elements C' act effectively similarly to those of the capacitor element C of the foregoing embodiment 2 (of FIG. 36).

The local wiring line $L_1$ is connected through the connection hole 43 with the n-type semiconductor region 5 (the drain region) of the drive MISFET $Qd_1$ and the gate electrode 8 of the drive MISFET $Qd_2$ (the load MISFET $Qp_2$), and through the connection hole 46 with the p-type semiconductor region 9 (the drain region) of the load MISFET $Qp_1$. In other words, the gate electrode 8 of the drive MISFET $Qd_2$ (the load MISFET $Qp_2$), the n-type semiconductor region 5 (the drain region) of the drive MISFET $Qd_1$, and the p-type semiconductor region 9 (the drain region) of the load MISFET $Qp_1$ are connected with one another through the local wiring line $L_1$.

The local wiring line $L_2$ is connected through the connection hole 44 with the p-type semiconductor region 9 (the drain region) of the load MISFET $Qp_2$ and the gate electrode 8 of the drive MISFET $Qd_1$ (the load MISFET $Qp_1$), and through the connection hole 45 with the n-type semiconductor region 5 (the drain region) of the drive MISFET $Qd_2$. In other words, the gate electrode 8 of the drive MISFET $Qd_1$ (the load MISFET $Qp_1$), the n-type semiconductor region 5 (the drain region) of the drive MISFET $Qd_2$, and the p-type semiconductor region 9 (the drain region) of the load MISFET $Qp_2$ are connected with one another through the local wiring line $L_2$.

Figure 57:
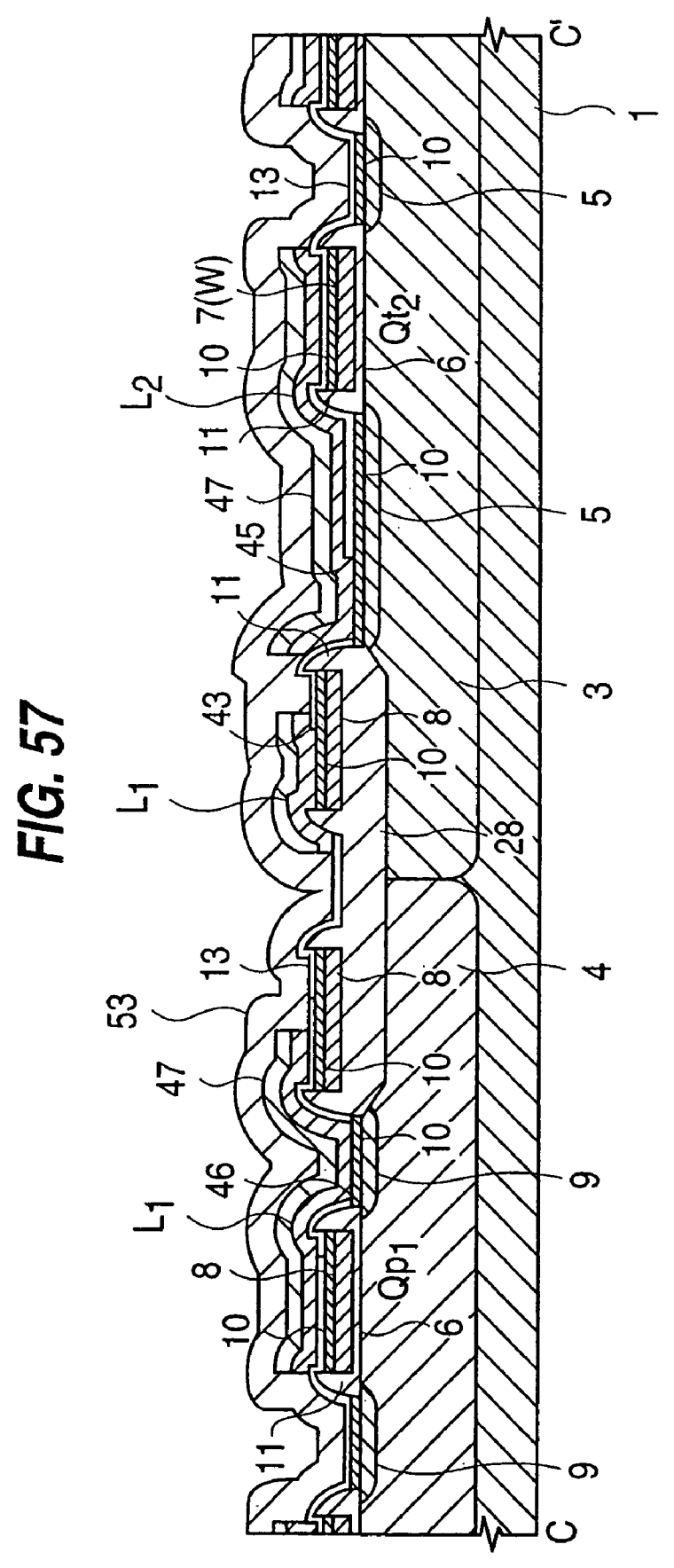
Figure 58:
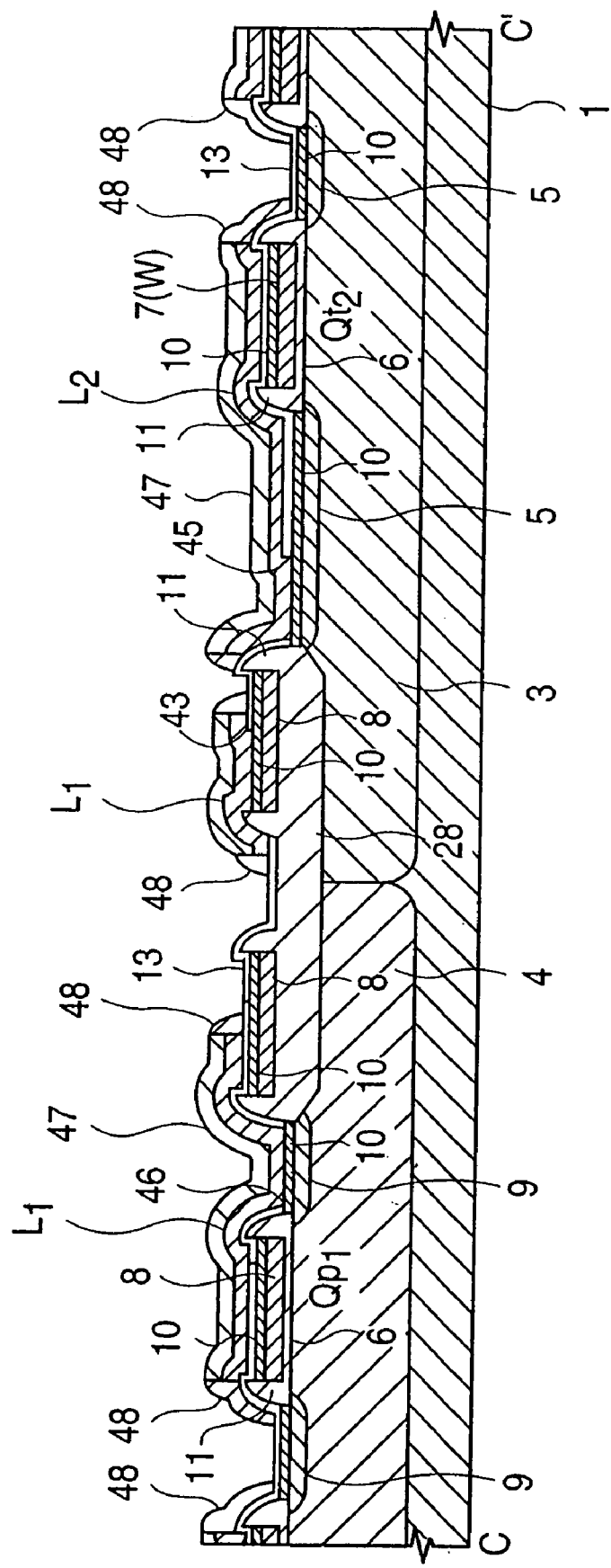
FIG. 58 is a section showing the method for manufacturing the memory cell of the SRAM of this third embodiment according to the present invention.

Next, as shown in FIG. 57, a silicon nitride film 53 having a thickness of about 200 nm is deposited over the silicon nitride film 47 by a CVD method. After this, as shown in FIG. 58, this silicon nitride film 53 is anisottopically etched by a RIE (Reactive Ion Etching) method to form side wall spacers 48 on the individual side walls of the gate electrode 7 (the word line WL), the gate electrode 8 and the local wiring lines $L_1$ and $L_2$.

Figure 59:
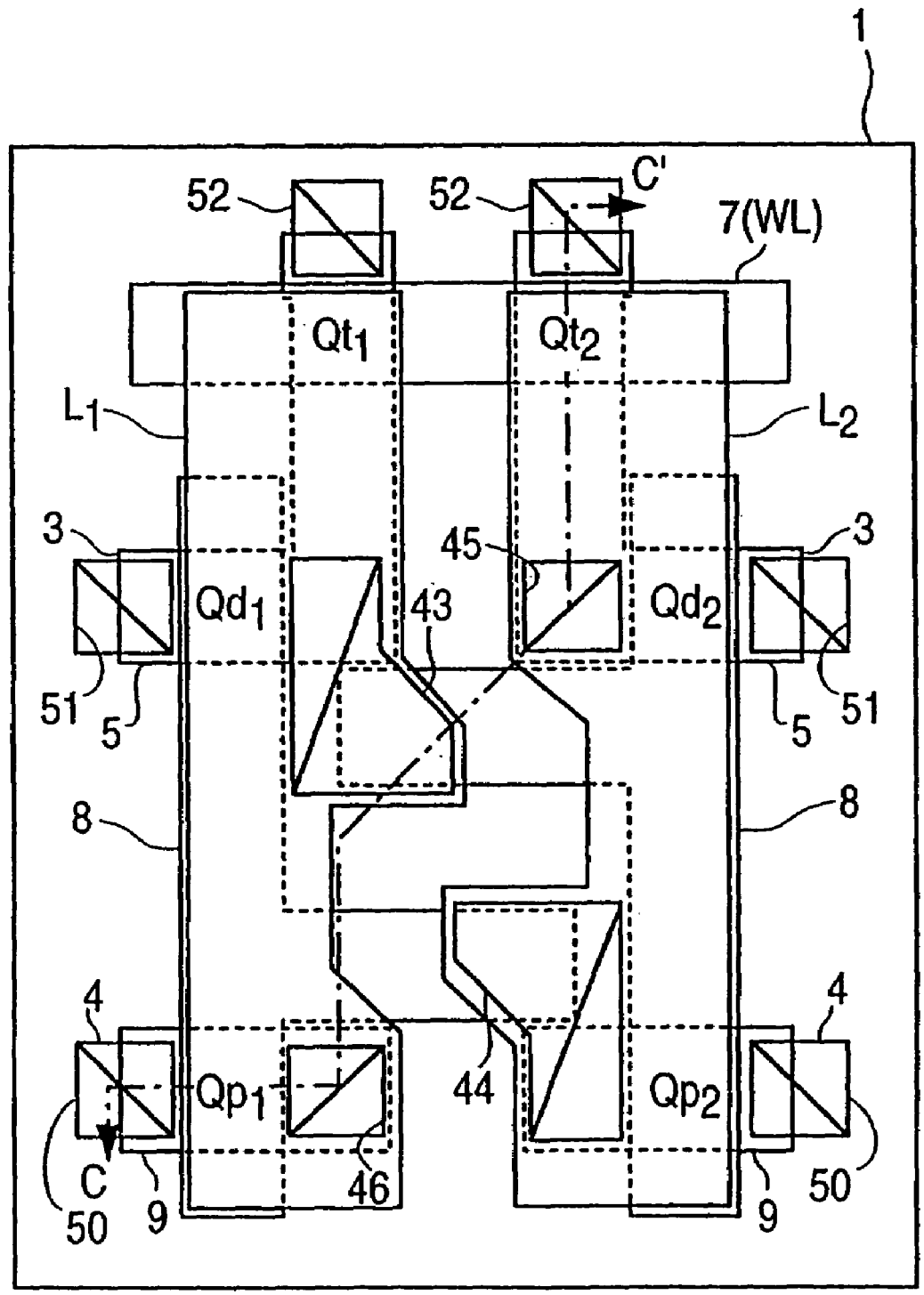
FIG. 59 is a top plan view showing the method for manufacturing the memory cell of the SRAM of this third embodiment according to the present invention.
Figure 60:
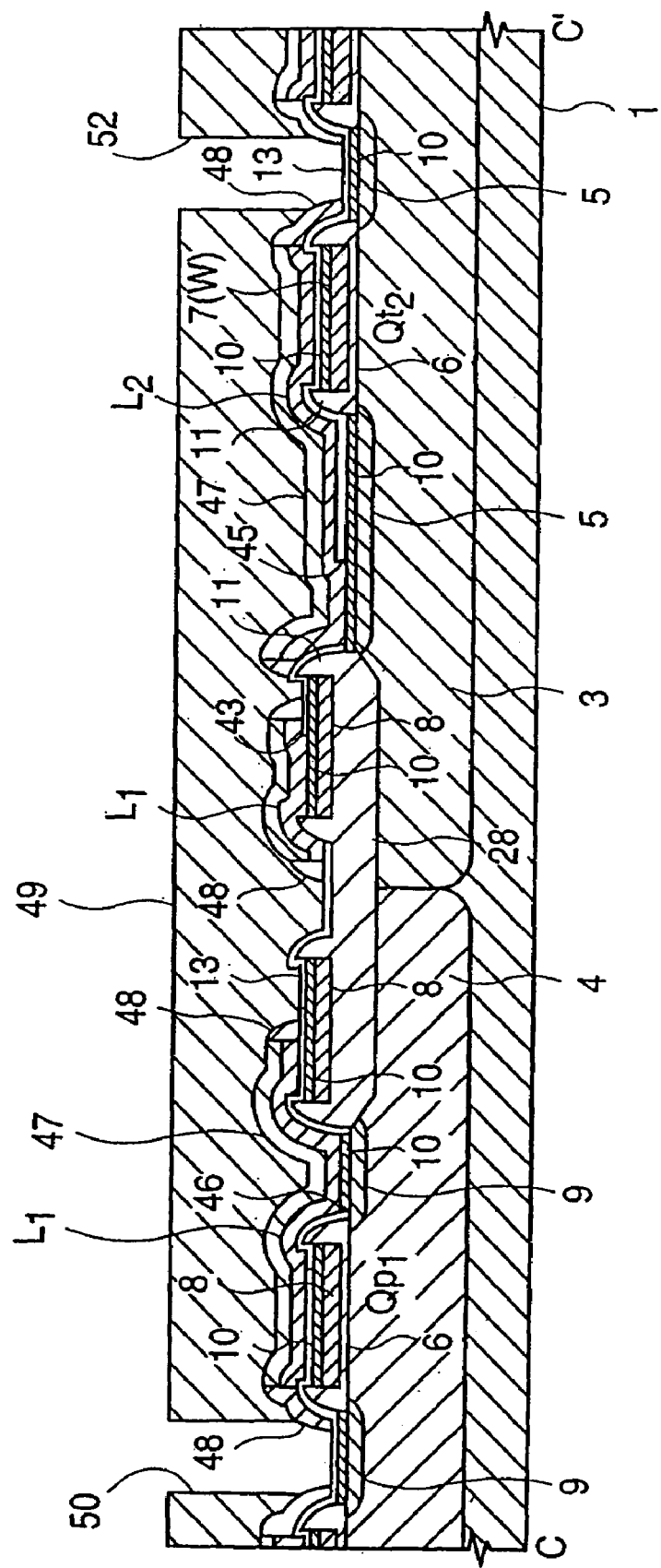
FIG. 60 is a section showing the method for manufacturing the memory cell of the SRAM of this third embodiment according to the present invention.

Next, as shown in FIGS. 59 and 60, an interlayer insulating film 49 of a silicon oxide, such as PSG, of an etching rate different from that of the silicon nitride films 47 and 53 (the side wall spacer 48) is deposited by a CVD method over the silicon nitride film 47 and the side wall spacers 48. The etching rate of the material of insulating film 49 is greater than that of the silicon nitride of films 47 and 53 (side wall spacer 48), for example. After this, the interlayer insulating film 49 over the individual p-type semiconductor regions 9 and 9 (the source regions) of the load MISFETs $Qp_1$ and $Qp_2$ are opened to form connection holes 50 and 50 by a dry-etching method using a photoresist as the mask. Simultaneously with this, the interlayer insulating film 49 over the individual n-type semiconductor regions and (the source regions) of the drive MISFETs $Qd_1$ and $Qd_2$ is opened to form connection holes 51 and 51, and the interlayer insulating film 49 over the individual n-type semiconductor regions 5 and 5 (the other of the source region and the drain region) of the transfer MISFETs $Qt_1$ and $Qt_2$ is opened to form connection holes 52 and 52.

At the aforementioned step of forming the connection holes 50, 51 and 52 by etching the interlayer insulating film 49 of PSG, due to the silicon nitride film 47 formed over the local wiring lines $L_1$ and $L_2$, and the side wall spacers of silicon nitride formed on the individual side walls of the gate electrode 7 (the word line WL), the gate electrode 8 and the local wiring lines $L_1$ and $L_2$ are hardly etched because their etching rates are different from (e.g., much less than) that of the material of the interlayer insulating film 49.

The connection holes 50, 51 and 52 and the local wiring lines $L_1$ and $L_2$ can be positionally displaced due to the misregistration of the photoresist mask used for forming the connection holes 50, 51 and 52 by etching the interlayer insulating film 49 and the photoresist mask used for forming the local wiring lines $L_1$ and $L_2$ by etching the TiN film. However, in the present embodiment, even with a partial overlap between any of the connection holes 50, 51 and 52 and the local wiring line $L_1$ or the local wiring line $L_2$, neither the local wiring line $L_1$ nor the local wiring line $L_2$ is exposed from the side wall of any of the connection holes 50, 51 and 52 when the interlayer insulating film 49 is etched, thereby preventing short circuit between the conductive film to be deposited at a later step in the connection holes 50, 51 and 52 and the local wiring line $L_1$ or the local wiring line $L_2$.

The connection holes 50, 51 and 52, the gate electrode 7 (the word line WL) and the gate electrode 8 can be relatively displaced due to misregistration between the photoresist mask to be used for forming the connection holes 50, 51 and 52 by etching the interlayer insulating film 49 and the photoresist mask to be used for forming the gate electrode (the word line WL) and the gate electrode 8 by etching the polycrystalline silicon film. However, in the present embodiment, even with a partial overlap between any of the connection holes 50, 51 and 52 and the gate electrode 7 (the word line WL) or the gate electrode 8, the gate electrode 8 is not exposed from the side wall of the connection hole 50 or 51, and the gate electrode 7 (the word line WL) is not exposed from the side wall of the connection hole 52 when the interlayer insulating film 49 is etched, thereby preventing short circuit between the conductive film to be deposited at a later step in the connection holes 50, 51 and 52 and the gate electrode 7 (the word line WL) or the gate electrode 8.

In short, according to the manufacturing method of the present embodiment, when the connection holes 50, 51 and 52 are laid out, it is unnecessary to take into consideration the registration allowance between the connection holes 50, 51 and 52 and the local wiring lines $L_1$ and $L_2$ and the registration allowance between the connection holes 50, 51 and 52 and the gate electrode 7 (the word line WL) and the gate electrode 8. As a result, the connection holes 5, 51 and 52 can be laid out so as to be closer to the local wiring lines $L_1$ and $L_2$, the gate electrode 7 (the word line WL) and the gate electrode 8 by a distance corresponding to those registration allowances. Therefore, the area occupied by the memory cell can be reduced in both the first direction and the second direction perpendicular to the first direction.

In order that the side wall spacer 48 may function as the etching stopper when the interlayer insulating film 49 is etched, the thickness of the silicon nitride film 53 constituting the side wall spacer 48 has to be larger than the registration allowance of the photoresist mask. The thickness of the silicon nitride film 53 is set to at least about 200 nm when the sum of (1) the registration allowance between the connection holes 50, 51 and 52 and the local wiring lines $L_1$ and $L_2$, and (2) the registration allowance between the connection holes 50, 51 and 52 and the gate electrode 7 (the word line WL) and the gate electrode 8, is about 200 nm, for example.

Figure 61:
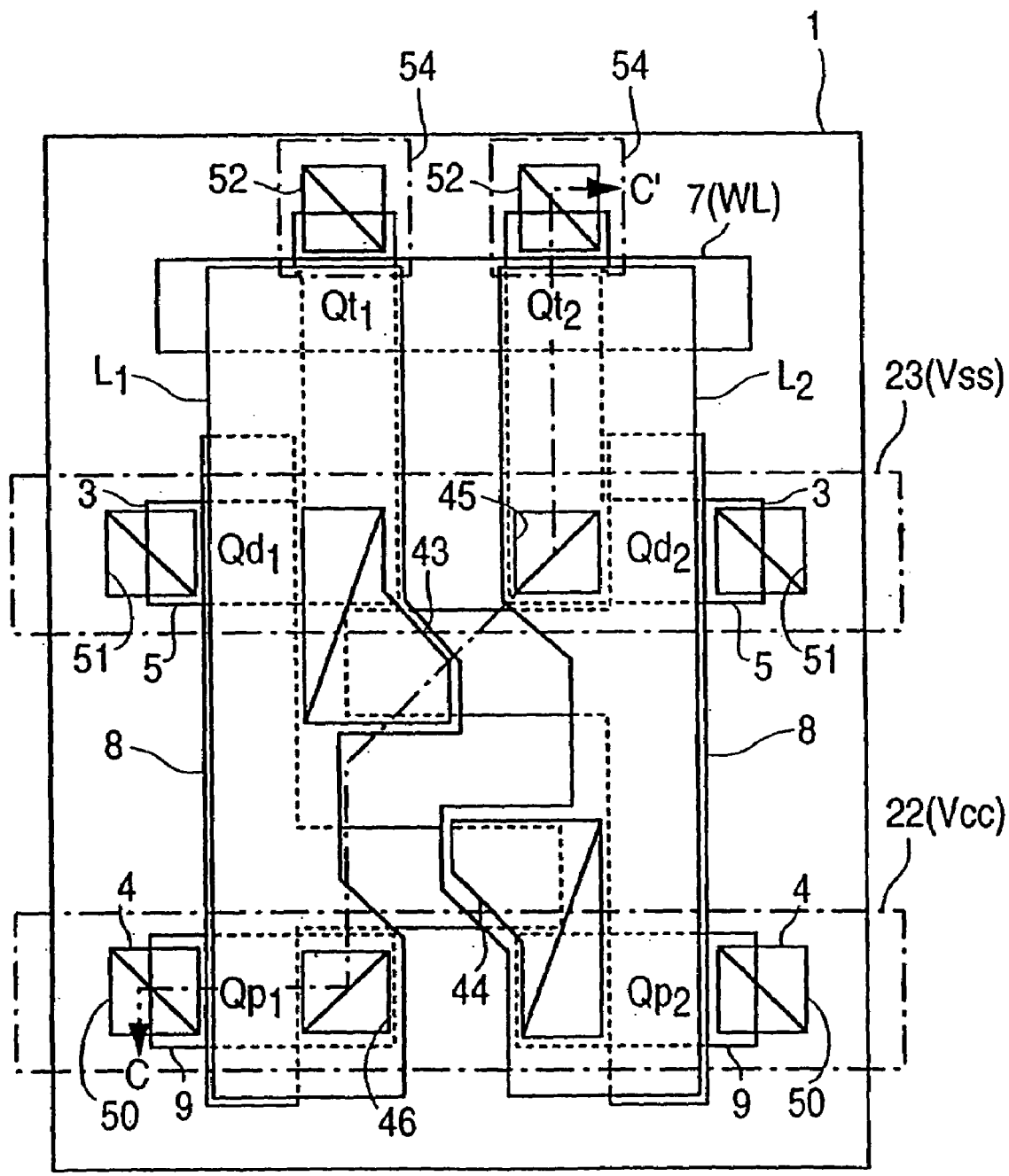
FIG. 61 is a top plan view showing the method for manufacturing the memory cell of the SRAM of this third embodiment according to the present invention.
Figure 62:
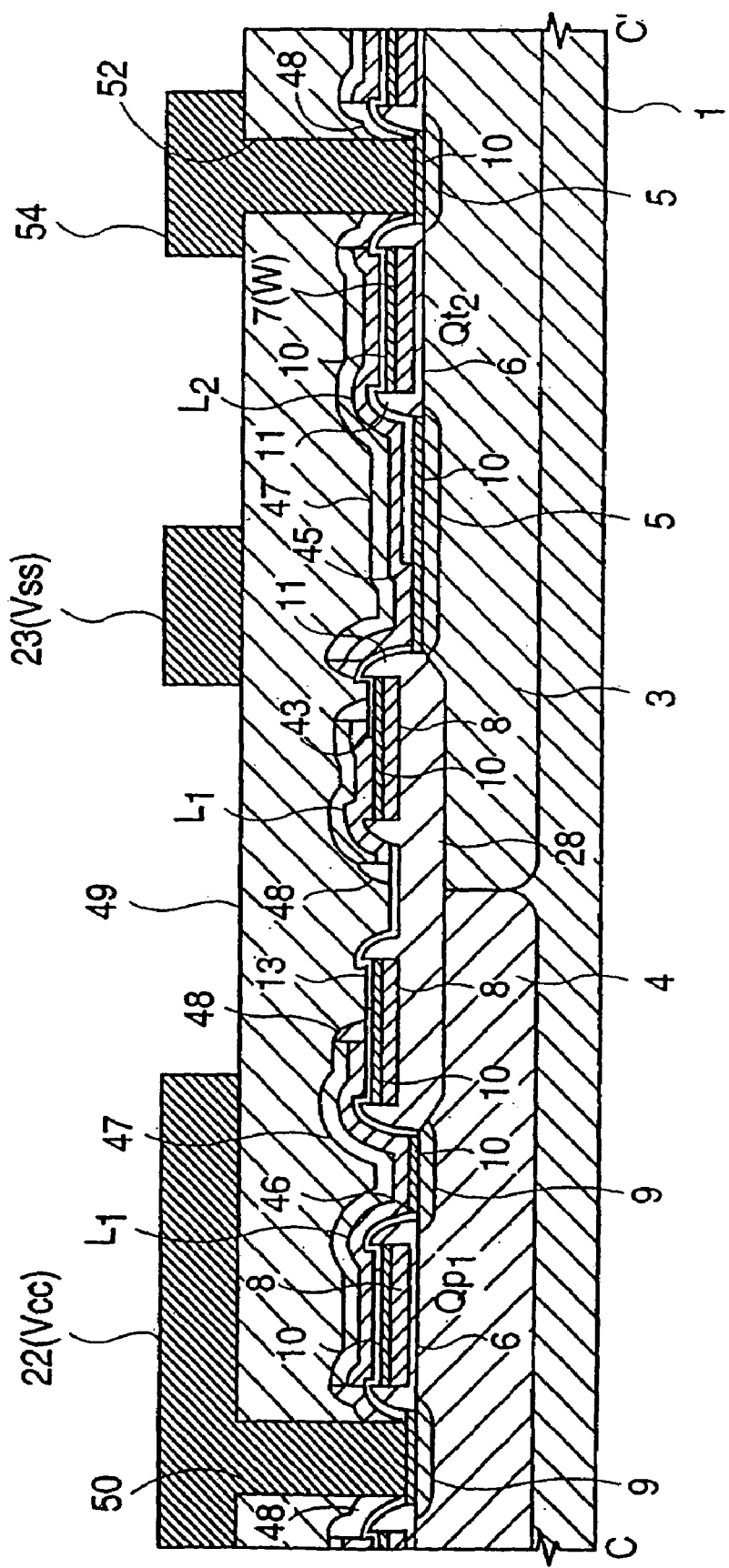
FIG. 62 is a section showing the method for manufacturing the memory cell of the SRAM of this third embodiment according to the present invention.

Next, the thin silicon nitride film 13 at the bottoms of the connection holes 50, 51 and 52 is etched. After this, as shown in FIG. 61 and 62, power supply voltage line 22, reference voltage line 23 and an intermediate wiring line 54 are formed over the interlayer insulating film 49. The power supply voltage line, reference voltage line and intermediate wiring line 22, 23 and 54 are formed by depositing a W-film, an Al film and a W-film consecutively over the interlayer insulating film 49 by a sputtering method, and then by patterning those films. Plugs of W-film may be formed, if necessary, in the connection holes 50, 51 and 52.

Figure 63:
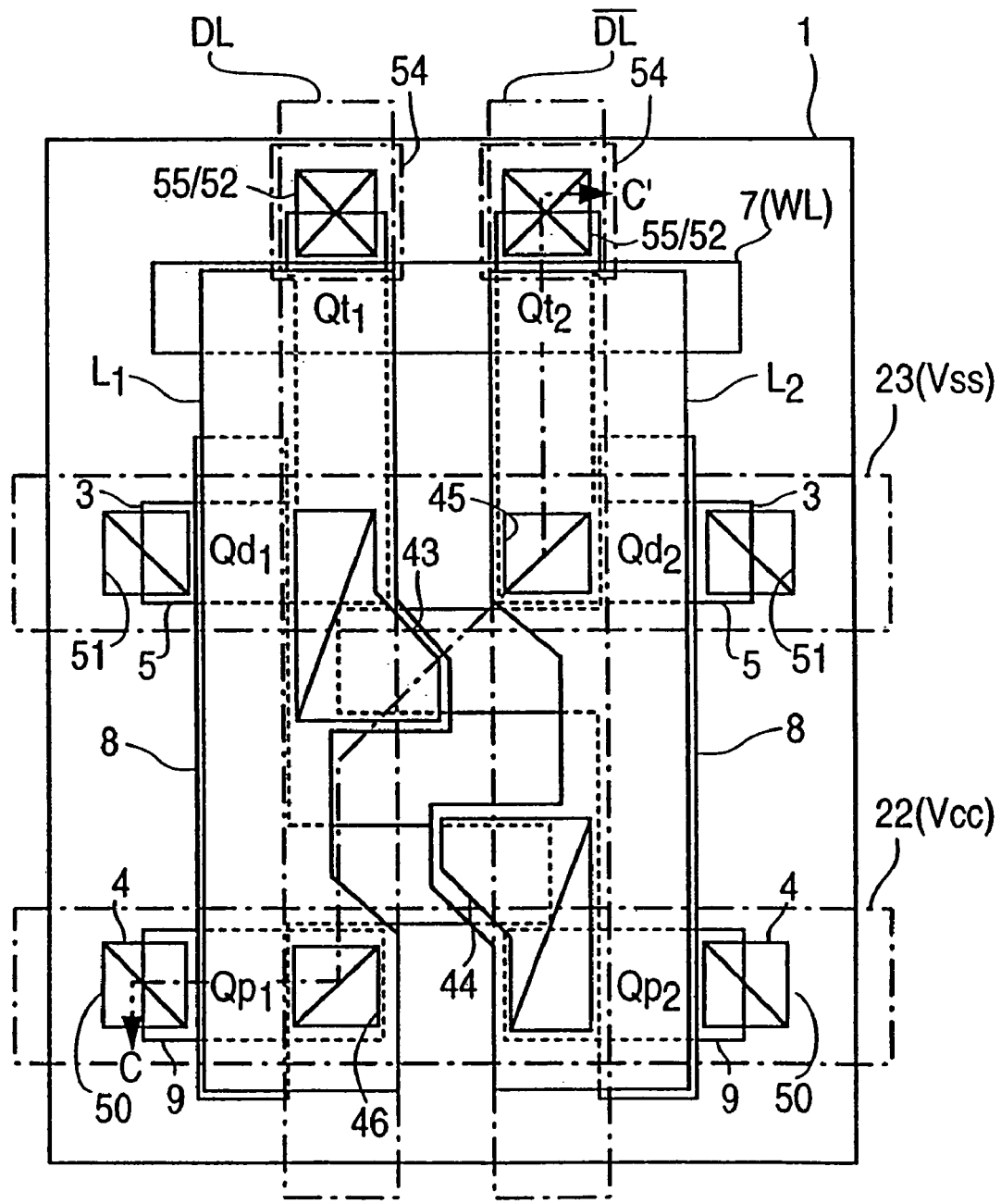
FIG. 63 is a top plan view showing the method for manufacturing the memory cell of the SRAM of this third embodiment according to the present invention.
Figure 64:
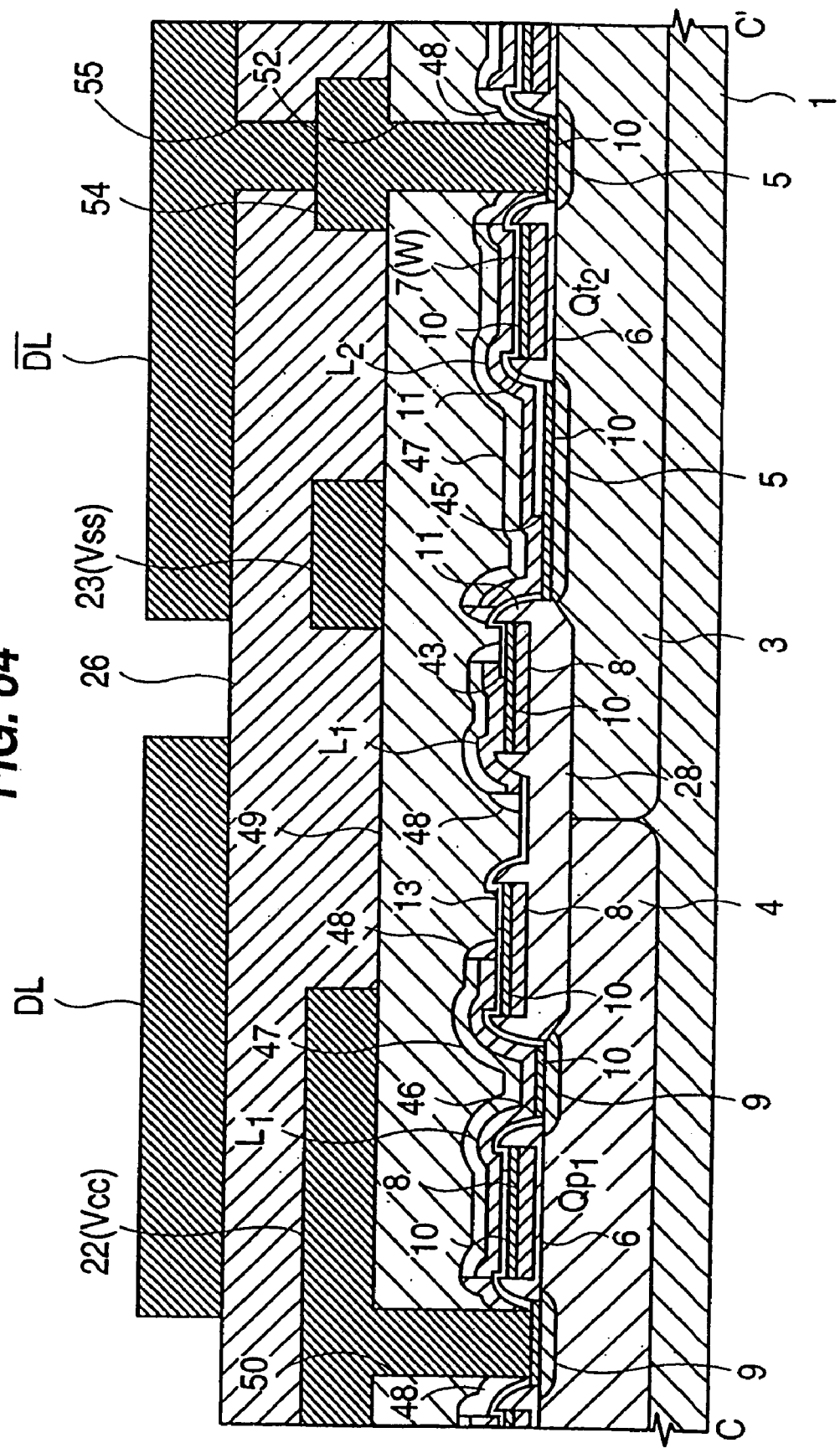
FIG. 64 is a section showing the method for manufacturing the memory cell of the SRAM of this third embodiment according to the present invention.

Next, as shown in FIGS. 63 and 64, an interlayer insulating film 26 of silicon oxide is deposited by a CVD method over the power supply voltage line 22, the reference voltage line 23 and the intermediate wiring line 54, and the interlayer insulating film 26 over the intermediate wiring line 54 is opened to form a connection hole 55 by a dry-etching method using a photoresist as the mask. After this, the data lines DL and DL are formed over the interlayer insulating film 26. These data lines DL and DL are formed by depositing a TiN film, an Al film and a TiN film consecutively over the interlayer insulating film 26 by sputtering and then by patterning those films.

EMBODIMENT 4

In the SRAM of the present embodiment, the paired local wiring lines $L_1$ and $L_2$ are formed in the same conductive layer as in the SRAM of the foregoing embodiment 3. A method for manufacturing the memory cell of this SRAM will be described with reference to FIGS. 65 to 82.

Figure 65:
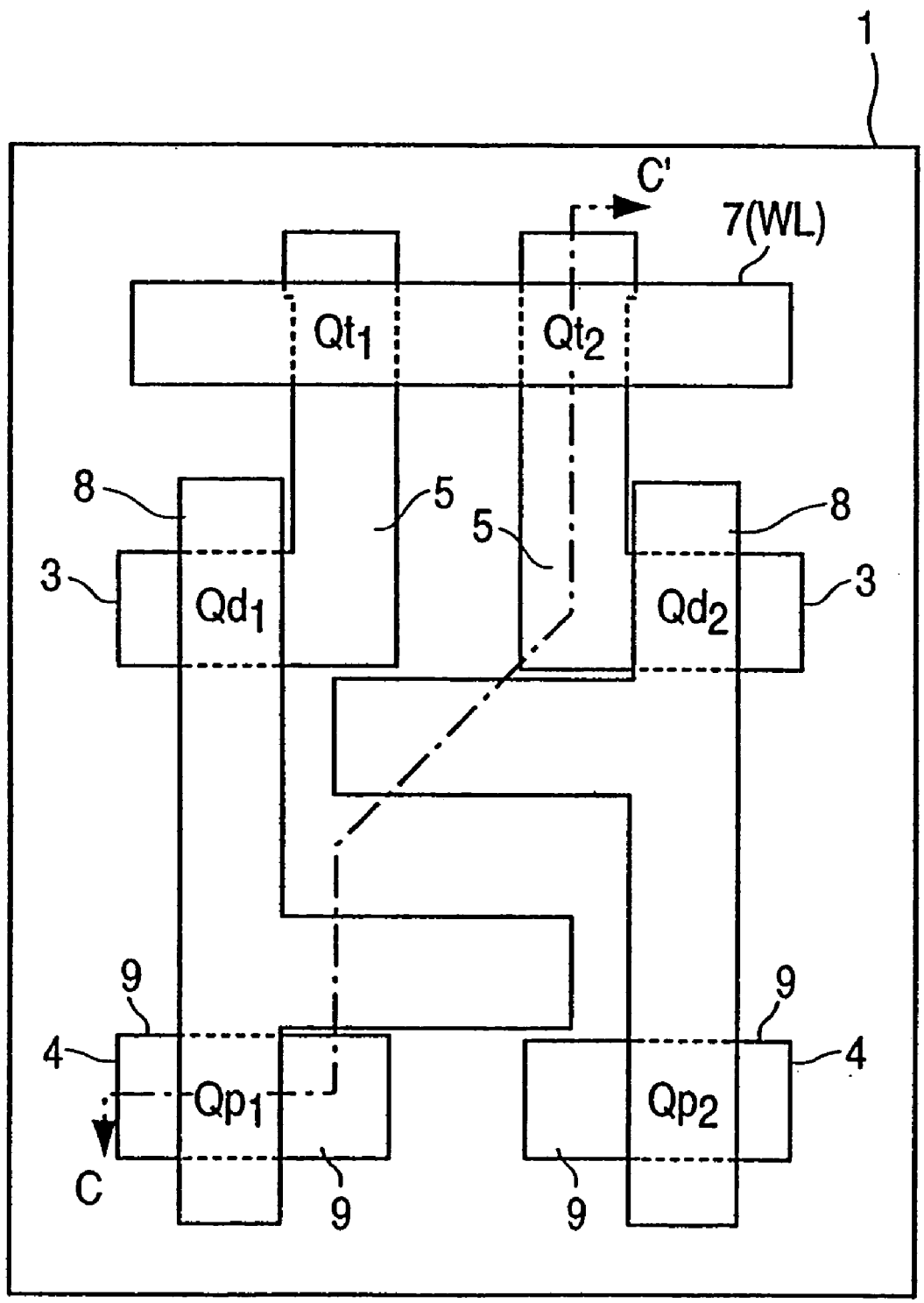
FIG. 65 is a top plan view showing a method for manufacturing a memory cell of an SRAM of a fourth embodiment according to the present invention.
Figure 66:
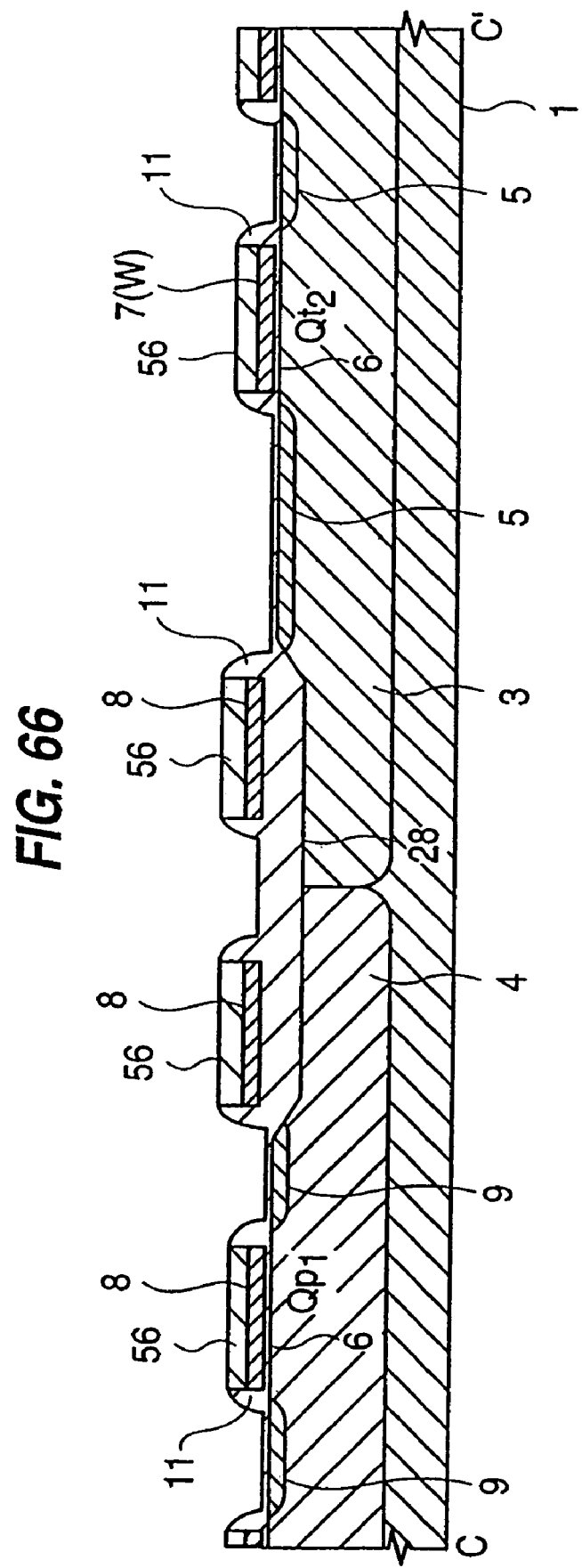
FIG. 66 is a section showing the method for manufacturing the memory cell of the SRAM of this fourth embodiment according to the present invention.

First of all, as shown in FIGS. 65 and 66, a p-type well 3 and an n-type well 4 are formed in the major face of a semiconductor substrate 1, and a field oxide film 28 for isolating the elements and a gate oxide film 6 of an MISFET are then formed on those surfaces. After this, drive MISFETs $Qd_1$ and $Qd_2$ and transfer MISFETs $Qd_1$ and $Qt_2$ are formed in the p-type well 3, and load MISFETs $Qp_1$ and $Qp_2$ are formed in the n-type well 4. A gate electrode 7 (the word line WL) of the transfer MISFETs $Qt_1$ and $Qt_2$ and gate electrodes 8 and 8 of the drive MISFETs $Qd_1$ and $Qd_2$ (the load MISFETs $Qp_1$ and $Qp_2$) are composed of a polycrystalline silicon film. The insulating films (the cap insulating films) covering the gate electrode 7 (the word line WL) and the gate electrode 8 individually are composed of a silicon nitride film 56. This silicon nitride film 56 is deposited thicker (the thickness is more than about 300 nm) than a later described silicon nitride film 13. Side wall spacers 11 on the individual side walls of the gate electrode 7 (the word line WL) and gate electrode 8 are formed by etching a silicon oxide film anisottopically.

Figure 67:
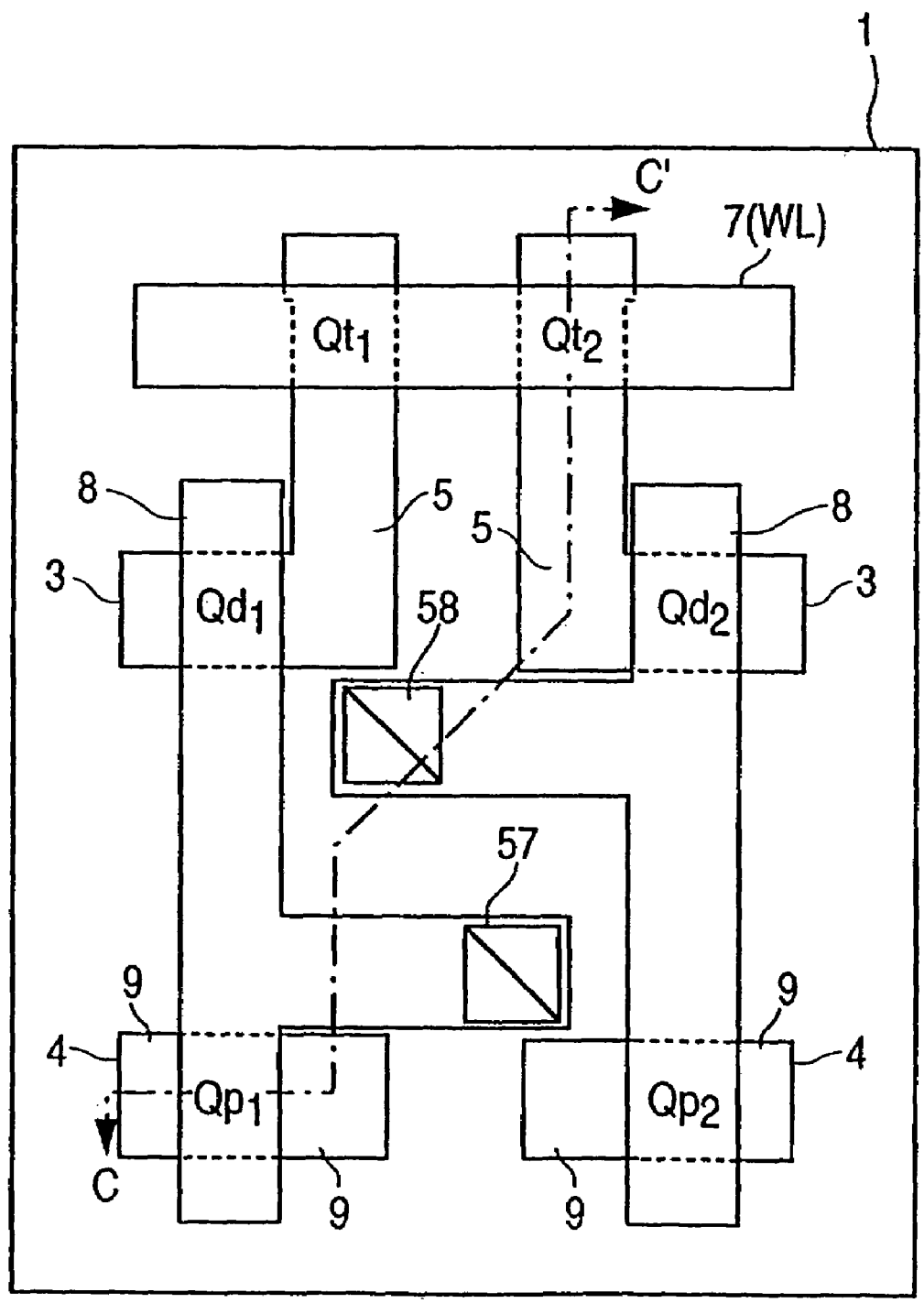
FIG. 67 is a top plan view showing the method for manufacturing the memory cell of the SRAM of this fourth embodiment according to the present invention.
Figure 68:
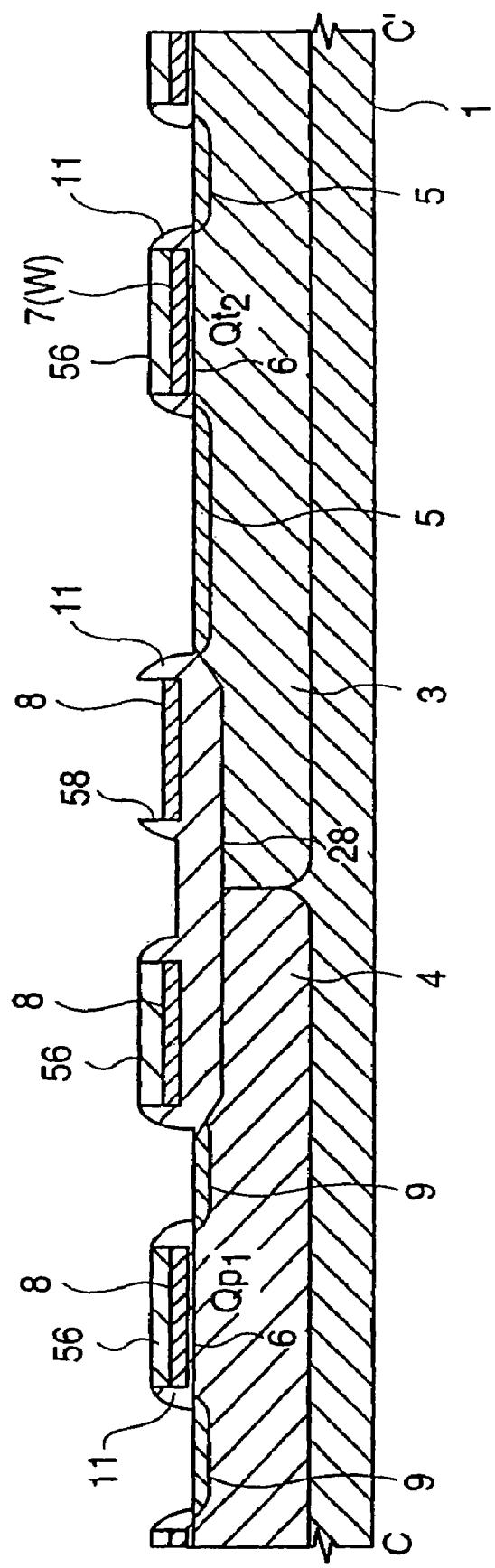
FIG. 68 is a section showing the method for manufacturing the memory cell of the SRAM of this fourth embodiment according to the present invention.

Next, as shown in FIGS. 67 and 68, the silicon nitride film 56 over the gate electrode 8 of the drive MISFET $Qd_1$ (the load MISFET $Qp_1$) is etched to form a connection hole 57, and the silicon nitride film 56 over the gate electrode 8 of the drive MISFET $Qd_2$ (the load MISFET $Qp_2$) is etched to form a connection hole 58. The connection hole 57 is formed in the region to be connected with the local wiring line $L_2$ at a later step, and the connection hole 58 is formed in the region to be connected with the local wiring line $L_1$ at a later step.

Figure 69:
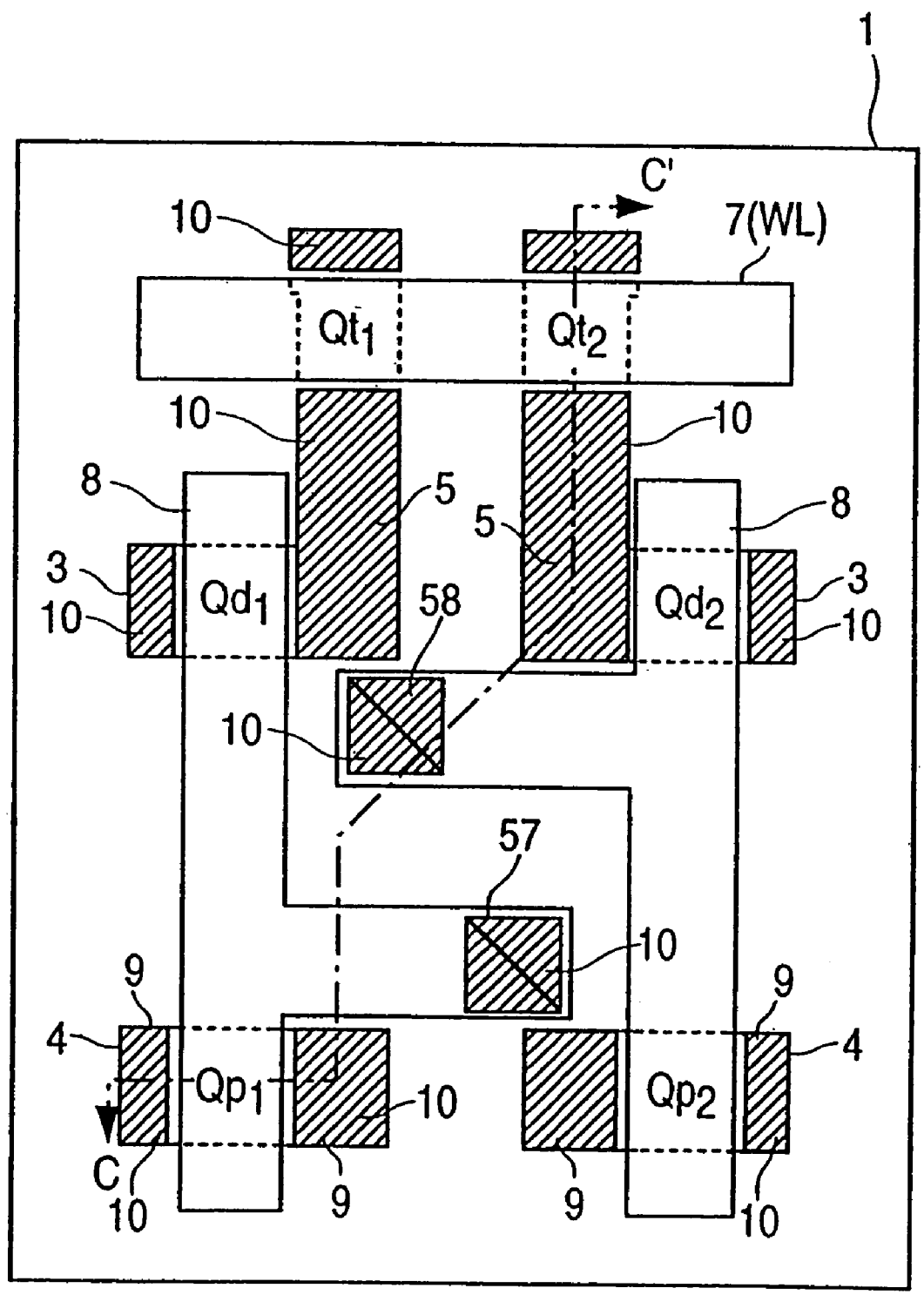
FIG. 69 is a top plan view showing the method for manufacturing the memory cell of the SRAM of this fourth embodiment according to the present invention.
Figure 70:
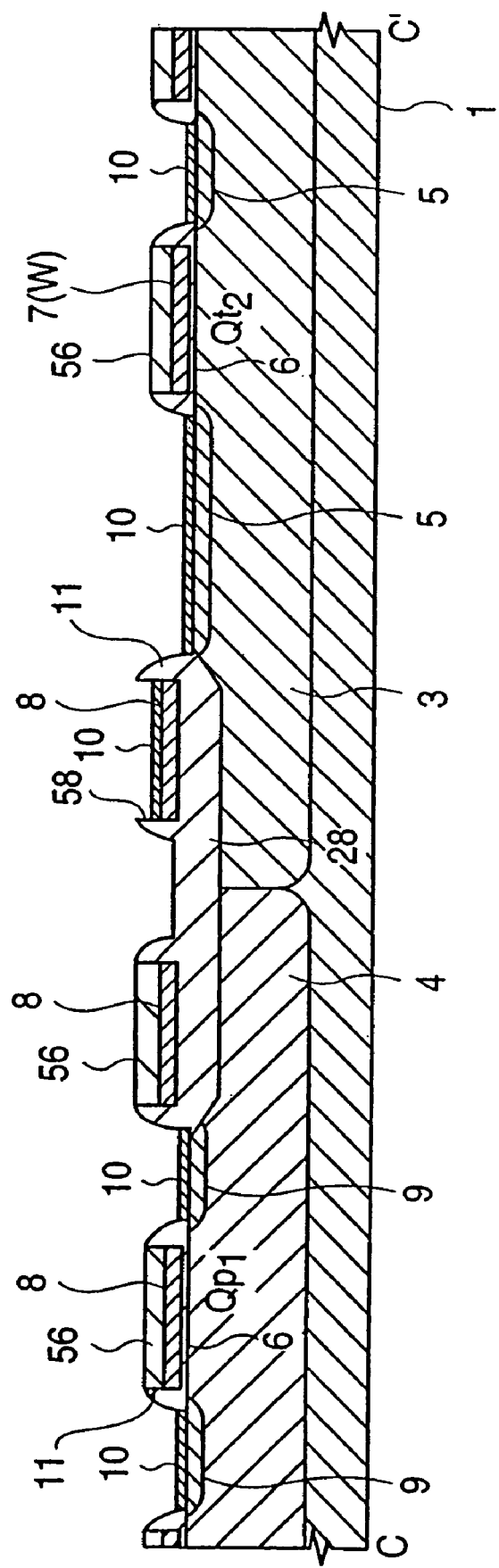
FIG. 70 is a section showing the method for manufacturing the memory cell of the SRAM of this fourth embodiment according to the present invention.

Next, as shown in FIGS. 69 and 70, a Ti-silicide layer is formed on the individual surfaces of the gate electrode 8 of the drive MISFET $Qd_1$ (the load MISFET $Qp_1$), exposed at the bottom of the connection hole 57, the gate electrode 8 of the drive MISFET $Qd_2$ (the load MISFET $Qp_2$), exposed at the bottom of the connection hole 58, n-type semiconductor regions 5 and 5 (the source region and the drain region) of the transfer MISFETs $Qt_1$ and $Qt_2$, the n-type semiconductor regions 5 and 5 (the source region and the drain region) of the drive MISFETs $Qd_1$ and $Qd_2$, and p-type semiconductor regions 9 and 9 (the source region and the drain region) of the load MISFETs $Qp_1$ and $Qp_2$.

In order to form the Ti-silicide layer 10, the gate oxide film 6, covering the surfaces of the individual n-type semiconductor regions 5 and 5 (the source region and the drain region) of the drive MISFETs $Qd_1$ and $Qd_2$ and transfer MISFETs $Qt_1$ and $Qt_2$, and the gate oxide film 6, covering the surface of the individual p-type semiconductor regions 5 and 5 (the source region and the drain region) of the load MISFETs $Qp_1$ and $Qp_2$, are etched. After this, a Ti-film is deposited over the semiconductor substrate 1 by sputtering. Next, the semiconductor substrate 1 is annealed to cause reactions between the Ti-film and the semiconductor substrate 1 (the n-type semiconductor region 5 and the p-type semiconductor region 9) and between the Ti-film and the polycrystalline silicon film (the gate electrode 8 exposed at the bottoms of the connection holes 57 and 58), and the unreacted Ti-film is etched off.

Figure 71:
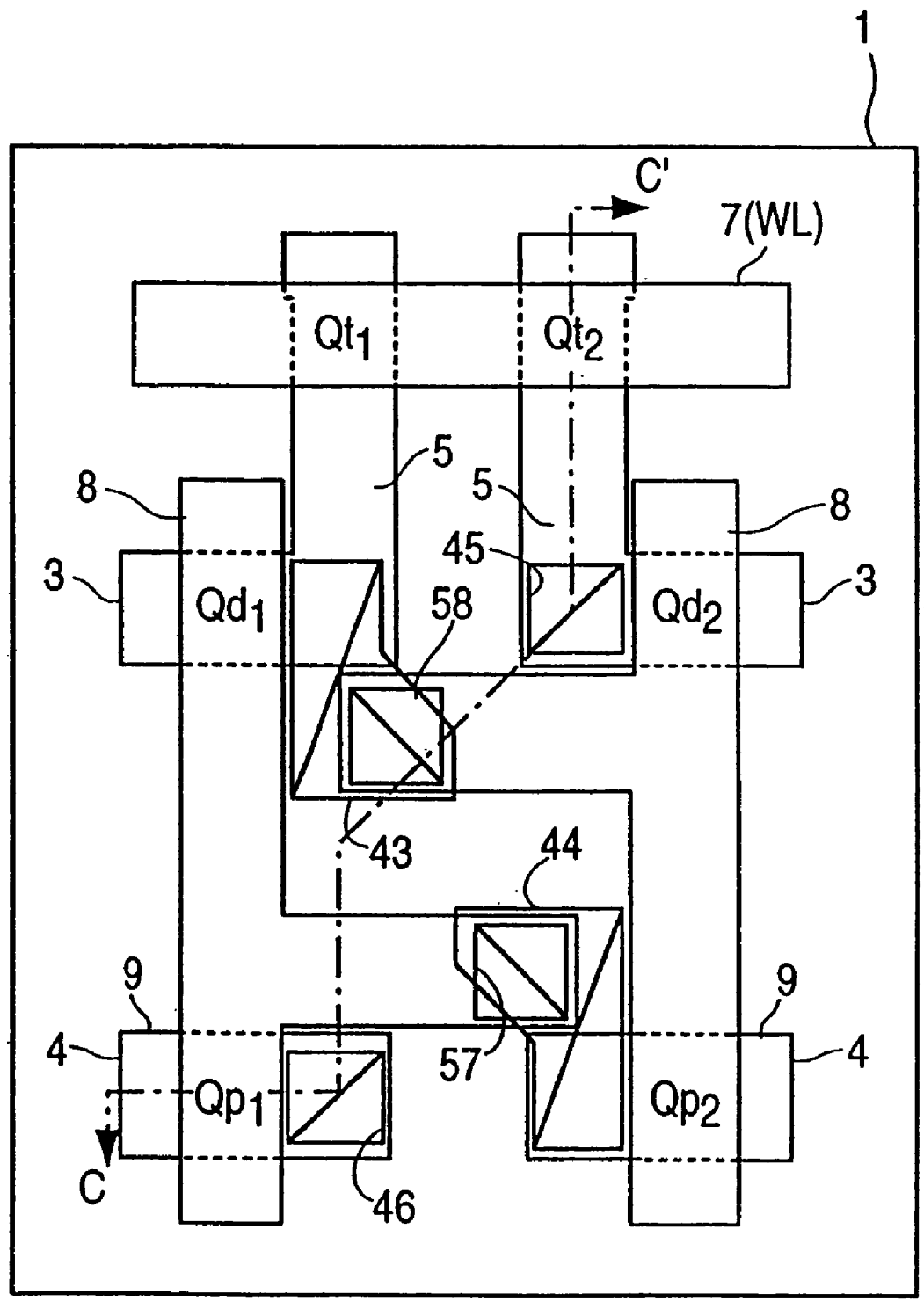
FIG. 71 is a top plan view showing the method for manufacturing the memory cell of the SRAM of this fourth embodiment according to the present invention.
Figure 72:
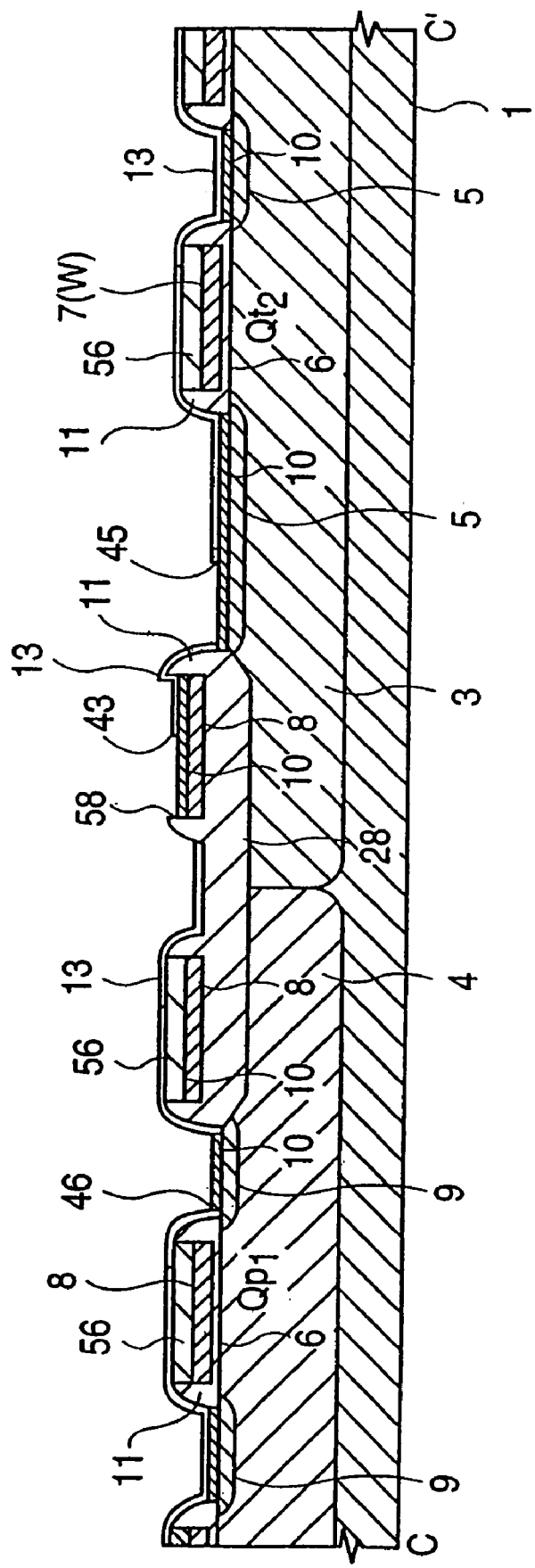
FIG. 72 is a section showing the method for manufacturing the memory cell of the SRAM of this fourth embodiment according to the present invention.

Next, as shown in FIGS. 71 and 72, the silicon nitride film 13, as thin as about 30 nm, is deposited over the semiconductor substrate 1 by a CVD method. After this, the silicon nitride film 13 is dry-etched by using a photoresist as the mask to form a connection hole 43, which reaches the n-type semiconductor region 5 (the drain region) of the drive MISFET $Qd_1$ and the gate electrode 8 of the drive MISFET $Qd_2$ (the load MISFET $Qp_2$), and a connection hole 44 which reaches the p-type semiconductor region 9 (the drain region) of the load MISFET $Qp_2$ and the gate electrode 8 of the drive MISFET $Qd_1$ (the load MISFET $Qp_1$). Simultaneously with this, a connection hole 45 is formed over the n-type semiconductor region 5 (the drain region) of the drive MISFET $Qd_2$, and a connection hole 46 is formed over the p-type semiconductor region 9 (the drain region) of the load MISFET $Qp_1$.

Since a connection hole 58 is formed in advance over the gate electrode 8 of the drive MISFET $Qd_1$ (the load MISFET $Qp_1$), the connection hole 43 partially overlaps the connection hole 58 over the gate electrode 8. Likewise, since a connection hole 57 is formed in advance over the gate electrode 8 of the drive MISFET $Qd_2$ (the load MISFET $Qp_2$), the connection hole 44 partially overlaps the connection hole 57 over the gate electrode 8.

In short, by the manufacturing method of the present embodiment, when the connection holes 43, 44, 45 and 46 are laid out, it is unnecessary to consider the registration allowance between those connection holes 43 to 46 and the gate electrode 8 and the registration allowance between the connection holes 43 to 46 and the connection holes 57 and 58. As a result, the connection holes 43 to 46 can be laid out so as to be closer to the gate electrode 8 by a distance corresponding to those registration allowances. Therefore the area occupied by the memory cell in the first direction can be reduced.

Specifically, even if the connection holes 43, 44, 45 and 46 overlap the gate electrode 8 when they are formed by etching the silicon nitride film 13, they do not reach the gate electrode 8 because the silicon nitride film 56, thicker than the silicon nitride film 13, is formed over the gate electrode 8. Since, moreover, there is a large difference in the etching rate between the silicon nitride film and the silicon oxide film, the side wall spacers 11, which are composed of the silicon oxide film on the individual side walls of the gate electrode 7 (or the word line WL) and the gate electrode 8, are hardly etched when the silicon nitride film 13 is etched to form the connection holes 43, 44, 45 and 46.

As a result, even if those connection holes 43 to 46 overlap the gate electrode 8 when they are formed, the conductive film deposited in the connection holes 43 to 46 and the gate electrode 8 do not short circuit at a later step.

Figure 73:
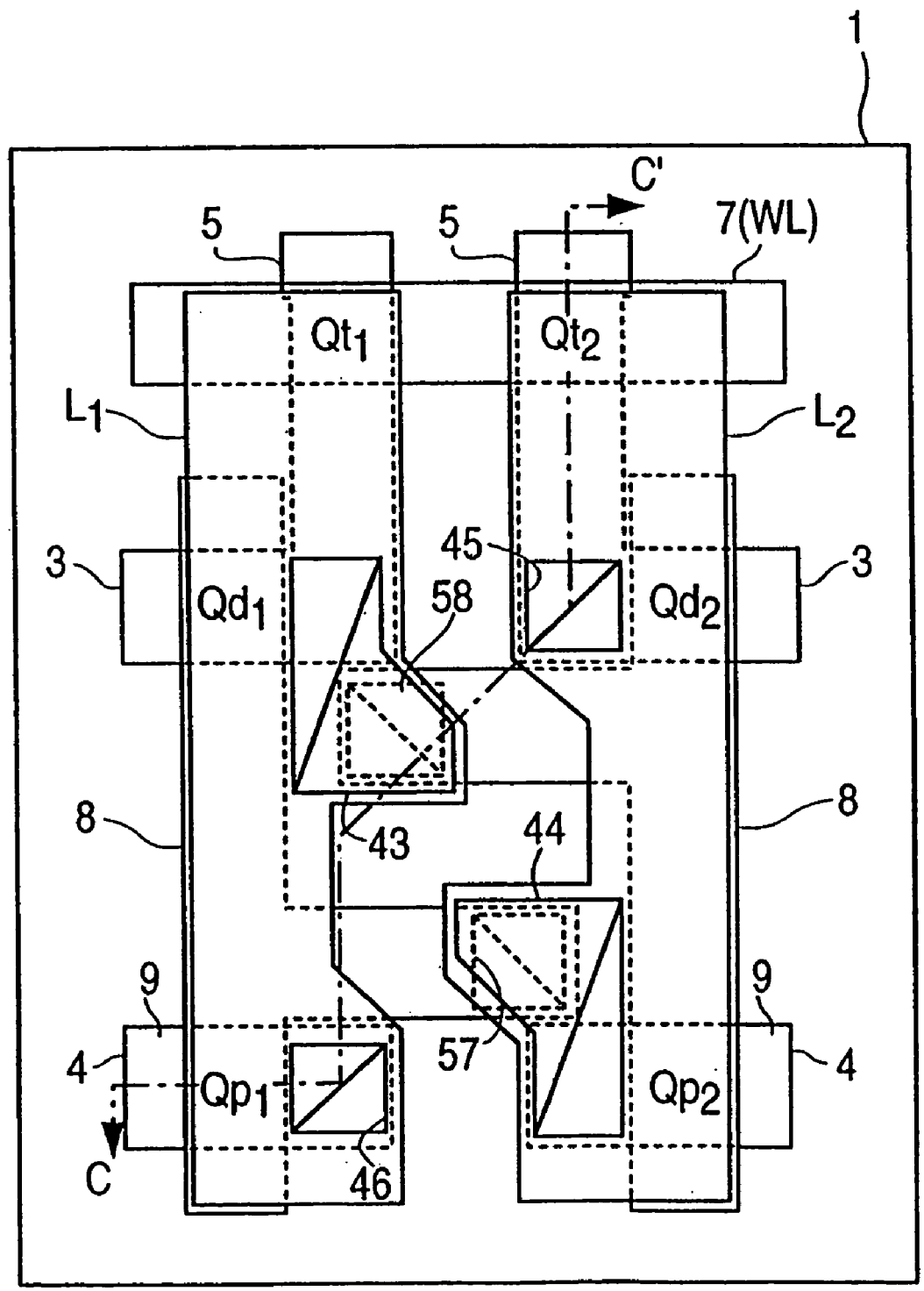
FIG. 73 is a top plan view showing the method for manufacturing the memory cell of the SRAM of this fourth embodiment according to the present invention.
Figure 74:
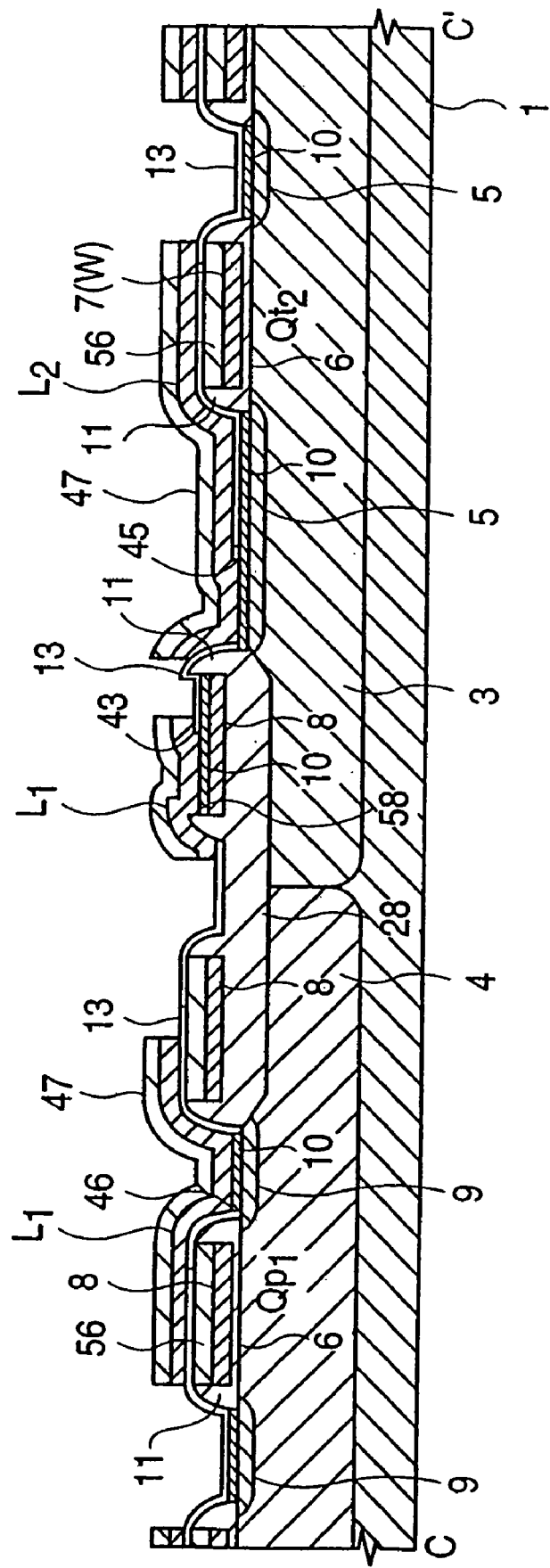
FIG. 74 is a section showing the method for manufacturing the memory cell of the SRAM of this fourth embodiment according to the present invention.

Next, as shown in FIGS. 73 and 74, a TiN film having a thickness of about 100 nm is deposited over the silicon nitride film 13 by a sputtering method or a CVD method, and a silicon nitride film 47 having a thickness of about 100 nm is then deposited over that TiN film by a CVD method. After this, the silicon nitride film 47 and the TiN film are patterned by a dry-etching method using a photoresist as the mask to form paired local wiring lines $L_1$ and $L_2$ composed of the TiN film.

The local wiring line $L_1$ is connected through the connection hole 43 and the connection hole 58 with the gate electrode 8 of the drive MISFET. $Qd_2$ (the load MISFET $Qp_2$), through the connection hole 43 with the n-type semiconductor region 5 (the drain region) of the drive MISFET $Qd_1$, and through the connection hole 46 with the p-type semiconductor region 9 (the drain region) of the load MISFET $Qp_1$. The local wiring line $L_2$ is connected through the connection hole 44 and the connection hole 57 with the gate electrode 8 of the drive MISFET $Qd_1$ (the load MISFET $Qp_1$), through the connection hole 44 with the p-type semiconductor region 9 (the drain region) of the load MISFET $Qp_2$, and through the connection hole 45 with the n-type semiconductor region 5 (the drain region) of the drive MISFET $Qd_2$.

The local wiring line $L_1$ is so arranged as to overlap with the gate electrode 8 of the drive MISFET $Qd_1$ (the load MISFET $Qp_1$) and the gate electrode 7 (the word line WL) of the transfer MISFETs $Qt_1$ and $Qt_2$, and the local wiring line $L_2$ is so arranged as to overlap with the gate electrode 8 of the drive MISFET $Qd_2$ (the load MISFET $Qp_2$) and the gate electrode 7 (the word line WL) of the transfer MISFETs $Qt_1$ and $Qt_2$. Thanks to this construction, a capacitor element C' is formed of the local wiring line $L_1$, the gate electrode 8 and the silicon nitride film 13 interposed therebetween, and a capacitor element C' is formed of the local wiring line $L_2$, the gate electrode 8 and the silicon nitride film 13 interposed therebetween, so that the amount of charge of the storage node can be increased to improve the alpha particle soft error resistance of the memory cell.

Figure 75:
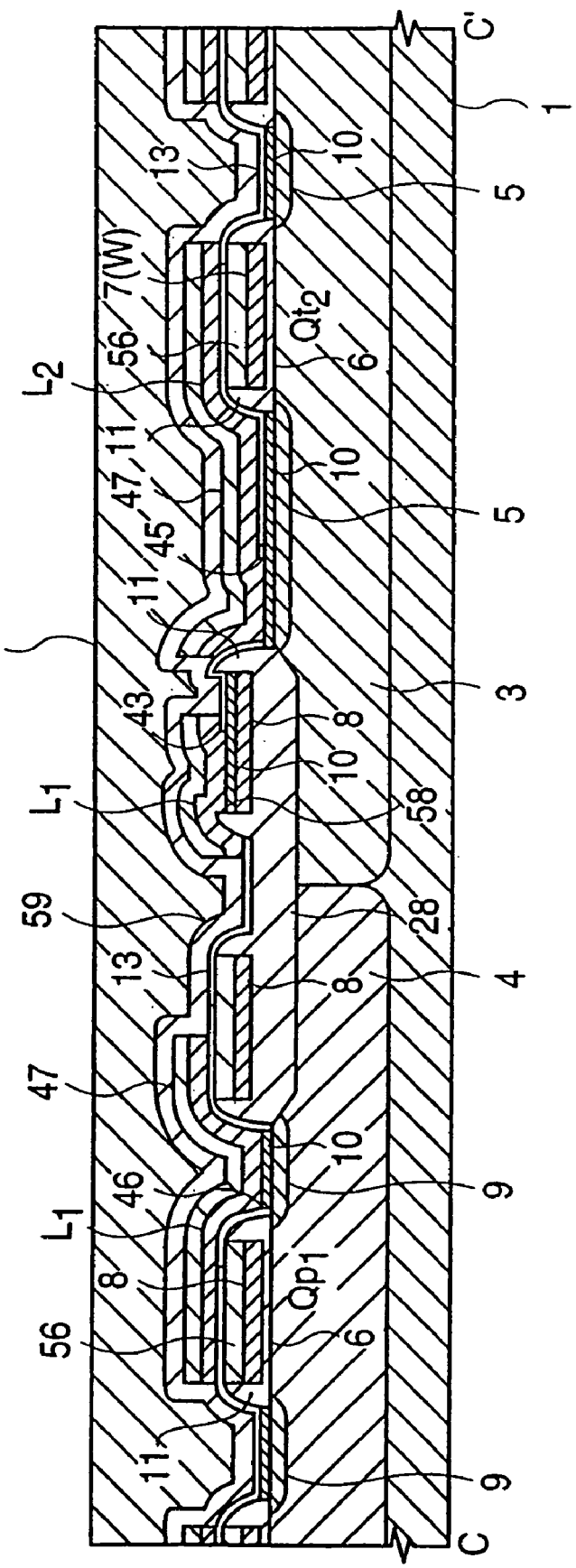
FIG. 75 is a section showing the method for manufacturing the memory cell of the SRAM of this fourth embodiment according to the present invention.

Next, as shown in FIG. 75, a silicon nitride film 59 is deposited by a CVD method over the silicon nitride film 47 covering the local wiring lines $L_1$ and $L_2$, and an interlayer insulating film 49 of PSG is deposited over the silicon nitride film 59 by the CVD method.

Figure 76:
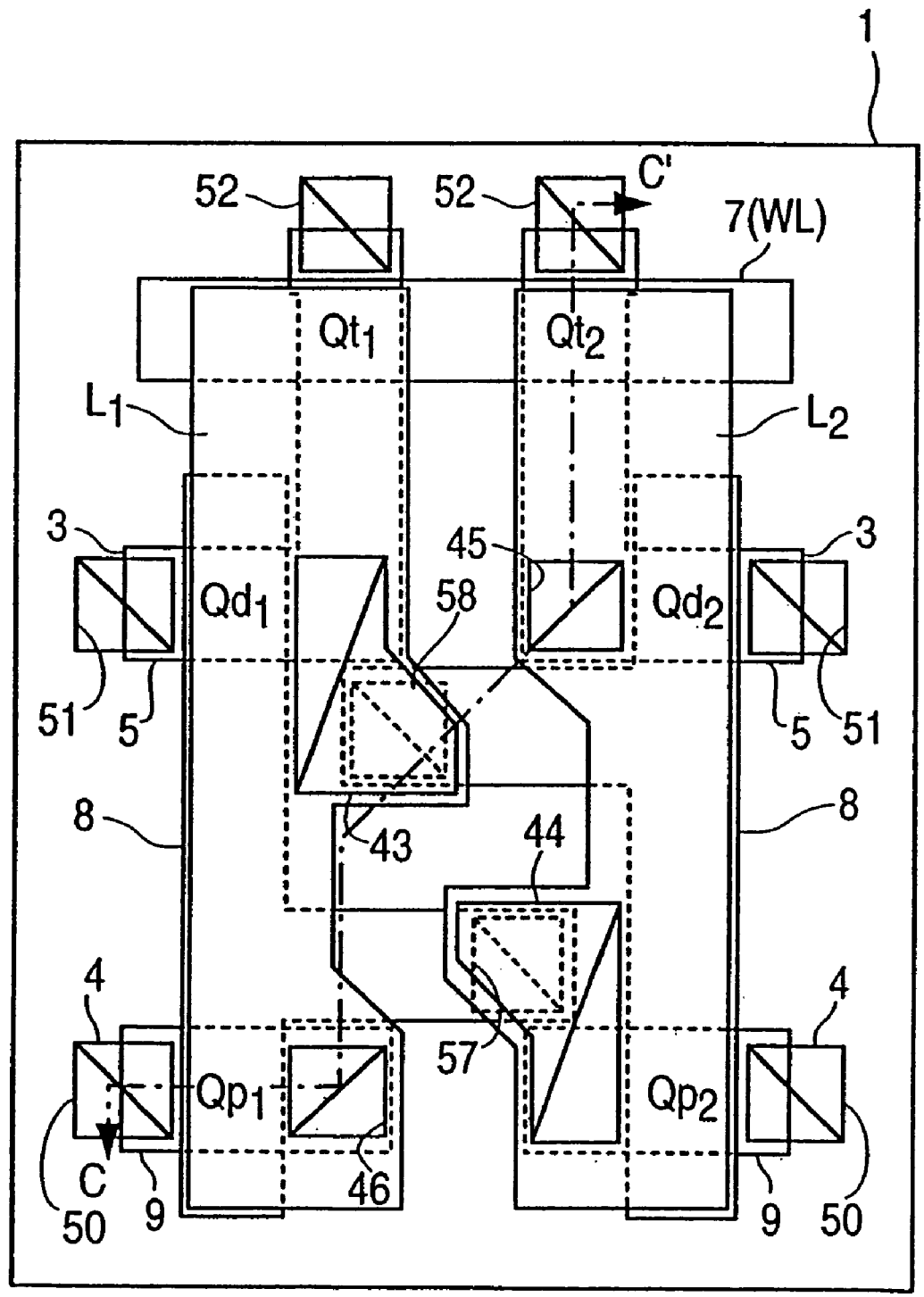
FIG. 76 is a top plan view showing the method for manufacturing the memory cell of the SRAM of this fourth embodiment according to the present invention.
Figure 77:
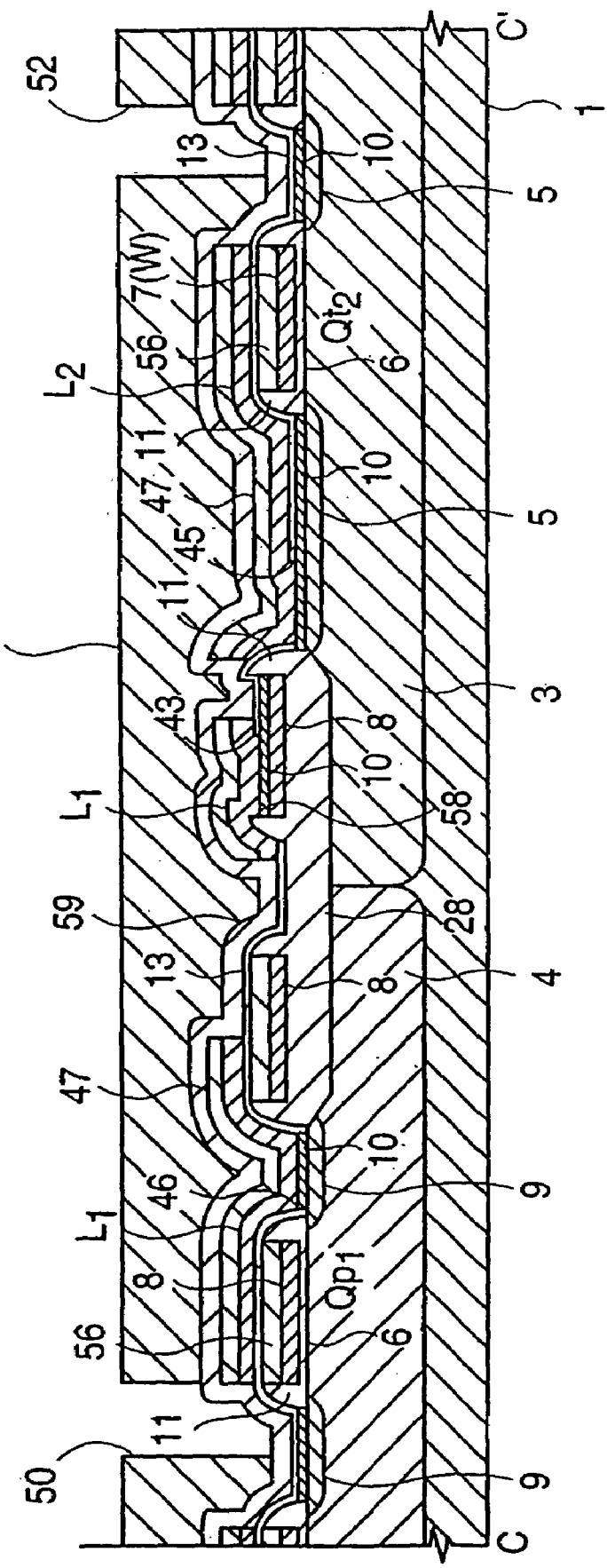
FIG. 77 is a section showing the method for manufacturing the memory cell of the SRAM of this fourth embodiment according to the present invention.

Next, as shown in FIG. 76 and 77, the interlayer insulating film 49 over the individual p-type semiconductor regions 9 and 9 (the source regions) of the load MISFETs $Qp_1$ and $Qp_2$ are opened by a dry etching method using a photoresist as the mask to form connection holes 50 and 50. Simultaneously with this, the interlayer insulating film 49 over the individual n-type semiconductor regions 5 and 5 (the source regions) of the drive MISFETs $Qd_1$ and $Qd_2$ are opened to form connection holes 51 and 51, and the interlayer insulating film 49 over the individual n-type semiconductor regions 5 and 5 (the drain regions) of the transfer MISFETs $Qd_1$ and $Qt_2$ are opened to form connection holes 52 and 52. This etching treatment is interrupted at the instant when the silicon nitride film 59 is exposed at the bottoms of the connection holes 50, 51 and 52.

Figure 78:
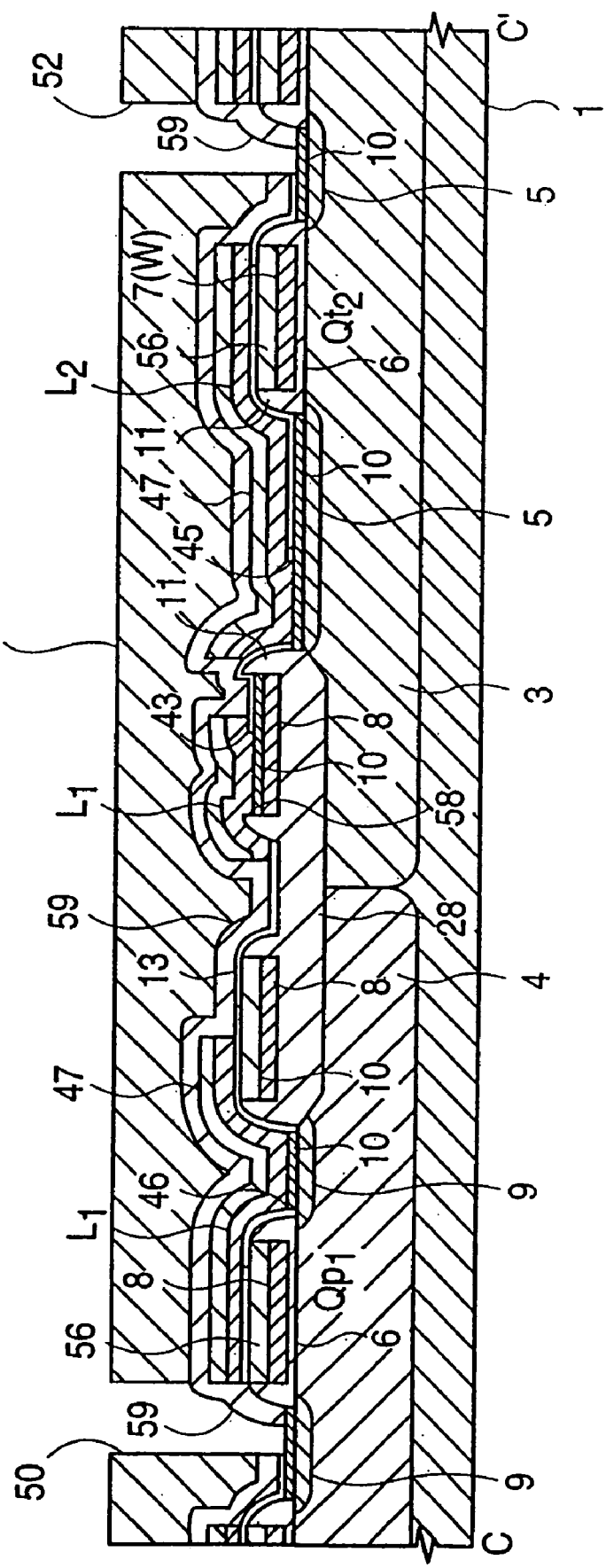
FIG. 78 is a section showing the method for manufacturing the memory cell of the SRAM of this fourth embodiment according to the present invention.

Next, the etching gas for the silicon oxide is changed to that for the silicon nitride, to etch the silicon nitride film 59 in the connection holes 50, 51 and 52 and the thin silicon nitride film 13 below the former, as shown in FIG. 78. This etching treatment is carried out in the connection holes 50, 51 and 52 under the condition that the side wall spacers are formed on the individual side walls of the gate electrode 7 (the word line WL), the gate electrode 8 and the local wiring lines $L_1$ and $L_2$.

Thus, in the foregoing embodiment 3, the connection holes 50, 51 and 52 are formed in the interlayer insulating film 49 after the side wall spacers 48 have been formed in advance on the individual side walls of the gate electrode 7 (the word line WL), the gate electrode 8 and the local wiring lines $L_1$ and $L_2$. In the present embodiment, on the contrary, the side wall spacers of silicon nitride are formed when the connection holes 50, 51 and 52 are formed by opening the interlayer insulating film 49.

In this embodiment, like embodiment 3, the gate electrode 7 (the word line WL), the gate electrode 8 and the local wiring lines $L_1$ and $L_2$ are not exposed on the side walls of the connection holes 50, 51 and 52 even if the connection holes 50, 51 and 52, the gate electrode 7 (the word line WL), and the gate electrode 8 overlap with each other and the connection holes 50, 51, and 52 and the local wiring lines overlap each other due to the misregistration of the photoresist mask. In short, in the case the manufacturing method of the present embodiment is used, when the connection holes 50, 51 and 52 are laid out, it is unnecessary to take into consideration the registration allowance between the connection holes 50, 51 and 52 and the local wiring lines $L_1$ and $L_2$ and the registration allowance between the connection holes 50, 51 and 52 and the gate electrode 7 (the word line WL) and the gate electrode 8. As a result, the connection holes 50, 51 and 52 can be laid out so as to be closer to the local wiring lines $L_1$ and $L_2$, the gate electrode 7 (the word line WL) and the gate electrode 8 by a distance corresponding to those registration allowances so that the area to be occupied by the memory cell can be reduced.

In order that the side wall spacers formed by the silicon nitride film 59 may function as the etching stopper, the thickness of the silicon nitride film 59 is made larger than the registration allowance of the aforementioned photoresist mask.

Figure 79:
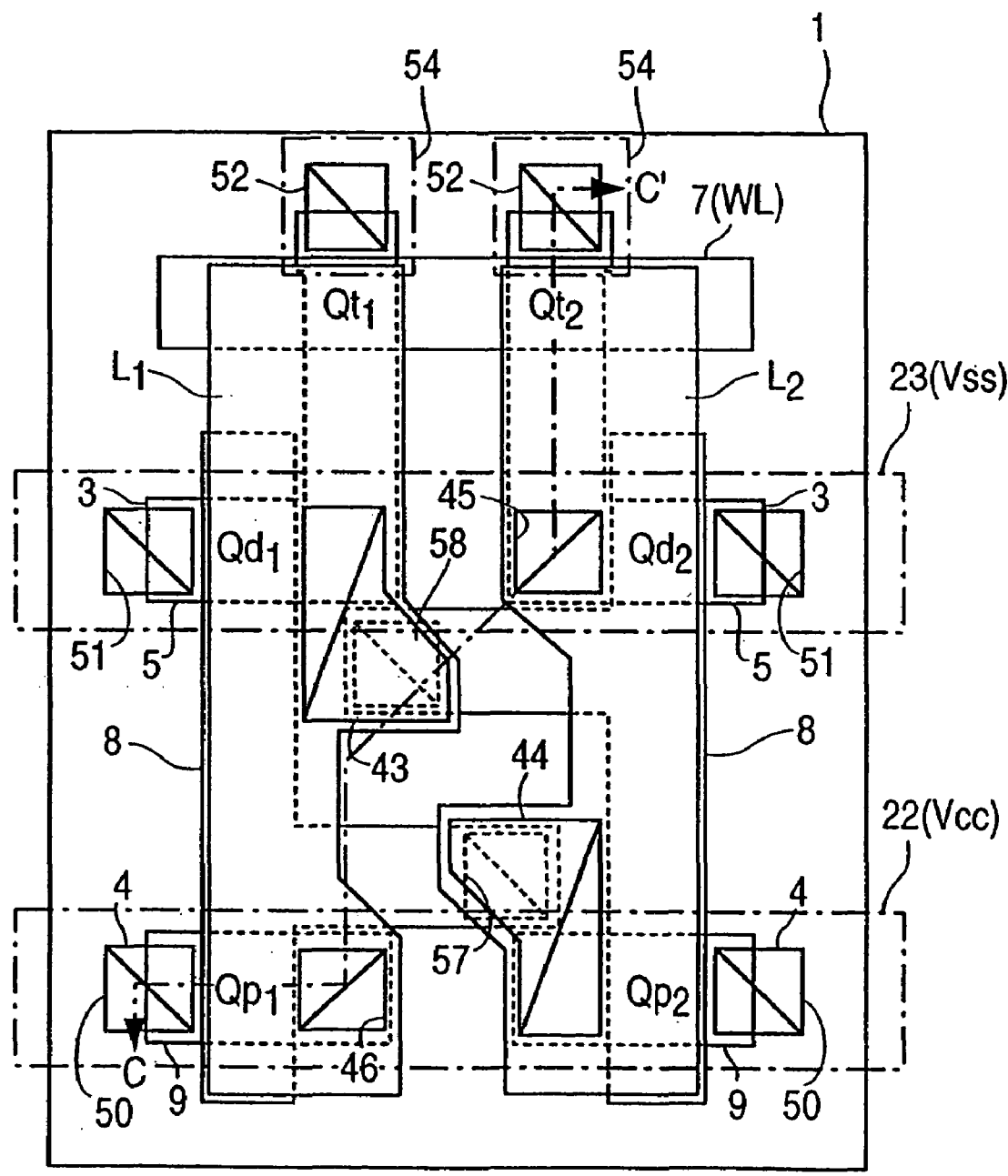
FIG. 79 is a top plan view showing the method for manufacturing the memory cell of the SRAM of this fourth embodiment according to the present invention.
Figure 80:
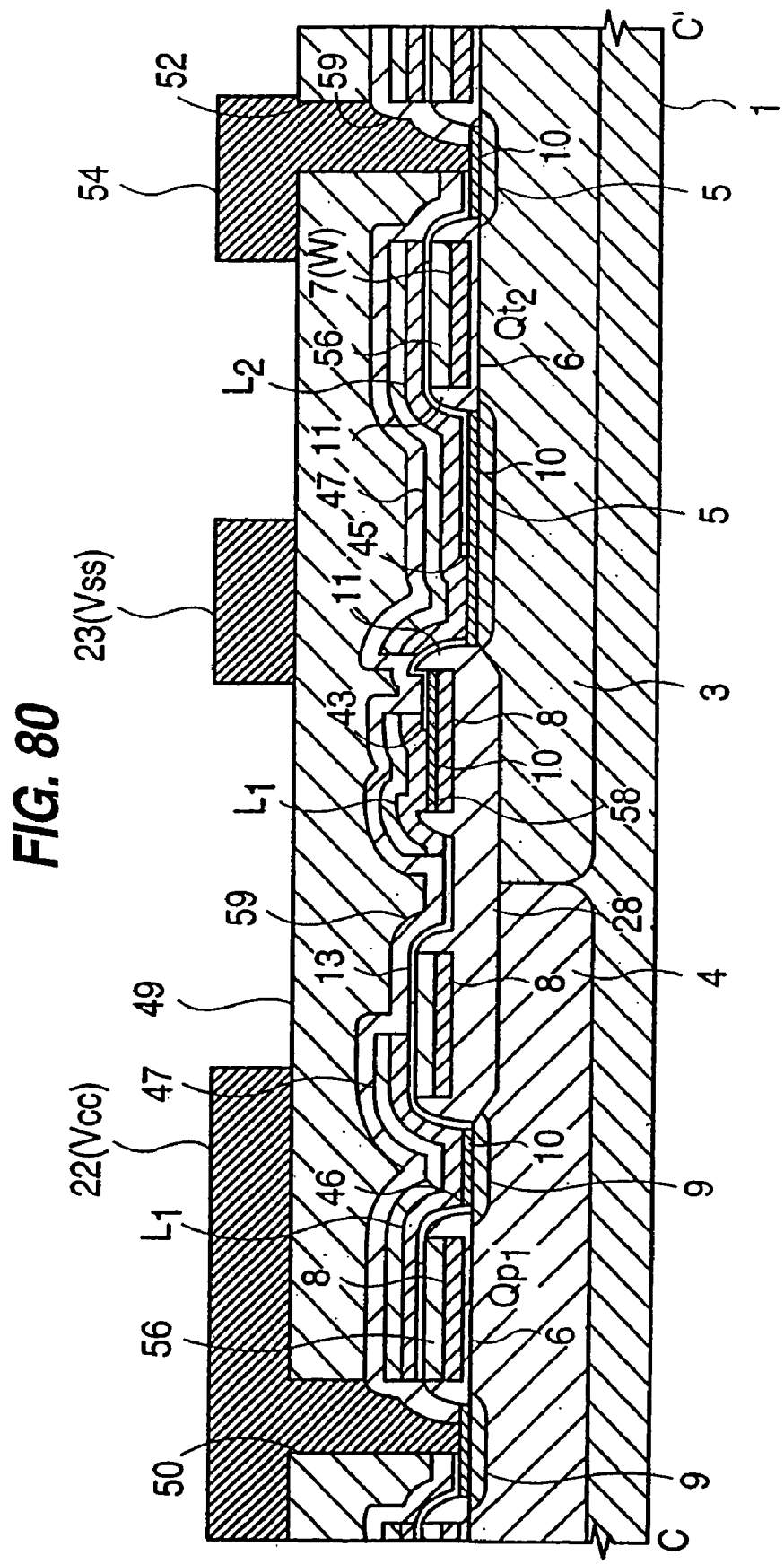
FIG. 80 is a section showing the method for manufacturing the memory cell of the SRAM of this fourth embodiment according to the present invention.
Figure 81:
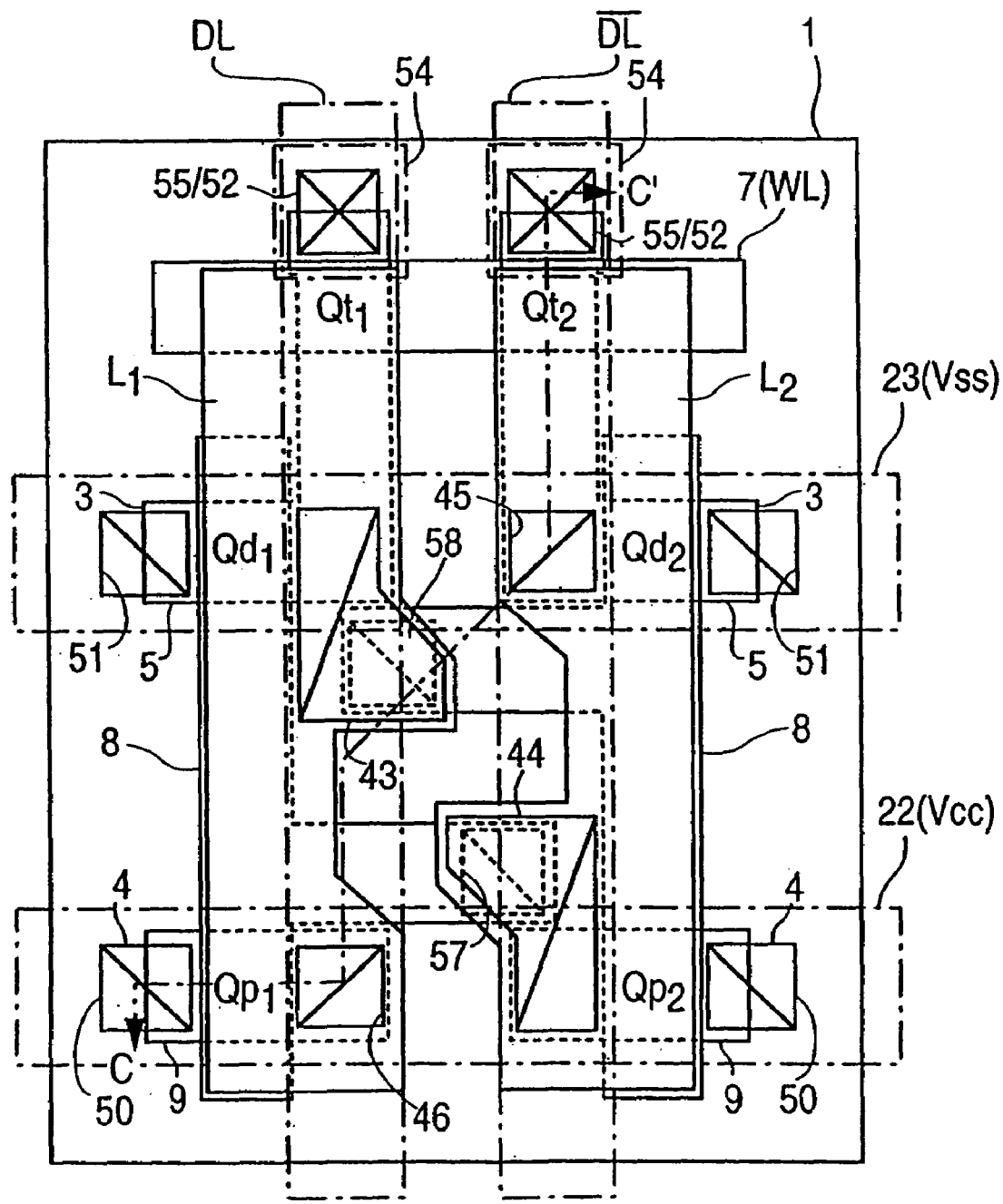
FIG. 81 is a top plan view showing the method for manufacturing the memory cell of the SRAM of this fourth embodiment according to the present invention.
Figure 82:
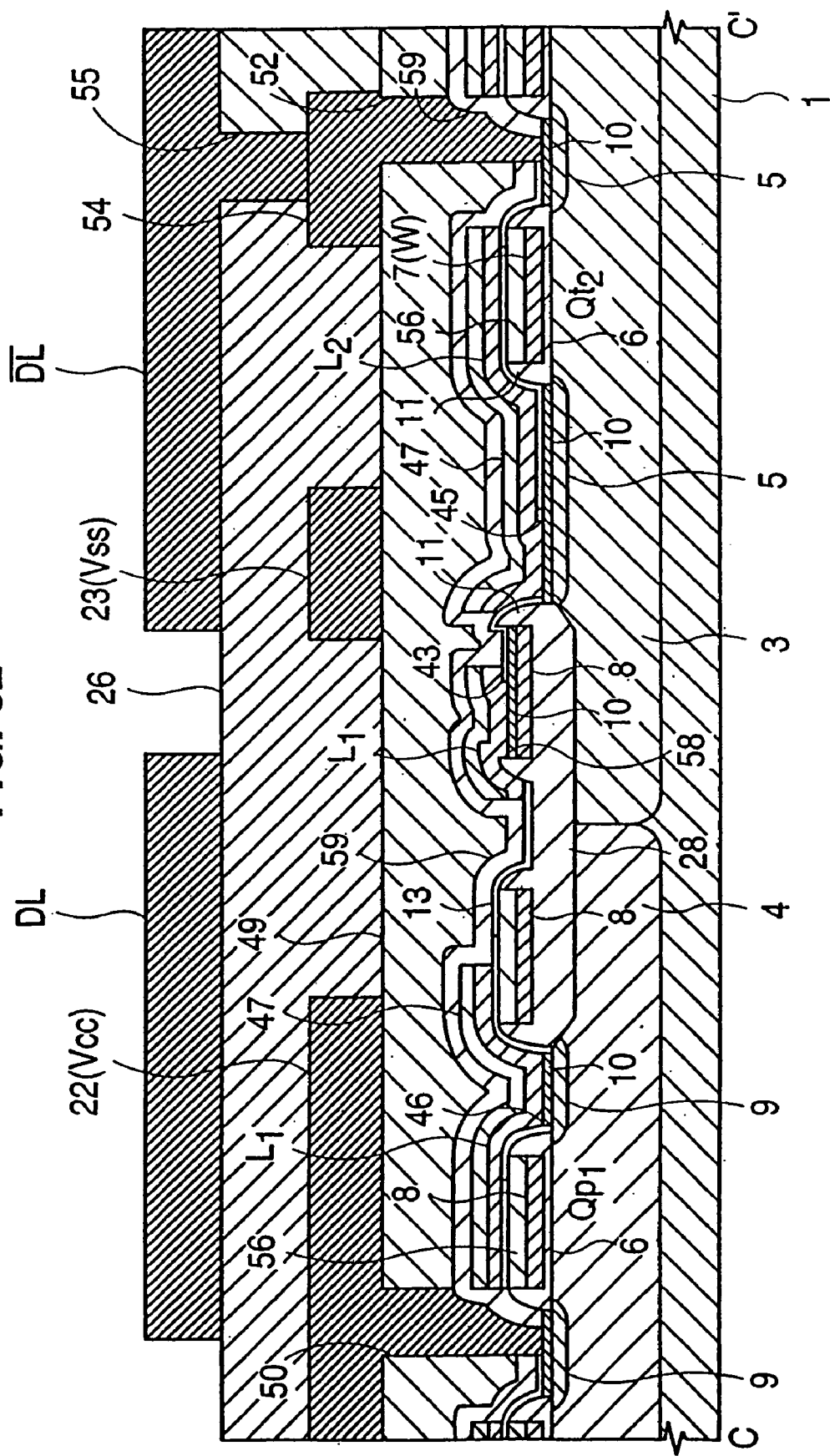
FIG. 82 is a section showing the method for manufacturing the memory cell of the SRAM of this fourth embodiment according to the present invention.

Next, as shown in FIGS. 79 and 80, the power supply voltage line 22, the reference voltage line 23 and the intermediate wiring line 54 are formed over the interlayer insulating film 49 in accordance with the manufacturing method of the aforementioned embodiment 3. Next, as shown in FIGS. 81 and 82, the interlayer insulating film 26 is deposited over the power supply voltage line 22, the reference voltage line 23 and the intermediate wiring line 54, and the interlayer insulating film 26 over the intermediate wiring line 54 is opened to form the connection hole 55 by a dry-etching method using a photoresist as the mask. After this, the data lines DL and DL are 5 formed over the interlayer insulating film 26.

According to the manufacturing method of the present embodiment, there are required neither the registration allowance between the connection holes 50, 51 and 52 and the local wiring lines $L_1$ and $L_2$ nor the registration allowance between the connection holes 50, 51 and 52 and the gate electrode 7 (the word line WL) and the gate electrode 8, and further neither the registration allowance between the connection holes 43 and 44 and the gate electrode 8 nor the registration allowance between the connection hole 43 and the n-type semiconductor region 5 (between the connection hole 44 and the p-type semiconductor region 9). As a result, the memory cell can be made smaller than that of the foregoing embodiment 3.

EMBODIMENT 5

In the SRAM of the present embodiment, the paired local wiring lines $L_1$ and $L_2$ are formed in different conductive layers, so that a capacitor element C is formed of the upper local wiring line $L_2$, the lower local wiring line $L_1$ and a thin insulating film interposed therebetween. The method for manufacturing the memory cell of this SRAM will be described with reference to FIGS. 83, 84(*a*) and (*b*), 85, 86(*a*) and (*b*), 87, 88(*a*) and (*b*), 89, 90(*a*) and (*b*), 91(*a*) and (*b*), 92, 93(*a*) and (*b*), 94, 95(*a*) and (*b*), 96 and 97(*a*) and (*b*).

Figure 83:
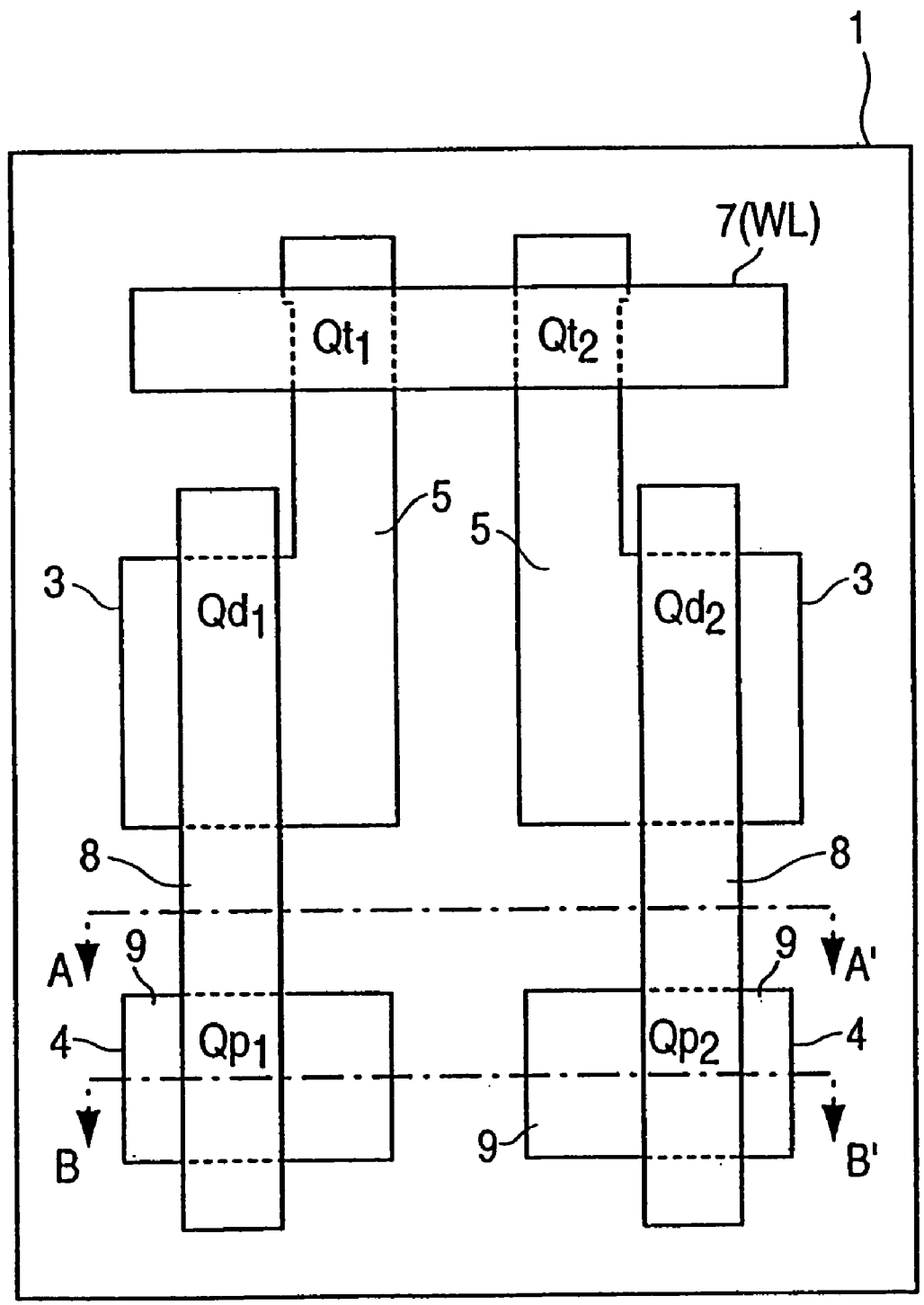
FIG. 83 is a top plan view showing the method for manufacturing a memory cell of the SRAM of a fifth embodiment according to the present invention.
Figure 84A:
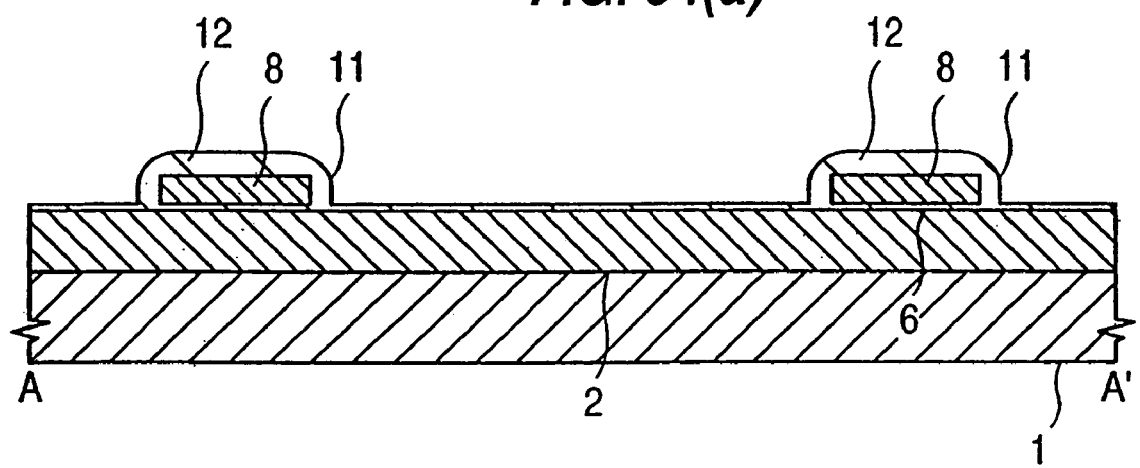
FIGS. 84(a) and 84(b) are sections showing the method for manufacturing the memory cell of the SRAM of this fifth embodiment according to the present invention.
Figure 84B:
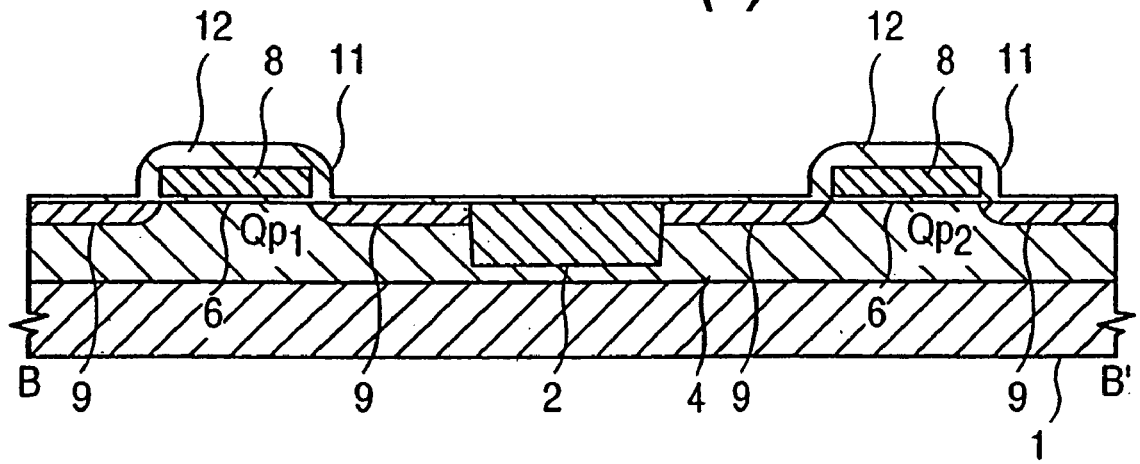

First of all, as shown in FIGS. 83 and 84(*a*) and (*b*), in accordance with the manufacturing method of the foregoing embodiment 1, the element isolating groove 2 and then the p-type well 3 and the n-type well 4 are formed in a major face of the semiconductor substrate 1, and the gate oxide film 6 of the MISFET is formed over the p-type well 3 and the n-type well 4. After this, the drive MISFETs $Qd_1$ and $Qd_2$ and the transfer MISFETs $Qt_1$ and $Qt_2$ are formed in the p-type well 3, and the load MISFETs $Qp_1$ and $Qp_2$ are formed in the n-type well 4. The gate electrode 7 (the word line WL) and the gate electrode 8 are composed of a polycrystalline silicon film, and the cap insulating film is composed of the silicon oxide film 12. The side wall spacers 11 on the individual side walls of the gate electrode 7 (the word line WL) and the gate electrode 8 are formed by etching a silicon oxide film.

Figure 85:
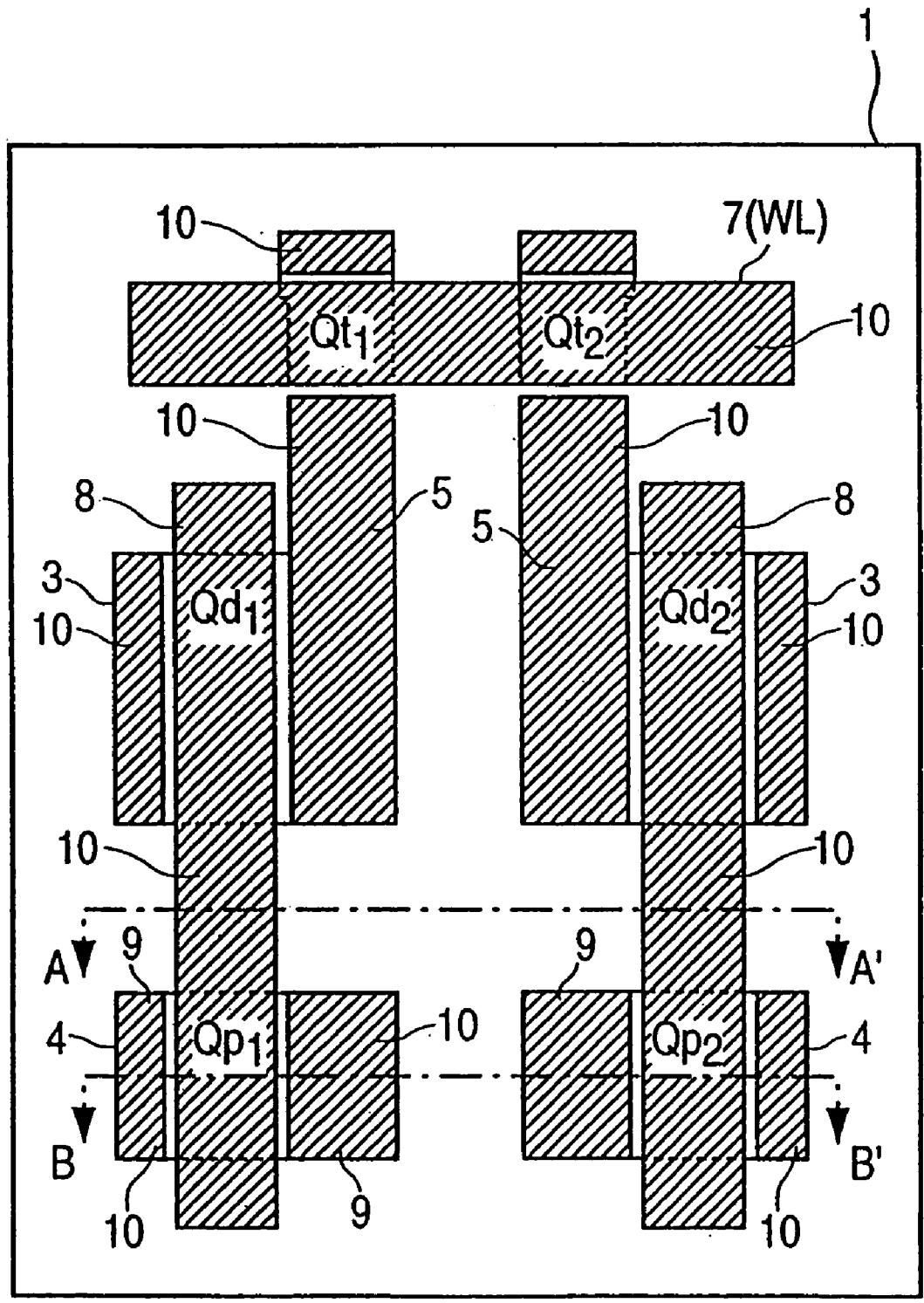
FIG. 85 is a top plan view showing the method for manufacturing the memory cell of the SRAM of this fifth embodiment according to the present invention.
Figure 86A:
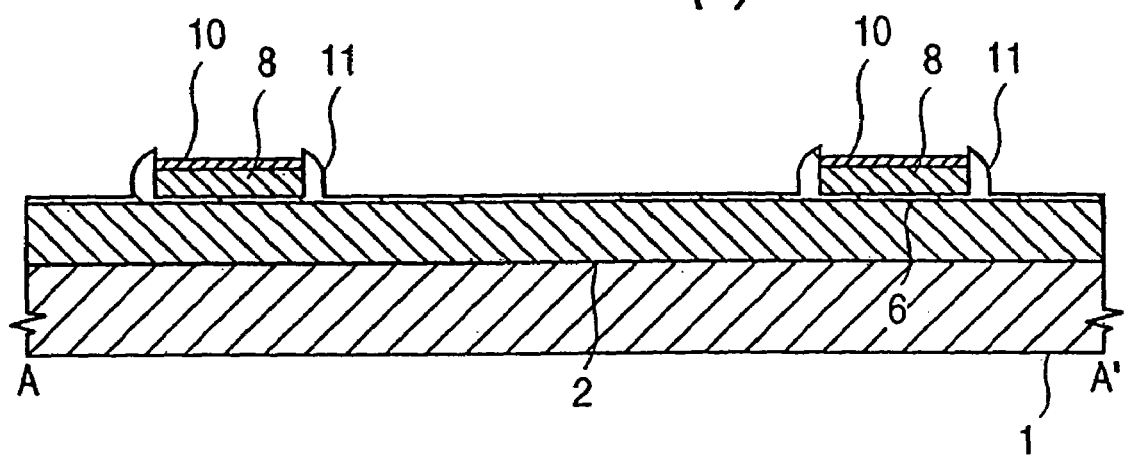
FIGS. 86(a) and (b) are sections showing the method for manufacturing the memory cell of the SRAM of this fifth embodiment according to the present invention.
Figure 86B:
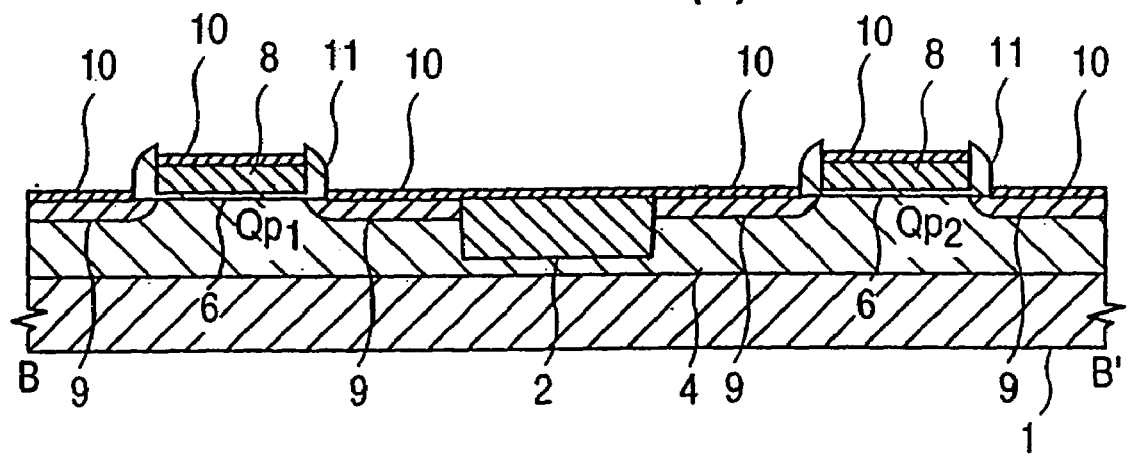

Next, as shown in FIGS. 85 and 86(*a*) and (*b*), in accordance with the manufacturing method of the foregoing embodiment 3, the Ti-silicide layer 10 is formed to reduce the sheet resistance over the individual surfaces of the gate electrode 7 (the word line WL) of the transfer MISFETs $Qt_1$ and $Qt_2$, the gate electrode 8 and 8 of the drive MISFETs $Qd_1$ and $Qd_2$ (the load MISFETs $Qp_1$ and $Qp_2$), the individual n-type semiconductor regions 5 and 5 (the source region and the drain region) of the transfer MISFETs $Qd_1$ and $Qt_2$ and the drive MISFETs $Qd_1$ and $Qd_2$, the individual p-type semiconductor regions 9 and 9 (the source region and the drain region) of the load MISFETs $Qp_1$ and $Qp_2$.

Figure 87:
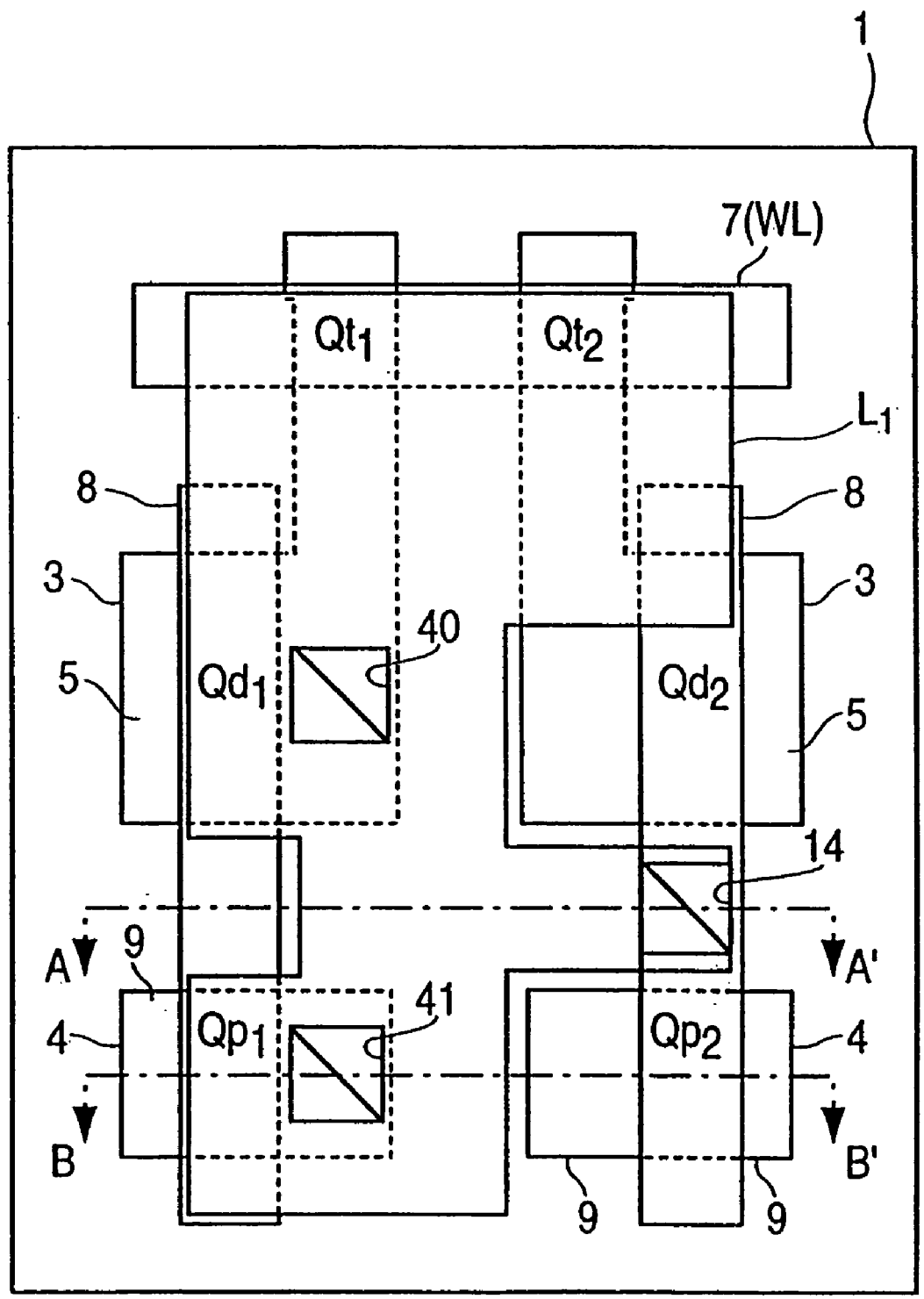
FIG. 87 is a top plan view showing the method for manufacturing the memory cell of the SRAM of this fifth embodiment according to the present invention.
Figure 88A:
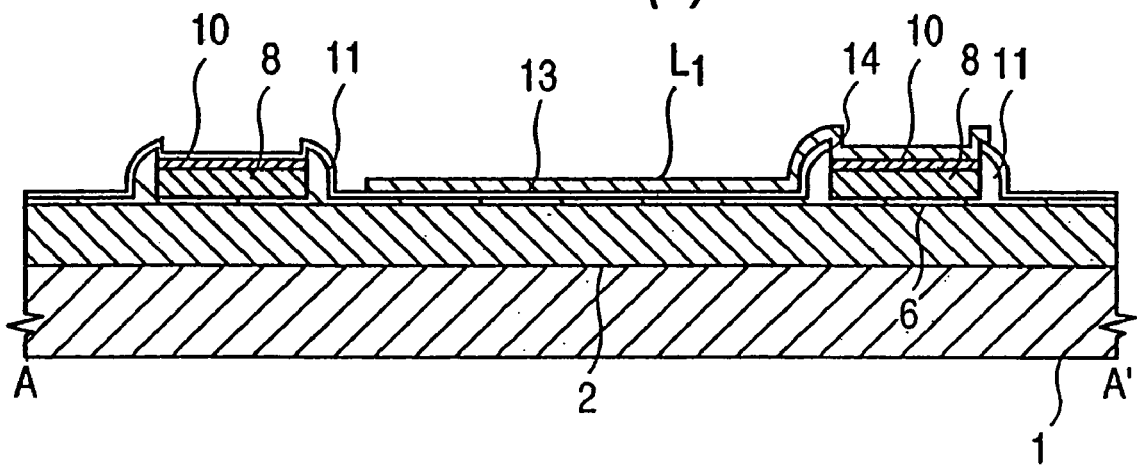
FIGS. 88(a) and 88(b) are sections showing the method for manufacturing the memory cell of the SRAM of this fifth embodiment according to the present invention.
Figure 88B:
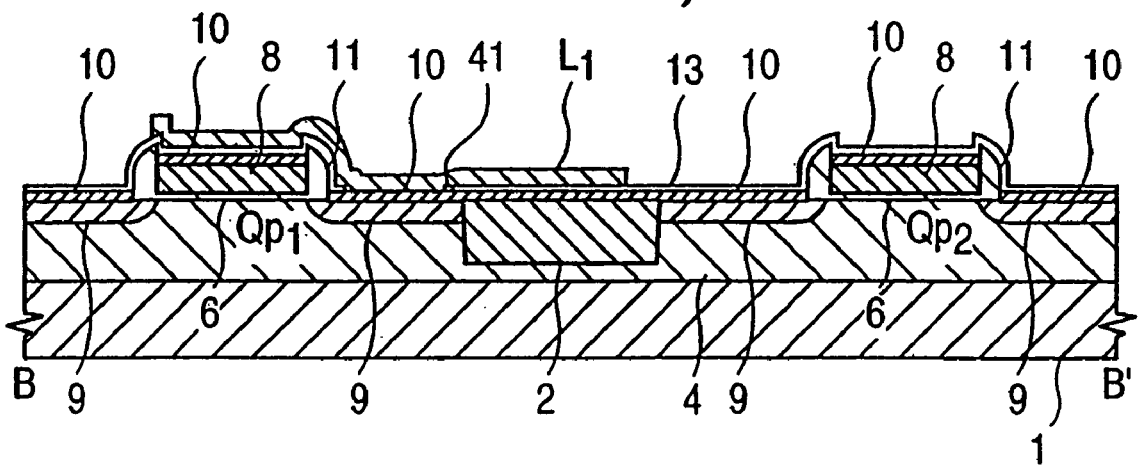

Next, as shown in FIGS. 87 and 88(*a*) and (*b*), the silicon nitride film 13, deposited over the semiconductor substrate by a CVD method and having a small thickness of about 50 nm, is etched to form the connection hole 14 over the gate electrode 8 of the drive MISFET $Qd_2$ (the load MISFET Qp$_2$), the connection hole 40 over the n-type semiconductor region 5 (the drain region) of the drive MISFET Qd$_1$ and the connection hole 41 over the p-type semiconductor region 9 (the drain region) of the load MISFET Qp$_1$. After this, the TiN film, deposited over the silicon nitride film 13 by a sputtering method or a CVD method and having a thickness of about 100 nm, is patterned to form the local wiring line L$_1$. This local wiring line L$_1$ is given an area wide enough to cover the six MISFETs constituting the memory cell. The local wiring line L$_1$ is connected through the connection hole 14 with the gate electrode 8 of the drive MISFET Qd$_2$ (the load MISFET Qp$_2$), through the connection hole 40 with the n-type semiconductor region 5 (the drain region) of the drive MISFET Qd$_1$, and through the connection hole 41 with the p-type semiconductor region 9 (the drain region) of the load MISFET Qp$_1$.

Figure 89:
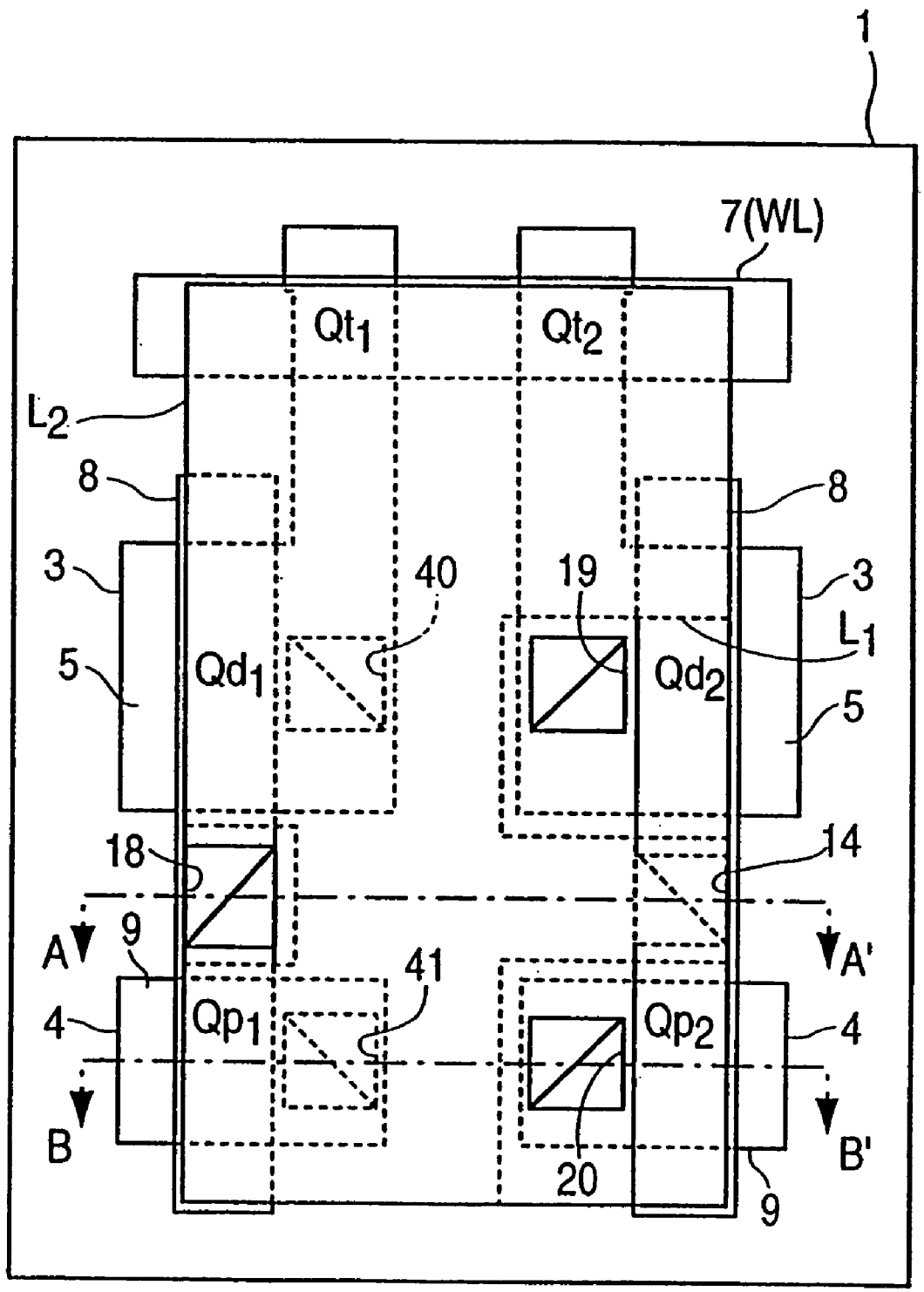
FIG. 89 is a top plan view showing the method for manufacturing the memory cell of the SRAM of this fifth embodiment according to the present invention.
Figure 90A:
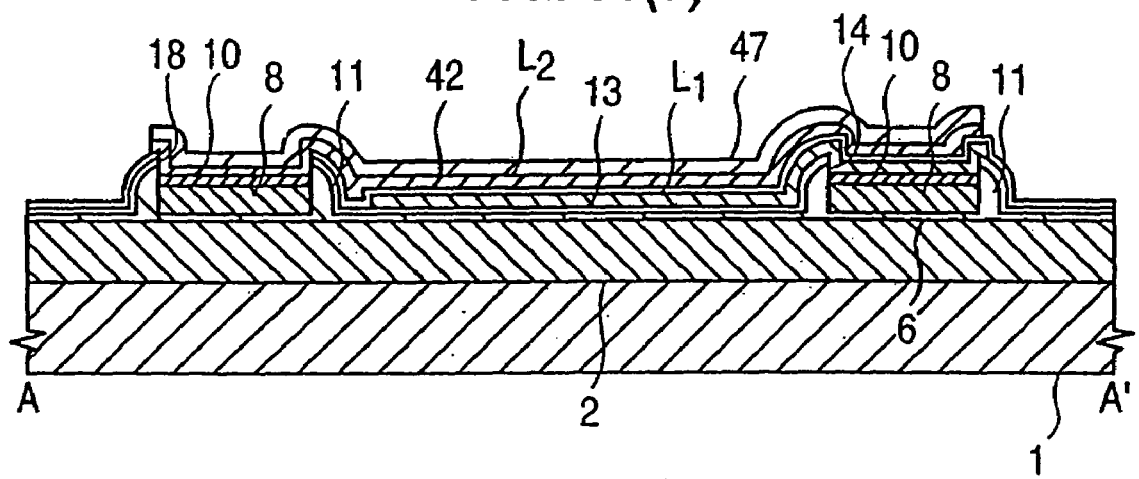
FIGS. 90(a) and 90(b) are sections showing the method for manufacturing the memory cell of the SRAM of this fifth embodiment according to the present invention.
Figure 90B:
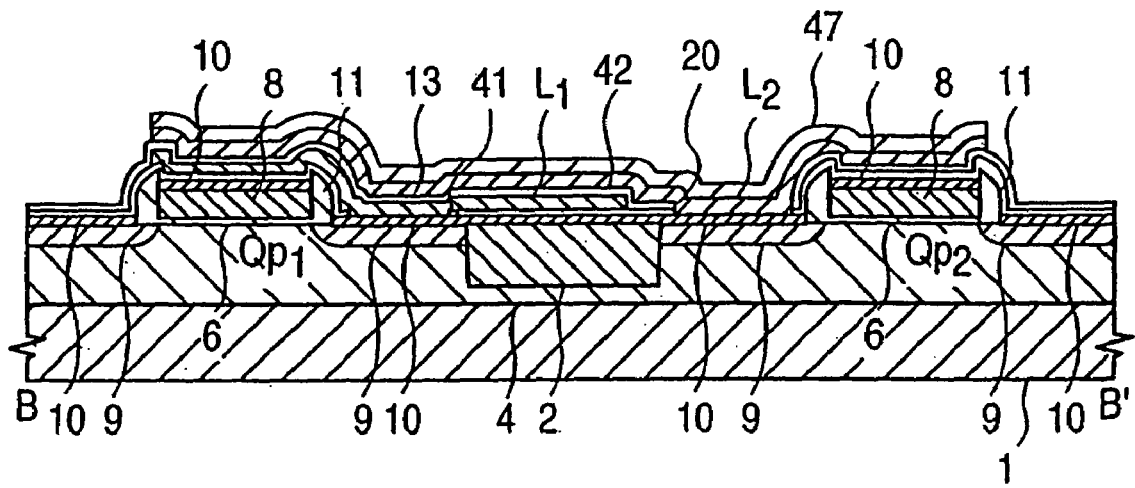

Next, as shown in FIGS. 89 and 90(a) and (b), the silicon nitride film 42, deposited over the semiconductor substrate 1 by a CVD method and having a small thickness of about 30 nm, is etched to form the connection hole 18 over the gate electrode 8 of the drive MISFET Qd$_1$ (or the load MISFET Qp$_1$), the connection hole 19 over the n-type semiconductor region 5 (the drain region) of the drive MISFET Qd$_2$, and the connection hole 20 over the p-type semiconductor region 9 (the drain region) of the load MISFET Qp$_2$. After this the local wiring line L$_2$ of a TiN film is formed over the silicon nitride film 42. The local wiring line L$_2$ is connected through the connection hole 18 with the gate electrode 8 of the drive MISFET Qd$_1$ (the load MISFET Qp$_1$), through the connection hole 19 with the n-type semiconductor region 5 (the drain region) of the drive MISFET Qd$_2$, and through the connection hole 20 with the p-type semiconductor region 9 (the drain region) of the load MISFET Qp$_2$.

The local wiring line L$_2$ is formed by depositing a TiN film having a thickness of about 100 nm over the silicon nitride film 42 by a sputtering method or a CVD method, by then depositing the silicon nitride film 47 having a thickness of about 100 nm over the TiN film by a CVD method, and thereafter by patterning the silicon nitride film 47 and the TiN film by a dry etching method using a photoresist as the mask. The local wiring line L$_2$ is given an area wide enough to cover the six MISFETs constituting the memory cell and to overlap the lower local wiring line L$_1$ substantially completely in the region excepting the open regions of the connection holes 18, 19 and 20 and the registration allowance region. As a result, the capacitor element C is formed of the local wiring lines L$_1$ and L$_2$ (the paired electrodes) and the silicon nitride film 42 (the dielectric film) made thinner than the local wiring lines L$_1$ and L$_2$. Moreover, the charge of the capacitor element C can be increased so that the amount of stored charge of the storage node can be increased to improve the alpha particle soft error resistance of the memory cell.

Figure 91A:
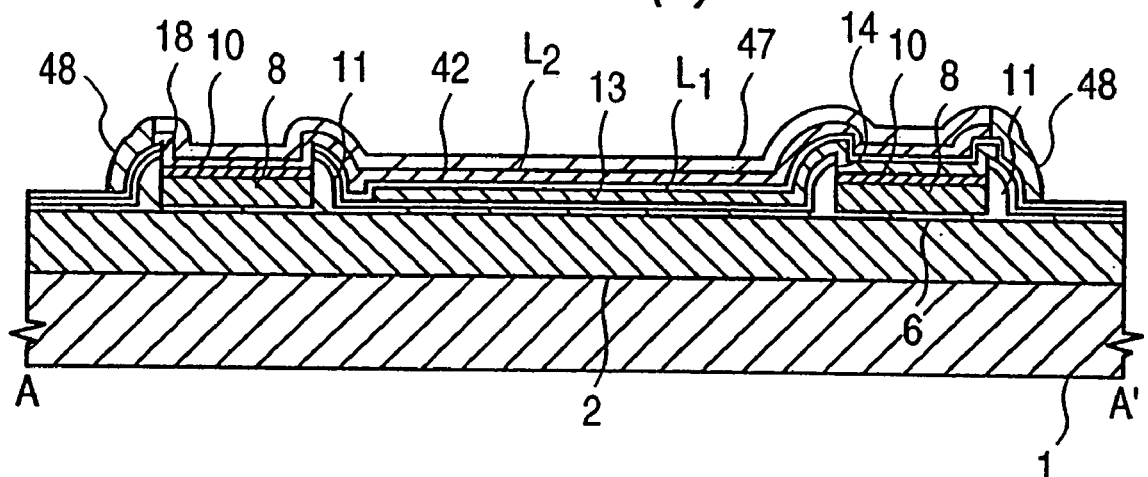
FIGS. 91(a) and 91(b) are sections showing the method for manufacturing the memory cell of the SRAM of this fifth embodiment according to the present invention.
Figure 91B:
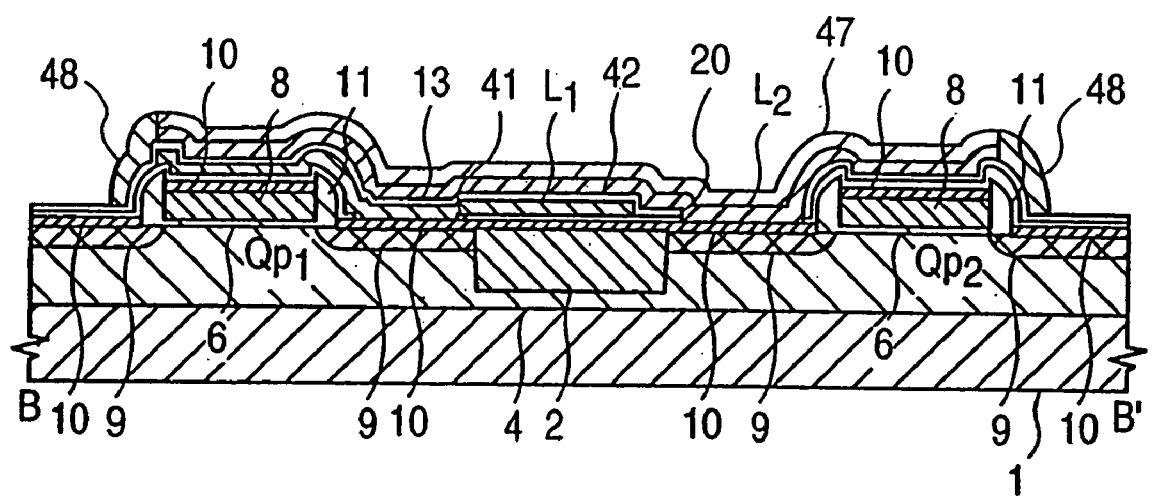

Next, as shown in FIG. 91(a) and (b), the side wall spacers 48 are formed on the individual side walls of the gate electrode 8, the lower local wiring line L$_1$ and the upper local wiring line L$_2$. The side wall spacer 48 is also formed on the side wall of the gate electrode 7 (the word line WL), although not shown. The side wall spacers 48 are formed by etching a silicon nitride film which is deposited over the silicon nitride film 47 by a CVD method and has a thickness of about 200 nm.

Figure 92:
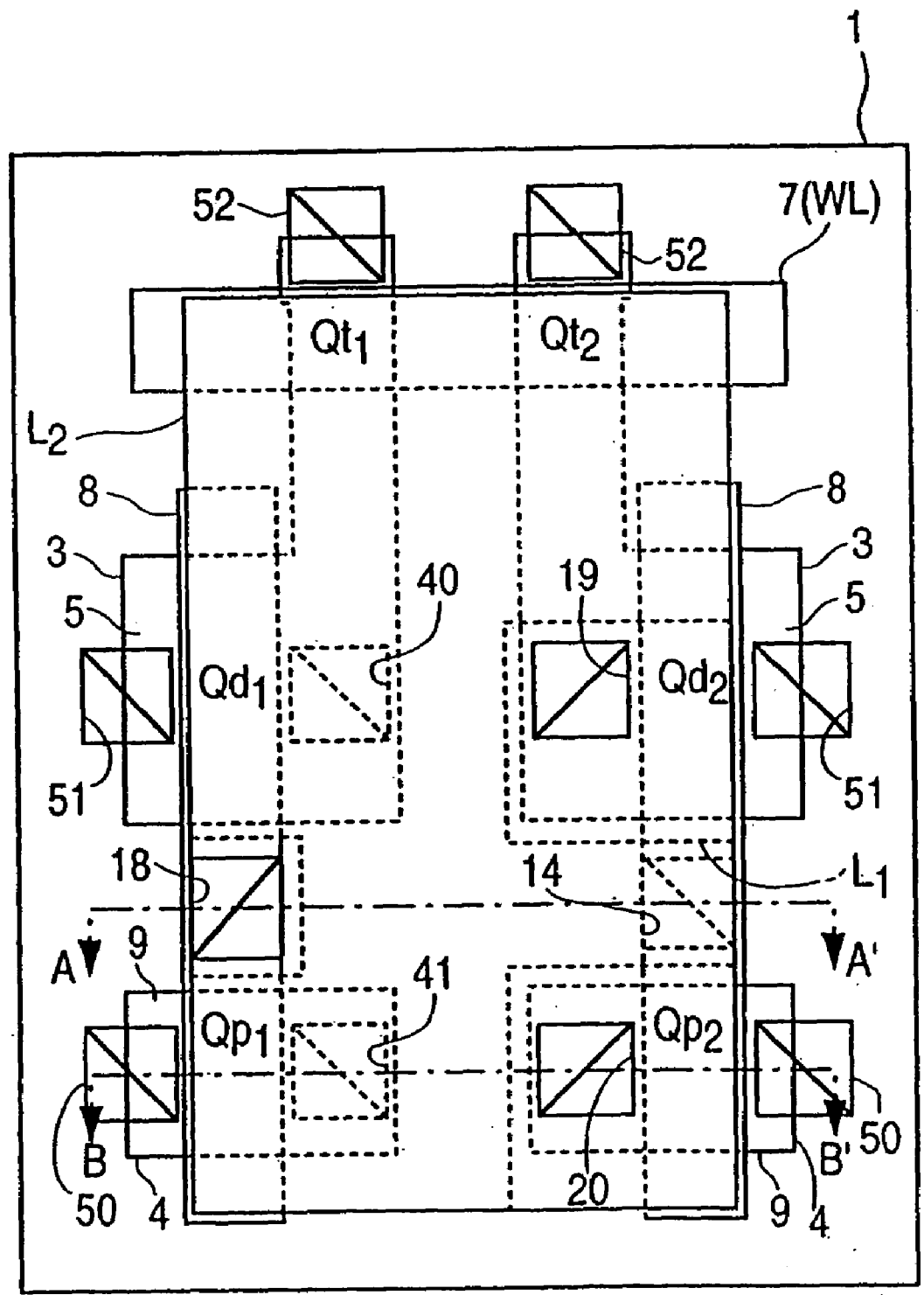
FIG. 92 is a top plan view showing the method for manufacturing the memory cell of the SRAM of this fifth embodiment according to the present invention.
Figure 93A:
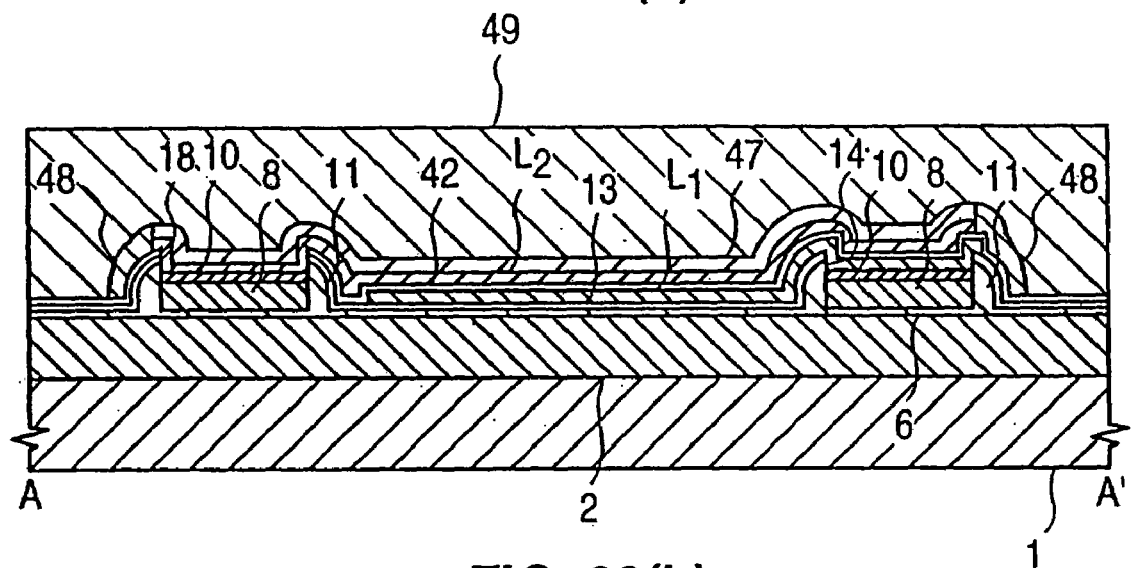
FIGS. 93(a) and 93(b) are sections showing the method for manufacturing the memory cell of the SRAM of this fifth embodiment according to the present invention.
Figure 93B:
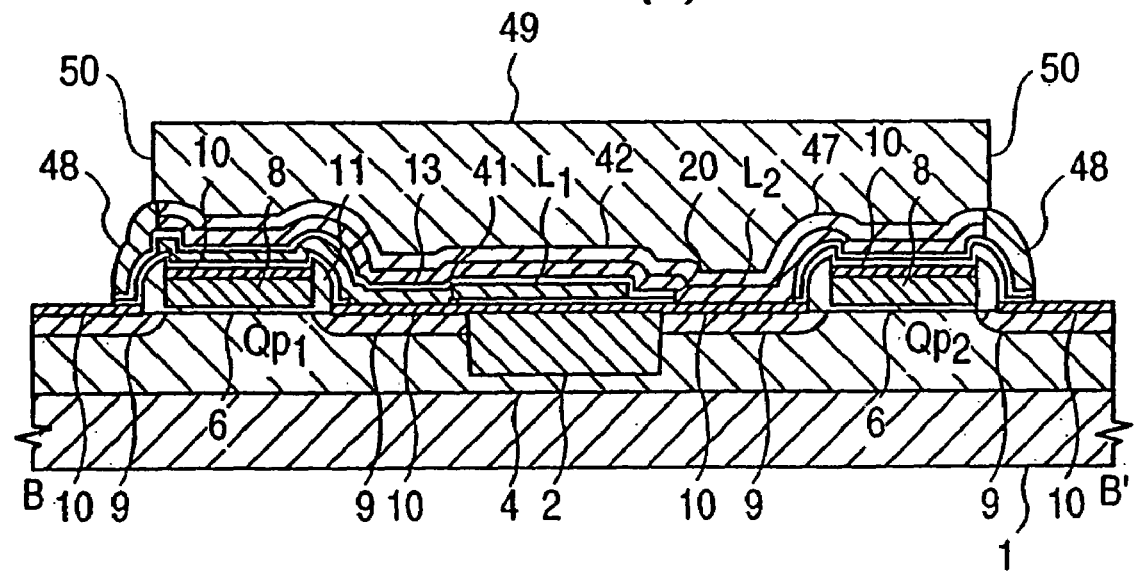

Next, as shown in FIGS. 92 and 93(a) and (b), the interlayer insulating film 49 of PSG having a thickness of about 400 nm is deposited over the silicon nitride film 47 by a CVD method. After this, the interlayer insulating film 49 is opened by a dry-etching method using a photoresist as the mask to form the connection holes 50 and 50 over the p-type semiconductor regions 9 and 9 (the source regions) of the load MISFETs Qp$_1$ and Qp$_2$, the connection holes 51 and 51 over the n-type semiconductor region 5 and 5 (the source regions) of the drive MISFETs Qd$_1$ and Qd$_2$, and the connection holes 52 and 52 over the n-type semiconductor regions 5 and 5 (the drain regions) of the transfer MISFETs Qt$_1$ and Qt$_2$. Since, at this time, the side wall spacers 48 on the silicon nitride film act as the etching stoppers, neither the gate electrode 8 is exposed at the side walls of the connection holes 50 and 51, nor is exposed the gate electrode 7 (the word line WL) at the side wall of the connection hole 52. Likewise, neither the lower local wiring line L$_1$ nor the upper local wiring line L$_2$ is exposed at the side walls of the connection holes 50, 51 and 52.

In short, when the manufacturing method of the present embodiment is applied to the SRAM in which the paired local wiring lines L$_1$ and L$_2$ are arranged in the different conductive layers, it is unnecessary to take into consideration the registration allowance between the connection holes 50, 51 and 52 and the upper local wiring line L$_2$, and the registration allowance between the connection holes 50, 51 and 52 and the gate electrode 7 (the word line WL) and the gate electrode 8. As a result, the connection holes 50, 51 and 52 can be so arranged as to be closer to the upper local wiring line L$_2$, the lower local wiring line L$_1$, the gate electrode 7 (word line WL) and the gate electrode 8 by a distance corresponding to those registration allowances so that the area occupied by the memory cell can be reduced. In order that the side wall spacers 48 may function as the etching stoppers when the interlayer insulating film 49 is etched, the thickness of the silicon nitride film constituting the side wall spacers 48 is made larger than the registration allowance of the aforementioned photoresist mask.

In the present embodiment, the side wall spacers 48 of the silicon nitride are formed in advance on the individual side walls of the gate electrode 7 (the word line WL), the gate electrode 8, the lower local wiring line L$_1$ and the upper local wiring line L$_2$, and the connection holes 50, 51 and 52 are then formed in the interlayer insulating film 49. As in the foregoing embodiment 4, the silicon nitride film and the interlayer insulating film 49 are deposited over the silicon nitride film 47 covering the upper local wiring line L$_2$ so that the side wall spacers may be formed when the interlayer insulating film 49 is opened to form the connection holes 50, 51 and 52.

Figure 94:
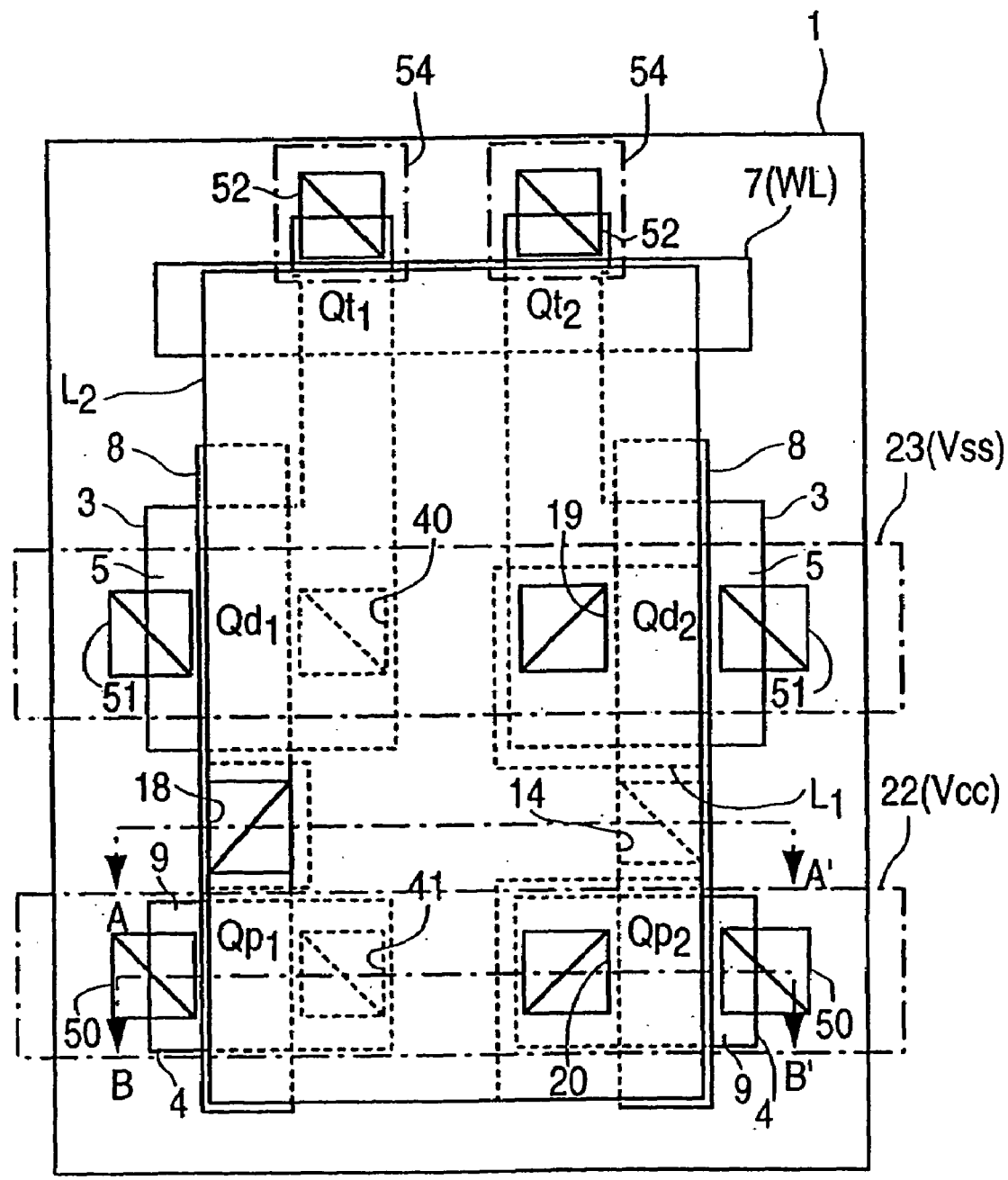
FIG. 94 is a top plan view showing the method for manufacturing the memory cell of the SRAM of this fifth embodiment according to the present invention.
Figure 95A:
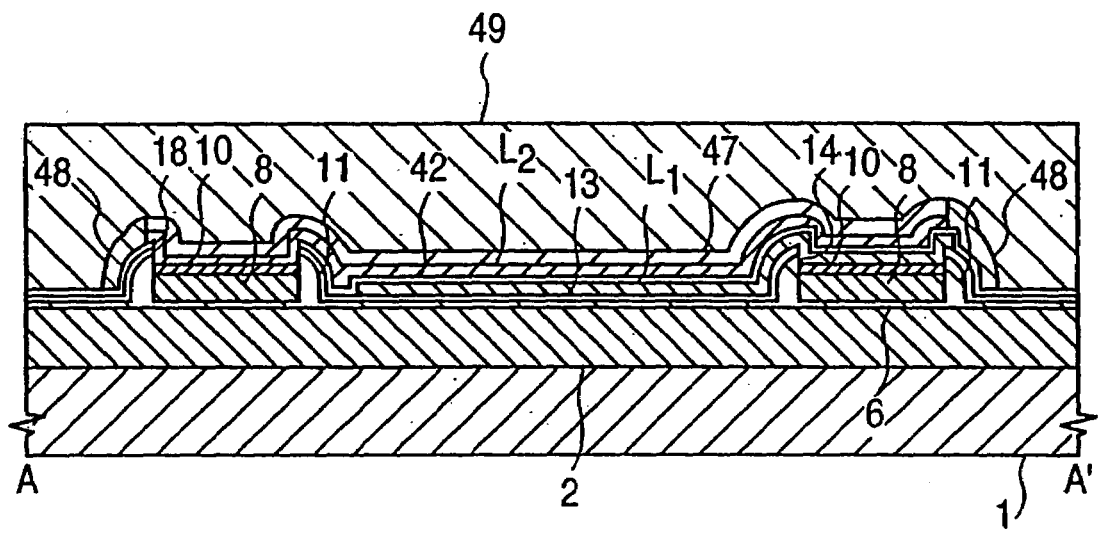
FIGS. 95(a) and 95(b) are sections showing the method for manufacturing the memory cell of the SRAM of this fifth embodiment according to the present invention.
Figure 95B:
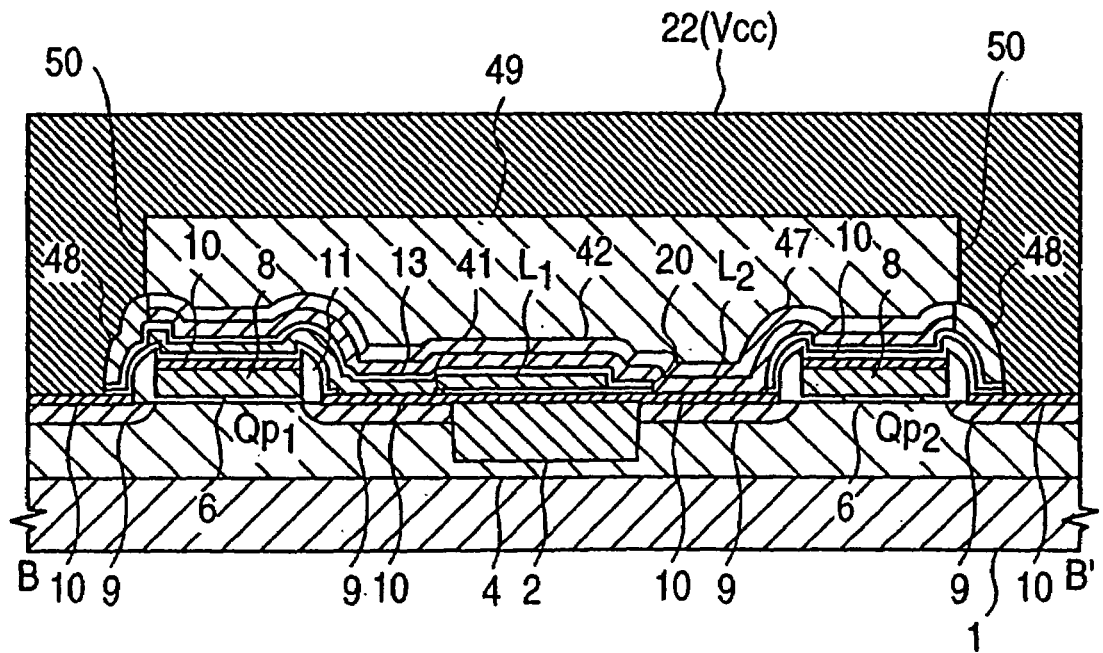
Figure 96:
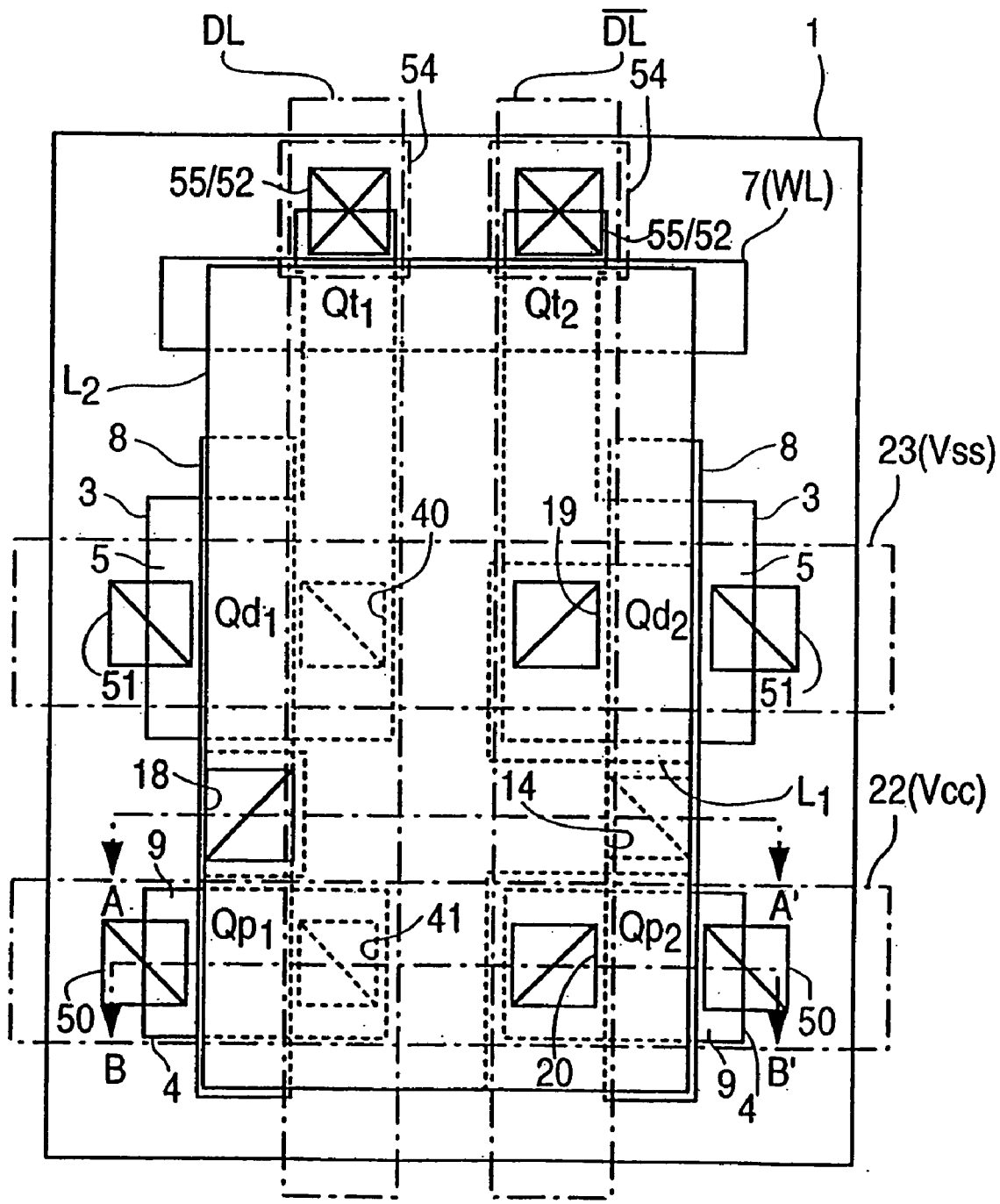
FIG. 96 is a top plan view showing the method for manufacturing the memory cell of the SRAM of this fifth embodiment according to the present invention.
Figure 97A:
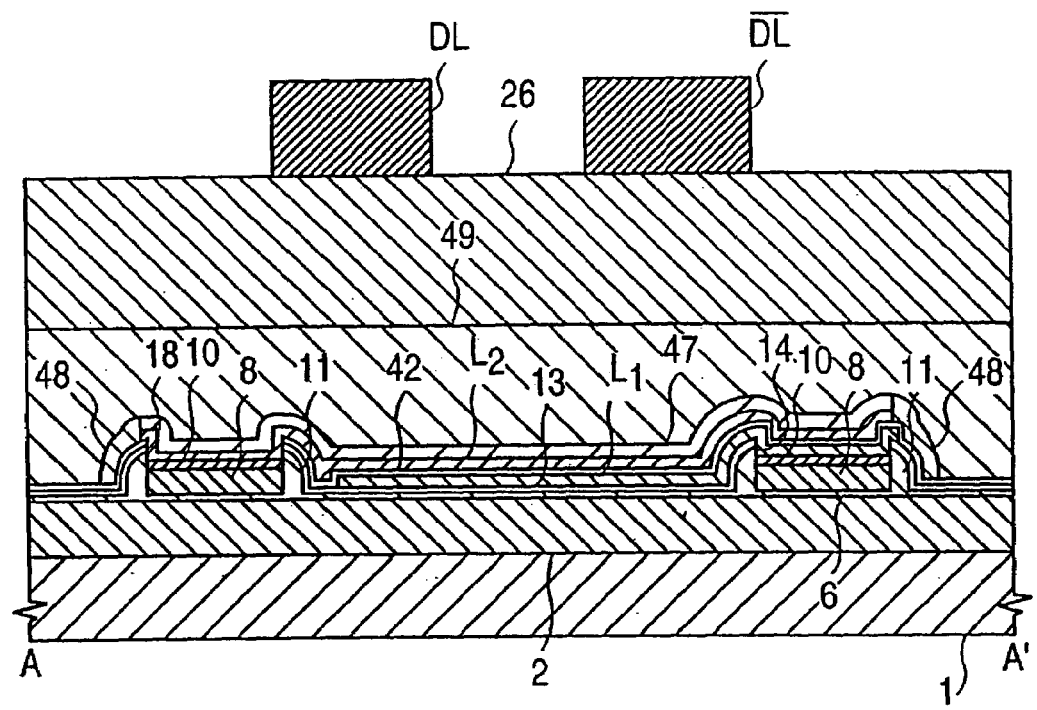
FIGS. 97(a) and 97(b) are sections showing the method for manufacturing the memory cell of the SRAM of this fifth embodiment according to the present invention.
Figure 97B:
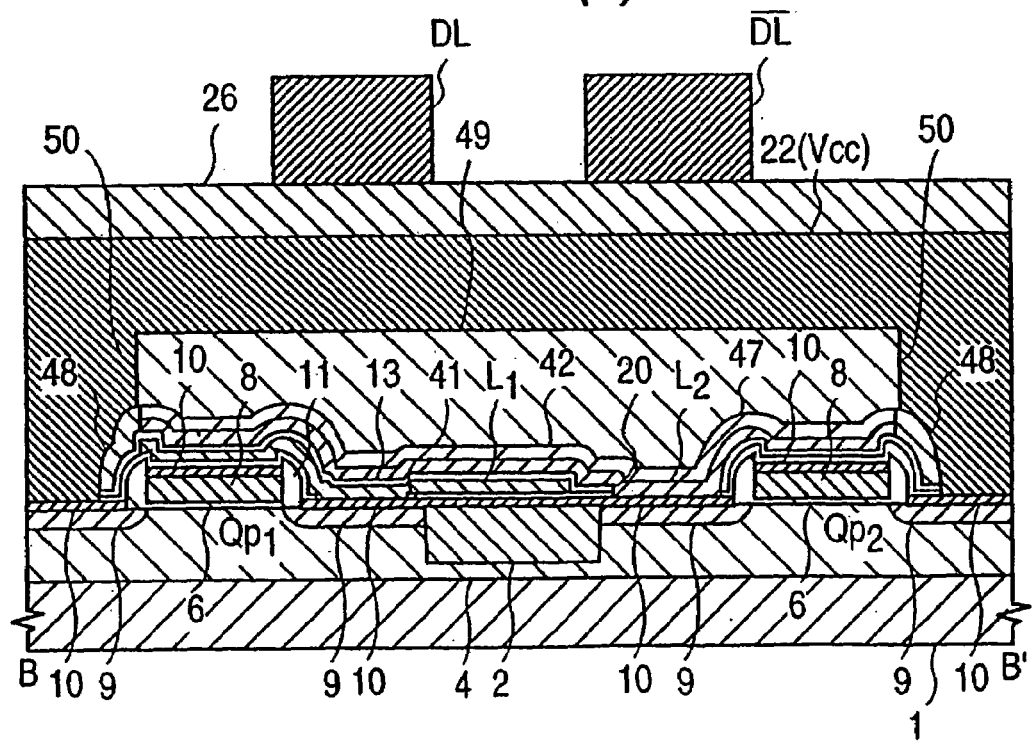

Next, as shown in FIGS. 94 and 95(a) and (b), in accordance with the manufacturing method of the foregoing embodiment 3, the power supply voltage line 22, the reference voltage line 23 and the intermediate wiring line 54 are formed over the interlayer insulating film 49. After this, as shown in FIGS. 96 and 97(a) and (b), the interlayer insulating film 26 is deposited over the power supply voltage line 22, the reference voltage line 23 and the intermediate wiring line 54, and the interlayer insulating film 26 ever the intermediate wiring line 54 is opened to form the connection hole 55. After this, the data lines DL and DL are formed over the interlayer insulating film 26.

According to the present embodiment, the paired local wiring lines L$_1$ and L$_2$ are formed in different conductive layers and are so arranged as to be superposed on each other so that the area occupied by the memory cell can be reduced. At the same time, there are made unnecessary the registration allowance between the connection holes 50, 51 and 52 and the upper local wiring line L$_2$, the registration allowance between the connection holes 50, 51 and 52 and the lower local wiring line L$_1$, and the registration allowance between the connection holes 50, 51 and 52 and the gate electrode 7 (the word line WL) and the gate electrode 8, so that the area occupied by the memory cell can be further reduced.

According to the present embodiment, the upper local wiring line $L_2$ and the lower local wiring line $L_1$ are so arranged as to overlap with each other over a wide area, and the capacitor element C is composed of the local wiring lines $L_1$ and $L_2$ and the thin insulating film interposed therebetween, so that the alpha particle soft error resistance of the memory cell can be improved.

EMBODIMENT 6

In the SRAM of the present embodiment, the paired local wiring lines $L_1$ and $L_2$ are formed in different conductive layers, so that a capacitor element C is formed of the upper local wiring line $L_2$, the lower local wiring line $L_1$ and a thin insulating film interposed therebetween. The method for manufacturing the memory cell of this SRAM will be described with reference to FIGS. 98, 99(a) and (b), 100, 101(a) and (b), 102, 103(a) and (b), 104, 105(a) and (b), 106(a) and (b), 107(a) and (b), 108 and 109.

Figure 98:
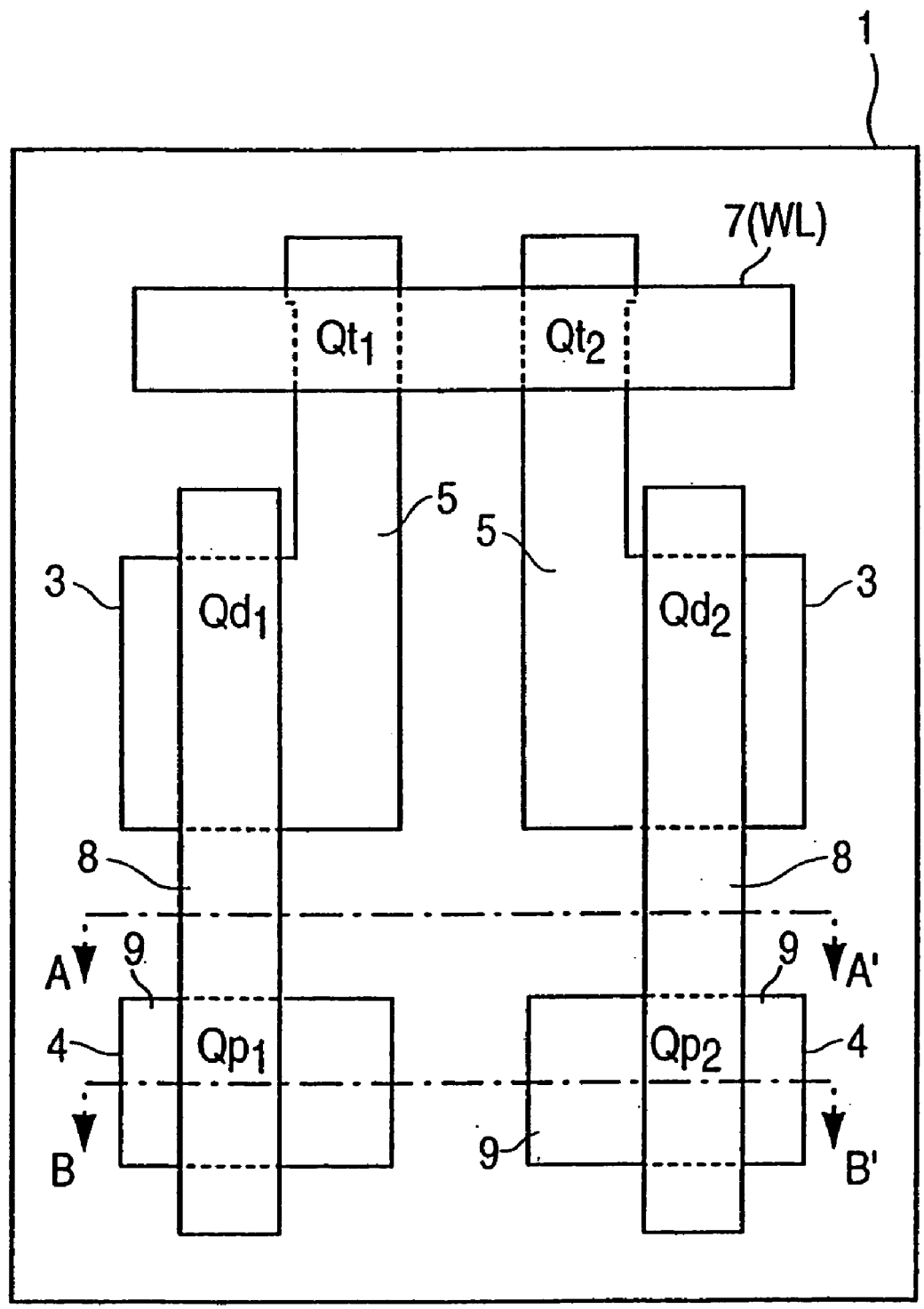
FIG. 98 is a top plan view showing the method for manufacturing a memory cell of the SRAM of a sixth embodiment according to the present invention.
Figure 99A:
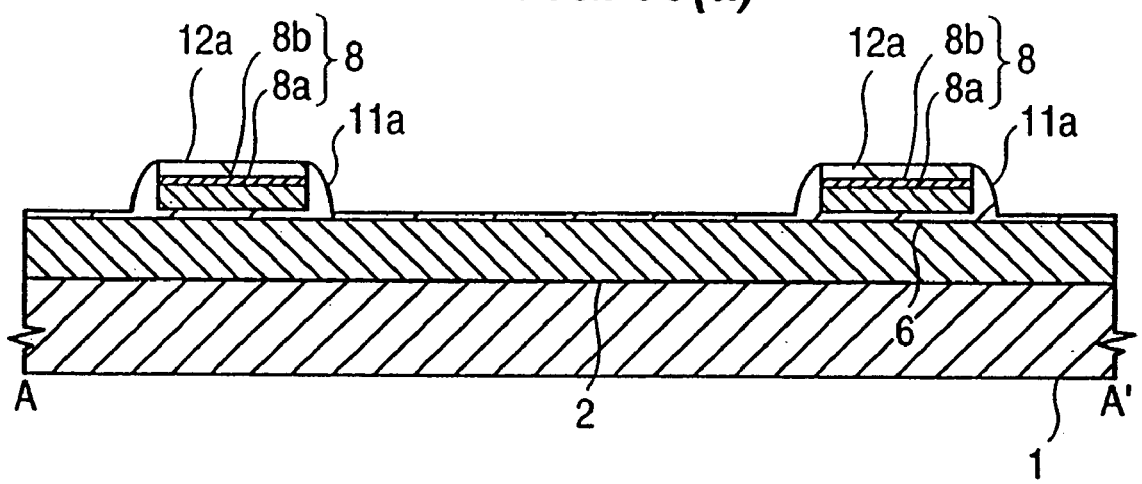
FIGS. 99(a) and 99(b) are sections showing the method for manufacturing the memory cell of the SRAM of this sixth embodiment according to the present invention.
Figure 99B:
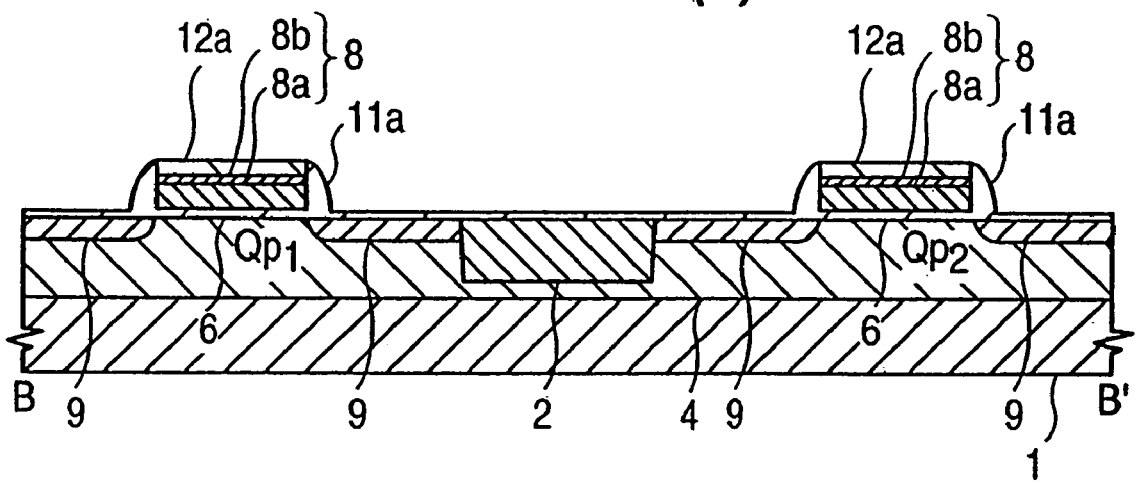

First of all, as shown in FIGS. 98 and 99(a) and (b), in accordance with the manufacturing method of the foregoing embodiment 1, the element isolating groove 2 and then the p-type well 3 and the n-type well 4 are formed in a major face of the semiconductor substrate 1, and the gate oxide film 6 of the MISFET is formed over the p-type well 3 and the n-type well 4. After this, the drive MISFETs $Qd_1$ and $Qd_2$ and the transfer MISFETs $Qt_1$ and $Qt_2$ are formed in the p-type well 3, and the load MISFETs $Qp_1$ and $Qp_2$ are formed in the n-type well 4. The gate electrode 7 (the word line WL) and the gate electrode 8 are composed of a polycrystalline silicon 8a and Ti-silicide film 8b film, and the cap insulating film is composed of the silicon nitride film 12a. The side wall spacers 11 on the individual side walls of the gate electrode 7 (the word line WL) and the gate electrode 8 are formed by anisottopically etching a silicon nitride film which is deposited over the gate electrodes 7, 8 and the cap insulating film 12a.

Figure 100:
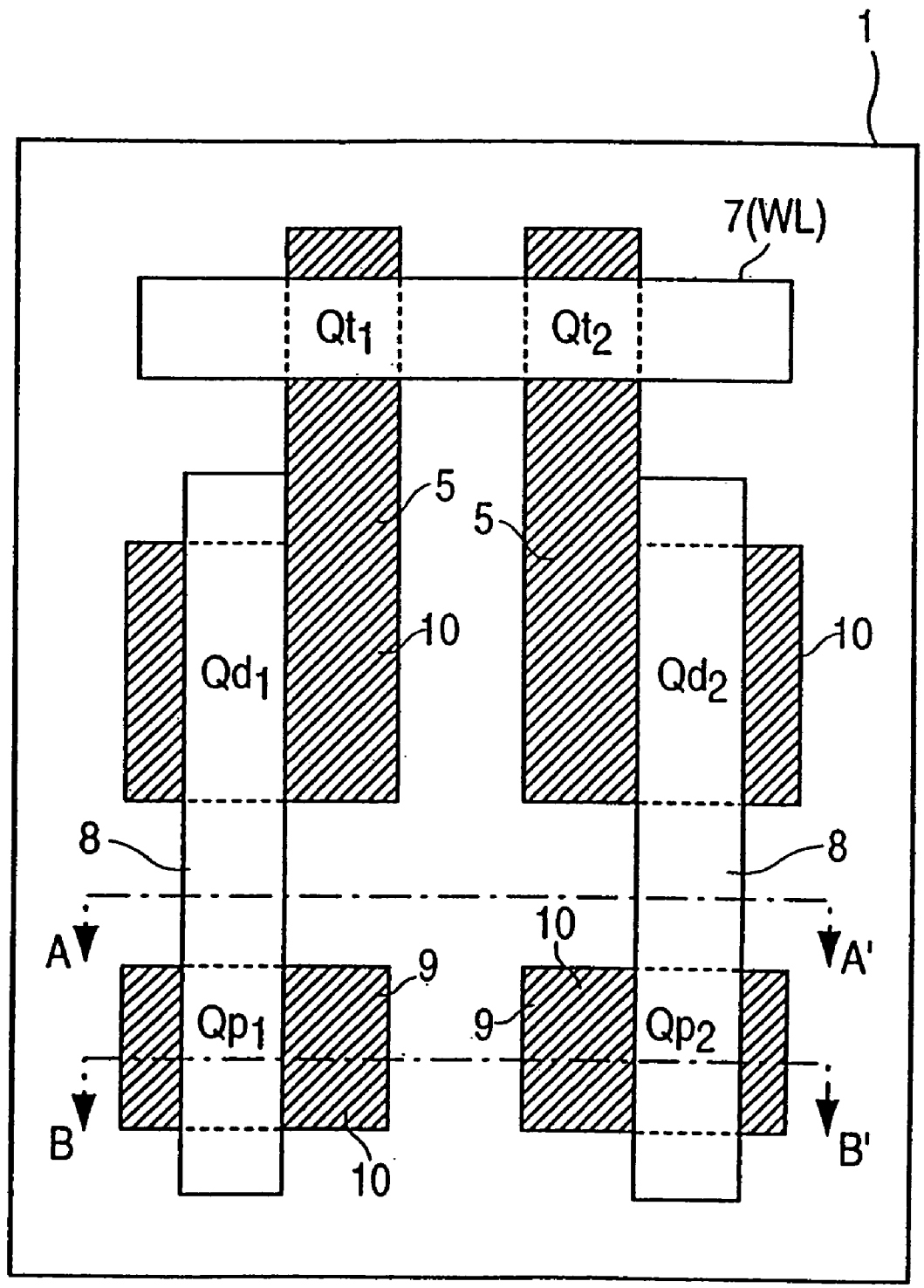
FIG. 100 is a top plan view showing the method for manufacturing the memory cell of the SRAM of this sixth embodiment according to the present invention.
Figure 101A:
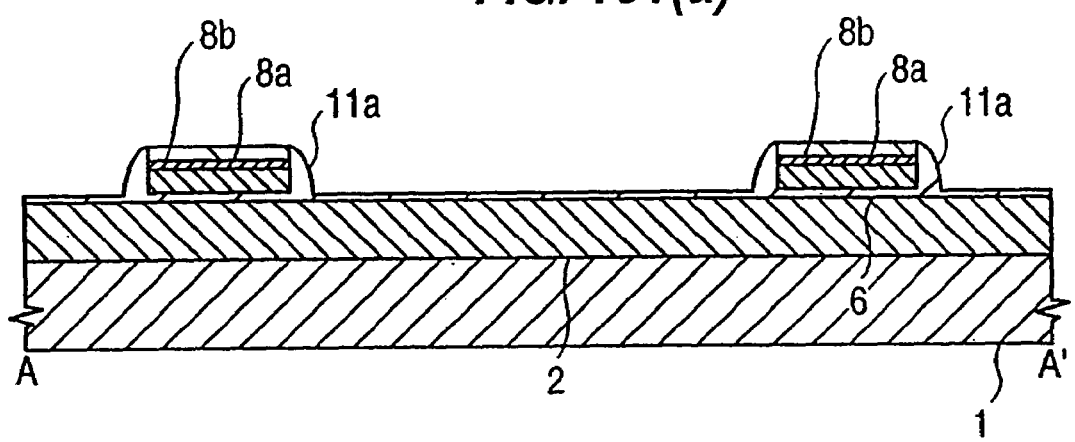
FIGS. 101(a) and 101(b) are sections showing the method for manufacturing the memory cell of the SRAM of this sixth embodiment according to the present invention.
Figure 101B:
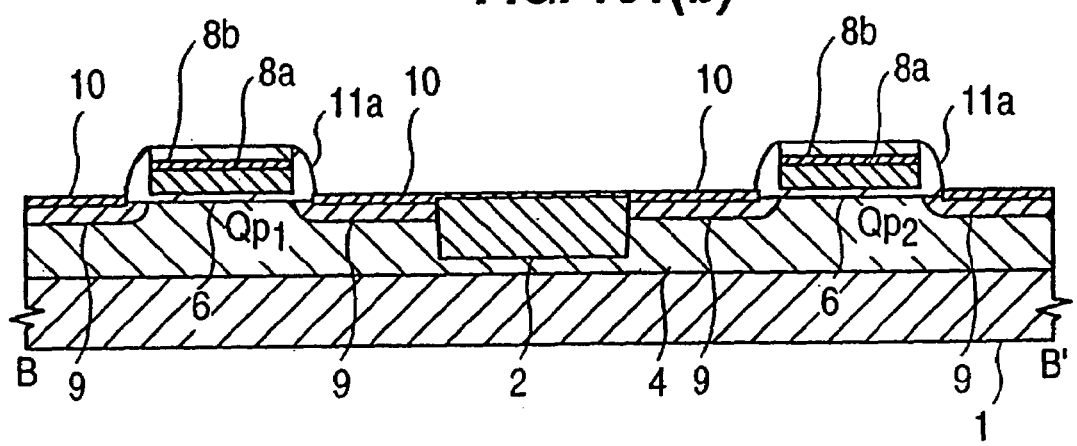

Next, as shown in FIGS. 100 and 101(a) and (b), in accordance with the manufacturing method of the foregoing embodiment 1, the Ti-silicide layer 10 is formed to reduce the sheet resistance over the individual n-type semiconductor regions 5 and 5 (the source region add the drain region) of the load MISFETs $Qp_1$ and $Qp_2$, and the individual p-type semiconductor regions 9 and 9 (the source region and the drain region) of the load MISFETs $Qp_1$ and $Qp_2$.

Figure 102:
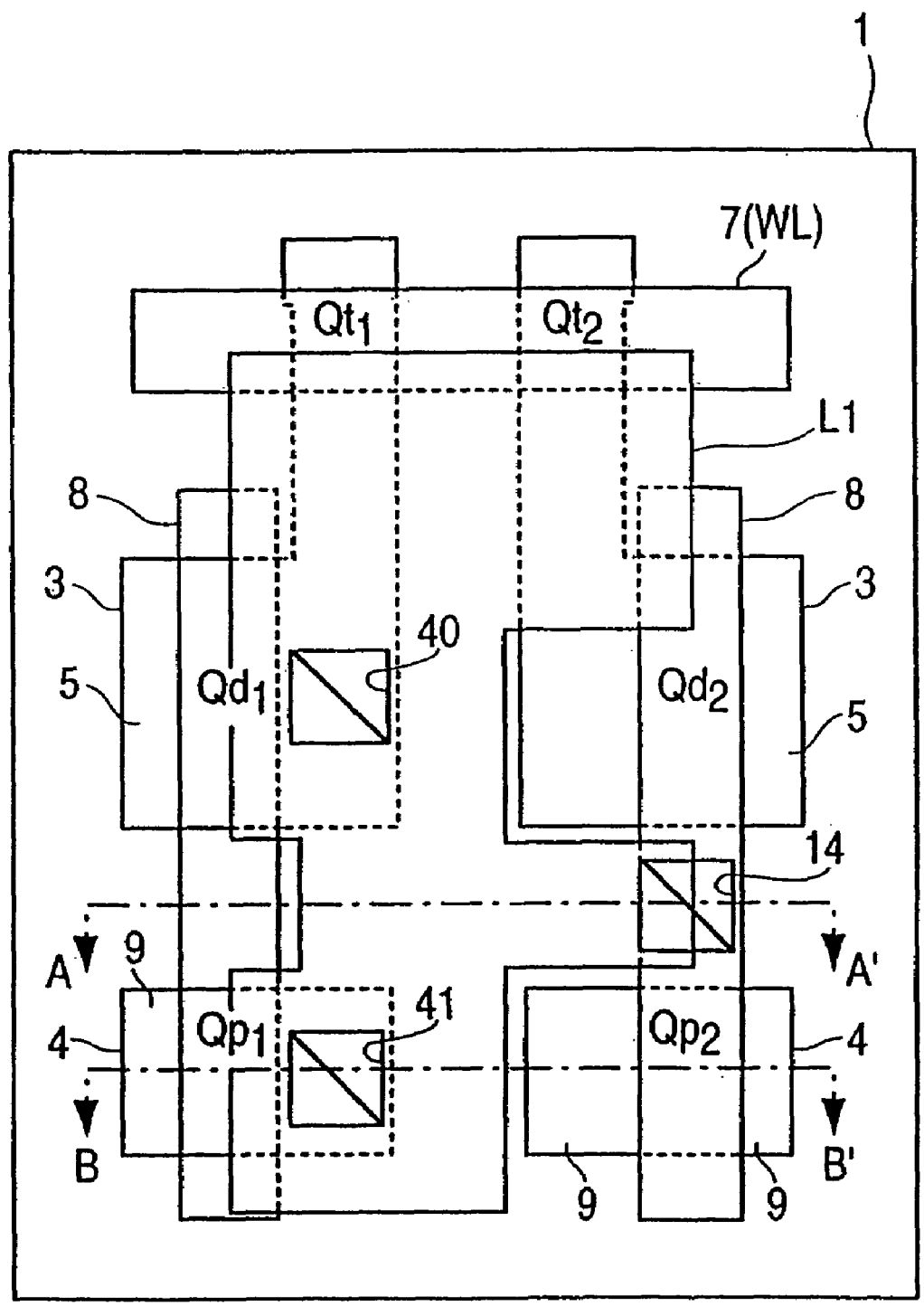
FIG. 102 is a top plan view showing the method for manufacturing the memory cell of the SRAM of this sixth embodiment according to the present invention.
Figure 103A:
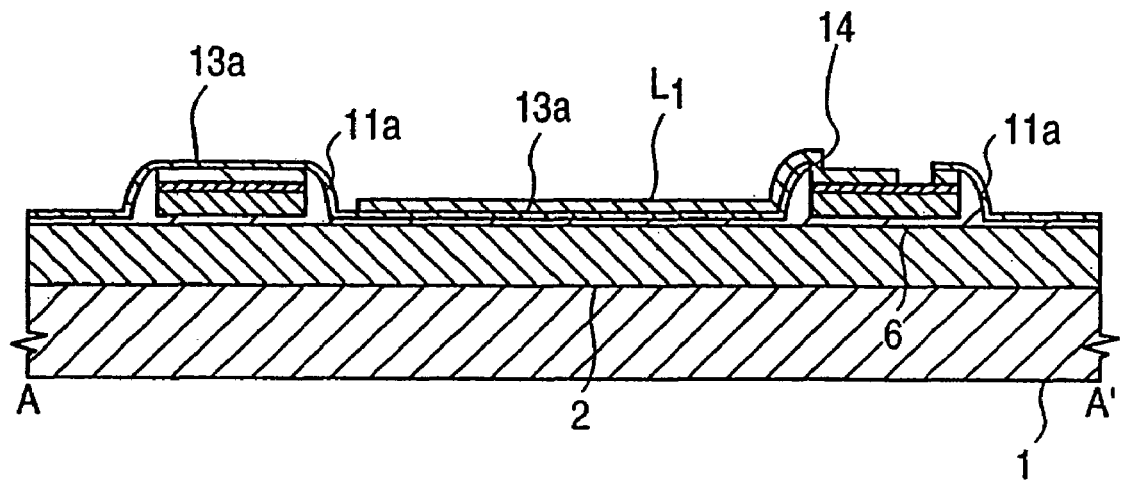
FIGS. 103(a) and 103(b) are sections showing the method for manufacturing the memory cell of the SRAM of this sixth embodiment according to the present invention.
Figure 103B:
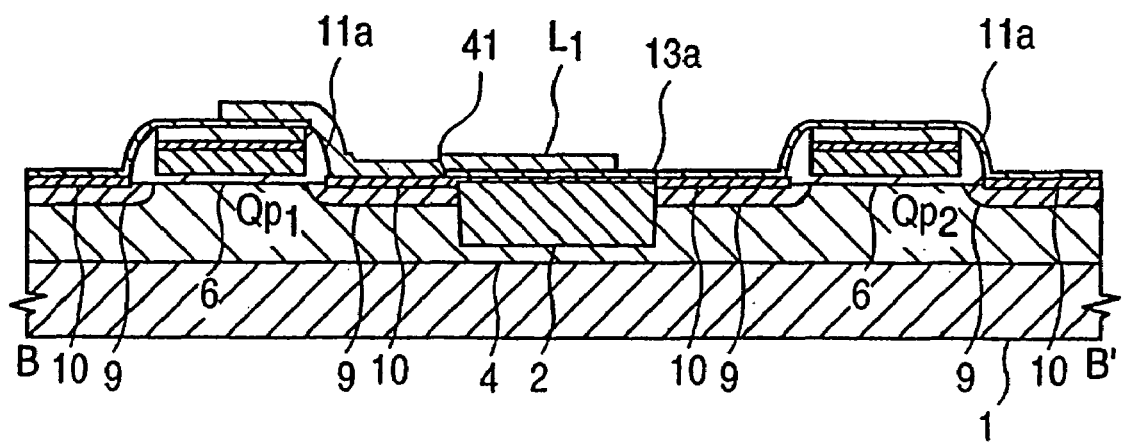

Next, as shown in FIGS. 102 and 103(a) and (b), the silicon oxide film 13a, deposited over the semiconductor substrate by a CVD method and having a small thickness of about 50 nm, is etched to form the connection hole 14 over the gate electrode 8 of the drive MISFET $Qd_2$ (the load MISFET $Qp_2$), the connection hole 40 over the n-type semiconductor region 5 (the drain region) of the drive MISFET $Qd_1$ and the connection hole 41 over the p-type semiconductor region 9 (the drain region) of the load MISFET $Qp_1$. After this, a TiN film, deposited over the silicon nitride film 13a by a sputtering method or a CVD method and having a thickness of about 100 nm, is patterned to form the local wiring line $L_1$. This local wiring line $L_1$ is given an area wide enough to cover the six MISFETs constituting the memory cell. The local wiring line $L_1$ is connected through the connection hole 14 with the gate electrode 8 of the drive MISFET $Qd_2$ (the load MISFET $Qp_2$), through the connection hole 40 with the n-type semiconductor region 5 (the drain region) of the drive MISFET $Qd_1$, and through the connection hole 41 with the p-type semiconductor region 9 (the drain region) of the load MISFET $Qp_1$.

Figure 104:
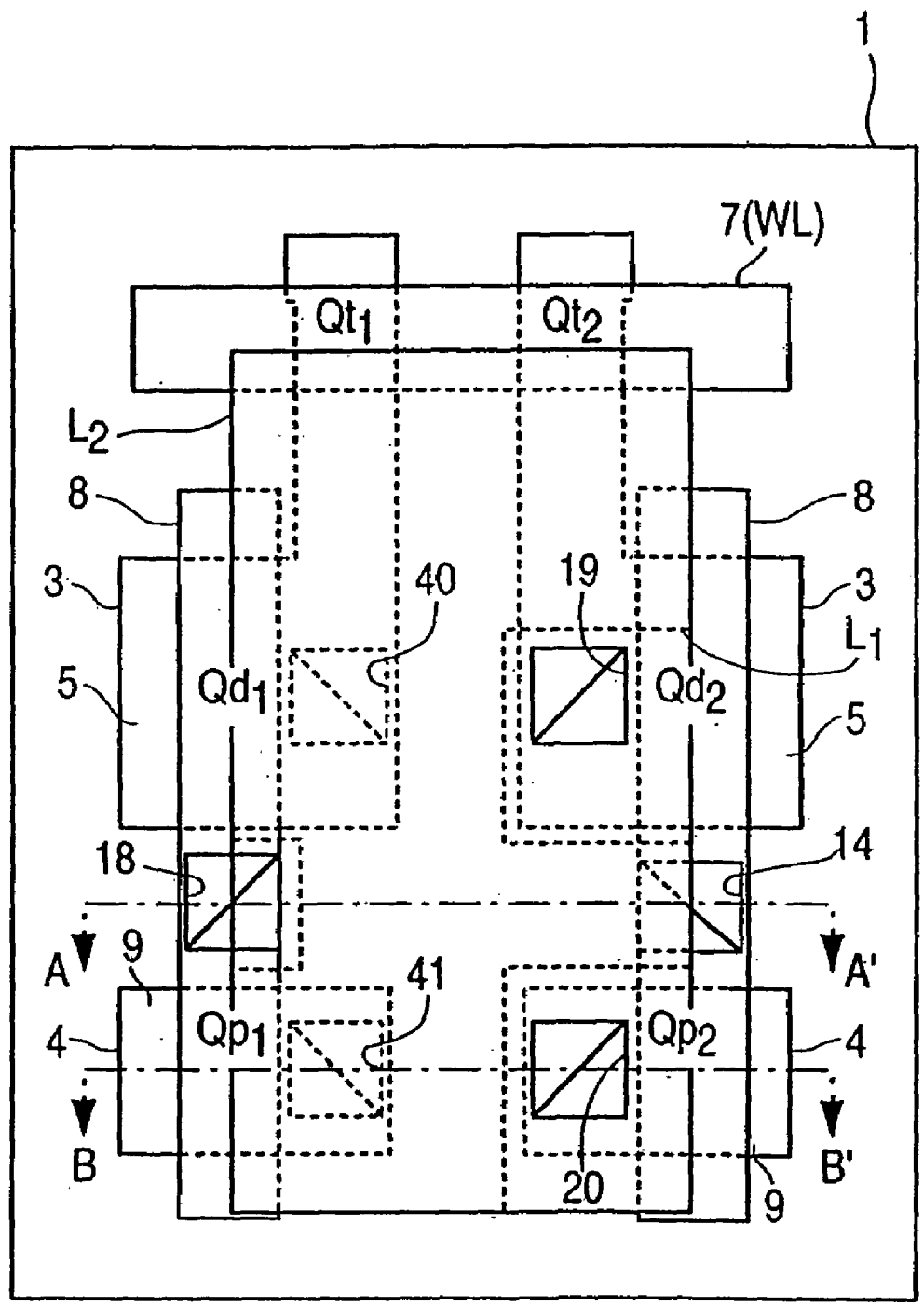
FIG. 104 is a top plan view showing the method for manufacturing the memory cell of the SRAM of this sixth embodiment according to the present invention.
Figure 105A:
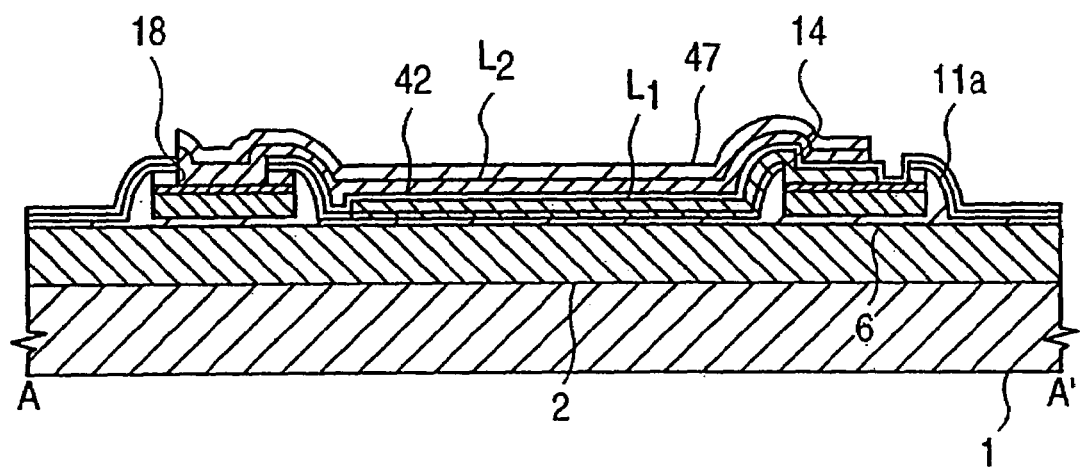
FIGS. 105(a) and 105(b) are sections showing the method for manufacturing the memory cell of the SRAM of this sixth embodiment according to the present invention.
Figure 105B:
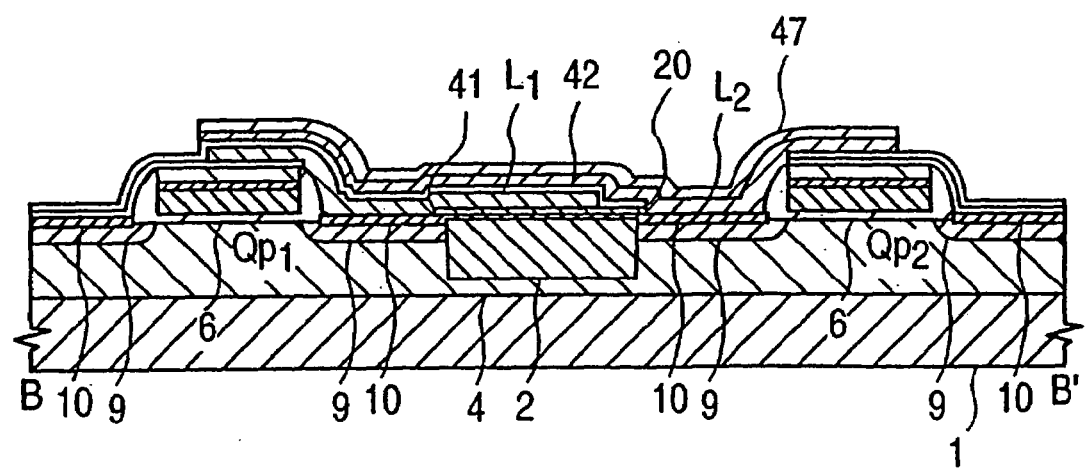

Next, as shown in FIGS. 104 and 105(a) and (b), the silicon nitride film 42, deposited over the semiconductor substrate 1 by a CVD method and having a small thickness of about 30 nm, is etched to form the connection hole 18 over the gate electrode 8 of the drive MISFET. $Qd_1$ (or the load MISFET $Qp_1$), the connection hole 19 over the n-type semiconductor region 5 (the drain region) of the drive MISFET $Qd_2$, and the connection hole 20 over the p-type semiconductor region 9 (the drain region) of the load MISFET $Qp_2$. After this the local wiring line $L_2$ of a TiN film is formed over the silicon nitride film 42. The local wiring line $L_2$ is connected through the connection hole 18 with the gate electrode 8 of the drive MISFET $Qd_1$ (the load MISFET $Qp_1$), through the connection hole 19 with the n-type semiconductor region 5 (the drain region) of the drive MISFET $Qd_2$, and through the connection hole 20 with the p-type semiconductor region 9 (the drain region) of the load MISFET $Qp_2$.

The local wiring line $L_2$ is formed by depositing a TiN film having a thickness of about 100 nm over the silicon nitride film 42 by a sputtering method or a CVD method, by then depositing the silicon nitride film 47 having a thickness of about 100 nm over the TiN film by a CVD method, and thereafter by patterning the silicon nitride film 47 and the TiN film by a dry etching method using a photoresist as the mask. The local wiring line $L_2$ is given an area wide enough to cover the six MISFETs constituting the memory cell and to overlap the lower local wiring line $L_1$ substantially completely in the region excepting the open regions of the connection holes 18, 19 and 20 and the registration allowance region. As a result, the capacitor element C is formed of the local wiring lines $L_1$ and $L_2$ (the paired electrodes) and the silicon nitride film 42 (the dielectric film) made thinner than the local wiring lines $L_1$ and $L_2$. Moreover, the charge of the capacitor element C can be increased so that the amount of stored charge of the storage node can be increased to improve the alpha particle soft error resistance of the memory cell.

Figure 106A:
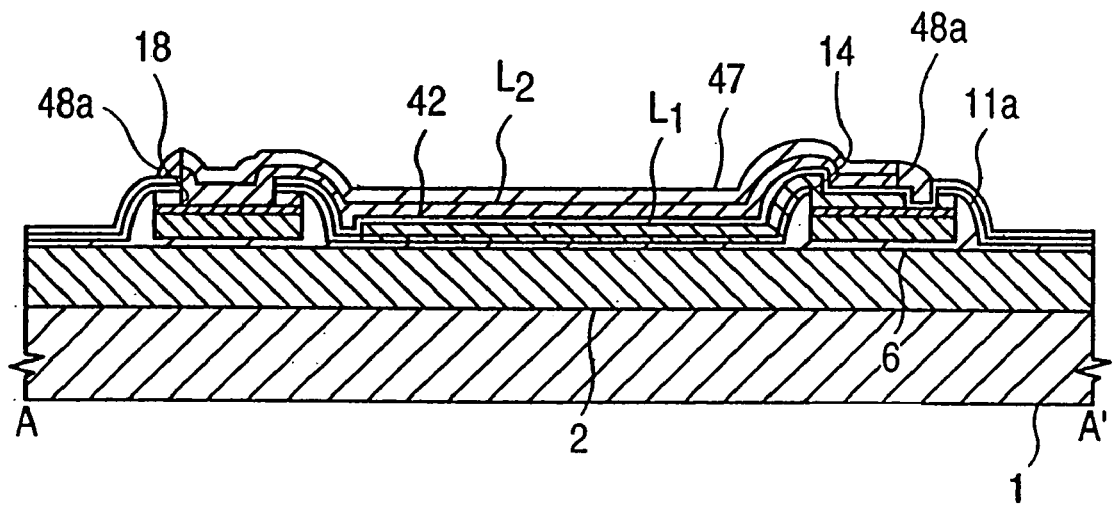
FIGS. 106(a) and 106(b) are sections showing the method for manufacturing the memory cell of the SRAM of this sixth embodiment according to the present invention.
Figure 106B:
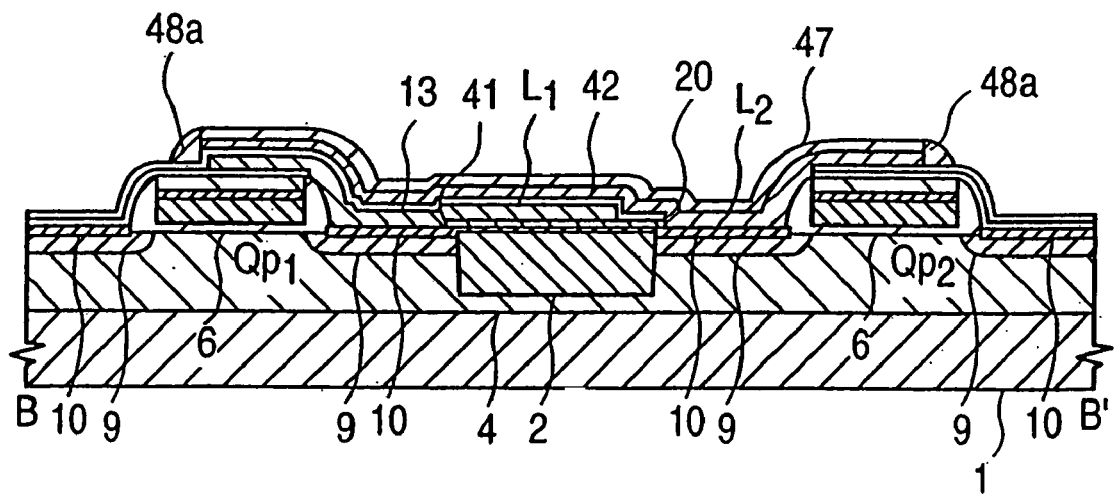

Next, as shown in FIG. 106(a) and (b), the side wall spacers 48a are formed on the individual side walls of the lower local wiring line $L_1$ and the upper local wiring line $L_2$. The side wall spacer 11a is also formed on the side wall of the gate electrode 7,8 (the word line WL). The side wall spacers 48a are formed by anisottopically etching a silicon nitride film which is deposited over the silicon nitride film 47 by a CVD method and has a thickness of about 200 nm.

Figure 107A:
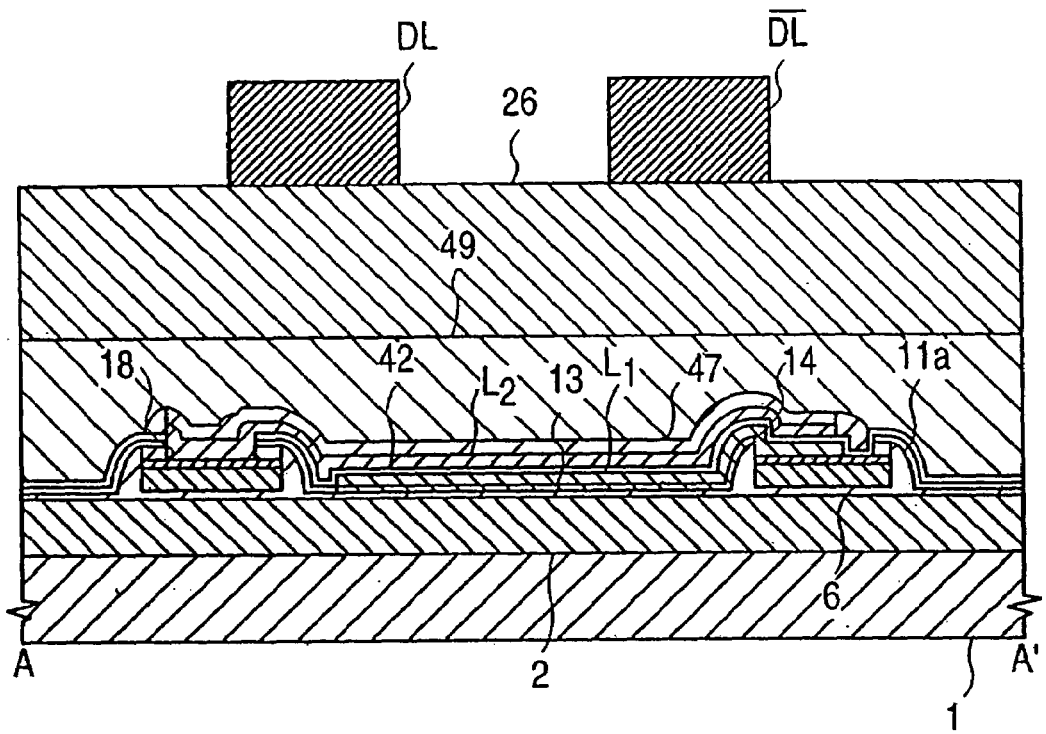
FIGS. 107(a) and 107(b) are sections showing the method for manufacturing the memory cell of the SRAM of this sixth embodiment according to the present invention.
Figure 107B:
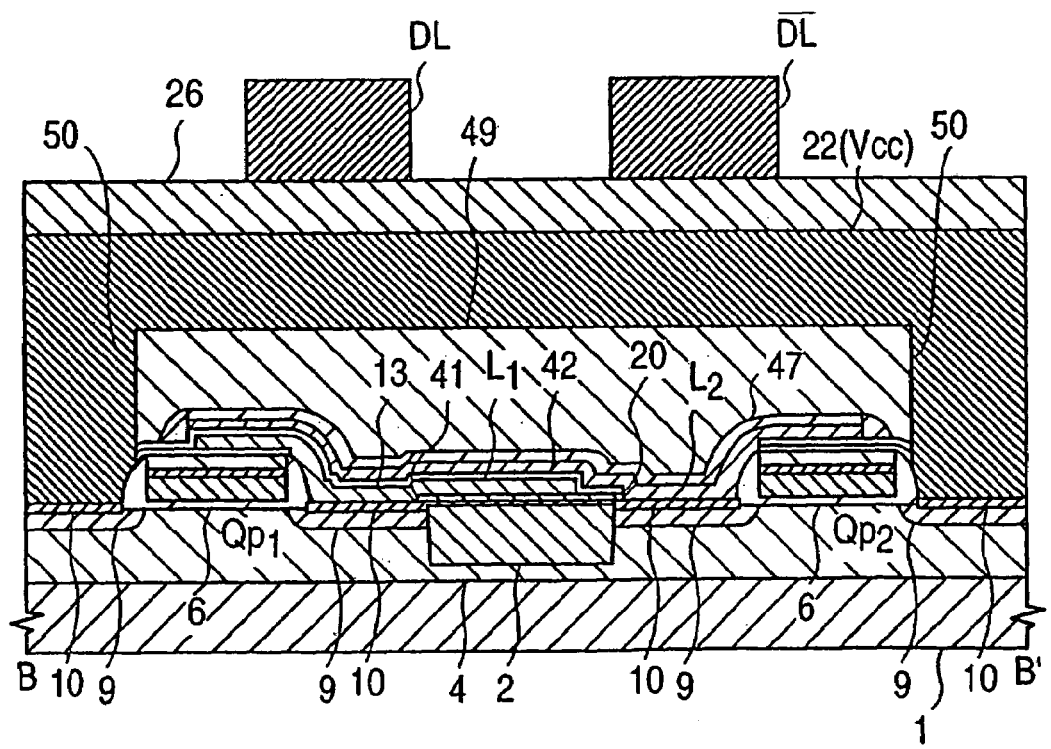
Figure 108:
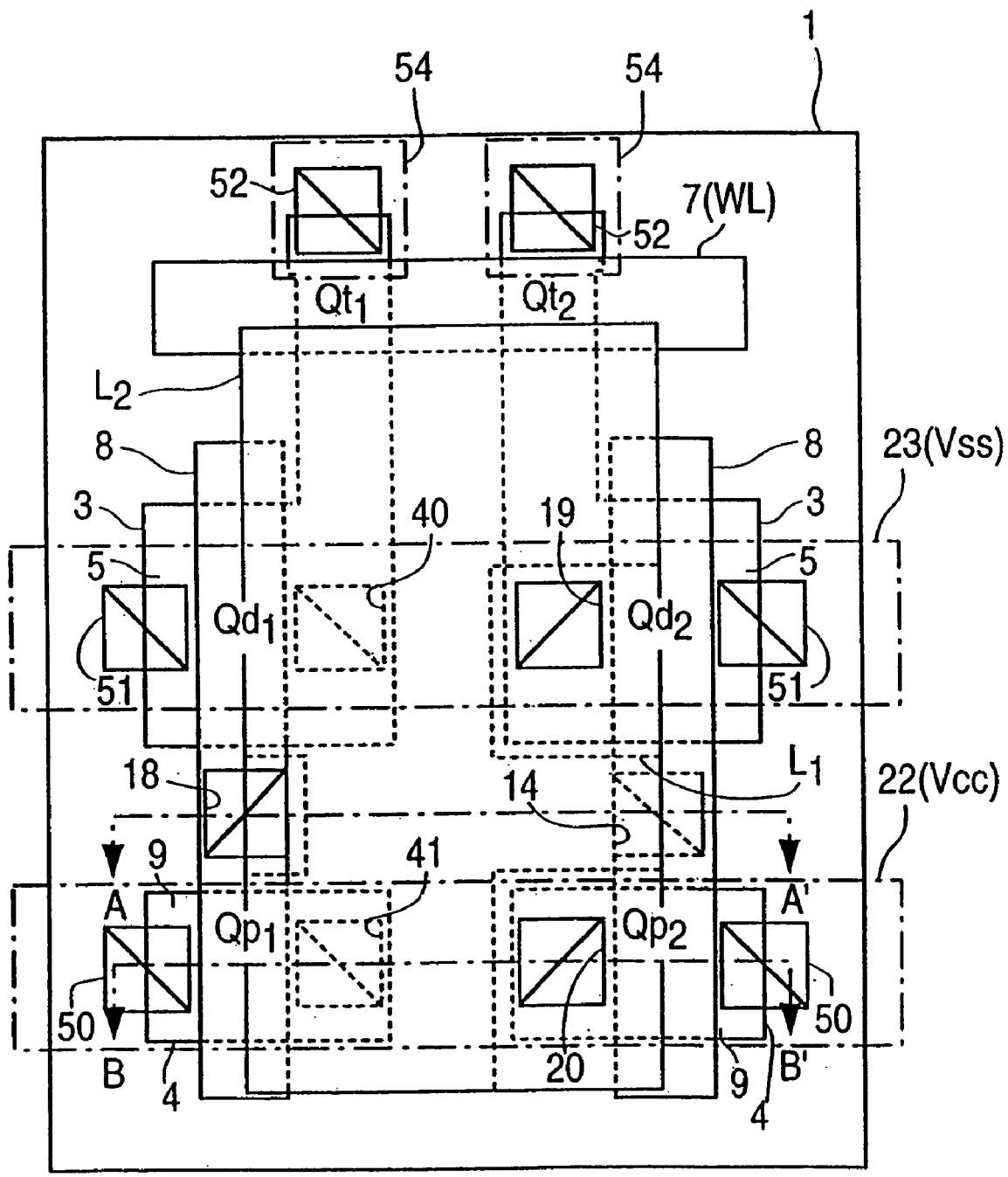
FIG. 108 is a top plan view showing the method for manufacturing the memory cell of the SRAM of this sixth embodiment according to the present invention.
Figure 109:
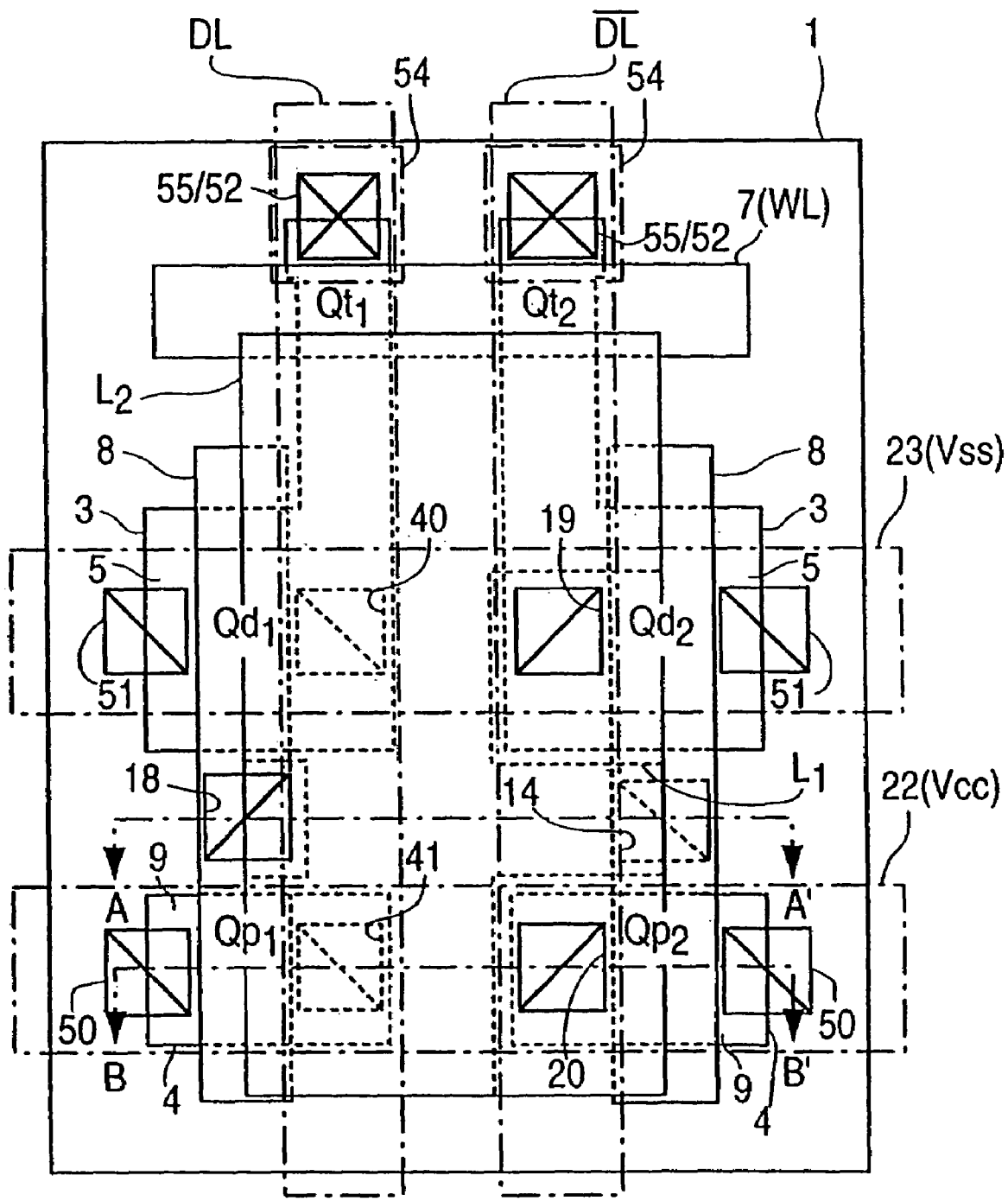
FIG. 109 is a top plan view showing the method for manufacturing the memory cell of the SRAM of this sixth embodiment according to the present invention.

Next, as shown in FIGS. 107(a) and (b) and 108, the interlayer insulating film 49 of PSG having a thickness of about 400 nm is deposited over the silicon nitride film 47 by a CVD method. After this, the interlayer insulating film 49 is opened by a dry-etching method using a photoresist as the mask to form the connection holes 50 and 50 over the p-type semiconductor regions 9 and 9 (the source regions) of the load MISFETs $Qp_1$ and $Qp_2$, the connection holes 51 and 51 over the n-type semiconductor region 5 and 5 (the source regions) of the drive MISFETs $Qd_1$ and $Qd_2$, and the connection holes 52 and 52 over the n-type semiconductor regions 5 and 5 (the drain regions) of the transfer MISFETs $Qd_1$ and $Qt_2$. Since, at this time, the side wall spacers 48a, 11a of the silicon nitride film and the silicon nitride film 47 act as etching stoppers, neither the gate electrode 8 is exposed at the side walls of the connection holes 50 and 51, nor is exposed the gate electrode 7 (the word line WL) at the side wall of the connection hole 52. Likewise, neither the lower local wiring line $L_1$ nor the upper local wiring line $L_2$ is exposed at the side walls of the connection holes 50, 51 and 52.

In short, when the manufacturing method of the present embodiment is applied to the SRAM in which the paired local wiring lines $L_1$ and $L_2$ are arranged in different conductive layers, it is unnecessary to take into consideration the registration allowance between the connection holes 50, 51 and 52 and the upper local wiring line $L_2$, and the registration allowance between the connection holes 50, 51 and 52 and the gate electrode 7 (the word line WL) and the gate electrode 8. As a result, the connection holes 50, 51 and 52 can be so arranged as to be closer to the upper local wiring line $L_2$, the lower local wiring line $L_1$, the gate electrode 7 (word line WL) and the gate electrode 8 by a distance corresponding to those registration allowances so that the area occupied by the memory cell can be reduced. In order that the side wall spacers 48a, 11a, and the silicon nitride film 47 may function as the etching stoppers when the interlayer insulating film 49 is etched, the thickness of the silicon nitride film constituting the side wall spacers 48a is made larger than the registration allowance of the aforementioned photoresist mask.

In the present embodiment, the side wall spacers 48a, 11a of the silicon nitride are formed in advance on the individual side walls of the gate electrode 7 (the word line WL), the gate electrode 8, the lower local wiring line $L_1$ and the upper local wiring line $L_2$, and the connection holes 50, 51 and 52 are then formed in the interlayer insulating film 49. As in the foregoing embodiment 4, the silicon nitride film and the interlayer insulating film 49 can be deposited over the silicon nitride film 47 covering the upper local wiring line $L_2$ so that the side wall spacers may be formed when the interlayer insulating film 49 is opened to form the connection holes 50, 51 and 52.

Next, as shown in FIGS. 107(a) and (b) and 109, in accordance with the manufacturing method of the foregoing embodiment 3, the power supply voltage line 22, the reference voltage line 23 and the intermediate wiring line 54 are formed over the interlayer insulating film 49. After this, as shown in FIGS. 96 and 97(a) and (b), the interlayer insulating film 26 is deposited over the power supply voltage line 22, the reference voltage line 23 and the intermediate wiring line 54, and the interlayer insulating film 26 over the intermediate wiring line 54 is opened to form the connection hole 55. After this, the data lines DL and DL are formed over the interlayer insulating film 26.

According to the present embodiment, the paired local wiring lines $L_1$ and $L_2$ are formed in different conductive layers and are so arranged as to be superposed on each other so that the area occupied by the memory cell can be reduced. At the same time, there are made unnecessary the registration allowance between the connection holes 50, 51 and 52 and the upper local wiring line $L_2$, the registration allowance between the connection holes 50, 51 and 52 and the lower local wiring line $L_1$, and the registration allowance between the connection holes 50, 51 and 52 and the gate electrode 7 (the word line WL) and the gate electrode 8, so that the area occupied by the memory cell can be further reduced.

According to the present embodiment, the upper local wiring line $L_2$ and the lower local wiring line $L_1$ are so arranged as to overlap with each other over a wide area, and the capacitor element C is composed of the local wiring lines $L_1$ and $L_2$ and the thin insulating film interposed therebetween, so that the alpha particle soft error resistance of the memory cell can be improved.

Although our invention has been specifically described in connection with its embodiments, it should not be limited thereto but can naturally be modified in various manners without departing from the gist thereof.

The metal material of the local wiring lines can be selected from a variety of materials in addition to those of the foregoing embodiments. For example, the lower local wiring line may be made of a first-layer aluminum metal (TiN/Al/TiN) whereas the upper local wiring line may be made of a second-layer aluminum metal. In this case, the power supply voltage line and the reference voltage line are made of a third layer aluminum metal whereas the complementary data lines are made of a fourth-layer aluminum metal.

The effects obtained by the present invention disclosed herein will be briefly described in the following.

According to the SRAM of the present invention, the paired local wiring lines cross-connecting the input/output terminals of the flip-flop circuit of the memory cell are formed in different conductive layers. As a result, the space, required to arrange the paired local wiring lines transversely when the two local wiring lines are composed of a common conductive film, can be eliminated, so that the local wiring lines can be so arranged as to overlap partially to reduce the area occupied by the memory cell.

According to the SRAM of the present invention, the lower local wiring line and the upper local wiring line are so arranged as to overlap with each other, and a capacitor element is composed of those local wiring lines and the insulating film interposed therebetween. As a result, the storage node capacitance of the memory cell can be increased to prevent a drop in the alpha particle soft error resistance which may be caused by the miniaturization of the memory cell size and the drop in the operation power supply voltage.

According to the SRAM of the present invention, refractory metal silicide layers of a low resistance material are formed on the surfaces of the source and drain regions of the drive MISFETs, the load MISFETs and the transfer MISFETs constituting the memory cell, so that the high-speed operation of the memory cell can be realized.

According to the SRAM of the present invention, the active region of the semiconductor substrate (the p-type well) where the drive MISFETs and the transfer MISFETs are formed, and the active region of the semiconductor substrate (the n-type well) where the load MISFETs are formed, are isolated by the grooves which are opened in the semiconductor substrate. As a result, the area occupied by the element isolating region can be made lower than that of the case that the isolation is achieved by the field insulating film formed by a LOCOS method, so that the area occupied by the memory cell can be reduced.

According to the method for manufacturing the SRAM of the present invention, the mask registration allowance, when the connection holes are made in the interlayer insulating film by using a photoresist as the mask, can be eliminated to reduce the area occupied by the memory cell.

While we have shown and described several embodiments in accordance with the present invention, it is understood that the same is not limited thereto, but is susceptible of numerous changes and modifications as known to those skilled in the art. Therefore, we do not wish to be limited to the details shown and described herein, but intend to cover all such changes and modifications as are encompassed by the scope of the appended claims.

What is claimed is:

1. A semiconductor device, comprising:
   a static memory cell including first and second driver MISFETs and first and second load MISFETs, and first and second transfer MISFETs; and
   a capacitor element including a first electrode, a dielectric layer, and a second electrode,
   wherein gates of said first driver MISFET and said first load MISFET are formed by a first gate layer, and
   wherein gates of said second driver MISFET and said second load MISFET are formed by a second gate layer; and
   first and second voltage lines, extending in a first direction crossing a second direction in which said first and second gate layers extend,
   wherein a third layer forming said first electrode electrically connects the drains of said first driver MISFET and said first load MISFET,
   wherein a fourth layer forming said second electrode electrically connects the drains of said second driver MISFET and said second load MISFET,
   wherein said third layer is formed between said first gate layer and said fourth layer,
   wherein a size of said fourth layer is larger than a size of said third layer,
   wherein said first and second voltage lines are metal layers, and
   wherein said fourth layer comprises a tungsten layer.

2. The semiconductor device according to claim 1, wherein said fourth layer completely covers said third layer.

3. The semiconductor device according to claim 2, wherein said dielectric layer includes a silicon nitride film.

* * * * *